US012745677B2

(12) United States Patent
Zhang et al.

(10) Patent No.: US 12,745,677 B2
(45) Date of Patent: Sep. 22, 2026

(54) COLOR-TEMPERATURE-TUNABLE LIGHTING DEVICES

(71) Applicant: BRIDGELUX, INC., Fremont, CA (US)

(72) Inventors: Jingqiong Zhang, Xiamen City (CN); Yi-Qun Li, Danville, CA (US); Jungang Zhao, Suzhou (CN)

(73) Assignee: BRIDGELUX, INC., Fremont, CA (US)

( * ) Notice: Subject to any disclaimer, the term of this patent is extended or adjusted under 35 U.S.C. 154(b) by 316 days.

(21) Appl. No.: 18/361,814

(22) Filed: Jul. 28, 2023

(65) Prior Publication Data

US 2024/0178199 A1 May 30, 2024

Related U.S. Application Data

(60) Provisional application No. 63/510,341, filed on Jun. 26, 2023.

(30) Foreign Application Priority Data

Nov. 29, 2022 (WO) ................ PCT/CN2022/135022

(51) Int. Cl.
*H10W 90/00* (2026.01)
*H10H 20/851* (2025.01)

(52) U.S. Cl.
CPC ........ *H10W 90/00* (2026.01); *H10H 20/8512* (2025.01)

(58) Field of Classification Search
CPC ............ H01L 25/0753; H10H 20/8512; H10H 20/8513; H10H 20/857; H05B 45/20; H10W 90/00
See application file for complete search history.

(56) References Cited

U.S. PATENT DOCUMENTS 10,883,672 B1 * 1/2021 DeSena, Jr. ............... F21V 7/05
11,294,238 B1 * 4/2022 Ly ..................... G02F 1/133603
(Continued)

FOREIGN PATENT DOCUMENTS

WO 2007139781 A2 12/2007
WO WO2016199101 A2 12/2016
(Continued)

OTHER PUBLICATIONS

International Search Report, PCT/US2023/081478; EPO as ISA, Brosa, Anna-Maria; mailed Apr. 16, 2024.
(Continued)

*Primary Examiner* — Jonathan Han
(74) *Attorney, Agent, or Firm* — Vista IP Law Group, LLP

(57) ABSTRACT

A lighting device comprising: a first LED for generating light of a first chromaticity in a first chromaticity region defined by chromaticity coordinates (0.486, 0.410), (0.509, 0.340), (0.578, 0.405), and (0.537, 0.461); a second LED for generating light of a second chromaticity in a second chromaticity region defined by chromaticity coordinates (0.328, 0.495), (0.342, 0.390), (0.478, 0.444), and (0.464, 0.545); and a third LED for generating light of a third chromaticity in a third chromaticity region defined by chromaticity coordinates (0.195, 0.266), (0.205, 0.212), (0.286, 0.293), and (0.276, 0.328). Light generated by the device comprises a combination of light of the first, second, and third chromaticity and has a chromaticity that can be tunable by controlling power to the first, second and third LEDs.

21 Claims, 66 Drawing Sheets

(56) References Cited

U.S. PATENT DOCUMENTS

2020/0245420 A1 7/2020 Qiu et al.
2020/0314976 A1 10/2020 Soer et al.
2022/0389313 A1* 12/2022 Wang .................. H10H 20/813

FOREIGN PATENT DOCUMENTS

WO WO2017183984 A1 10/2017
WO WO2019010074 A1 1/2019
WO 2020232668 A1 11/2020

OTHER PUBLICATIONS

Written Opinion, PCT/US2023/081478; EPO as ISA, Brosa, Anna-Maria; mailed Apr. 16, 2024.
International Search Report and Written Opinion, PCT/CN2022/135022, EPO as ISA, Rijswijk, NL, mailed Jun. 16, 2023.

* cited by examiner

SECTION A-A

SECTION B-B

SECTION C-C

SECTION D-D

SECTION E-E

SECTION F-F

SECTION G-G

COLOR-TEMPERATURE-TUNABLE LIGHTING DEVICES

CROSS REFERENCE TO RELATED APPLICATION

This application claims the benefit of priority to: i) International Patent Application Number PCT/CN2022/135022, filed Nov. 29, 2022, entitled "Color-Temperature-Tunable Lighting Devices", and ii) Provisional Patent Application No. 63/510,341 Jun. 26, 2023, entitled "Color-Temperature-Tunable Lighting Devices", which are hereby incorporated by reference in their entirety.

FIELD OF THE INVENTION

Embodiments of the invention relate to color-temperature-tunable lighting devices that for generating light with a Correlated Color Temperature (CCT) in a range from 1500K to 7500K. More particularly, though not exclusively, embodiments concern multi-color LED (Light Emitting Diode) packaged devices and multi-LED packaging arrangements.

BACKGROUND OF THE INVENTION

An example of a known color-tunable multi-LED packaged lighting device is shown in FIGS. 1A and 1B, in which FIG. 1A shows a top view and FIG. 1B shows a sectional side view through A-A of the multi-LED packaged lighting device. The known color-tunable lighting device 1 comprises a lead frame 2 for providing power to the red, green, and blue direct-emitting LED chips 3R, 3G, 3B. A housing 4 is molded onto the lead frame and comprises a single cavity (recess) 5 (e.g., circular in shape). The red, green, and blue LED direct-emitting LED chips 3R, 3G, 3B are mounted on the floor of cavity 5 and electrically connected to the lead frame 2. To protect the LED chips 3R, 3G, 3B from the external environment, the cavity 5 is typically filled with a light-transmissive encapsulant 6 such as a silicone material. Portions of the lead frame 2 extend laterally to the outside edges of the housing 4 and form respective electrical terminals 7, 8 along opposing edges and base of the package allowing electrical power to be independently (individually) applied to the anode and cathode of each of the red, green, and blue direct-emitting LED chips 3R, 3G, 3B.

Phosphor Converted (PC) LEDs are to be contrasted with Direct-Emitting Color LED chips, wherein PC LEDs comprise a Direct-Emitting blue LED chip and a photoluminescence material, typically a phosphor material, that converts a portion blue excitation light generated by the LED chip, with the remainder of the blue light contributing to the final emission product. The phosphor material may be incorporated in the light-transmissive encapsulant in the LED package.

A disadvantage of color-tunable multi-LED packaged lighting devices based on Direct-Emitting Color LEDs, however, is that since they are based on different semiconductor material systems each Color LED has different characteristics such as thermal stability, ageing characteristics, drive requirements etc. As a result of these different characteristics, the light output of Red, Green and Blue LEDs will change differently from one another with temperature and time. The color composition of light generated by an RGB system based on Color LEDs will consequently change with temperature and time and such RGB systems may employ complex drive circuitry to compensate for these differing characteristics which can lead to additional cost during manufacture and maintenance.

Prior art color-temperature-tunable lighting devices typically comprise two color temperature LEDs, one warm white (e.g., CCTs from 1800K to 3000K) and one cool white (e.g., CCT from 4000K to 6500K). While such devices can generate warm light and cool light that corresponds to the black body locus, for color temperatures in between, in which light generated by the devices is a combination of warm white and cool white, said light deviates from the black body locus. A further limitation of the known color-temperature-tunable lighting devices is that their emission spectrum, intensity versus wavelength, does not resemble the spectrum of a black body radiator.

The present invention intends to address and/or overcome the limitations discussed above by presenting new designs and methods not hitherto contemplated nor possible by known constructions. More particularly, although not exclusively, embodiments of the invention concern improvements relating to increasing the luminous efficacy of color-tunable multi-LED packaged lighting devices.

SUMMARY OF THE INVENTION

The invention relates generally to color-temperature-tunable lighting devices comprising multi-color LEDs that can generate light of a color temperature that is tunable in a range of CCTs from 1800K to 6500K with a chromaticity/color temperature that corresponds to the black body locus. Advantageously, lighting devices according to the invention generate light with a spectrum, intensity versus wavelength, that closely resembles (matches) the spectrum of a black body radiator. The characteristic of being able to generate light with a spectrum that closely matches a black body radiator over a full range of color temperatures is desirable for circadian lighting in which color tuning is used to mimic the color temperature cycle of sunlight from sunrise to sunset to match the human circadian rhythm.

Aspects of the invention relate to color-temperature-tunable lighting devices comprising a plurality of LEDs that generate light of two, three, or four different chromaticity/CCTs. To improve the luminous efficacy of the lighting device, at least one of the plurality of LEDs, for example, the LED that generates light with the lowest color temperature, may comprise a narrowband red phosphor such as a narrowband red fluoride phosphor; for example, $K_2SiF_6:Mn^{4+}$, $K_2GeF_6:Mn^{4+}$, and/or $K_2TiF_6:Mn^{4+}$.

In this specification "chromaticity" of light, "color of light", and "color point" of light may be used interchangeably and refer to the chromaticity/color of light as represented by chromaticity coordinates CIE x, y on a CIE 1931 chromaticity diagram.

According to an aspect of the present invention, there is provided a lighting device comprising: a first LED for generating light of a first chromaticity in a first chromaticity region defined by chromaticity coordinates (0.498, 0.422), (0.522, 0.370), (0.562, 0.410), and (0.537, 0.461); a second LED for generating light of a second chromaticity in a second chromaticity region defined by chromaticity coordinates (0.330, 0.480), (0.342, 0.385), (0.392, 0.420), and (0.378, 0.514); and a third LED for generating light of a third chromaticity in a third chromaticity region defined by chromaticity coordinates (0.196, 0.261), (0.206, 0.212), (0.234, 0.243), and (0.226, 0.290). In this specification "a chromaticity region"—CIE region—is as an area on the CIE 1931 chromaticity diagram and may be defined as a quadrilateral area composed of four chromaticity coordinates CIE x, y connected by four straight lines. The chromaticity of light for the chromaticity region (CIE region) can comprise any chromaticity value (CIE x, y) within the quadrilateral or lying on the straight line sides of the quadrilateral. Light generated by the device comprises a combination of light generated by the first, second, and third LEDs and wherein a chromaticity of light generatable by the device is tunable by controlling power to the first, second and third LEDs. In terms of CCT, light of the first chromaticity may have a CCT from 1720K to 2350K and light of the second chromaticity may have a CCT from 4000K to 5580K. Such a lighting device can generate light with a CCT from 1800K to 6500K with a General Color Rendering Index, CRI Ra, from 80 to 97 and have a chromaticity corresponding to, or close to, the black body locus or Standard Illuminant of the same CCT.

It may be that a chromaticity of light generated by the device are within 0.003 Δuv of the black body locus for CCTs from 1800K to 6500K. Δuv (Delta uv) is a metric that quantifies how close light of a given color temperature is to the black body locus. As is known, Δuv is the Euclidean difference of chromaticity coordinate uv between a test light source to the closest point on the black body locus and is defined in ANSI_NEMA_ANSLG C78.377-2008: American National Standard for electric lamps—Specifications for the Chromaticity of Solid State Lighting Products. Δuv is on the 1976 CIE u, v chromaticity diagram, a measure of the distance of the color point of light of a given CCT (Correlated Color Temperature) from the black body locus (Planckian locus of black body radiation) along the iso-CCT line (Lines of Constant Color Temperature). A positive Δuv value indicates that the color point is above the black body locus (i.e., on a 1931 CIE x, y chromaticity diagram CIE y is greater than the CIE y value of the black body locus) with a yellowish/greenish color shift from the black body locus. A negative value the color point is below the black body locus (i.e., on a 1931 CIE x, y chromaticity diagram CIE y is less than the CIE y value of the black body locus) with a pinkish color shift from the black body locus.

It may be that the first chromaticity region is 6 SDCM (Standard Deviation Color Matching—Mac Adam ellipses) centered on a chromaticity (0.530, 0.415); the second chromaticity region is 6 SDCM centered on a chromaticity (0.360, 0.450); and the third chromaticity region is 6 SDCM centered on a chromaticity (0.216, 0.251). Again, such a lighting device can generate light with a CCT from 1800K to 6500K with a General Color Rendering Index, CRI Ra, from 80 to 97 and have a chromaticity corresponding to, or close to, the black body locus or Standard Illuminant of the same CCT (typically Δuv is less than 0.003).

In an embodiment, it may be that the first chromaticity region is defined by chromaticity coordinates (0.502, 0.419), (0.510, 0.398), (0.538, 0.424), and (0.530, 0.445); the second chromaticity region is defined by chromaticity coordinates (0.364, 0.439), (0.365, 0.407), (0.388, 0.424), and (0.386, 0.456); and the third chromaticity region is defined by chromaticity coordinates (0.200, 0.244), (0.205, 0.212), (0.225, 0.232), and (0.219, 0.265). Such a lighting device may include a narrowband red fluoride phosphor; for example, $K_2SiF_6:Mn^{4+}$, $K_2GeF_6:Mn^{4+}$, and/or $K_2TiF_6:Mn^{4+}$ and can generate light with a CCT from 1800K to 6500K with a General Color Rendering Index, CRI Ra, of about 80 and have a chromaticity corresponding to, or close to, the black body locus or Standard Illuminant of the same CCT (typically, Δuv is less than 0.003). In terms of CCT, light of the first chromaticity may have a CCT from 1970K to 2270K, and light of the second chromaticity may have a CCT from 4100K to 4750K.

It may be that the first chromaticity region is 6 SDCM centered on a chromaticity (0.520, 0.421); the second chromaticity region is 6 SDCM centered on a chromaticity (0.376, 0.432); and the third chromaticity region is 6 SDCM centered on a chromaticity (0.212, 0.238). Again, such a lighting device can generate light with a CCT from 1800K to 6500K with a General Color Rendering Index, CRI Ra, of about 80 and have a chromaticity corresponding to, or close to, the black body locus or Standard Illuminant of the same CCT (typically Δuv is less than 0.003) and may include a narrowband red fluoride phosphor.

In another embodiment, it may be that the first chromaticity region is defined by chromaticity coordinates (0.511, 0.435), (0.518, 0.415), (0.545, 0.441), and (0.537, 0.461); the second chromaticity region is defined by chromaticity coordinates (0.353, 0.428), (0.356, 0.396), (0.379, 0.415), and (0.376, 0.448); and the third chromaticity region is defined by chromaticity coordinates (0.200, 0.244), (0.205, 0.212), (0.225, 0.232), and (0.219, 0.265). Such a lighting device can generate light with a CCT from 1800K to 6500K with a General Color Rendering Index, CRI Ra, of about 80 and have a chromaticity corresponding to, or close to, the black body locus or Standard Illuminant of the same CCT (typically Δuv is less than 0.003). In terms of CCT, light of the first chromaticity may have a CCT from 2200K to 2280K, and light of the second chromaticity may have a CCT from 4250K to 4980K.

It may be that the first chromaticity region is 6 SDCM centered on a chromaticity (0.528, 0.439); the second chromaticity region is 6 SDCM centered on a chromaticity (0.366, 0.422); and the third chromaticity region is 6 SDCM centered on a chromaticity (0.212, 0.238). Again, such a lighting device can generate light with a CCT from 1800K to 6500K with a General Color Rendering Index, CRI Ra, of about 80 and have a chromaticity corresponding to, or close to, the black body locus or Standard Illuminant of the same CCT (typically Δuv is less than 0.003).

In a further embodiment, it may be that the first chromaticity region is defined by chromaticity coordinates (0.525, 0.405), (0.531, 0.383), (0.559, 0.407), and (0.553, 0.429); the second chromaticity region is defined by chromaticity coordinates (0.335, 0.445), (0.339, 0.415), (0.361, 0.436), and (0.357, 0.467); and the third chromaticity region is defined by chromaticity coordinates (0.200, 0.244), (0.205, 0.212), (0.225, 0.232), and (0.219, 0.265). Such a lighting device may include a narrowband red fluoride phosphor; for example, $K_2SiF_6:Mn^{4+}$, $K_2GeF_6:Mn^{4+}$, and/or $K_2TiF_6:Mn^{4+}$ and can generate light with a CCT from 1800K to 6500K with a General Color Rendering Index, CRI Ra, of about 90 and have a chromaticity corresponding to, or close to, the black body locus or Standard Illuminant of the same CCT (typically Δuv is less than 0.003). In terms of CCT, light of the first chromaticity may have a CCT from 1700K to 1970K and light of the second chromaticity may have a CCT from 4800K to 5460K.

It may be that the first chromaticity region is 6 SDCM centered on a chromaticity (0.5412, 0.406); the second chromaticity region is 6 SDCM centered on a chromaticity (0.348, 0.441); and the third chromaticity region is 6 SDCM centered on a chromaticity (0.212, 0.238). Again, such a lighting device can generate light with a CCT from 1800K to 6500K with a General Color Rendering Index, CRI Ra, of about 90 and have a chromaticity corresponding to, or close to, the black body locus or Standard Illuminant of the same CCT (typically Δuv is less than 0.003) and may include a narrowband red fluoride phosphor.

In a yet further embodiment, it may be that the first chromaticity region is defined by chromaticity coordinates (0.515, 0.399), (0.522, 0.378), (0.549, 0.404), and (0.542, 0.425); the second chromaticity region is defined by chromaticity coordinates (0.356, 0.497), (0.358, 0.465), (0.380, 0.483), and (0.378, 0.514); and the third chromaticity region is defined by chromaticity coordinates (0.217, 0.281), (0.220, 0.267), (0.228, 0.276), and (0.226, 0.290). Such a lighting device can generate light with a CCT from 1800K to 6500K with a General Color Rendering Index, CRI Ra, of about 97 and have a chromaticity corresponding to, or close to, the black body locus or Standard Illuminant of the same CCT (typically Δuv is less than 0.003). In terms of CCT, light of the first chromaticity may have a CCT from 1750K to 2020K and light of the second chromaticity may have a CCT from 4500K to 5050K.

It may be that the first chromaticity region is 6 SDCM centered on a chromaticity (0.532, 0.4012); the second chromaticity region is 6 SDCM centered on a chromaticity (0.368, 0.490); and the third chromaticity region is 6 SDCM centered on a chromaticity (0.223, 0.278). Again, such a lighting device can generate light with a CCT from 1800K to 6500K with a General Color Rendering Index, CRI Ra, of about 97 and have a chromaticity corresponding to, or close to, the black body locus or Standard Illuminant of the same CCT (typically Δuv is less than 0.003).

The lighting device, according to various embodiments, may comprise at least two first LEDs. It may be beneficial to utilize at least two first LEDs that generate light of the first chromaticity rather than using a single first LED to reduce a need to overdrive the first LED or underdrive the second and third LEDs; that is it can equalize the maximum drive current to the first, second, and third LEDs. This is because light of the first chromaticity corresponds to light with the lowest color temperature and, as a result, the luminous efficacy of the first LED(s) is lower than that of the second and third LEDs.

Lighting devices, according to various embodiments, may further comprise a fourth LED that generates light with a fourth chromaticity in a fourth chromaticity region.

The fourth chromaticity region may be between the first and second chromaticity regions. For example, the fourth chromaticity region may be defined by chromaticity coordinates (0.420, 0.468), (0.418, 0.383), (0.475, 0.430), and (0.479, 0.514). In terms of CCT, light of the fourth chromaticity may have a CCT from 2620K to 3750K.

Alternatively, the fourth chromaticity region may be between the second and third chromaticity regions. For example, the fourth chromaticity region may be defined by chromaticity coordinates (0.249, 0.362), (0.265, 0.283), (0.309, 0.335), and (0.295, 0.414). In terms of CCT, light of the fourth chromaticity may have a CCT from 6650K to 12500K.

Lighting devices according to various embodiments can generate light of a chromaticity that may be within 0.003 Δuv of the black body locus for CCTs from 1800K to 6500K.

The at least one of the first, second, or third LEDs may comprise a broadband LED chip that generates light with a dominant wavelength from 420 nm to 480 nm with a FWHM of at about 30 nm to about 80 nm. A broadband LED can be beneficial for generating light having a spectrum that resembles sunlight.

The light generated by the device may have a selected Color Temperature and an intensity versus wavelength spectrum, which over a wavelength range 460 nm to 650 nm, a maximum percentage deviation between the normalized intensity of light generated by the lighting device and the normalized intensity of light of the spectrum of a black body radiator or standard illuminant of the same Color Temperature is at least one of less than 30%, less than 20%, and/or less than 10%, said intensity versus wavelength spectra of the light and black body radiator being normalized to the same luminance. The characteristic of generating light with a spectrum that matches a black body radiator is desirable for circadian lighting in which color tuning is used to mimic the color temperature cycle of sunlight from sunrise to sunset to match the human circadian rhythm.

The at least one of the first, second, or third LEDs may comprise a narrowband red phosphor selected from the group consisting of: $K_2SiF_6:Mn^{4+}$, $K_2GeF_6:Mn^{4+}$, and $K_2TiF_6:Mn^{4+}$.

Lighting devices according to embodiments may further comprise a package comprising a lead frame; and a housing comprising a first recess having the first LED, a second recess having the second LED, and a third recess having the third LED; and wherein the lead frame may comprise a first (e.g., cathode) electrode common to each recess and a respective second (e.g., anode) electrode to each recess.

It may be that each recess comprises a first terminal connected to the first electrode and a second terminal connected to the second electrode and wherein the first and second terminals for each recess are located on opposing edges of the housing across from one another. For instance, it could be said that the first and second terminals for each recess are located on opposing edges of the housing and face one another (or positioned facing one another).

It may be that the first (e.g., cathode) terminals are common to a recess.

The lighting device may comprise respective first and second terminals on opposite edges of housing.

In another aspect, the present invention contemplates a lighting device comprising: a first LED for generating light of a first CCT from about 1700K to about 3500K; and a second LED for generating light of a second CCT from about 4000K to about 5600K; wherein the first LED comprises a narrowband red phosphor selected from the group consisting of: $K_2SiF_6:Mn^{4+}$, $K_2GeF_6:Mn^{4+}$, and $K_2TiF_6:Mn^{4+}$.

The lighting device may comprise a third LED for generating light with a chromaticity in a chromaticity region defined by chromaticity coordinates (0.196, 0.261), (0.206, 0.212), (0.234, 0.243), and (0.226, 0.290).

In another aspect, the present invention envisages a lighting device comprising: a first, second, and third LED for generating light with different CIE color points, wherein the device can generate white light of different CCTs from 1800K to 8000K by controlling the light output of the three LEDs, wherein the chromaticity of white light generated by the device is along the black body locus, and wherein at least one of the LEDs comprises a narrowband red phosphor selected from the group consisting of: $K_2SiF_6:Mn^{4+}$, $K_2GeF_6:Mn^{4+}$, and $K_2TiF_6:Mn^{4+}$.

The chromaticity of light generated by the device may be within 0.003 Δuv of the black body locus or Standard Illuminant for CCTs from 1800K to 6500K.

The lighting device, according to various embodiments, may comprise at least two first LEDs. It may be beneficial to utilize at least two first LEDs for generating light of the first chromaticity rather than using a single first LED to reduce a need to overdrive the first LED or underdrive the second and third LEDs; that is this can equalize the maximum drive current to the first, second, and third LEDs. This is because light of the first chromaticity corresponds to light with the lowest color temperature and as a result the luminous efficacy of the first LED(s) is lower than that of the second and third LEDs.

In another aspect, the present invention comprehends a lighting device comprising: a first LED for generating light of a first chromaticity in a first chromaticity region defined by chromaticity coordinates (0.498, 0.422), (0.522, 0.370), (0.562, 0.410), and (0.537, 0461); a second LED for generating light of a second chromaticity in a second chromaticity region defined by chromaticity coordinates (0.390, 0.488), (0.398, 0.403), (0.450, 0.450), and (0.442, 0.534); a third LED for generating light of a third chromaticity in a third chromaticity region defined by chromaticity coordinates (0.277, 0.418), (0.283, 0.333), (0.334, 0.380), and (0.327, 0.464); and a fourth LED for generating light of a fourth chromaticity in a fourth chromaticity region defined by chromaticity coordinates (0.196, 0.261), (0.206, 0.212), (0.234, 0.243), and (0.226, 0.290). Light generated by the device comprises a combination of light generated by the first, second, third, and fourth LEDs and wherein a chromaticity of light generated by the device is tunable by controlling power to the first, second, third, and fourth LEDs. In terms of CCT, light of the first chromaticity may have a CCT from 1700K to 1970K, light of the second chromaticity may have a CCT from 4800K to 5460K, and light of the third chromaticity may have a CCT from 4800K to 5460K.

It may be that the first chromaticity region is 6 SDCM centered on a chromaticity (0.530, 0.415); the second chromaticity region is 6 SDCM centered on a chromaticity (0.420, 0.470); the third chromaticity region is 6 SDCM centered on a chromaticity (0.305, 0.400); and the fourth chromaticity region is 6 SDCM centered on a chromaticity (0.216, 0.251).

In another aspect, the present invention encompasses a lighting device comprising: a circuit board and a plurality of lighting devices as defined herein.

The circuit board may comprise a flexible circuit board.

In another aspect, the present invention comprehends a lighting device comprising: at least two first LEDs for generating light of a first chromaticity; a second LED for generating light of a second chromaticity; and a third LED for generating light of a third chromaticity; wherein the first chromaticity has the lowest color temperature. Light generated by the device comprises a combination of light generated by the first, second, and third LEDs and wherein a chromaticity of light generated by the device is tunable by controlling power to the first, second and third LEDs. It may be beneficial to utilize at least two first LEDs for generating light of the lowest color temperature rather than using a single first LED to reduce a need to overdrive the first LED or underdrive the second and third LEDs; that is, it can equalize the maximum drive current to the first, second, and third LEDs. This is because light of the first chromaticity corresponds to light with the lowest color temperature and as a result the luminous efficacy of the first LED(s) is lower than that of the second and third LEDs.

It will be understood that any of the first, second, or third chromaticity described herein may be defined by any of the chromaticity regions defined herein.

In another aspect, the present invention contemplates an LED package comprising: a lead frame; and a housing comprising a first recess for receiving a first LED, a second recess for receiving a second LED, a third recess for receiving a third LED, and a fourth recess for receiving a fourth LED; wherein the lead frame comprises a respective first (e.g., cathode) electrode to each recess and a respective second (e.g., anode) electrode to each recess.

It may be that each recess comprises a first terminal connected to the first electrode and a second terminal connected to the second electrode and wherein the first and second terminals for each recess are located on opposing edges of the housing across from one another. For instance, it could be said that the first and second terminals for each recess are located on opposing edges of the housing and face one another (or positioned facing one another).

According to further aspect of the invention, there is contemplated a lighting device comprising: a first LED for generating light of a first chromaticity in a first chromaticity region defined by chromaticity coordinates (0.486, 0.410), (0.509, 0.340), (0.578, 0.405), and (0.537, 0.461); a second LED for generating light of a second chromaticity in a second chromaticity region defined by chromaticity coordinates (0.328, 0.495), (0.342, 0.390), (0.478, 0.444), and (0.464, 0.545); and a third LED for generating light of a third chromaticity in a third chromaticity region defined by chromaticity coordinates (0.195, 0.266), (0.205, 0.212), (0.286, 0.293), and (0.276, 0.328). It may be that the first chromaticity region is 6 SDCM centered on a chromaticity (0.525, 0.408); the second chromaticity region is 6 SDCM centered on a chromaticity (0.405, 0.469); and the third chromaticity region is 6 SDCM centered on a chromaticity (0.247, 0.282).

It may be that the second chromaticity region is defined by chromaticity coordinates (0.348, 0.478), (0.356, 0.396), (0.477, 0.444), and (0.467, 0.526).

In embodiments, the first chromaticity region may be defined by chromaticity coordinates (0.495, 0.384), (0.509, 0.340), (0.576, 0.402), and (0.557, 0.442); the second chromaticity region may be defined by chromaticity coordinates (0.427, 0.484), (0.433, 0.427), (0.474, 0.468), and (0.467, 0.526); and the third chromaticity region may be defined by chromaticity coordinates (0.207, 0.275), (0.210, 0.240), (0.284, 0.294), and (0.279, 0.326). It may be that the first chromaticity region is 6 SDCM centered on a chromaticity (0.536, 0.394); the second chromaticity region is 6 SDCM centered on a chromaticity (0.450, 0.476); and the third chromaticity region is 6 SDCM centered on a chromaticity (0.249, 0.286).

It may be that the first chromaticity region is defined by chromaticity coordinates (0.495, 0.384), (0.501, 0.363), (0.529, 0.388), and (0.522, 0.409); the second chromaticity region is defined by chromaticity coordinates (0.430, 0.457), (0.433, 0.426), (0.455, 0.449), and (0.452, 0.479); and the third chromaticity region is defined by chromaticity coordinates (0.270, 0.310), (0.274, 0.297), (0.281, 0.308), and (0.278, 0.321). It may be that the first chromaticity region is 6 SDCM centered on a chromaticity (0.511, 0.386); the second chromaticity region is 6 SDCM centered on a chromaticity (0.443, 0.453); and the third chromaticity region is 6 SDCM centered on a chromaticity (0.276, 0.309).

In an embodiment the first chromaticity region be defined by chromaticity coordinates (0.539, 0.396), (0.545, 0.374), (0.572, 0.399), and (0.567, 0.421); the second chromaticity region be defined by chromaticity coordinates (0.445, 0.503), (0.448, 0.473), (0.470, 0.496), and (0.467, 0.526); and the third chromaticity region is defined by chromaticity coordinates (0.207, 0.275), (0.210, 0.240), (0.230, 0.254), and (0.227, 0.289). It may be that the first chromaticity region is 6 SDCM centered on a chromaticity (0.556, 0.397); the second chromaticity region is 6 SDCM centered on a chromaticity (0.458, 0.499); and the third chromaticity region is 6 SDCM centered on a chromaticity (0.218, 0.264).

In various embodiments, the chromaticity of light generatable by the device may be within 0.004 Δuv or 0.003 Δuv of the black body locus for a CCT in a range from 1800K to 6500K.

In embodiments, at least one of the first, second, or third LEDs may comprise a LED chip for generating blue light with a FWHM of at about 30 nm to about 80 nm, for example a broadband LED chip.

In various embodiments, light generated light by the device can have a selected Color Temperature and an intensity versus wavelength spectrum, which over a wavelength range 440 nm to 650 nm, a maximum percentage deviation between the intensity of light generated by the lighting device and the intensity of light of the spectrum of a black body radiator or standard illuminant of the same Color Temperature is at least one of less than 30%, less than 20%, or less than 10%. The intensity versus wavelength spectra of the light and black body radiator may be normalized to the same relative luminance.

In embodiments, the lighting device is for generating light with a CCT that is tunable within a range from 1800K to 6500K and has a chromaticity that is within 3 SDCM of the black body locus.

In embodiments, at least one of the first, second, or third LEDs comprises a narrowband red phosphor selected from the group consisting of: $K_2SiF_6:Mn^{4+}$, $K_2GeF_6:Mn^{4+}$, and $K_2TiF_6:Mn^{4+}$.

The lighting device may further comprise a package comprising a lead frame; and a housing comprising a first recess having the first LED, a second recess having the second LED, and a third recess having the third LED; and wherein the lead frame comprises a first (e.g., cathode) electrode that is common to each recess and a respective second (e.g., anode) electrode to each recess.

Alternatively, the lighting device may further comprise a package comprising a lead frame; and a housing comprising a first recess having the first LED, a second recess having the second LED, and a third recess having the third LED; and wherein the lead frame comprises a respective first (e.g., cathode) electrode to each recess and a respective second (e.g., anode) electrode to each recess.

According to a further aspect, there is contemplated a lighting device comprises: a first LED, a second LED, and a third LED that for generating light with different CIE color points, and wherein at least one of the first, second, or third LEDs comprises a narrowband red phosphor selected from the group consisting of: $K_2SiF_6:Mn^{4+}$, $K_2GeF_6:Mn^{4+}$, and $K_2TiF_6:Mn^{4+}$.

According to another aspect, there is provided a lighting device comprising: a first LED for generating light of a first chromaticity in a first chromaticity region defined by chromaticity coordinates (0.495, 0.384), (0.501, 0.363), (0.529, 0.388), and (0.522, 0.409); a second LED for generating light of a second chromaticity in a second chromaticity region defined by chromaticity coordinates (0.430, 0.457), (0.433, 0.426), (0.455, 0.449), and (0.452, 0.479); and a third LED for generating light of a third chromaticity in a third chromaticity region defined by chromaticity coordinates (0.270, 0.310), (0.274, 0.297), (0.281, 0.308), and (0.278, 0.321); and wherein at least one of the first, second, or third LEDs comprises an LED chip for generating blue light having a FWHM of about 30 nm to about 80 nm.

Advantageously, the lighting device is for generating light of a CCT within a range 1800 k to 6500K and has an intensity versus wavelength spectrum that closely resembles sunlight/daylight. In embodiments the device is for generating light with an intensity versus wavelength spectrum, which over a wavelength range 440 nm to 650 nm, a maximum percentage deviation between the intensity of light generated by the lighting device and the intensity of light of the spectrum of a black body radiator or standard illuminant is at least one of less than 30%, less than 20%, or less than 10%. Preferably, the lighting device is for generating light with a CRI of at least 95.

The lighting device may be for generating light with a CCT that is tunable within a range of CCTs from 1800K to 6500K and has a chromaticity that is within 5 SDCM of the black body locus.

The lighting device of claim 15, wherein the device has a luminous efficacy of at least 95 lm/W.

According to further aspect, there is provided a lighting device comprising: a first LED for generating light of a first chromaticity in a first chromaticity region defined by chromaticity coordinates (0.539, 0.396), (0.545, 0.374), (0.572, 0.399), and (0.567, 0.421); a second LED for generating light of a second chromaticity in a second chromaticity region defined by chromaticity coordinates (0.445, 0.503), (0.448, 0.473), (0.470, 0.496), and (0.467, 0.526); and a third LED for generating light of a third chromaticity in a third chromaticity region defined by chromaticity coordinates (0.207, 0.275), (0.210, 0.240), (0.230, 0.254), and (0.227, 0.289); and wherein at least one of the first, second, or third LEDs comprises a narrowband red phosphor selected from the group consisting of: $K_2SiF_6:Mn^{4+}$, $K_2GeF_6:Mn^{4+}$, and $K_2TiF_6:Mn^{4+}$. Inclusion of $K_2SiF_6:Mn^{4+}$, $K_2GeF_6:Mn^{4+}$, and $K_2TiF_6:Mn^{4+}$ can increase luminous efficacy of the lighting device and the device may have a luminous efficacy of at least 135 lm/W.

The lighting device may be for generating light with a CCT that is tunable within a range of CCTs from 1800K to 6500K and has a chromaticity that is within 5 SDCM of the black body locus.

According to further aspects of the invention, there are contemplated lighting devices comprising four LEDs for generating light of four different chromaticity. In an embodiment, a lighting device comprises: a first LED for generating light of a first chromaticity in a first chromaticity region defined by chromaticity coordinates (0.498, 0.422), (0.522, 0.370), (0.562, 0.410), and (0.537, 0461); a second LED for generating light of a second chromaticity in a second chromaticity region defined by chromaticity coordinates (0.390, 0.488), (0.398, 0.403), (0.450, 0.450), and (0.442, 0.534); a third LED for generating light of a third chromaticity in a third chromaticity region defined by chromaticity coordinates (0.277, 0.418), (0.283, 0.333), (0.334, 0.380), and (0.327, 0.464); and a fourth LED for generating light of a fourth chromaticity in a fourth chromaticity region defined by chromaticity coordinates (0.196, 0.261), (0.206, 0.212), (0.234, 0.243), and (0.226, 0.290).

It may be that the first chromaticity region is 6 SDCM centered on a chromaticity (0.530, 0.415); the second chromaticity region is 6 SDCM centered on a chromaticity (0.420, 0.470); the third chromaticity region is 6 SDCM centered on a chromaticity (0.305, 0.400); and the fourth chromaticity region is 6 SDCM centered on a chromaticity (0.216, 0.251).

BRIEF DESCRIPTION OF THE DRAWINGS

These and other aspects and features of the present invention will become apparent to those ordinarily skilled in the art upon review of the following description of specific embodiments of the invention in conjunction with the accompanying figures, in which:

FIGS. 1A and 1B are schematic representations of a known color-tunable multi-LED package in which FIG. 1A shows a top view and FIG. 1B shows a sectional side view through A-A;

FIGS. 2A-2D are schematic representations of a multi-LED (Four-LED) package in accordance with an embodiment of the invention comprising a common cathode arrangement in which FIG. 2A shows a top view, FIG. 2B shows a sectional side view through B-B, FIG. 2C shows a sectional side view through C-C, and FIG. 2D is top view of the lead frame of the multi-LED package;

FIGS. 3A-3D are schematic representations of a multi-LED (Four-LED) package in accordance with a further embodiment of the invention in which FIG. 3A shows a top view, FIG. 3B shows a sectional side view through D-D, FIG. 3C shows a sectional side view through E-E, and FIG. 3D is top view of the lead frame of the multi-LED package;

FIGS. 3E and 3F are schematic representations of a multi-LED (Four-LED) package in accordance with another embodiment of the invention in which FIG. 3E shows a top view, and FIG. 3F is top view of the lead frame of the multi-LED package;

FIG. 7A-7D are measured characteristics for color-temperature-tunable lighting device (Dev.2) comprising LEDs of three chromaticity/color temperatures: C1, C2, C3 in which: FIG. 7A is a CIE 1931 chromaticity diagram illustrating the chromaticity (center point—solid square) of light C3, 1 SDCM, 2 SDCM, 3 SDCM and 6 SDCM (Standard Deviation Color Matching—Mac Adam ellipses—dotted and dashed lines) and CIE region (solid line—square) for light C3, FIG. 7B shows spectra, normalized intensity (a.u.) versus wavelength (nm), for light C1 (dotted line), light C2 (solid line), and light C3 (dashed line), FIG. 7C is a CIE 1931 chromaticity diagram illustrating the chromaticity (center point—cross) of light C1, C2, C3, the CIE region for light C1 (solid line/diamond), C2 (solid line/triangle), C3 (solid line/square), gamut of light (solid line) that lighting device Dev.2 can generate, and black body locus (dotted line), and FIG. 7D is a CIE 1931 chromaticity diagram illustrating the chromaticity (color) of light (solid square) generated by lighting device Dev.2 for nominal CCTs of 2700K, 3000K, 3500K, 4000K, 4500K, 5000K, 5700K, and 6500K, light emission locus (solid line) for CCTs from 2700K to 6500K, black body locus (dotted line), and 3 SDCM and 6 SDCM (Standard Deviation Color Matching—Mac Adam ellipses—thin solid line);

FIG. 8A-8C are measured characteristics for a color-temperature-tunable lighting device (Dev.3) in which FIG. 8A shows spectra, normalized intensity (a.u.) versus wavelength (nm), for light C1 (dotted line), light C2 (solid line), and light C3 (dashed line), FIG. 8B is a CIE 1931 chromaticity diagram illustrating the chromaticity (center point—cross) of light C1, C2, C3, the CIE region for light C1 (solid line/diamond), C2 (solid line/triangle), C3 (solid line/square), gamut of light (solid line) that the lighting device (Dev.3) can generate, and black body locus (dotted line), and FIG. 8C is a CIE 1931 chromaticity diagram illustrating the chromaticity (color) of light (sold square) generated by lighting device Dev.3 for nominal CCTs of 2700K, 3000K, 3500K, 4000K, 4500K, 5000K, 5700K, and 6500K, light emission locus (solid line) for CCTs from 2700K to 6500K, black body locus (dotted line), and 3 SDCM and 6 SDCM (Mac Adam ellipses—thin solid line);

FIG. 9A-9C are measured characteristics for a color-temperature-tunable lighting device (Dev.4) comprising LEDs of three chromaticity/color temperatures C1, C2, C3 in which FIG. 9A shows spectra, normalized intensity (a.u.) versus wavelength (nm), for light C1 (dotted line), light C2 (solid line), and light C3 (dashed line), FIG. 9B is a CIE 1931 chromaticity diagram illustrating the chromaticity (center point—cross) of light C1, C2, C3, the CIE region for light C1 (solid line/diamond), C2 (solid line/triangle), C3 (solid line/square), gamut of light (solid line) that lighting device Dev.4 can generate, and black body locus (dotted line), and FIG. 9C is a CIE 1931 chromaticity diagram illustrating the chromaticity (color) of light (solid square) generated by lighting device Dev.4 for nominal CCTs of 2700K, 3000K, 3500K, 4000K, 5000K, 5700K, and 6500K, light emission locus (solid line) for CCTs from 2700K to 6500K, black body locus (dotted line), and 3 SDCM and 6 SDCM (Mac Adam ellipses—thin solid line);

FIG. 10A-10C are measured characteristics for a color-temperature-tunable lighting device (Dev.5) comprising LEDs of three chromaticity/color temperatures C1, C2, C3 in which FIG. 10A shows spectra, normalized intensity (a.u.) versus wavelength (nm), for light C1 (dotted line), light C2 (solid line), and light C3 (dashed line), FIG. 10B is a CIE 1931 chromaticity diagram illustrating the chromaticity (center point—cross) of light C1, C2, C3, the CIE region for light C1 (solid line/diamond), C2 (solid line/triangle), C3 (solid line/square), gamut of light (solid line) that lighting device Dev.5 can generate, and black body locus (dotted line), and FIG. 10C is a CIE 1931 chromaticity diagram illustrating the chromaticity (color) of light (solid square) generated by lighting device Dev.5 for nominal CCTs of 2700K, 3000K, 3500K, 4000K, 4500K, 5000K, 5700K, and 6500K, light emission locus (solid line) for CCTs from 2700K to 6500K, black body locus (dotted line), and 3 SDCM and 6 SDCM (Mac Adam ellipses—thin solid line);

FIGS. 10D-10I are measured emission spectra (solid line), normalized intensity versus wavelength (nm), for lighting device Dev.5 in which: FIG. 10D is the emission spectrum for operation for a nominal CCT of 2700K, FIG. 10E is the emission spectrum for operation for a nominal CCT of 3000K, FIG. 10F is the emission spectrum for operation for a nominal CCT of 3500K, FIG. 10G is the emission spectrum for operation for a nominal CCT of 4000K, FIG. 10H is the emission spectrum for operation for a nominal CCT of 5700K, and FIG. 10I is the emission spectrum for operation for a nominal CCT of 6500K;

FIG. 14A-14C are measured characteristics for a color-temperature-tunable lighting device (Dev.6) comprising LEDs of three chromaticity/color temperatures C1, C2, C3 in which FIG. 14A shows spectra, normalized intensity (a.u.) versus wavelength (nm), for light C1 (dotted line), light C2 (solid line), and light C3 (dashed line), FIG. 14B is a CIE 1931 chromaticity diagram illustrating the chromaticity (CIE center point—cross) of light C1, C2, C3, the CIE region for light C1 (solid line/diamond), C2 (solid line/triangle), C3 (solid line/square), gamut of light (solid line) that lighting device Dev.6 can generate, and black body locus (dotted line), and FIG. 14C is a CIE 1931 chromaticity diagram illustrating the chromaticity (color) of light (sold square) generated by lighting device Dev.6 for nominal CCTs of 2700K, 3000K, 3500K, 4000K, 5000K, 5700K, and 6500K, light emission locus (solid line) for CCTs from 2700K to 6500K, black body locus (dashed line), and 3 SDCM and 6 SDCM (Mac Adam ellipses—thin solid line);

FIGS. 14D-14J are measured emission spectra (solid line), normalized intensity versus wavelength (nm), for lighting device Dev.6 in which: FIG. 14D is the emission spectrum for operation for a nominal CCT of 2700K, FIG. 14E is the emission spectrum for operation for a nominal CCT of 3000K, FIG. 14F is the emission spectrum for operation for a nominal CCT of 3500K, FIG. 14G is the emission spectrum for operation for a nominal CCT of 4000K, FIG. 10H is the emission spectrum for operation for a nominal CCT of 5000K, FIG. 14I is the emission spectrum for operation for a nominal CCT of 5700K, and FIG. 14J is the emission spectrum for operation for a nominal CCT of 6500K;

FIG. 15A-15C are measured characteristics for a color-temperature-tunable lighting device (Dev.7) comprising LEDs of three chromaticity/color temperatures C1, C2, C3 in which FIG. 15A shows spectra, normalized intensity (a.u.) versus wavelength (nm), for light C1 (dotted line), light C2 (solid line), and light C3 (dashed line), FIG. 15B is a CIE 1931 chromaticity diagram illustrating the chromaticity (CIE center point—cross) of light C1, C2, C3, the CIE region for light C1 (solid line/diamond), C2 (solid line/triangle), C3 (solid line/square), gamut of light (solid line) that lighting device Dev.7 can generate, and black body locus (dotted line), and FIG. 15C is a CIE 1931 chromaticity diagram illustrating the chromaticity (color) of light (solid square) generated by lighting device Dev.7 for nominal CCTs of 2700K, 3000K, 3500K, 4000K, 5000K, 5700K, and 6500K, light emission locus (solid line) for CCTs from 2700K to 6500K, black body locus (dotted line), and 3 SDCM and 6 SDCM (Mac Adam ellipses—thin solid line);

DETAILED DESCRIPTION OF THE INVENTION

Figure 1A:
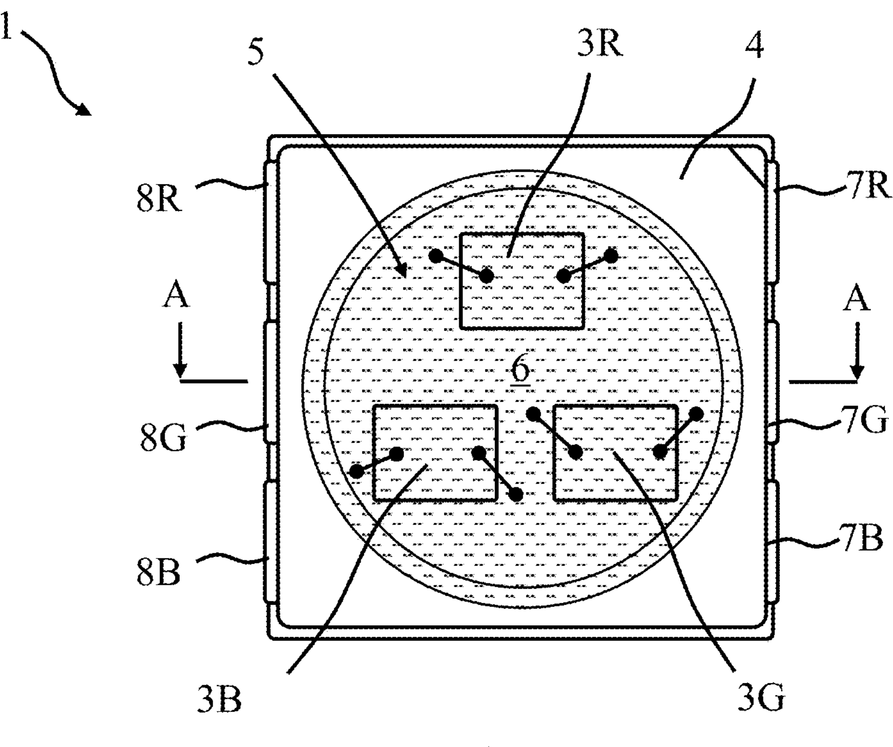
Figure 1B:
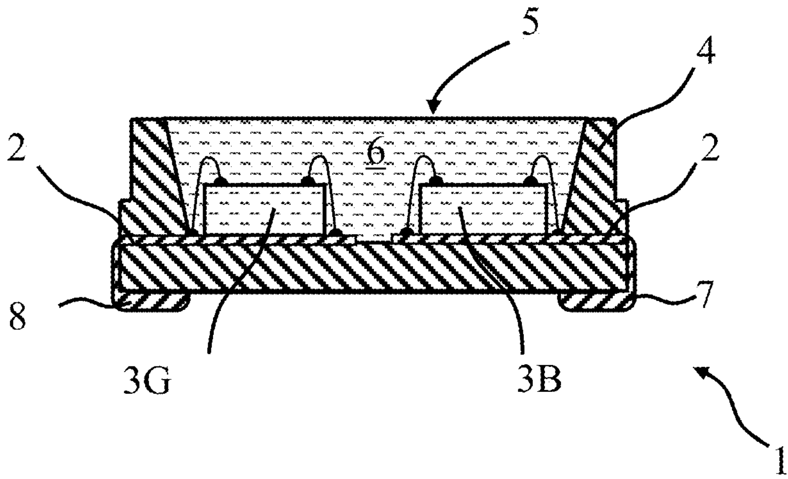

Embodiments of the invention relate to color-tunable lighting devices that can generate light of a color temperature that is tunable from 1800K to 6500K.

Aspects of the invention relate to color-temperature-tunable lighting devices comprising a single package comprising a plurality of LEDs that generate light of two, three, or four different chromaticity/CCTs. To improve the luminous efficacy of the lighting device, at least one of the plurality of LEDs, for example, the LED that generates light with the lowest color temperature, may comprise a narrowband red phosphor such as a narrowband red fluoride phosphor; for example, $K_2SiF_6:Mn^{4+}$, $K_2GeF_6:Mn^{4+}$, and/or $K_2TiF_6:Mn^{4+}$.

Throughout this specification like reference numerals are used to denote like parts preceded by the figure number #. For example, an LED chip #20 is denoted 220 in FIG. 2 and is denoted 320 in FIG. 3 and so forth.

Multi-LED Package

Figure 2A:
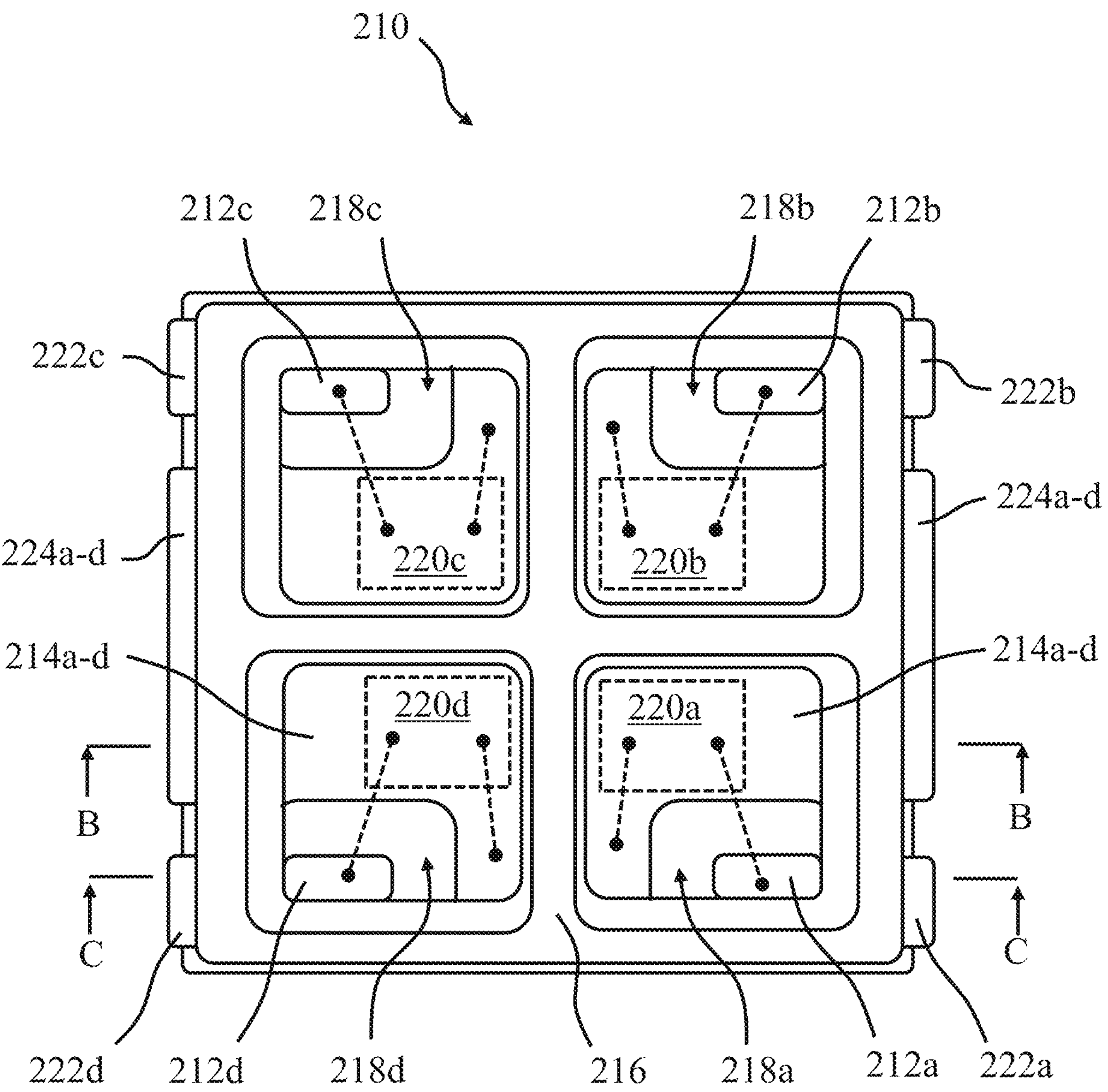
Figure 2B:
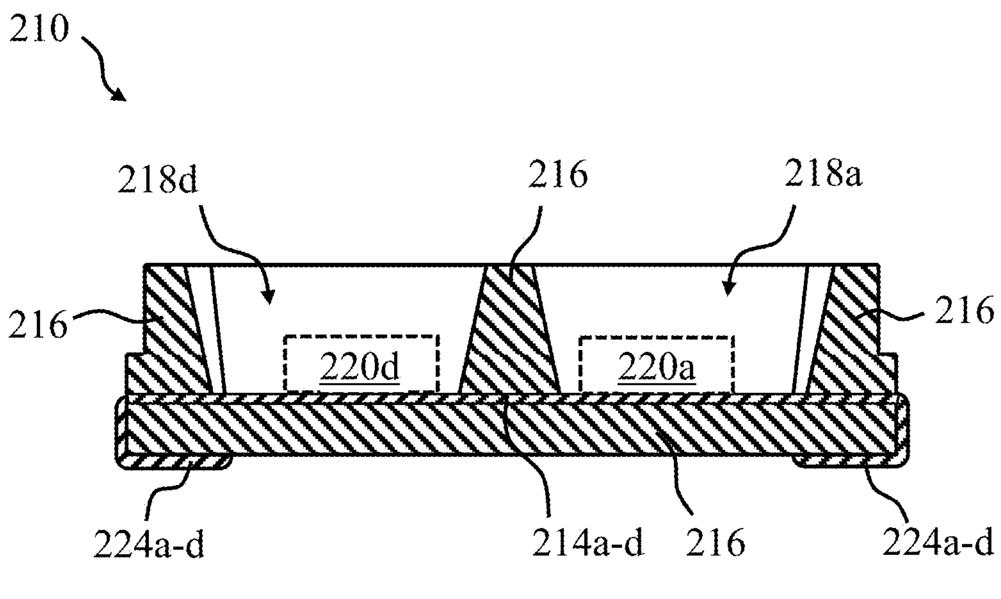
Figure 2C:
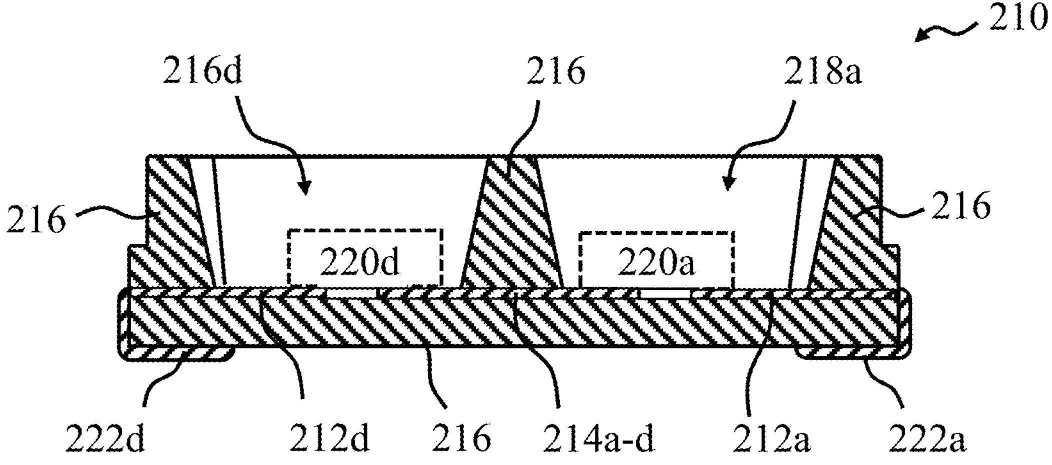
Figure 2D:
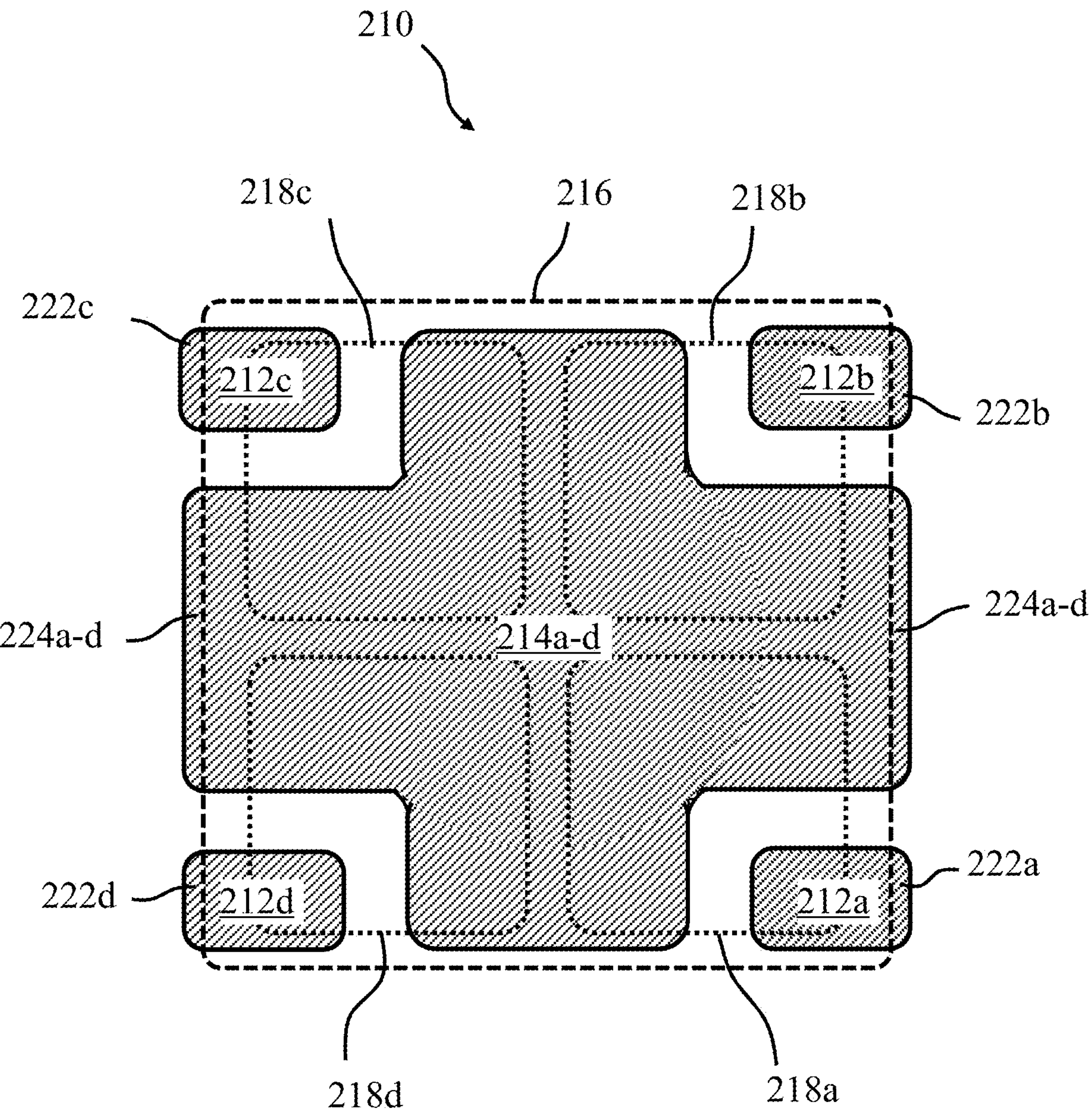

FIGS. 2A-2D are schematic representation of a multi-LED, four-LED, package in accordance with an embodiment of the invention comprising a common cathode terminal arrangement in which FIG. 2A shows a top view, FIG. 2B shows a sectional side view through B-B, FIG. 2C shows a sectional side view through C-C, and FIG. 2D is a top view of the lead frame of the multi-LED package.

As shown in FIGS. 2A-2D, the multi-LED package 210 comprises a lead frame 212*a*-212*d*, 214*a*-*d* and a housing 216 molded onto the lead frame. The housing 216 comprises a first cavity (cup) 218*a* for receiving a respective first LED chip 220*a*, a second cavity (cup) 218*b* for receiving a respective second LED chip 220*b*, a third cavity (cup) 218*c* for receiving a respective third LED chip 220*c*, and a fourth cavity 218*d* for receiving a respective fourth LED chip 220*d*. The LED chips 220*a*-220*d* are indicated in FIG. 2A to 2C by a dashed rectangle and bond wires connecting the LED chips to the lead frame are indicated by dashed lines.

Referring to FIG. 2D, the various regions of the lead frame 212*a*-212*d*, 214*a*-*d* are indicated by cross-hatching and the relative position of the housing 216 and the cavities 218*a*-218*d* are respectively indicated by dashed and dotted lines. The lead frame comprises a central cross-shaped cathode region 214*a*-*d* and four rectangular anode regions 212*a*-212*d* located at the empty corners of the cross-shaped region 214*a*-*d*. As can be seen from FIG. 2D, each cavity 218*a*-218*d* comprises on its floor, a respective L-shaped region of the cross-shaped cathode region 214*a*-*d* which constitutes a common cathode connection to each cavity. The L-shaped cathode region on the floor of each cavity, in addition to providing a common (shared) cathode connection, provides a thermally conductive mounting pad for the LED chip, thereby improving thermal dissipation from the LED chips. As can be seen from FIG. 2D, each cavity 218*a*-218*d* comprises on its floor, a respective rectangular anode region 212*a*-212*d* which constitutes an anode connection to the cavity. As illustrated in FIGS. 2A-2D, each respective anode region of the lead frame 212*a*-212*d* extends beyond an outer edge of the housing 216 and provides a respective anode electrical terminal 222*a*-222*d* for each cavity 218*a*-218*d*. Similarly, the cathode region of the lead frame 214*a-d* extends beyond opposing edges of the housing and provides a common cathode electrical terminal 224*a-d* on opposite edges of the housing.

As described herein, in embodiments, the multi-LED (e.g., four-LED) package may comprise a single cathode electrical terminal 224*a-d* that is common to each LED chip and a respective anode electrical terminal 222*a*-222*d* for each LED chip. In other embodiments of the invention, the multi-LED package may comprise a respective pair of anode and cathode electrical terminals for each LED. Such an arrangement can be beneficial when using multiple multi-LED packages as it allows the LED chips to be connected in series.

Figure 3A:
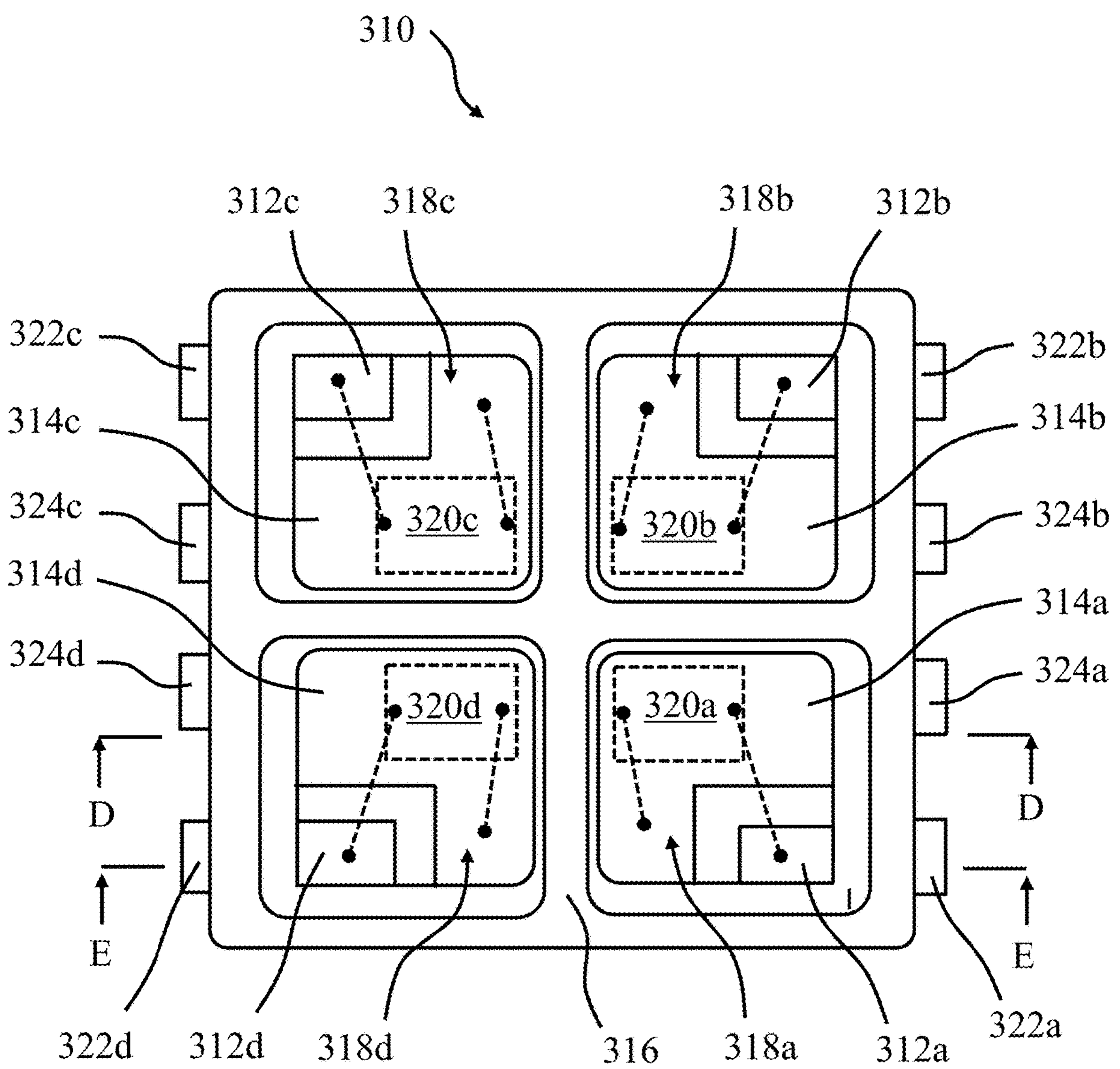
Figure 3B:
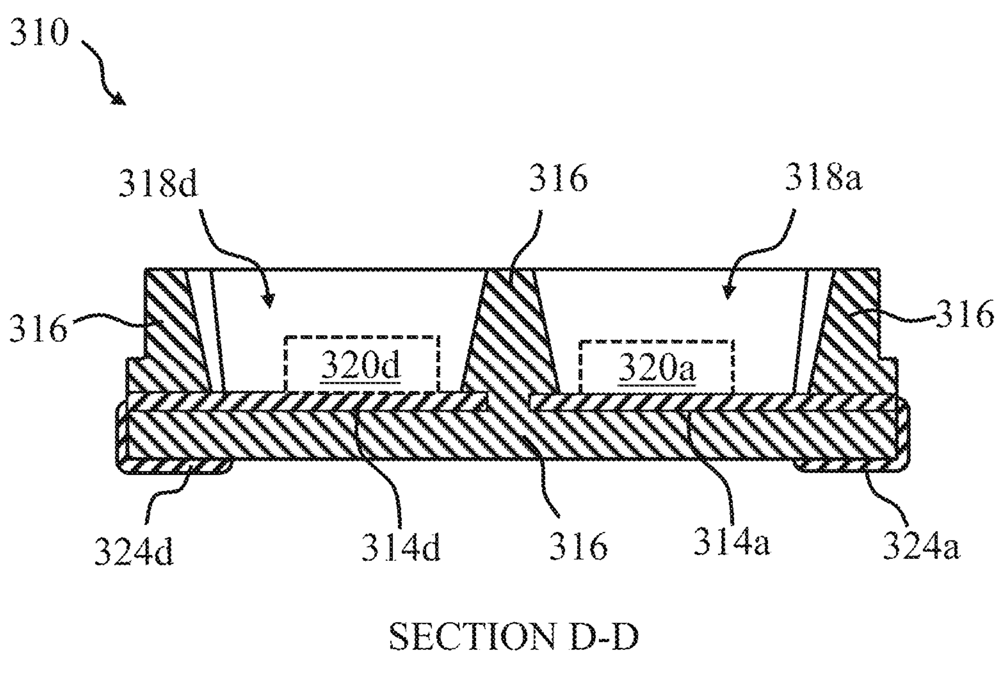
Figure 3C:
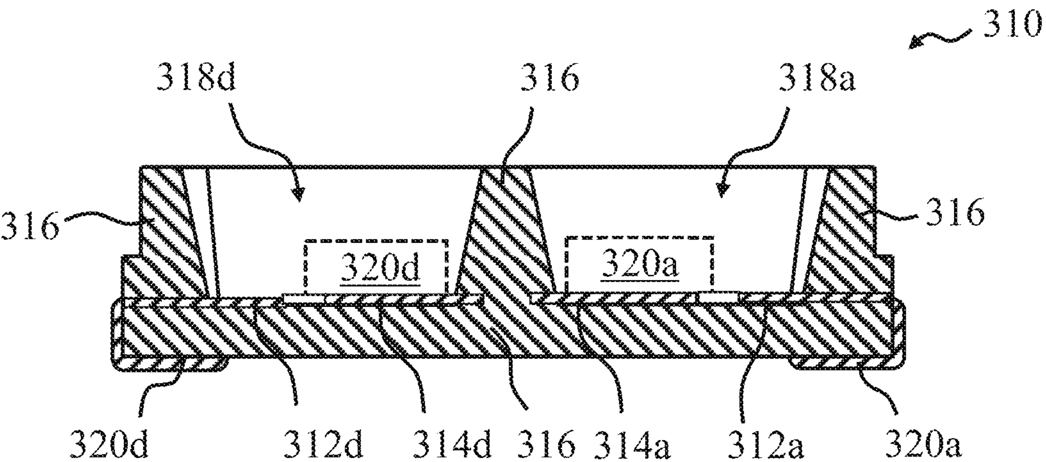
Figure 3D:
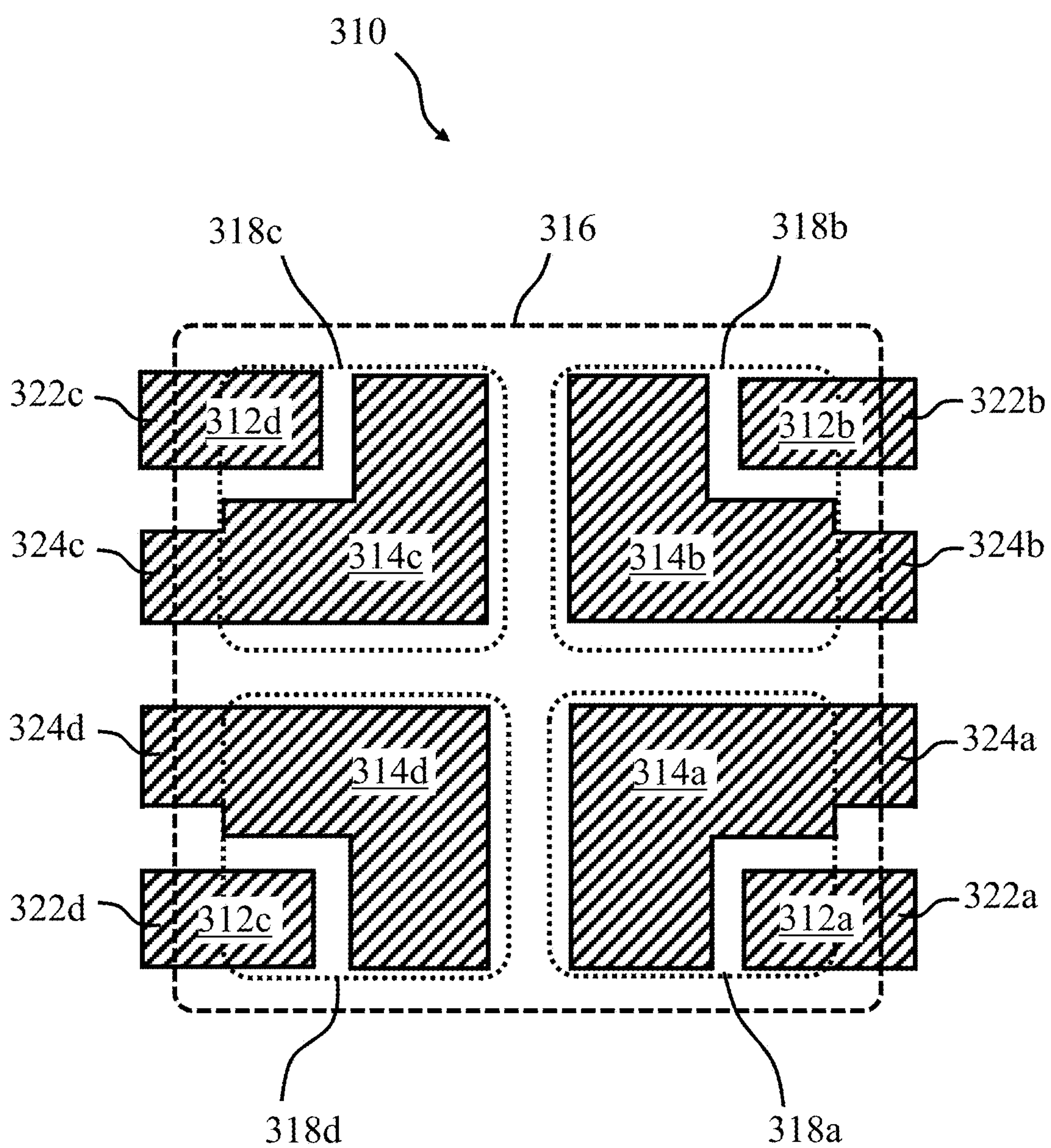

FIGS. 3A-3D are schematic representations of a multi-LED, four-LED, package in accordance with an embodiment of the invention comprising a respective pair of anode and cathode electrical terminals for each LED in which FIG. 3A shows a top view, FIG. 3B shows a sectional side view through D-D, FIG. 3C shows a sectional side view through E-E, and FIG. 3D is a plan view of the lead frame of the multi-LED package.

As shown in FIGS. 3A-3D, the multi-LED package 310 comprises a lead frame 312*a*-312*d*, 314*a*-314*d* and a housing 316 molded onto the lead frame. The housing 316 comprises a first cavity 318*a* for receiving a respective first LED chip 320*a*, a second cavity 318*b* for receiving a respective second LED chip 320*b*, a third cavity 318*c* for receiving a respective third LED chip 320*c*, and a fourth cavity 318*d* for receiving a respective fourth LED chip 320*d*. The LED chips 320*a*-320*d* are indicated in FIG. 3A to 3C by a dashed rectangle and bond wires connecting the LED chips to the lead frame are indicated by dashed lines.

Referring to FIG. 3D, the various regions of the lead frame 312*a*-312*d*, 314*a*-314*d* are indicated by cross-hatching and the relative position of the housing 316 and the cavities 318*a*-318*d* are respectively indicated by dashed and dotted lines. The lead frame comprises four L-shaped cathode region 314*a*-314*d* arranged as a cross and four rectangular anode regions 312*a*-312*d* with a respective anode region located at the empty corners of a respective L-shaped region. As can be seen from FIG. 3D, each cavity 318*a*-318*d* comprises on its floor, a respective L-shaped cathode region 314*a*-314*d* and a respective rectangular shaped anode region 312*a*-312*d*. The L-shaped cathode region on the floor of each cavity, in addition to providing a cathode connection, provides a thermally conductive mounting pad for the LED chip, thereby improving thermal dissipation from the LED chips. As can be seen from FIG. 3D, each cavity 318*a*-318*d* comprises on its floor, a respective rectangular anode region 312*a*-312*d* which constitutes an anode connection to the cavity. As illustrated in FIGS. 3A-3D, each anode region of the lead frame 312*a*-312*d* extends beyond an outer edge of the housing 316 and provides a respective anode electrical terminal 322*a*-322*d* for each cavity 318*a*-318*d*. Similarly, each cathode region of the lead frame 314*a*-314*d* extends beyond the outer edge of the housing and provides a respective cathode electrical terminal 324*a*-324*d* on the same edge of the housing as the anode electrical terminal.

Figure 3E:
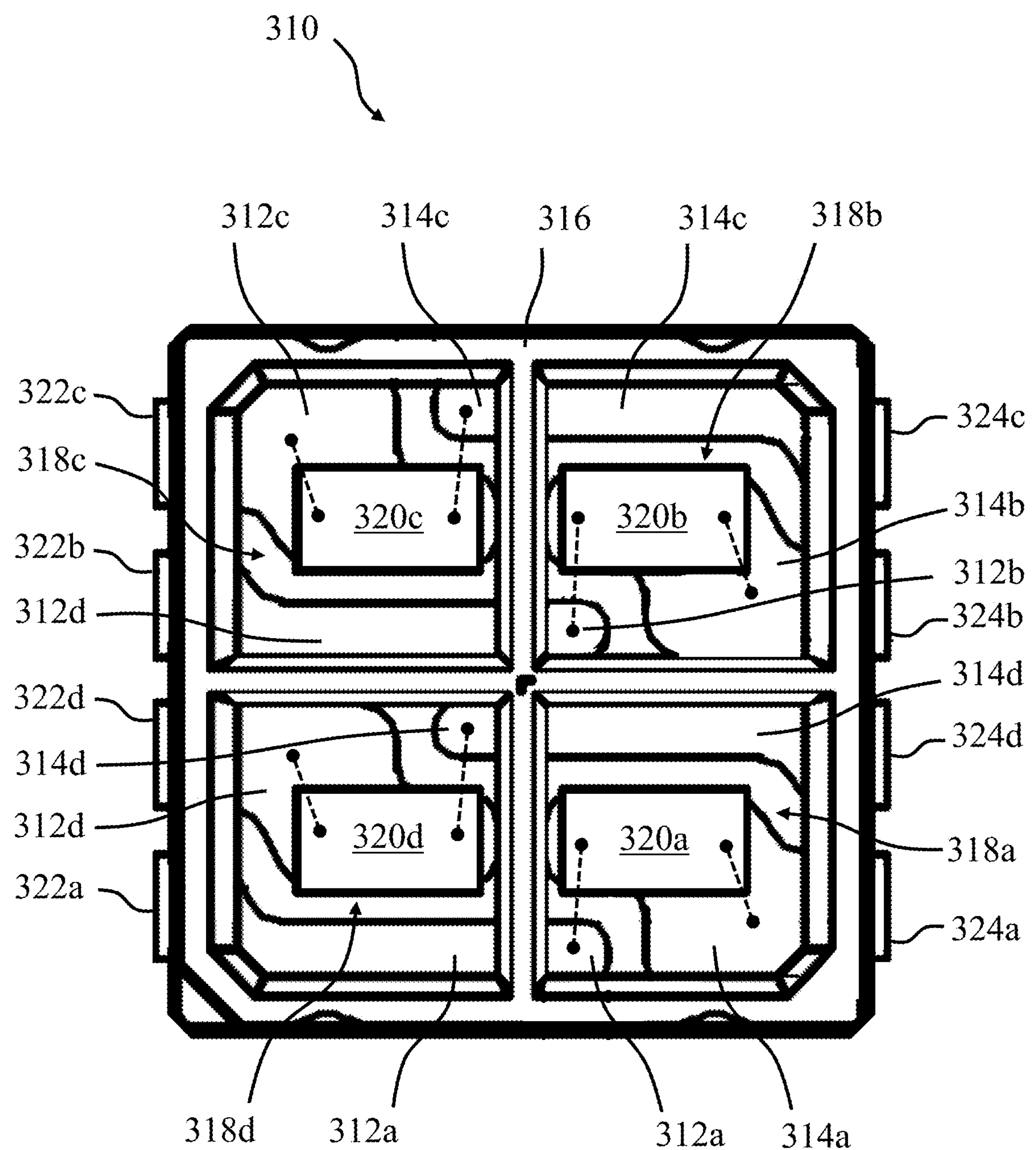
Figure 3F:
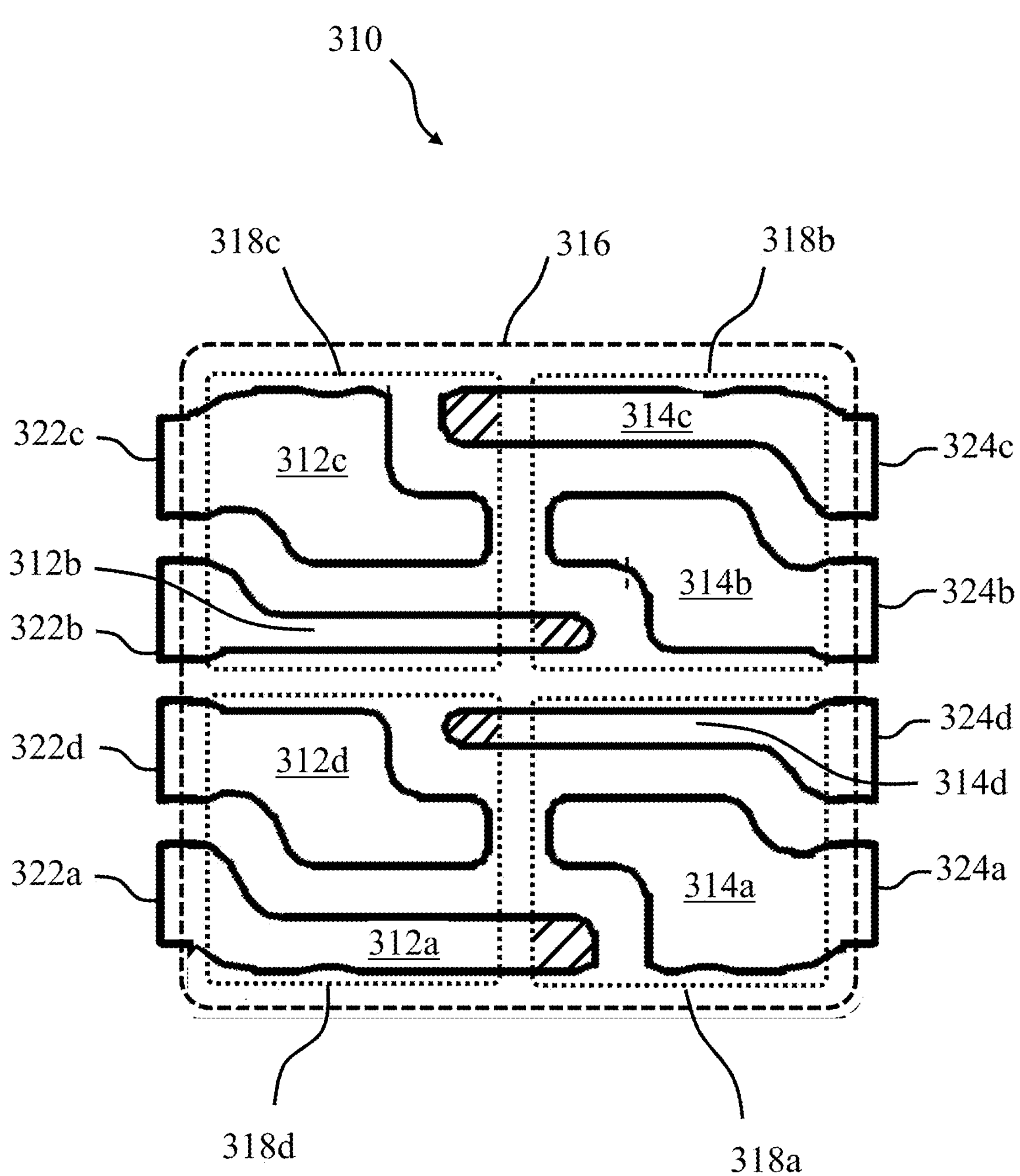

FIGS. 3E and 3F are schematic representations of a multi-LED (Four-LED) package in accordance with another embodiment of the invention in which FIG. 3E shows a top view, and FIG. 3F is top view of the lead frame of the multi-LED package 310. This embodiment is similar to the multi-LED package of FIGS. 3A-3D, except that the lead frame regions 312*a*-312*d* and 314*a*-314*d* are configured such that each anode terminal 322*a*-322*d* is aligned with and located on an opposing edge of the housing to its respective cathode terminal 324*a*-324*d*. Such a packaging arrangement can be advantageous in linear lighting arrangements utilizing a plurality of multi-LED packages in which it is preferred to serially connect LEDs of each cavity.

As shown in FIGS. 3E and 3F the multi-LED package 310 comprises a lead frame 312*a*-312*d*, 314*a*-314*d* and a housing 316 molded onto the lead frame. The housing 316 comprises a first cavity 318*a* for receiving a respective first LED chip 320*a*, a second cavity 318*b* for receiving a respective second LED chip 320*b*, a third cavity 318*c* for receiving a respective third LED chip 320*c*, and a fourth cavity 318*d* for receiving a respective fourth LED chip 320*d*. Bond wires connecting the LED chips 320*a*-320*d* to the lead frame are indicated by dashed lines.

Referring to FIG. 3F, the various regions of the lead frame 312*a*-312*d*, 314*a*-314*d* are shown and the relative position of the housing 316 and the cavities 318*a*-318*d* are respectively indicated by dashed and dotted lines. The lead frame comprises four cathode regions 314*a*-314*d* and four anode regions 312*a*-312*d*. For the first and second cavities 318*a* and 318*b*, the cathode regions 314*a* and 314*b* are zigzag shaped and the anode regions 312*a* and 312*b* are elongate in form. The first and second cavities 318*a* and 318*b* comprise on their floor, a respective zigzag shaped cathode region 314*a* and 314*b* and a respective square shaped portion (indicated by cross hatching) of the elongate anode region 312*a* and 312*b*. In this embodiment, the elongate anode region 312*a* extends from the first cavity 318*a* though the fourth cavity 318*d* to the edge of the package. Similarly, the elongate anode region 312*b* extends from the second cavity 318*b* through the third cavity 318*c* to the edge of the package. In this way, an anode region (for instance, elongate) extends from one cavity to an adjacent cavity. It may be that an anode region is able to extend between at least two, three or more cavities. For the third and fourth cavities 318*c* and 318*d*, the cathode regions 314*c* and 314*d* are elongate in form and the anode regions 312*c* and 312*d* are zigzag shaped. The third and fourth cavities 318*c* and 318*d* comprise on their floor, a respective square shaped cathode portion (indicated by cross hatching) of the elongate cathode region 314*c* and 314*d*. In this embodiment, the elongate cathode region 314*c* extends from the third cavity 318*c* through the second cavity 318*b* to the edge of the package. Similarly, in this embodiment, the elongate cathode region 314*d* extends from the fourth cavity 318*d* through the first cavity 318*a* to the edge of the package. In this way, a cathode region (for instance, elongate) is able to extend from one cavity to an adjacent cavity. The zigzag shaped region on the floor of each cavity, in addition to providing an electrical connection, provides a thermally conductive mounting pad for the LED chip, thereby improving thermal dissipation from the LED chips. As illustrated in FIGS. 3E and 3F, each anode region of the lead frame extends beyond an outer edge of the housing 316 and provides a respective anode electrical terminal 322*a*-322*d* for each cavity 318*a*-318*d*. Similarly, each cathode region of the lead frame extends beyond the outer edge of the housing and provides a respective cathode electrical terminal 324_a_-324_d_ on the opposite edge of the housing to that of the anode electrical terminal. In at least this embodiment, for example, the anode and cathode terminals are aligned (or in the same linear path, for instance).

Color-Temperature-Tunable Lighting Devices

Figure 4A:
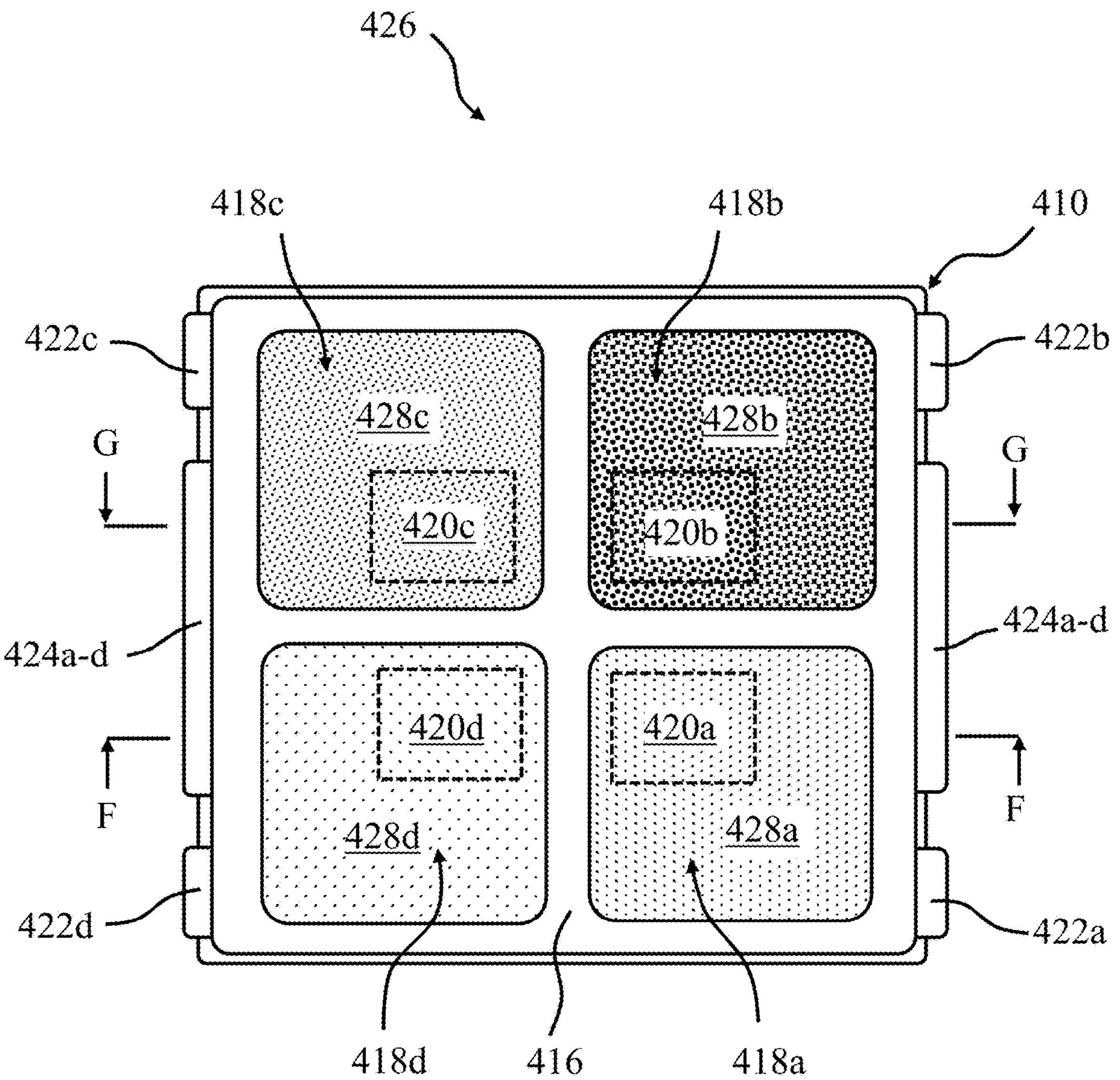
FIGS. 4A-4C show a schematic top view, a sectional side view through F-F, and a sectional side view through G-G of a color-temperature-tunable lighting device in accordance with an embodiment of the invention, respectively.
Figure 4B:
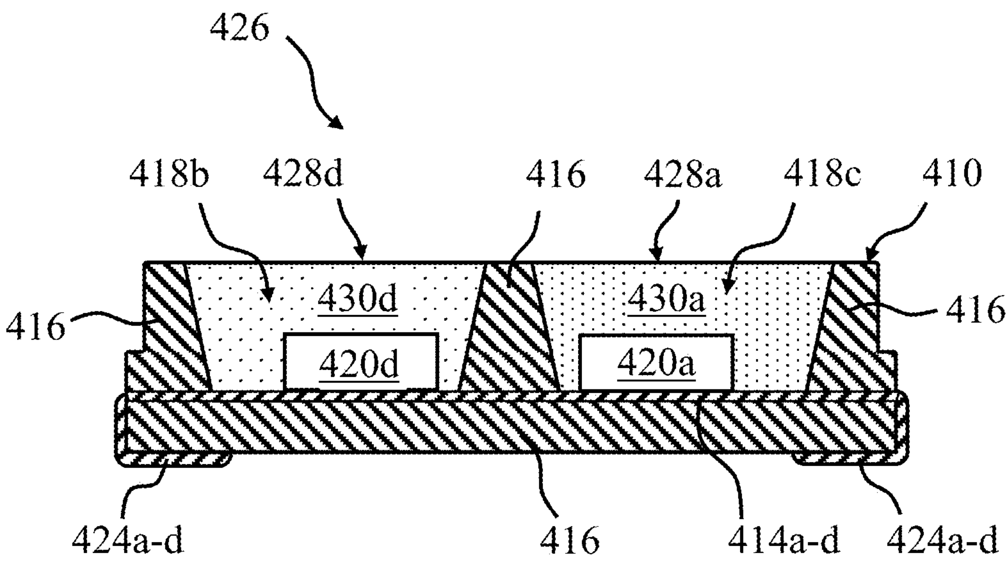
Figure 4C:
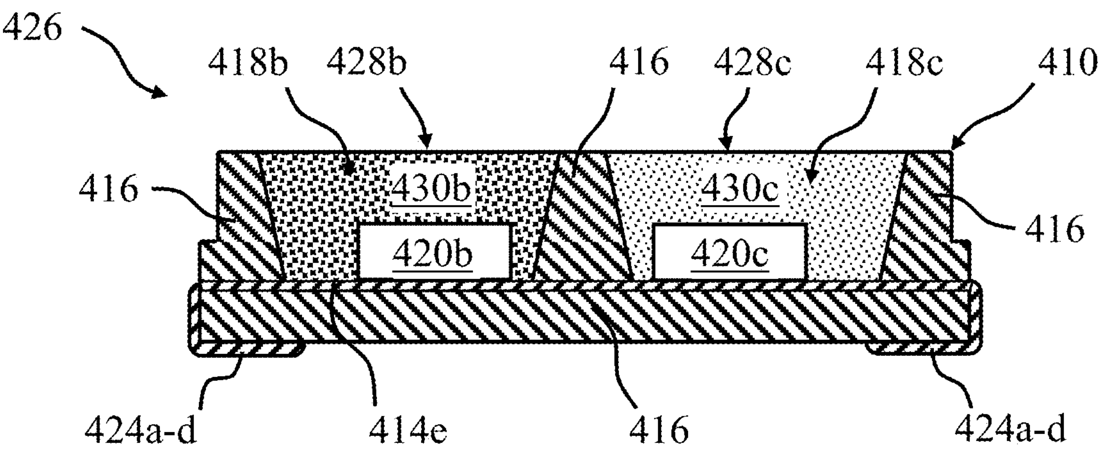

FIGS. 4A-4C show a schematic top view, a sectional side view through F-F, and a sectional side view through G-G of a color-temperature-tunable lighting device 426 that utilizes the multi-LED package 210 of FIGS. 2A-2D and comprises four LEDs 428_a_-428_d_.

The lighting device 426 comprises a package 410 comprising a lead frame and a housing 416 molded onto the lead frame. The housing 416 comprises a first cavity 418_a_, a second cavity 418_b_, a third cavity 418_c_, and a fourth cavity 418_d_ that respectively contain a first LED 428_a_, a second LED 428_b_, a third LED 428_c_, and a fourth LED 428_d_. As illustrated, the first, second, third and fourth LEDs 428_a_-428_d_ may comprise packaged devices in which each of the first, second, third, and fourth cavities 418_a_-418_d_ contain a respective violet to blue LED chip 420_a_-420_d_ and is filled with a phosphor photoluminescence layer 430_a_-430_d_ that covers the violet to blue LED chip 420_a_-420_d_. The chromaticity (color)/CCT (Correlated Color Temperature) of light generated by each LED 428_a_-428_d_ is dependent on the phosphors within the photoluminescence layer 430_a_-430_d_. For example, when an LED is to generate Cool White (CW) light with a CCT from, for example, about 4100K to 8000K the phosphor photoluminescence layer may comprise green to yellow phosphor. When an LED is to generate Warm White (WW) light with a CCT from, for example, about 1800K to 4000K the phosphor photoluminescence layer may comprise green to red phosphors and a narrowband red phosphor such as $K_2SiF_6:Mn^{4+}$, $K_2GeF_6:Mn^{4+}$, and $K_2TiF_6:Mn^{4+}$. As illustrated, the package 410 comprises common cathode terminals 424_a-d_ and respective anode terminals 422_a_-422_d_ for each cavity 418_a_-418_d_ allowing electrical power to be independently applied to each of the LED chip 418_a_-418_d_.

The LEDs 430_a_-430_d_ may be configured generate light of two, three or four different chromaticity (colors)/color temperatures.

Figure 4D:
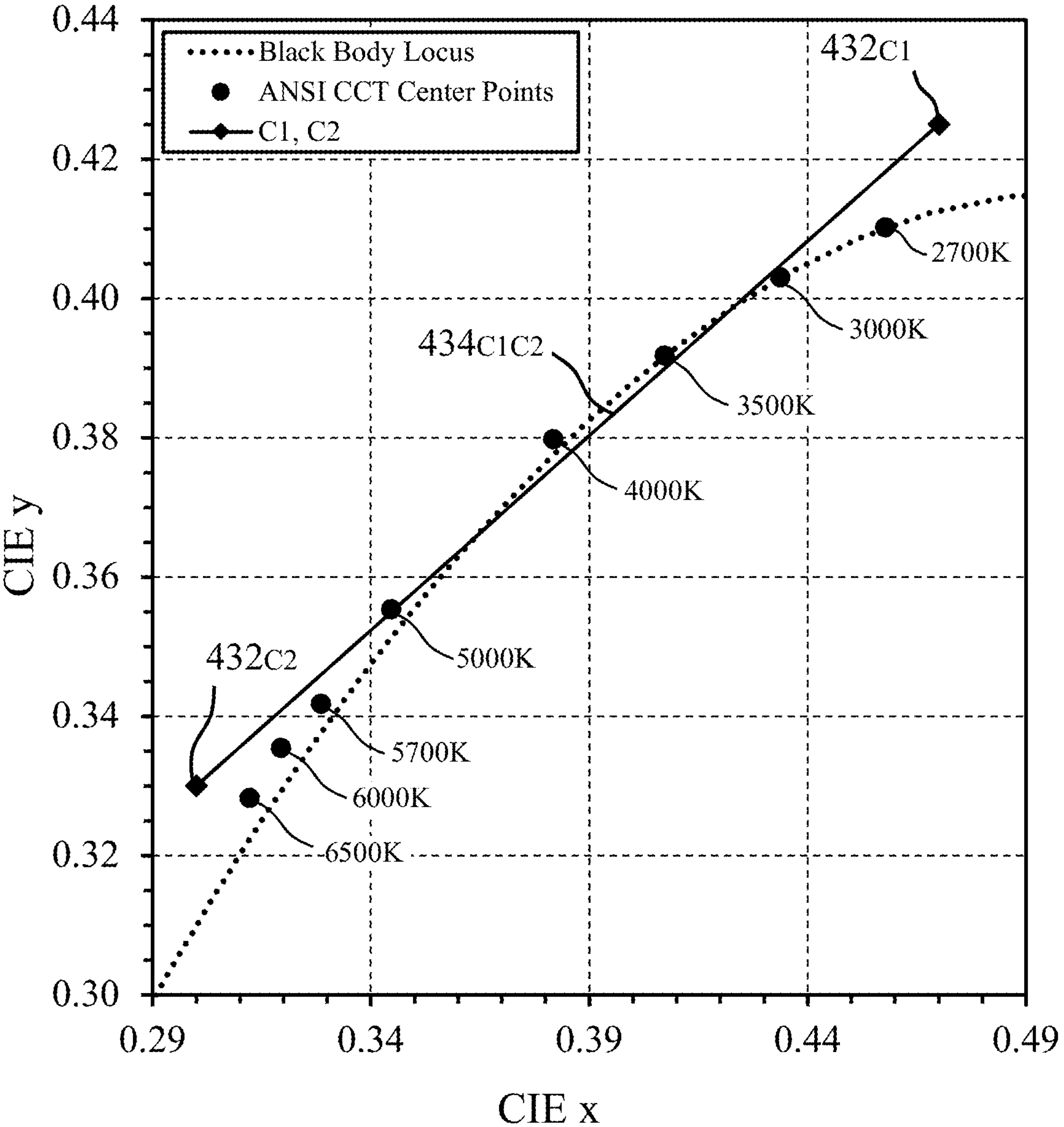
FIG. 4D is a CIE 1931 chromaticity diagram illustrating the gamut of light (solid line) that the color-temperature-tunable lighting device of FIGS. 4A-4C can generate when it comprises LEDs of two different chromaticity/color temperatures C1 and C2 (solid diamond)

In a first embodiment, the LEDs 430_a_-430_d_ can be configured to generate light of two chromaticity/color temperatures C1, and C2. The first chromaticity/color temperature of light C1 can, for example, comprise Warm White (WW)—at least 1800K to 4000K and the second chromaticity/color temperature of light C2 can, for example, comprise Cool White (CW)—at least 4100K and up to 25000K; more typically up to about 8000K. In such an arrangement, the light emitting device 426 can generate light of different color temperatures from C1 to C2. FIG. 4D is a CIE 1931 chromaticity diagram illustrating the gamut of light that the light emitting device 426 can generate when it comprises white LEDs of two different color temperatures C1 (2670K) and C2 (7250K). The CIE chromaticity diagram shows the chromaticity (color point: chromaticity coordinates CIE 0.4700, 0.4250—Δuv 0.0044) $\mathbf{432}_{C1}$ of light of a first color C1 generated by the C1 LED(s) and chromaticity (color point: chromaticity coordinates CIE 0.3000, 0.3300) $\mathbf{432}_{C2}$ of light of a second color C2 generated by the C2 LED(s). It is to be noted that the color points $\mathbf{432}_{C1}$ and $\mathbf{432}_{C2}$ lie off of (away from or not directly on) the black body locus (i.e., the points do not lie on the black body locus) and, as illustrated, they both lie above the black body locus. A straight line $\mathbf{434}_{C1C2}$ connecting the points $\mathbf{432}_{C1}$ and $\mathbf{432}_{C2}$ represents the gamut of color temperatures (chromaticity) of light that light emitting device 426 can generate—i.e., the device can generate color temperatures of light lying on the straight line $\mathbf{434}_{C1C2}$ from $\mathbf{432}_{C1}$ (2670K) to $\mathbf{432}_{C2}$ 7205K. It is to be noted the since the black body locus (dotted line) is a curved line the device cannot generate CCTs of light lying on the black body locus for all CCTs from $\mathbf{432}_{C1}$ to $432_{C2}$.

Figure 4E:
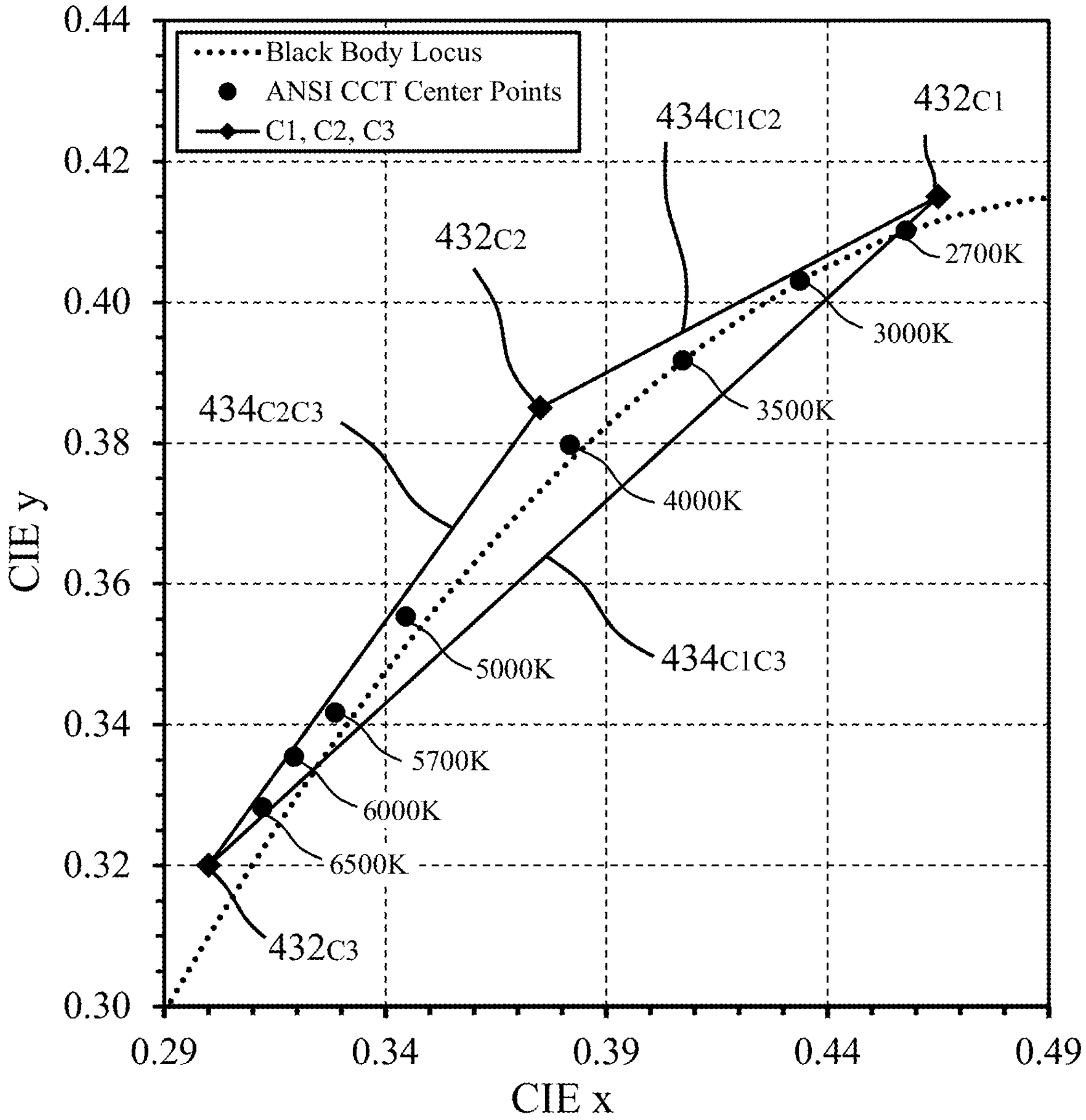
FIG. 4E is a CIE 1931 chromaticity diagram illustrating the gamut of light (solid line) that the color-temperature-tunable lighting device of FIGS. 4A-4C can generate when it comprises LEDs of three different chromaticity/color temperatures C1, C2 and C3 (solid diamond)

In a second embodiment, the LEDs 428_a_-428_d_ can be configured to generate light of three different chromaticity/CCTs: C1, C2, and C3. FIG. 4E is a CIE 1931 chromaticity diagram illustrating the gamut of light that the light emitting device 426 can generate when it comprises white LEDs of three different color temperatures C1 (2665K), C2 (4205K) and C3 (7355K). The CIE chromaticity diagram shows the chromaticity (color point: chromaticity coordinates CIE 0.4650, 0.4150—Δuv 0.0012) $\mathbf{432}_{C1}$ for light of the first CCT (C1), the chromaticity (color point: chromaticity coordinates CIE 0.3750, 0.3850—Δuv 0.0055) $\mathbf{432}_{C2}$ for light of the second CCT (C2), and the chromaticity (color point: chromaticity coordinates CIE 0.3000, 0.3200—Δuv 0.0052) $\mathbf{432}_{C3}$ for light of the third CCT (C3). It is to be noted that the color points $\mathbf{432}_{C1}$, $\mathbf{432}_{C2}$, and $\mathbf{432}_{C3}$ lie off of the black body locus (i.e., the points do not lie on the black body locus) and, as illustrated, all three points lie above the black body locus. Straight lines $\mathbf{434}_{C1C2}$, $\mathbf{434}_{C2C3}$, and $\mathbf{434}_{C1C3}$ connecting the points $\mathbf{432}_{C1}$, $\mathbf{432}_{C2}$, and $\mathbf{432}_{C3}$ define a triangle that represents the gamut of color temperatures (chromaticity) of light that light emitting device 426 can generate—i.e. the device can generate any chromaticity/color temperature of light lying within the triangle or lying on the boundary of the triangle. As will be noted from the chromaticity diagram, the device 426 can generate color temperatures of light from 2700K to 6500K lying on the black body locus (dotted line) or corresponding to the ANSI CCT center points (indicated by dots).

Figure 4F:
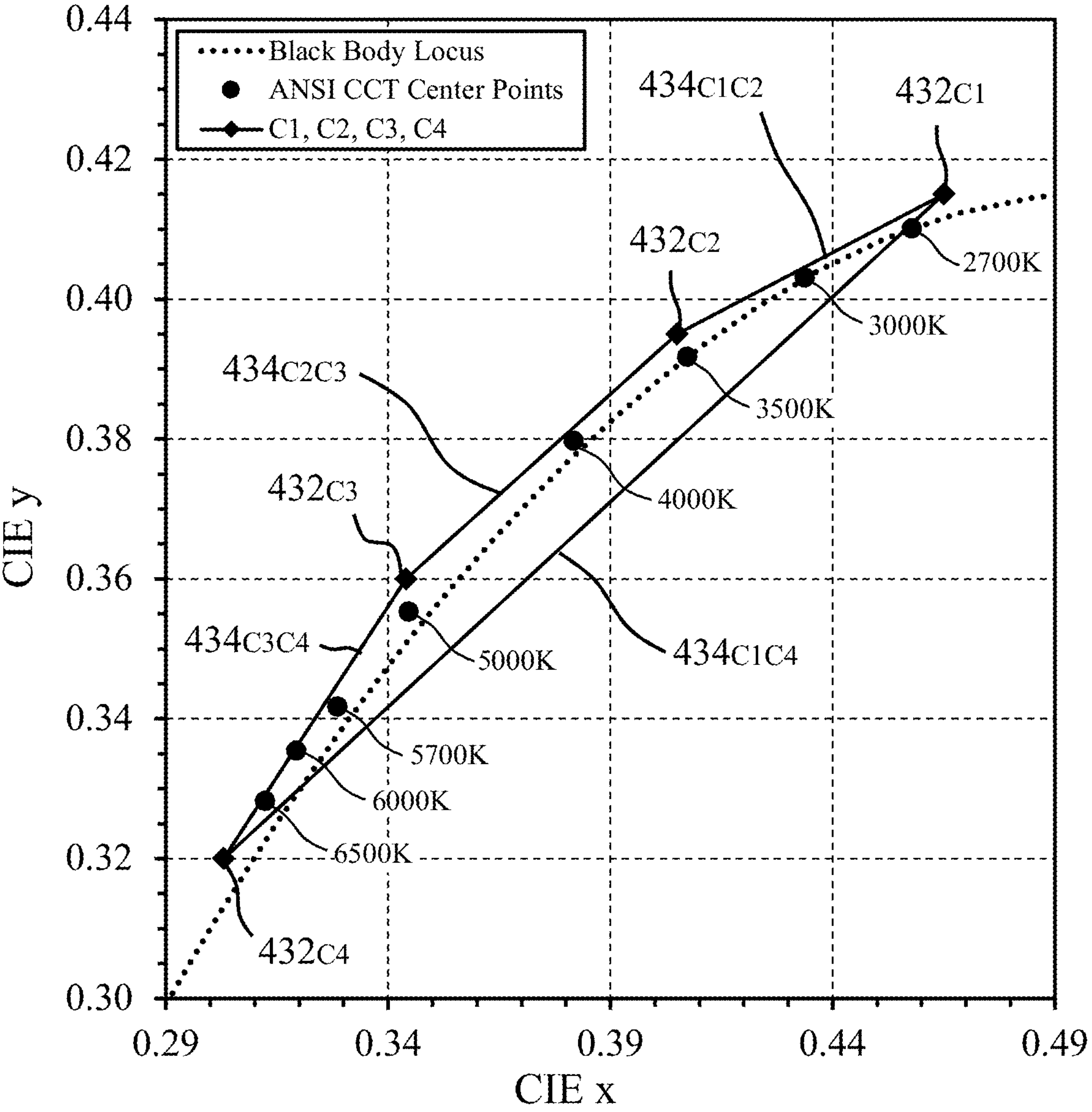
FIG. 4F is a CIE 1931 chromaticity diagram illustrating the gamut of light (solid line) that the color-temperature-tunable lighting device of FIGS. 4A-4C can generate when it comprises LEDs of four different chromaticity/color temperatures C1, C2, C3, and C4 (solid diamond)

In a third embodiment, the four LEDs 428_a_-428_d_ can be configured to generate light of four different chromaticity/CCTs: C1, C2, C3, C4. FIG. 4F is a CIE 1931 chromaticity diagram illustrating the gamut of light that the light device 426 can generate when it comprises white LEDs of four different color temperatures C1 (2665K), C2 (3540K), C3 (5070K), and C4 (7165K). The CIE chromaticity diagram shows the chromaticity (color point: chromaticity coordinates CIE 0.4650, 0.4150—Δuv 0.0012) $\mathbf{432}_{C1}$ for light of the first CCT (C1), the chromaticity (color point: chromaticity coordinates CIE 0.4050, 0.3950—Δuv 0.0019) $\mathbf{432}_{C2}$ for light of the second CCT (C2), the chromaticity (color point: chromaticity coordinates CIE 0.3440, 0.3600—Δuv 0.0019) $\mathbf{432}_{C3}$ for light of the third CCT (C3), and the chromaticity (color point: chromaticity coordinates 0.3030, 0.3200—Δuv 0.0036) $\mathbf{432}_{C4}$ for light of the fourth CCT (C4). It is to be noted that the color points $\mathbf{432}_{C1}$, $\mathbf{432}_{C2}$, $\mathbf{432}_{C3}$, and $\mathbf{432}_{C4}$ lie off of the black body locus (i.e., the points do not lie on the black body locus) and, as illustrated, all four points lie above the black body locus (dashed line). Straight lines $\mathbf{434}_{C1C2}$, $\mathbf{434}_{C2C3}$, $\mathbf{434}_{C3C4}$, and $\mathbf{434}_{C1C4}$ connecting the points $\mathbf{432}_{C1}$, $\mathbf{432}_{C2}$, $\mathbf{432}_{C3}$, and $\mathbf{432}_{C4}$ define a quadrilateral that represents the gamut of color temperatures (chromaticity) of light that light emitting device 426 can generate—i.e., the device can generate any color temperature of light lying within the quadrilateral or lying on the boundary of the quadrilateral. As will be noted from the chromaticity diagram, the device 426 can generate color temperatures of light from 2700K to 6500K lying on the black body locus (dashed line) or corresponding to the ANSI CCT center points.

Figure 5:
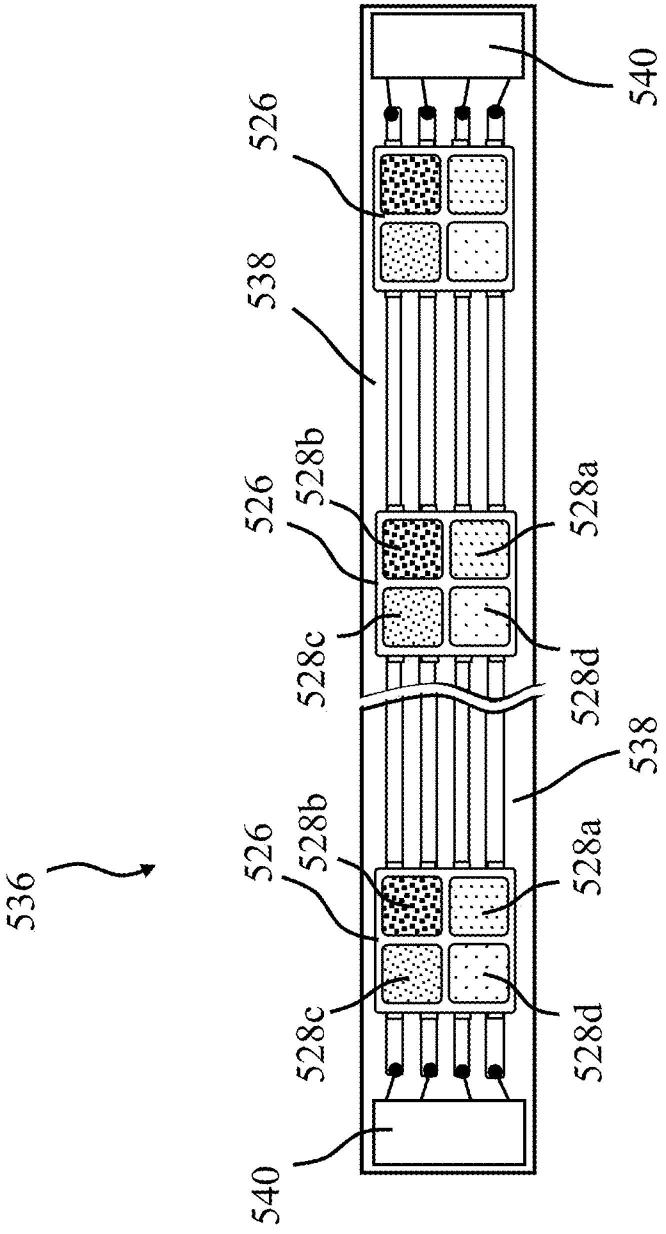
FIG. 5 is a schematic representation of a color-temperature-tunable linear lighting device in accordance with an embodiment of the invention.

FIG. 5 is a schematic top view of a color-temperature-tunable linear light emitting device 536 in accordance with an embodiment of the invention. The linear light emitting device 536 comprises a linear (elongate) substrate 538, such as for example a strip of Metal Core Printed Circuit Board (MCPCB) or a strip of flexible circuit board, and a plurality of color-temperature-tunable lighting devices 526 mounted on and electrically connected to the substrate. For the purposes of illustration only, the lighting devices 526 are shown as comprising the multi-LED package 310 of FIGS. 3E and 3F and comprise LEDs that generate light of two, three, or four different chromaticity/color temperatures. As illustrated, the lighting devices 526 can be arranged as a linear array extending in a direction of elongation of the substrate. The linear light emitting device 536 may, at opposite ends of the substrate 538, comprise an electrical connector 540 comprising respective electrical connections to the anode and cathode of the first, second, third, and fourth LEDs 528*a*-528*d* of the lighting devices 526. In such an arrangement the first, second, third and fourth LEDs 528*a*-528*d* of each device 526 are electrically connected in series. In other embodiments utilizing light emitting devices having a common cathode arrangement for the four LEDs, such as for example the multi-LED package 210 of FIGS. 2A-2D, the first, second, third and fourth LEDs of each device are electrically connected in parallel.

Experimental Test Data

In this specification, Dev.# is used to denote a color-temperature-tunable multi-LED packaged lighting device in accordance with the invention. The test method involves measuring light emission of the color-temperature-tunable lighting devices in an integrating sphere.

Color-Temperature-Tunable Lighting Device—Dev.1

A color-temperature-tunable lighting device, denoted Dev.1, comprises LEDs that generate light of two different chromaticity/CCTs: C1 and C2. Device, Dev.1 comprises the lighting device of FIGS. 3A-3D and comprises a 3838 four cavity package containing two cool white (CW) LEDs and two warm white (WW) LEDs. The CW LEDs, in the first and second cavities, comprise a PC white LED comprising a mixture of green to yellow photoluminescence materials (e.g., yttrium or lutetium aluminum garnet phosphors: GaYAG ($Y_3(Al,Ga)_5O_{12}$:Ce), GaLuAG ($Lu_3(Al,Ga)_5O_{12}$:Ce), $(Y,Lu)_3(Al,Ga)_5O_{12}$, YAG ($Y_3Al_5O_{12}$:Ce), and/or LuAG ($Lu_3Al_5O_{12}$:Ce)). The green to yellow phosphors are incorporated in a light transmissive encapsulant (e.g., phenyl silicone) and the mixture dispensed into the first and second cavities of the package to cover the violet to blue InGaN LED chip. The WW LEDs, in the third and fourth cavities, comprise a single-layer PC white LED comprising a mixture of green to red photoluminescence materials (e.g., GaYAG, GaLuAG, $(Y,Lu)_3(Al,Ga)_5O_{12}$ and red nitride phosphor $CaAlSiN_3$:Eu (CASN)). The green to red phosphors are incorporated in a light transmissive encapsulant and the mixture dispensed into the third and fourth cavities of the package to cover the violet to blue InGaN LED chip. Color-temperature-tunable lighting device Dev.1 is configured to generate light with a CCT from 2700K to 5000K and a general Color Rendering Index CRI Ra of 80.

TABLE 1 tabulates the optical characteristics of the PC Warm White (WW) LED (2700K) and Cool White (CW) LED of lighting device Dev.1. As can be seen from TABLE 1, the WW LEDs have a luminous efficacy of 127.5 lm/W and generates light with a CCT of 2700K with CRI Ra of 82.4 (about 80) and a CRI R9 of 6.0, while the CW LEDs have a luminous efficacy of 139.0 lm/W and generates light with a CCT of 5000K with CRI Ra of 80.7 (about 80) and a CRI R9 of 2.5.

TABLE 1

Dev. 1: Measured characteristics of PC Warm White LED (WW) and PC Cool White LED (CW)

| CCT (K) | Flux (lm) | Power (W) | LE (lm/W) | CIE x | CIE Y | CCT (K) | CRI Ra | CRI R9 | Δuv |
|---|---|---|---|---|---|---|---|---|---|
| 2700 (WW) | 120.5 | 0.95 | 127.5 | 0.4585 | 0.4114 | 2725 | 82.4 | 6.0 | 0.0004 |
| 5000 (CW) | 131.4 | 0.95 | 139.0 | 0.3487 | 0.3571 | 4886 | 80.7 | 2.5 | 0.0013 |

Figure 6:
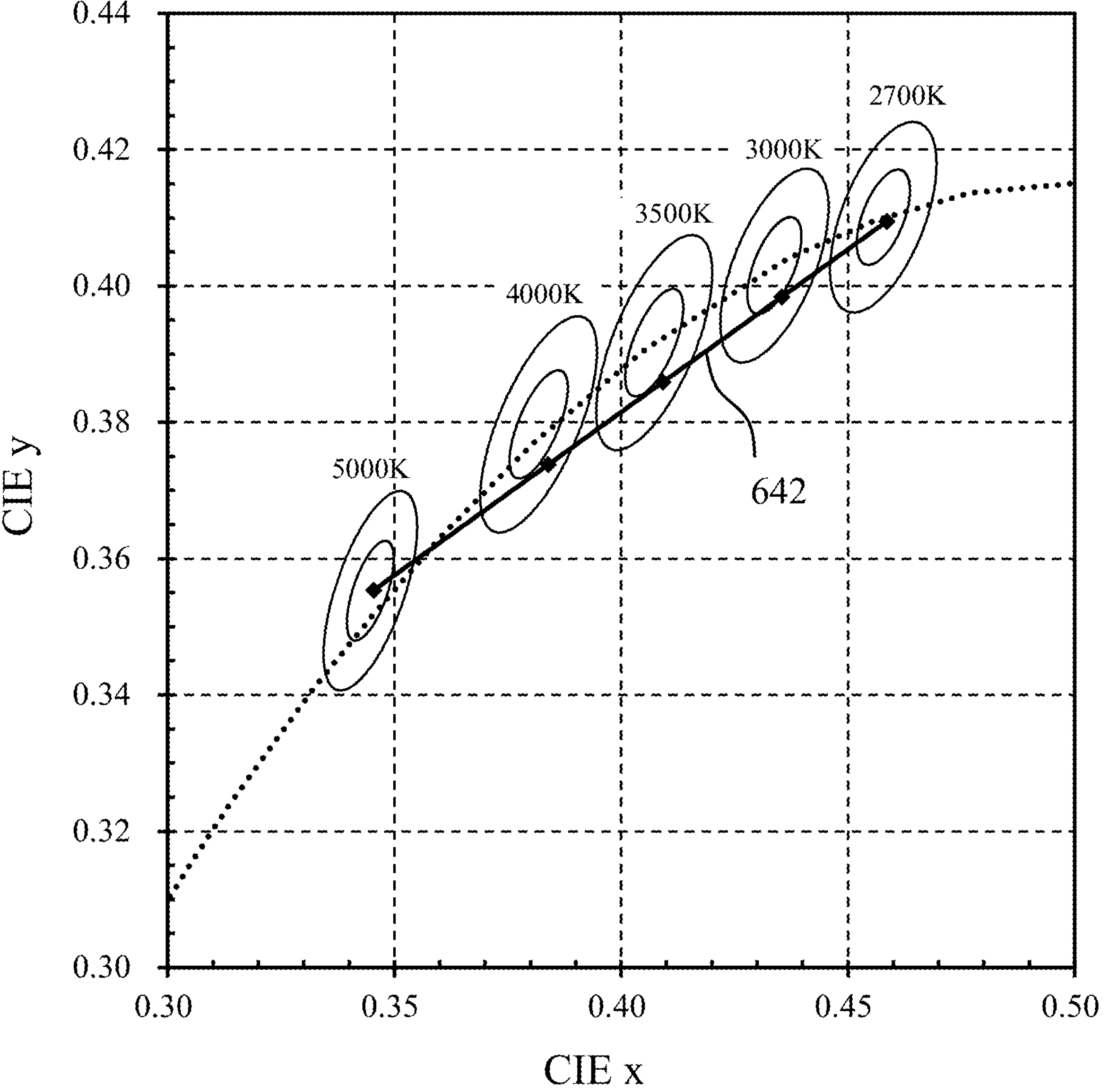
FIG. 6 is a CIE 1931 chromaticity diagram illustrating the chromaticity (color) of light generated by a color-temperature-tunable lighting device (Dev.1) comprising LEDs of two chromaticity/color temperatures: C1—Warm White (WW) and C2—Cool White (CW) for CCTs of 2700K, 3000K, 3500K, 4000K, and 5000K, light emission locus (solid line) for CCTs from 2700K to 5000K, black body locus (dotted line), and 3 SDCM and 6 SDCM (Mac Adam ellipses—thin solid line)

FIG. 6 is a CIE 1931 chromaticity diagram illustrating the chromaticity (color) of light generated by lighting device (Dev.1) comprising LEDs of two different Color Temperatures: Warm White (WW) and Cool White (CW) for CCTs of 2700K, 3000K, 3500K, 4000K, and 5000K, light emission locus (solid line) for CCTs from 2700K to 5000K, black body locus (dotted line), and 3 SDCM and 6 SDCM (Standard Deviation Color Matching—Mac Adam ellipses). Referring to FIG. 6, it is to be noted that light emission locus (solid line 642)—the chromaticity locus of light that lighting device Dev.1 is capable of generating—is a straight line 642 connecting the color points for the WW LED (2700K) and CW LED (5000K) and that color of light over the temperature range is within 3 SDCM.

Color-Temperature-Tunable Lighting Device—Dev.2

A color-temperature-tunable lighting device, denoted Dev.2, comprises LEDs that generate light of three different colors/CCTs: C1, C2, and C3. Lighting device Dev.2 comprises the device of FIGS. 3A-3C and comprises a 3838 four cavity package containing two LEDs, LED-C1, that generate light with a first chromaticity/color temperature C1, an LED, LED-C2, that generates of a second chromaticity/color temperature C2, and an LED, LED-C3, that generates light of a third chromaticity/color temperature C3. The two LED-C1 LEDs, in the first and second cavities, comprise a PC LED comprising a mixture of green to red photoluminescence materials (e.g., GaYAG, GaLuAG, and/or $(Y,Lu)_3(Al,Ga)_5O_{12}$ and CASN) and a narrowband red phosphor (e.g., $K_2SiF_6$:Eu (KSF)). The green to red and narrowband red phosphor are incorporated in a light transmissive encapsulant (e.g., phenyl silicone) and the mixture dispensed into the first and second cavities to cover the violet to blue InGaN LED chip. LED-C2, in the third cavity, comprises a PC LED comprising a mixture of green to red photoluminescence materials (e.g., GaYAG, GaLuAG, and/or $(Y,Lu)_3(Al,Ga)_5O_{12}$ and CASN). The green to red phosphors are incorporated in a light transmissive encapsulant (e.g., phenyl silicone) and the mixture dispensed into the third cavity of the package to cover the violet to blue InGaN LED chip. LED-C3, in the fourth cavity, comprises a PC LED comprising a yellow photoluminescence material (e.g., Yttrium Aluminum Garnet (YAG) phosphor). The yellow phosphor is incorporated in a light transmissive encapsulant (e.g., phenyl silicone) and the mixture dispensed into the fourth cavity of the package to cover the violet to blue InGaN LED chip. Color-temperature-tunable Lighting device Dev.2 is configured to generate light with a CCT from 2700K to 6500K and a general Color Rendering Index CRI Ra of 80.

Figure 7A:
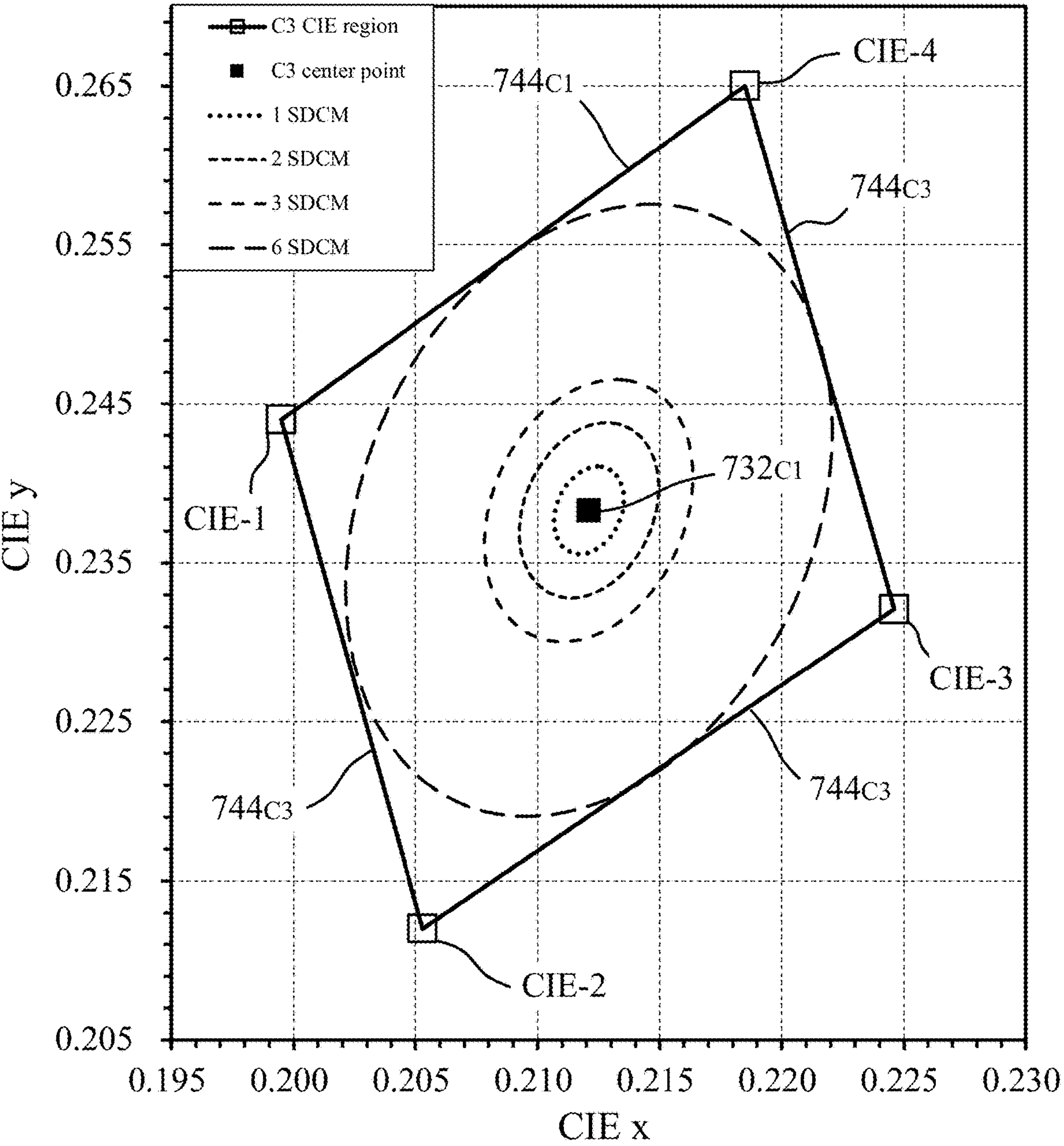
Figure 7B:
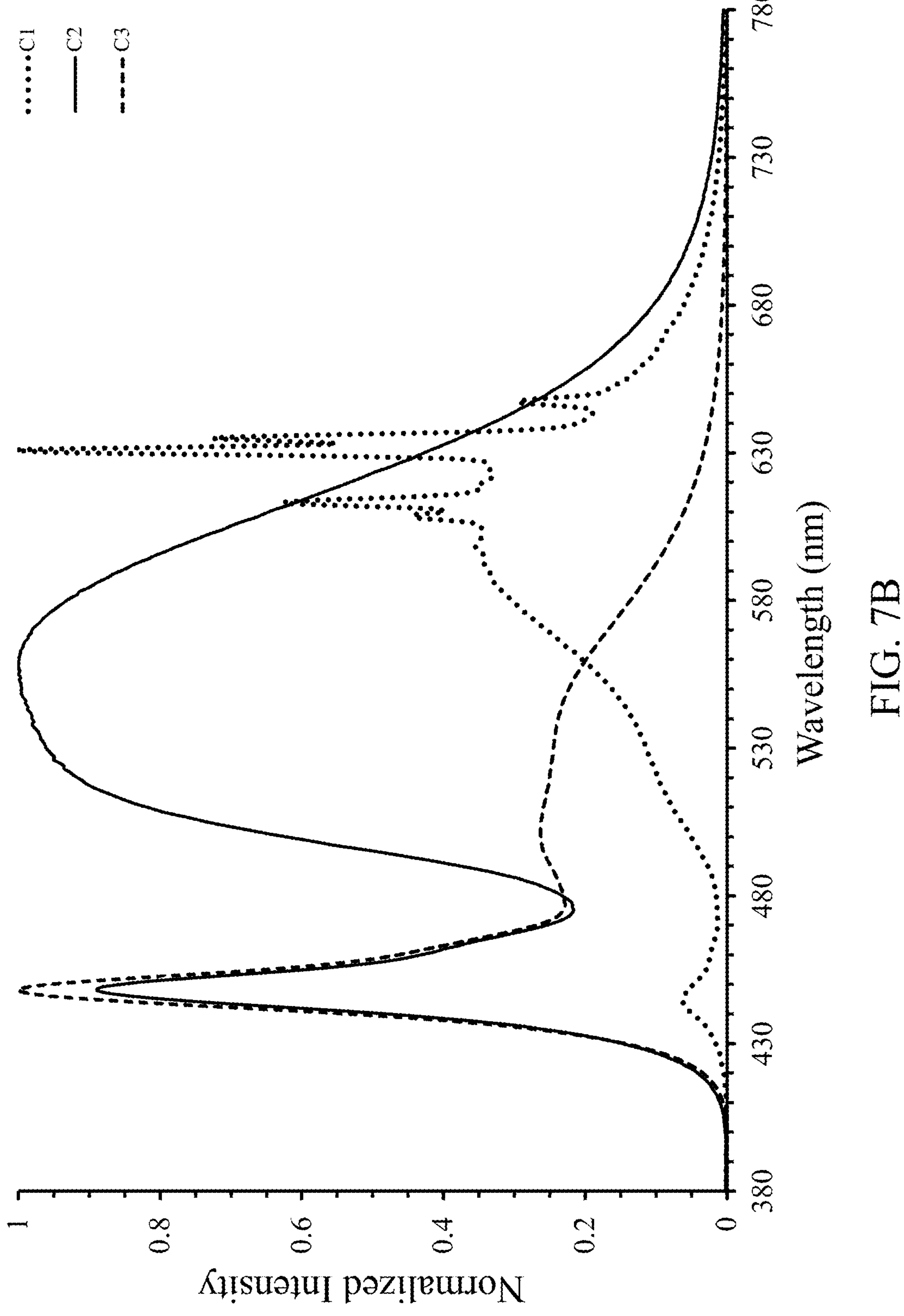
Figure 7C:
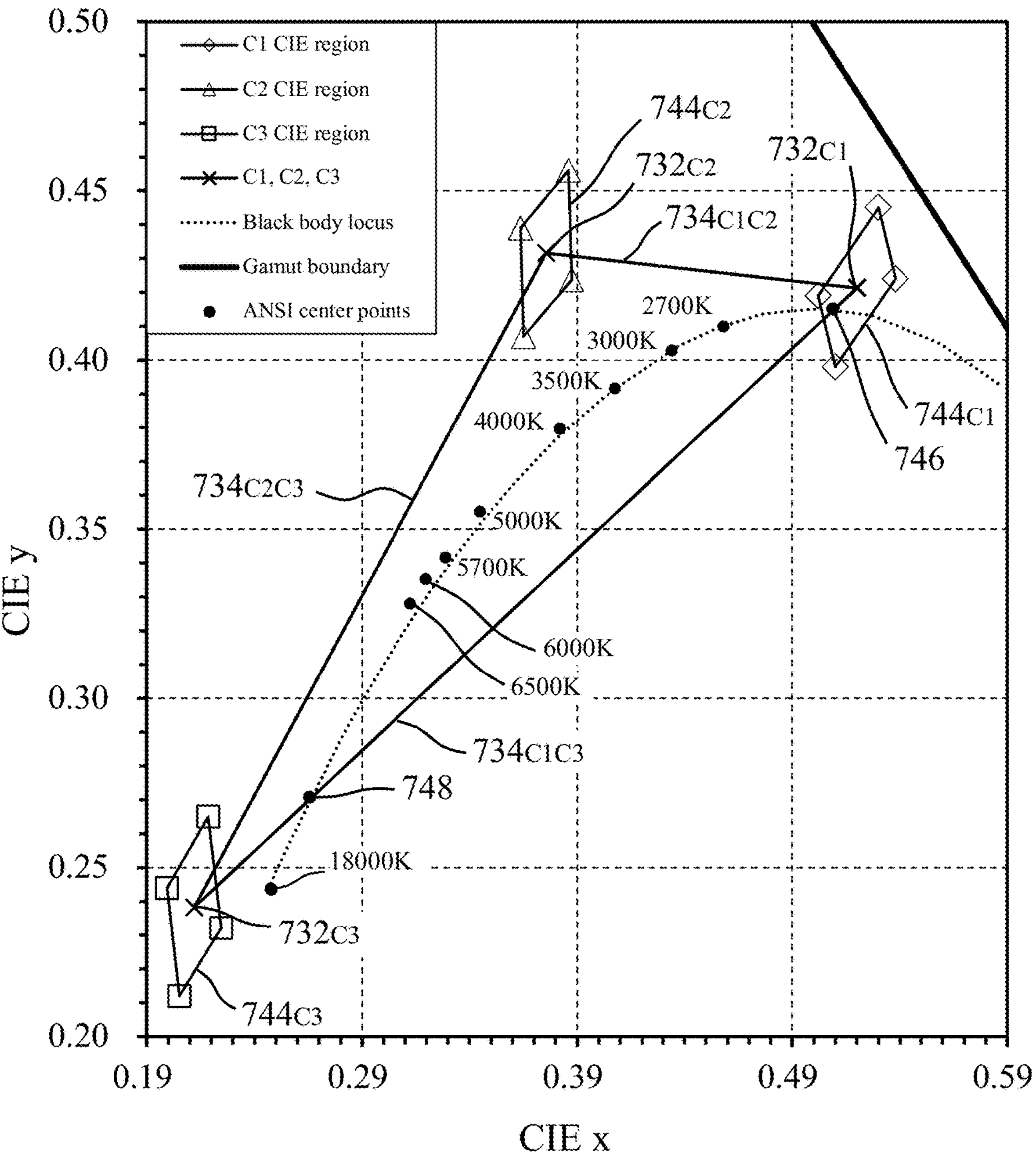
Figure 7D:
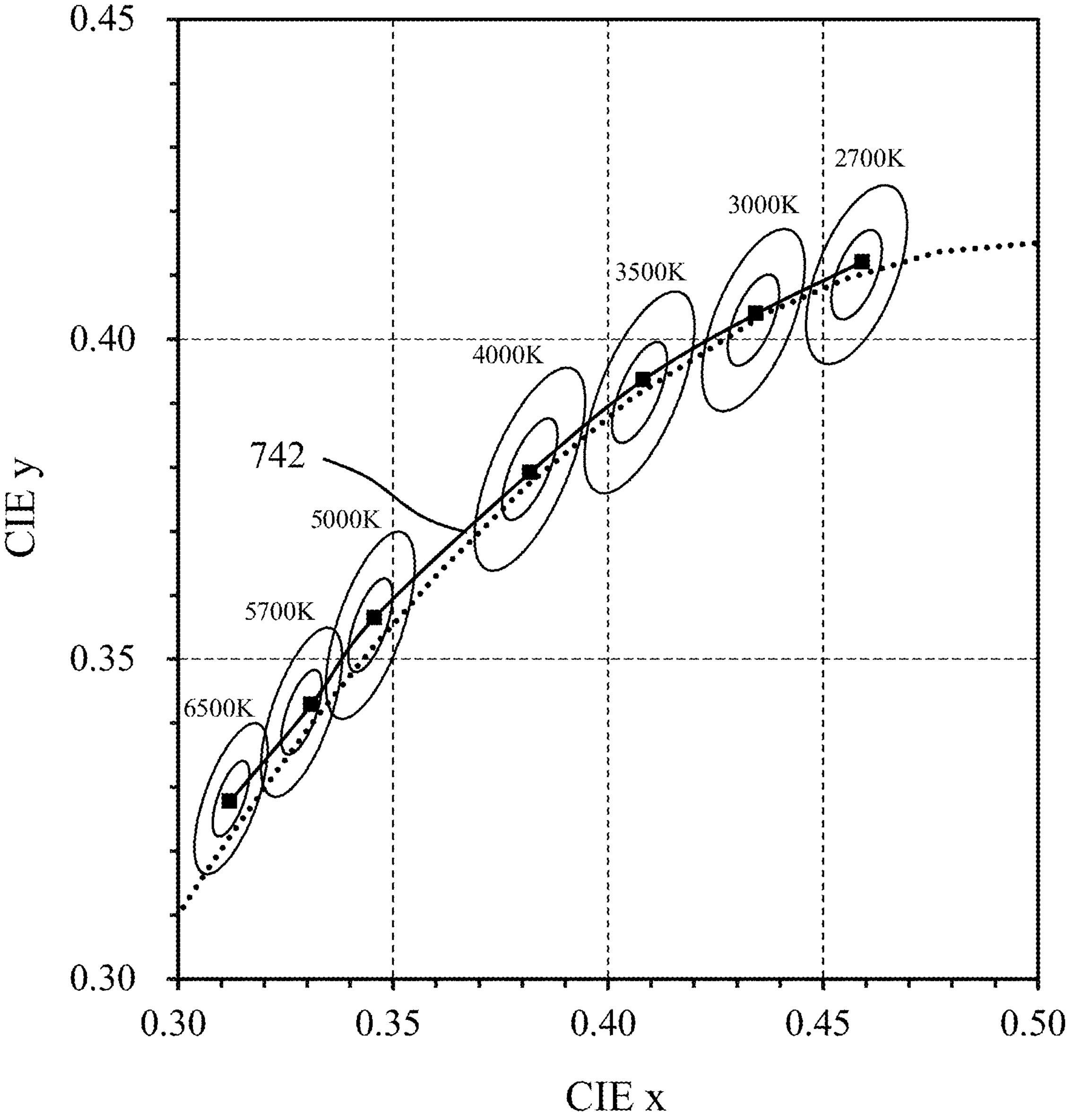

TABLE 2A tabulates measured optical/electrical characteristics of LED-C1, LED-C2, and LED-C3 of lighting device Dev.2 and TABLE 2B tabulates CIE region, CIE center point for light C1, C2, and C3 and CCT and Δuv for light C1 and C2. FIG. 7A-7D are measured characteristics for lighting device Dev.2 in which: FIG. 7A is a CIE 1931 chromaticity diagram illustrating the chromaticity (center point—solid square) of light C3, 1 SDCM, 2 SDCM, 3 SDCM and 6 SDCM (Standard Deviation Color Matching—Mac Adam ellipses—dotted and dashed lines) and CIE region (solid line—square) for light C3, FIG. 7B shows spectra, normalized intensity (a.u.) versus wavelength (nm), for light C1 (dotted line), light C2 (solid line), and light C3 (dashed line), FIG. 7C is a CIE 1931 chromaticity diagram illustrating the chromaticity (center point—cross) of light C1, C2, C3, the CIE region for light C1 (solid line/diamond), C2 (solid line/triangle), C3 (solid line/square), gamut of light (solid line) that Dev.2 can generate, and black body locus (dotted line), and FIG. 7D is a CIE 1931 chromaticity diagram illustrating the chromaticity (color) of light (solid square) generated by Dev.2 for nominal CCTs of 2700K, 3000K, 3500K, 4000K, 4500K, 5000K, 5700K, and 6500K, light emission locus (solid line) for CCTs from 2700K to 6500K, black body locus (dotted line), and 3 SDCM and 6 SDCM (Standard Deviation Color Matching—Mac Adam ellipses—thin solid line).

As can be seen from TABLE 2A: LED-C1 has a luminous efficacy (LE) of 119 lm/W and generates light of chromaticity (color point: CIE 0.5200, 0.4213, Δuv=0.0021) corresponding to a CCT of 2107K (about 2100K) with a CRI Ra of 78.1 (about 80); LED-C2 has a luminous efficacy of 170 lm/W and generates light of chromaticity (color point: CIE 0.3756, 0.4316, Δuv=0.0251) corresponding to a CCT of 4436K (about 4400K) with a CRI Ra of 61.7 (about 62); and LED-C3 has a luminous efficacy of 120 lm/W and generates light with a chromaticity (color point: CIE 0.2121, 0.2383) which is greenish blue to blue in color.

As is known, the black body locus represents the chromaticity locus of light generated by a black body (Planckian) radiator for temperatures from 1000K to infinity and goes from deep red at low temperatures through orange, yellowish white, white to bluish white. Since the chromaticity (color point) of light in the greenish blue to blue region of the chromaticity diagram cannot be generated by a Planckian black body radiator, the chromaticity (color point) of light C3 cannot be ascribed a CCT. Since light C3 cannot be described in terms of color temperature, it will be described by a chromaticity center point and CIE chromaticity region (C3 CIE region). In this specification "a chromaticity region" is defined as an area on the CIE 1931 chromaticity diagram and may be defined as a quadrilateral composed of four chromaticity points CIE-1, CIE-2, CIE-3, and CIE-4 that are connected by straight lines. The C3 CIE region is defined by four CIE color points CIE-1, CIE-2, CIE-3, and CIE-4: CIE-1 (0.200, 0.244), CIE-2 (0.205, 0.212), CIE-3 (0.225, 0.232), and CIE-4 (0.219, 0.265)—TABLE 2B. The CIE region corresponds to 6 SDCM about the CIE center point and calculation of the CIE region is illustrated in FIG. 7A which is a CIE 1931 chromaticity diagram illustrating the chromaticity $\mathbf{732}_{C1}$ (center point—solid square) and C3 CIE region $\mathbf{744}_{C3}$ (solid line/square) for light C3. As can be seen from the figure, the CIE region $\mathbf{744}_{C3}$ is a quadrilateral approximating to 6 SDCM (Mac Adam ellipses).

Similarly, CIE regions defined by four CIE color points CIE-1, CIE-2, CIE-3, and CIE-4 for light C1 and C2 were calculated and are given in TABLE 2B together with CCT and Δuv for each color point. C1 comprises a quadrilateral CIE region (C1 CIE region) defined by CIE color coordinates CIE-1 (0.502, 0.419), CIE-2 (0.510, 0.398), CIE-3 (0.538, 0.424), and CIE-4 (0.530, 0.445) connected by straight lines which in terms of CCT is from 1974K (about 1970K) to 2261K (about 2270K). C2 comprises a quadrilateral CIE region (C2 CIE Region) defined by CIE color coordinates CIE-1 (0.364, 0.439), CIE-2 (0.365, 0.407), CIE-3 (0.388, 0.424), and CIE-4 (0.386, 0.456) connected by straight lines which in terms of CCT is from 4116K (about 4100K) to 4734K (about 4750K). The CIE chromaticity diagram of FIG. 7C shows each of the CIE regions: C1 CIE region $\mathbf{744}_{C1}$ (diamond/solid line), C2 CIE region $\mathbf{744}_{C2}$ (triangle/solid line), and C3 CIE Region $\mathbf{744}_{C3}$ (square/solid line).

Referring to FIG. 7B the emission spectrum for LED-C1 (dotted line) primarily comprises a broadband peak (at about 610 nm) in the red region of the visible spectrum with multiple higher intensity narrowband peaks (FWHM≈5 nm) from about 610-650 nm (maximum intensity peak at ≈632 nm) in the orange to red region of the visible spectrum. The emission spectrum for the LED-C2 (solid line) comprises a narrowband peak (FWHM≈20 nm) with a peak emission wavelength at about 450 nm in the blue region if the visible spectrum and a broadband peak (FWHM≈125 nm) with a peak emission wavelength of about 530 nm in the green region of the visible spectrum. The emission spectrum for the LED-C3 (dashed line) comprises a narrowband peak (FWHM≈20 nm) with a peak emission wavelength of about 450 nm in the blue region of the visible spectrum and a lower intensity (about 25%) tail at wavelengths in the green to yellow region of the spectrum (460-580 nm).

TABLE 2A

Dev. 2: Measured characteristics of LED-C1, LED-C2, and LED-C3

| LED | Flux (lm) | Power (W) | LE (lm/W) | CIE center point x | CIE center point y | CCT (K) | CRI Ra | Δuv |
|---|---|---|---|---|---|---|---|---|
| LED-C1 | 44.6 | 0.376 | 119 | 0.5200 | 0.4213 | 2107 | 78.1 | 0.0021 |
| LED-C2 | 63.8 | 0.376 | 170 | 0.3756 | 0.4316 | 4436 | 61.7 | 0.0251 |
| LED-C3 | 45.0 | 0.376 | 120 | 0.2121 | 0.2383 | n/a | n/a | n/a |

TABLE 2B

Dev. 2: CIE region for light C1, C2, and C3

| CIE point | C1 CIE region: CIE x | C1 CIE y | C1 CCT (K) | C1 Δuv | C2 CIE region: CIE x | C2 CIE y | C2 CCT (K) | C2 Δuv | C3 CIE region: CIE x | C3 CIE y |
|---|---|---|---|---|---|---|---|---|---|---|
| CIE-1 | 0.502 | 0.419 | 2261 | 0.0012 | 0.364 | 0.439 | 4734 | 0.0317 | 0.200 | 0.244 |
| CIE-2 | 0.510 | 0.398 | 2045 | −0.0053 | 0.365 | 0.407 | 4591 | 0.0184 | 0.205 | 0.212 |
| CIE-3 | 0.538 | 0.424 | 1974 | 0.0036 | 0.388 | 0.424 | 4116 | 0.0185 | 0.225 | 0.232 |
| CIE-4 | 0.530 | 0.445 | 2167 | 0.0092 | 0.386 | 0.456 | 4316 | 0.0314 | 0.219 | 0.265 |
| Center | 0.5200 | 0.4213 | 2107 | 0.0021 | 0.3756 | 0.4316 | 4436 | 0.0251 | 0.2121 | 0.2383 |

The CIE chromaticity diagram of FIG. 7C shows the chromaticity (center color point) 732C1 of light of color C1 generated by the LED-C1, the chromaticity (center color point) 732$_{C2}$ of light of color C2 generated by LED-C2, and the chromaticity (center color point) 732$_{C3}$ of light of color C3 generated by the LED-C3. Straight lines 734$_{C1C2}$, 734$_{C2C3}$, and 734$_{C1C3}$ connecting the points 732$_{C1}$, 732$_{C2}$, and 732$_{C3}$ define a triangle that represents the gamut of chromaticity (colors)/color temperatures of light that Dev.2 can generate—i.e., the device can generate any chromaticity (color)/color temperature of light lying on the boundary or within the triangle. It is to be noted that lowest CCT of light that Dev.2 can generate that lies on the black body locus (dotted line) is 2157K (about 2150K) which corresponds to the point of intersection 746 (CIE 0.510 0.415) of line 734$_{C1C3}$ connecting color points 732$_{C1}$ to 732$_{C3}$ and the black body locus. It is to be noted that highest CCT of light that Dev.2 can generate that lies on the black body locus (dotted line) is 14012K (14000K) which corresponds to the point of intersection 748 (CIE 0.266, 0.270) of line 734$_{C1C3}$ connecting color point 732$_{C1}$ to color point 732$_{C3}$ and the black body locus. It will be appreciated that Dev.2 is, therefore, capable of generating any CCT of light from about 2150K to about 14000K lying on the black body locus.

TABLE 3 tabulates forward drive current ($I_F$) for first and second LED-C1, LED-C2, and LED-C3 of Dev.2 for generating light with a nominal general color rendering index CRI Ra of 80 for nominal color temperatures (CCT) from 2700K, 3000K, 3500K, 4000K, 5000K, 5700K, and 6500K. TABLE 4 tabulates the measured optical and electrical characteristics for Dev.2 when operated to generate light with a nominal CRI Ra of 80 for nominal color temperatures (CCT) from 2700K to 6500K.

As can be seen from TABLE 4, the CCT of light generated by Dev.2 is increased by increasing the proportion of light of color C3 while reducing the proportion of light of color C1. TABLE 4 demonstrates that by selection of the drive currents to the first and second LED-C1, LED-C2, and LED-C3, lighting device Dev.2 can generate white light with a CCT from 2700 K to 6500K with a general color rendering index CRI Ra of about 80 (80.2 to 82.0) and CRI R9 of at least 9 (9.2 to 14.6) with a luminous efficacy from about 134 lm/W (133.6 lm/W) to about 143 lm/W (143 lm/W). TABLE 4 also includes the measured CCT of light generated by Dev.2.

Referring to FIG. 7D it is to be noted that Dev.2 can generate light 742 (solid line) of CCTs from 2700K to 6500K with a chromaticity that closely matches the black body locus (dotted line). As can be seen from TABLE 4, the chromaticity of light generated by Dev.2 are within 0.0029 Δuv (about 0.003) or less of the black body locus for CCTs from 2700K to 6500K.

TABLE 3

Dev. 2: Forward drive current $I_F$ for the 1st LED-C1, 2nd LED-C1, LED-C2, and LED-C3 for generating light with a nominal CRI Ra = 80 for nominal CCTs from 2700K to 6500K

| Nom. CCT (K) | Forward drive current $I_F$ (mA): 1st LED-C1 | 2nd LED-C1 | LED-C2 | LED-C3 |
|---|---|---|---|---|
| 2700 | 117 | 117 | 72 | 13 |
| 3000 | 101 | 101 | 94 | 24 |
| 3500 | 83 | 83 | 114 | 38 |
| 4000 | 68 | 68 | 124 | 59 |
| 5000 | 49 | 49 | 128 | 94 |
| 5700 | 45 | 45 | 115 | 114 |
| 6500 | 37 | 37 | 106 | 139 |

TABLE 4

Dev. 2: Measured optical and Electrical characteristics for nominal CRI Ra = 80 for nominal color temperatures (CCT) from 2700 K to 6500 K

| Nom. CCT (K) | Flux (lm) | Power (W) | LE (lm/W) | CIE x | CIE y | CCT (K) | CRI Ra | CRI R9 | Δuv |
|---|---|---|---|---|---|---|---|---|---|
| 2700 | 130.1 | 0.97 | 133.6 | 0.4592 | 0.4121 | 2721 | 80.3 | 9.8 | 0.0006 |
| 3000 | 133.6 | 0.97 | 137.2 | 0.4345 | 0.4040 | 3041 | 80.6 | 12.0 | 0.0003 |
| 3500 | 136.9 | 0.97 | 140.7 | 0.4083 | 0.3937 | 3460 | 80.4 | 12.2 | 0.0007 |
| 4000 | 138.6 | 0.97 | 142.3 | 0.3819 | 0.3792 | 3979 | 80.5 | 12.7 | 0.0007 |
| 5000 | 139.5 | 0.97 | 143.2 | 0.3457 | 0.3565 | 4994 | 80.2 | 9.2 | 0.0022 |
| 5700 | 137.4 | 0.97 | 141.2 | 0.3310 | 0.3429 | 5563 | 81.7 | 14.6 | 0.0016 |
| 6500 | 136.0 | 0.97 | 139.7 | 0.3121 | 0.3278 | 6546 | 82.0 | 14.5 | 0.0029 |

Color-Temperature-Tunable Lighting Device—Dev.3

A color-temperature-tunable lighting device, denoted Dev.3, comprises LEDs that generate light of three different colors/CCTs: C1, C2, and C3. Lighting device Dev.3 comprises the device of FIGS. 3A-3C and comprises a 3838 four cavity package containing two LEDs, LED-C1, that generate light with a first chromaticity/color temperature C1, an LED, LED-C2, that generates of a second chromaticity/color temperature C2, and an LED, LED-C3, that generates light of a third chromaticity/color temperature C3. The two LEDs LED-C1, in the first and second cavities, comprise a PC LED comprising a mixture of green to red photoluminescence materials (e.g., GaYAG, GaLuAG, and/or $(Y,Lu)_3(Al,Ga)_5O_{12}$ and CASN). The green to red phosphors are incorporated in a light transmissive encapsulant (e.g., phenyl silicone) and the mixture dispensed into the first and second cavities to cover the violet to blue InGaN LED chip. LED-2, in the third cavity, comprises a PC LED comprising a mixture of green to yellow photoluminescence materials (e.g., GaYAG, GaLuAG, $(Y,Lu)_3(Al,Ga)_5O_{12}$), YAG, and/or LuAG). The green to yellow phosphors are incorporated in a light transmissive encapsulant (e.g., phenyl silicone) and the mixture dispensed into the third cavity of the package to cover the violet to blue InGaN LED chip. LED-C3, in the fourth cavity, comprises a PC LED comprising green to yellow photoluminescence material (e.g., GaYAG, GaLuAG, $(Y,Lu)_3(Al,Ga)_5O_{12}$), YAG, and/or LuAG). The green to yellow phosphors are incorporated in a light transmissive encapsulant (e.g., phenyl silicone) and the mixture dispensed into the fourth cavity of the package to cover the violet to blue InGaN LED chip. Color-temperature-tunable lighting device Dev.3 is configured to generate light with a CCT from 2700K to 6500K and a general Color Rendering Index CRI Ra of 80.

Figure 8A:
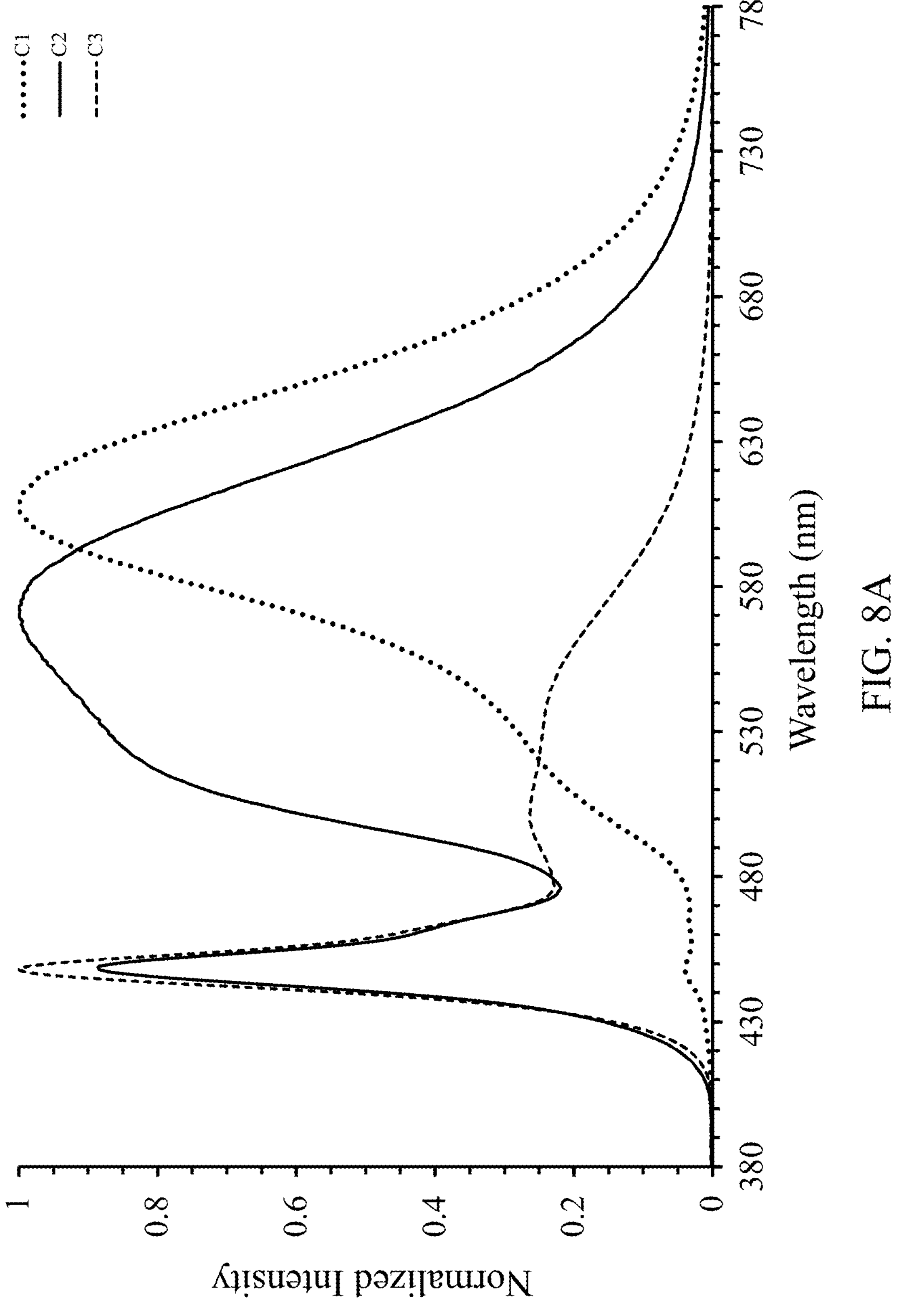
Figure 8B:
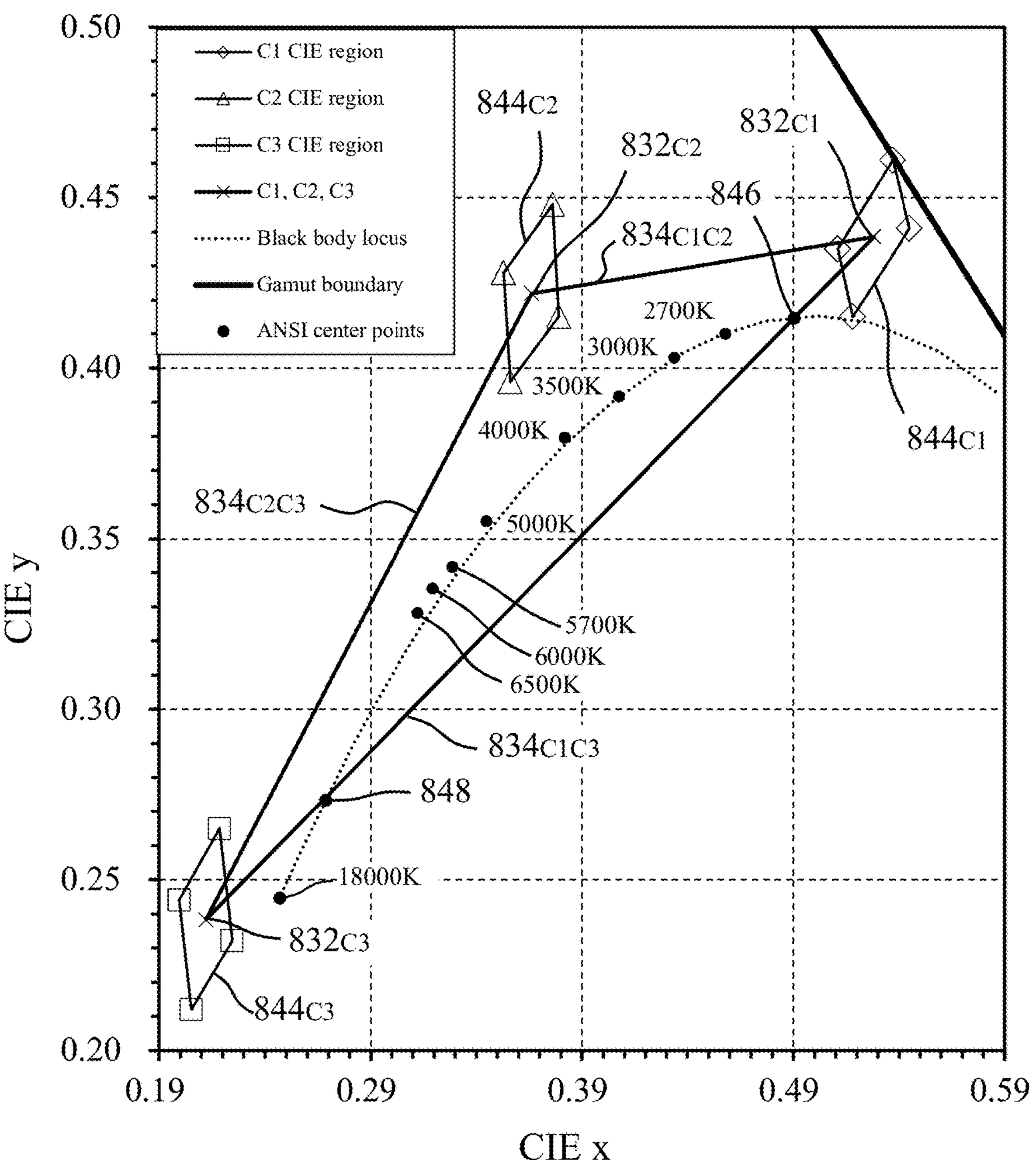
Figure 8C:
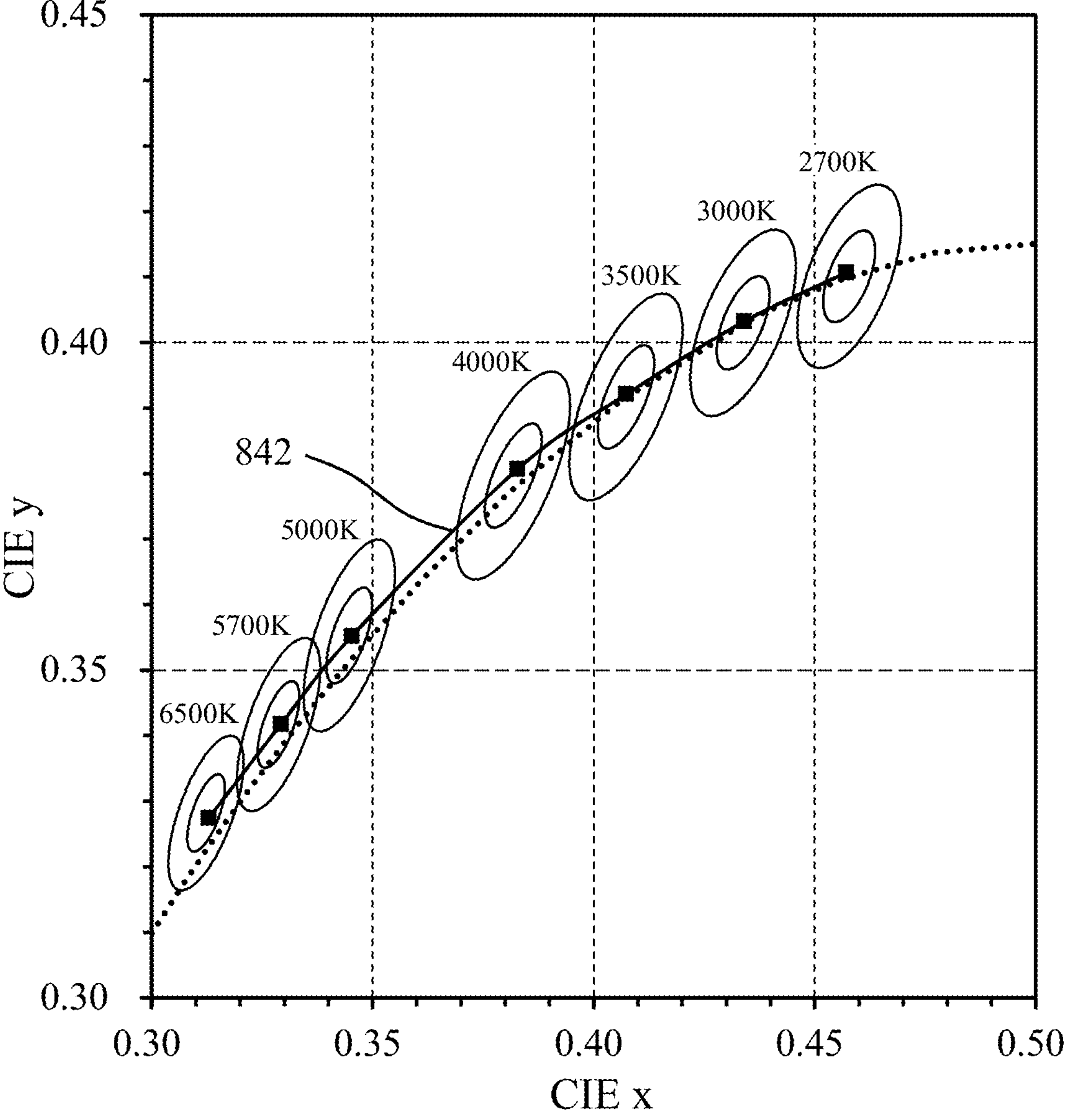

TABLE 5A tabulates measured optical/electrical characteristics of LED-C1, LED-C2, and LED-C3 of Dev.3 and TABLE 5B tabulates CIE region, CIE center point for light C1, C2, and C3 and CCT and Δuv for light C1 and C2. FIG. 8A-8C are measured characteristics lighting device Dev.3 in which FIG. 8A shows spectra, normalized intensity (a.u.) versus wavelength (nm), for light C1 (dotted line), light C2 (solid line), and light C3 (dashed line), FIG. 8B is a CIE 1931 chromaticity diagram illustrating the chromaticity (center point—cross) of light C1, C2, C3, the CIE region for light C1 (solid line/diamond), C2 (solid line/triangle), C3 (solid line/square), gamut of light (solid line) that Dev.3 can generate, and black body locus (dotted line), and FIG. 8C is a CIE 1931 chromaticity diagram illustrating the chromaticity (color) of light (sold square) generated by Dev.3 for nominal CCTs of 2700K, 3000K, 3500K, 4000K, 4500K, 5000K, 5700K, and 6500K, light emission locus (solid line) for CCTs from 2700K to 6500K, black body locus (dotted line), and 3 SDCM and 6 SDCM (Mac Adam ellipses—thin solid line);

As can be seen from TABLE 5A: LED-C1 has a luminous efficacy (LE) of 119 lm/W and generates light of chromaticity (color point: CIE 0.5280, 0.4385, Δuv=0.0073) corresponding to a CCT of 2144K (about 2100K) with a CRI Ra of 74.4 (about 75); LED-C2 has a luminous efficacy of 164 lm/W and generates light of chromaticity (color point: CIE 0.3661, 0.4219, Δuv=0.0242) corresponding to a CCT of 4623K (about 4600K) with a CRI Ra of 69.5 (about 70); and LED-C3 has a luminous efficacy of 120 lm/W and generates light with a chromaticity (color point: CIE 0.2121, 0.2383). C1 comprises a CIE region (C1 CIE region) defined by CIE color coordinates CIE-1 (0.511, 0.435), CIE-2 (0.518, 0.415), CIE-3 (0.545, 0.441), and CIE-4 (0.537, 0.461) which in terms of CCT is from 2203K (about 2200K) to 2279K (about 2300K). C2 comprises a CIE region (C2 CIE Region) defined by CIE color coordinates CIE-1 (0.353, 0.428), CIE-2 (0.356, 0.396), CIE-3 (0.379, 0.415), and CIE-4 (0.376, 0.448) which in terms of CCT is from about 4276K (about 4250K) to 4973K (about 4980K). C3 comprises a CIE region (C3 CIE Region) defined by CIE color coordinates CIE-1 (0.200, 0.244), CIE-2 (0.205, 0.212), CIE-3 (0.225, 0.232), and CIE-4 (0.219, 0.265)—TABLE 5B. The CIE chromaticity diagram of FIG. 8B shows each of the CIE regions: C1 CIE region $\mathbf{844}_{C1}$ (diamond/solid line), C2 CIE region $\mathbf{844}_{C2}$ (triangle/solid line), and C3 CIE Region $\mathbf{844}_{C3}$ (square/solid line).

As can be seen from FIG. 8A, the emission spectrum for the LED-C1 (solid line) is composed primarily of a broad emission peak in the orange to red region of the spectrum and the emission spectrum for LED-C3 (dashed line) is composed primarily of blue light with a low intensity tail at wavelengths in the green to yellow region of the spectrum.

Referring to FIG. 8A the emission spectrum for LED-C1 (dotted line) primarily comprises a broadband peak (FWHM≈90 nm) with a peak emission wavelength of about 530 nm at about 610 nm in the red region of the visible spectrum. The emission spectrum for the LED-C2 (solid line) comprises a narrowband peak (FWHM≈20 nm) with a peak emission wavelength at about 450 nm in the blue region if the visible spectrum and a broadband peak (FWHM≈130 nm) with a peak emission wavelength of about 570 nm in the yellow region of the visible spectrum. The emission spectrum for the LED-C3 (dashed line) comprises a narrowband peak (FWHM≈20 nm) with a peak emission wavelength of about 450 nm in the blue region of the visible spectrum and a lower intensity (about 25%) tail at wavelengths in the green to yellow region of the spectrum (460-580 nm).

TABLE 5A

Dev. 3: Measured characteristics of LED-C1, LED-C2, and LED-C3

| LED | Flux (lm) | Power (W) | LE (lm/W) | CIE center point x | CIE center point y | CCT (K) | CRI Ra | Δuv |
|---|---|---|---|---|---|---|---|---|
| LED-C1 | 44.9 | 0.376 | 119 | 0.5280 | 0.4385 | 2144 | 74.4 | 0.0073 |
| LED-C2 | 61.6 | 0.376 | 164 | 0.3661 | 0.4219 | 4623 | 69.5 | 0.0242 |
| LED-C3 | 45.0 | 0.376 | 120 | 0.2121 | 0.2383 | n/a | n/a | n/a |

TABLE 5B

Dev. 3: CIE region for light C1, C2, and C3

| | C1 CIE region | | | | C2 CIE region | | | | C3 CIE region | |
|---|---|---|---|---|---|---|---|---|---|---|
| | CIE | | CCT | | CIE | | CCT | | CIE | |
| CIE point | x | y | (K) | Δuv | x | Y | (K) | Δuv | x | y |
| CIE-1 | 0.511 | 0.435 | 2279 | 0.0061 | 0.353 | 0.428 | 4973 | 0.0310 | 0.200 | 0.244 |
| CIE-2 | 0.518 | 0.415 | 2084 | 0.0002 | 0.356 | 0.396 | 4797 | 0.0167 | 0.205 | 0.212 |
| CIE-3 | 0.545 | 0.441 | 2019 | 0.0085 | 0.379 | 0.415 | 4276 | 0.0174 | 0.225 | 0.232 |
| CIE-4 | 0.537 | 0.461 | 2203 | 0.0137 | 0.376 | 0.448 | 4494 | 0.0314 | 0.219 | 0.265 |
| Center | 0.5280 | 0.4385 | 2144 | 0.0073 | 0.3661 | 0.4219 | 4623 | 0.0242 | 0.2121 | 0.2383 |

The CIE chromaticity diagram of FIG. 8B shows the chromaticity (center color point) 832C1 of light of color C1 generated by the LED-C1, the chromaticity (center color point) 832$_{C2}$ of light of color C2 generated by LED-C2, and the chromaticity (center color point) 832C3 of light of color C3 generated by the LED-C3. Straight lines 834$_{C1C2}$, 834$_{C2C3}$, and 832$_{C1C3}$ connecting the points 832$_{C1}$, 832$_{C2}$, and 832$_{C3}$ define a triangle that represents the gamut of chromaticity (colors)/color temperatures of light that Dev.3 can generate—i.e., the device can generate any chromaticity (color)/color temperature of light lying on the boundary or within the triangle. It is to be noted that lowest CCT of light that Dev.3 can generate that lies on the black body locus (dashed line) is 2349K (2350K) which corresponds to the point of intersection 846 (CIE 0.491, 0.415) of line 834$_{C1C3}$ connecting color points 832$_{C1}$ to 832$_{C3}$ and the black body locus. It is to be noted that highest CCT of light that Dev.3 can generate that lies on the black body locus (dashed line) is about 12404K (about 12000K) which corresponds to the point of intersection 848 (CIE 0.271, 0.275) of line 834$_{C1C3}$ connecting color point 832$_{C1}$ to color point 832$_{C3}$ and the black body locus. It will be appreciated that Dev.3 is therefore capable of generating any CCT of light from 2350K to about 12000K lying on the black body locus.

TABLE 6 tabulates forward drive current ($I_F$) for first and second LED-C1, LED-C2, and LED-C3 of Dev.3 for generating light with a nominal general color rendering index CRI Ra of 80 for nominal color temperatures (CCT) from 2700K, 3000K, 3500K, 4000K, 5000K, 5700K, and 6500K. TABLE 7 tabulates the measured optical and electrical characteristics for Dev.3 when operated to generate light with a nominal CRI Ra of 80 for nominal color temperatures (CCT) from 2700K to 6500K.

As can be seen from TABLE 6, the CCT of light generated by Dev.3 is increased by increasing the proportion of light of color C3 while reducing the proportion of light of color C1. TABLE 7 demonstrates that by selection of the drive currents to the first and second LED-C1, LED-C2, and LED-C3, Dev.3 can generate white light with a CCT from 2700 K to 6500K with a general color rendering index CRI Ra of about 80 (81.1 to 84.4) and CRI R9 of up to about 9 (−2.5 to 10.4) with a luminous efficacy from about 130 lm/W (130.1 lm/W) to about 140 lm/W (139.9 lm/W). The reduction of the value of CRI R9 compared with that of Dev.2 is due to the absence of the narrowband red phosphor. TABLE 7 also includes the measured CCT of light generated by Dev.3.

Referring to FIG. 8C it is to be noted that Dev.3 can generate light 842 (solid line) of CCTs from 2700K to 6500K with a chromaticity that closely matches the black body locus (dotted line). As can be seen from TABLE 7, the chromaticity of light generated by Dev.3 are within 0.0034 Δuv (about 0.003) or less of the black body locus for CCTs from 2700K to 6500K.

TABLE 6

Dev. 3: Forward drive current $I_F$ for the 1st LED-C1, 2nd LED-C1, LED-C2, and LED-C3 for generating light with a nominal CRI Ra = 80 for nominal CCTs from 2700K to 6500K

| Nom. CCT | Forward drive current $I_F$ (mA) | | | |
|---|---|---|---|---|
| (K) | 1st LED-C1 | 2nd LED-C1 | LED-C2 | LED-C3 |
| 2700 | 123 | 123 | 52 | 22 |
| 3000 | 106 | 106 | 78 | 30 |
| 3500 | 88 | 88 | 101 | 42 |
| 4000 | 71 | 71 | 120 | 58 |
| 5000 | 53 | 53 | 120 | 94 |
| 5700 | 46 | 46 | 116 | 112 |
| 6500 | 39 | 39 | 108 | 133 |

TABLE 7

Dev. 3: Measured optical and Electrical characteristics for nominal CRI Ra = 80 for nominal color temperatures (CCT) from 2700 K to 6500 K

| Nom. | Flux | Power | LE | CIE | | CCT | CRI | | |
|---|---|---|---|---|---|---|---|---|---|
| CCT (K) | (lm) | (W) | (lm/W) | x | y | (K) | Ra | R9 | Δuv |
| 2700 | 126.7 | 0.97 | 130.1 | 0.4599 | 0.4129 | 2717 | 81.1 | −2.5 | 0.0008 |
| 3000 | 130.4 | 0.97 | 133.9 | 0.4341 | 0.4043 | 3050 | 82.5 | 2.1 | 0.0005 |
| 3500 | 133.5 | 0.97 | 137.2 | 0.4080 | 0.3935 | 3464 | 83.2 | 5.1 | 0.0006 |
| 4000 | 136.2 | 0.97 | 139.9 | 0.3818 | 0.3809 | 3993 | 83.3 | 5.6 | 0.0015 |
| 5000 | 136.2 | 0.97 | 139.9 | 0.3450 | 0.3552 | 5015 | 83.8 | 7.0 | 0.0018 |
| 5700 | 135.8 | 0.97 | 139.4 | 0.3296 | 0.3434 | 5625 | 84.3 | 9.3 | 0.0025 |
| 6500 | 134.6 | 0.97 | 138.3 | 0.3134 | 0.3301 | 6459 | 84.4 | 10.4 | 0.0034 |

Color-Temperature-Tunable Lighting Device—Dev.4

A color-temperature-tunable lighting device, denoted Dev.4, comprises LEDs that generate light of three different colors/CCTs: C1, C2, and C3. Lighting device Dev.4 comprises the device of FIGS. 3A-3C and comprises a 3838 four cavity package containing two LEDs, LED-C1, that generate light with a first chromaticity/color temperature C1, an LED, LED-C2, that generates of a second chromaticity/color temperature C2, and an LED, LED-C3, that generates light of a third chromaticity/color temperature C3. The two C1 LEDs, in the first and second cavities, comprise a PC LED comprising a mixture of green to red photoluminescence materials (e.g., GaYAG, GaLuAG, and/or $(Y,Lu)_3(Al,Ga)_5O_{12}$ and CASN) and a narrowband red phosphor (e.g., KSF). The green to red and narrowband red phosphor are incorporated in a light transmissive encapsulant (e.g., phenyl silicone) and the mixture dispensed into the first and second cavities to cover the violet to blue InGaN LED chip. LED-C2, in the third cavity, comprises a PC LED comprising a mixture of green to red photoluminescence materials (e.g., GaYAG, GaLuAG, and/or $(Y,Lu)_3(Al,Ga)_5O_{12}$ and CASN) and a narrowband red phosphor (e.g., KSF). The green to red phosphors and narrowband red phosphor are incorporated in a light transmissive encapsulant (e.g., phenyl silicone) and the mixture dispensed into the third cavity of the package to cover the violet to blue InGaN LED chip. LED-C3, in the fourth cavity, comprises a PC LED comprising green to yellow photoluminescence materials (e.g., YAG, LuAG, GaYAG, GaLuAG, and/or $(Y,Lu)_3(Al,Ga)_5O_{12}$). The green to yellow phosphor is incorporated in a light transmissive encapsulant (e.g., phenyl silicone) and the mixture dispensed into the fourth cavity of the package to cover the violet to blue InGaN LED chip. Lighting device Dev.4 is configured to generate light with a general color rendering index CRI Ra of 90.

Figure 9A:
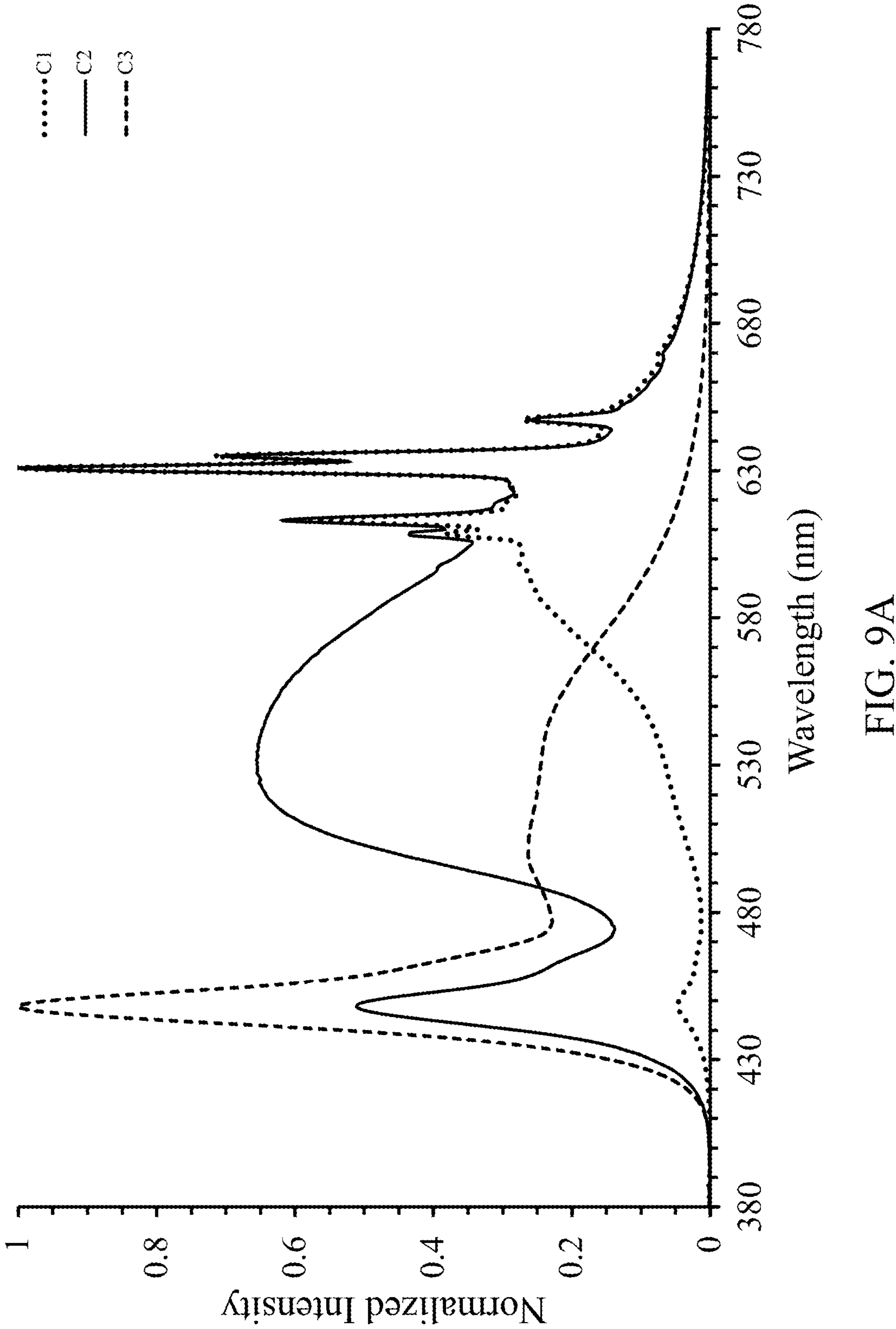
Figure 9B:
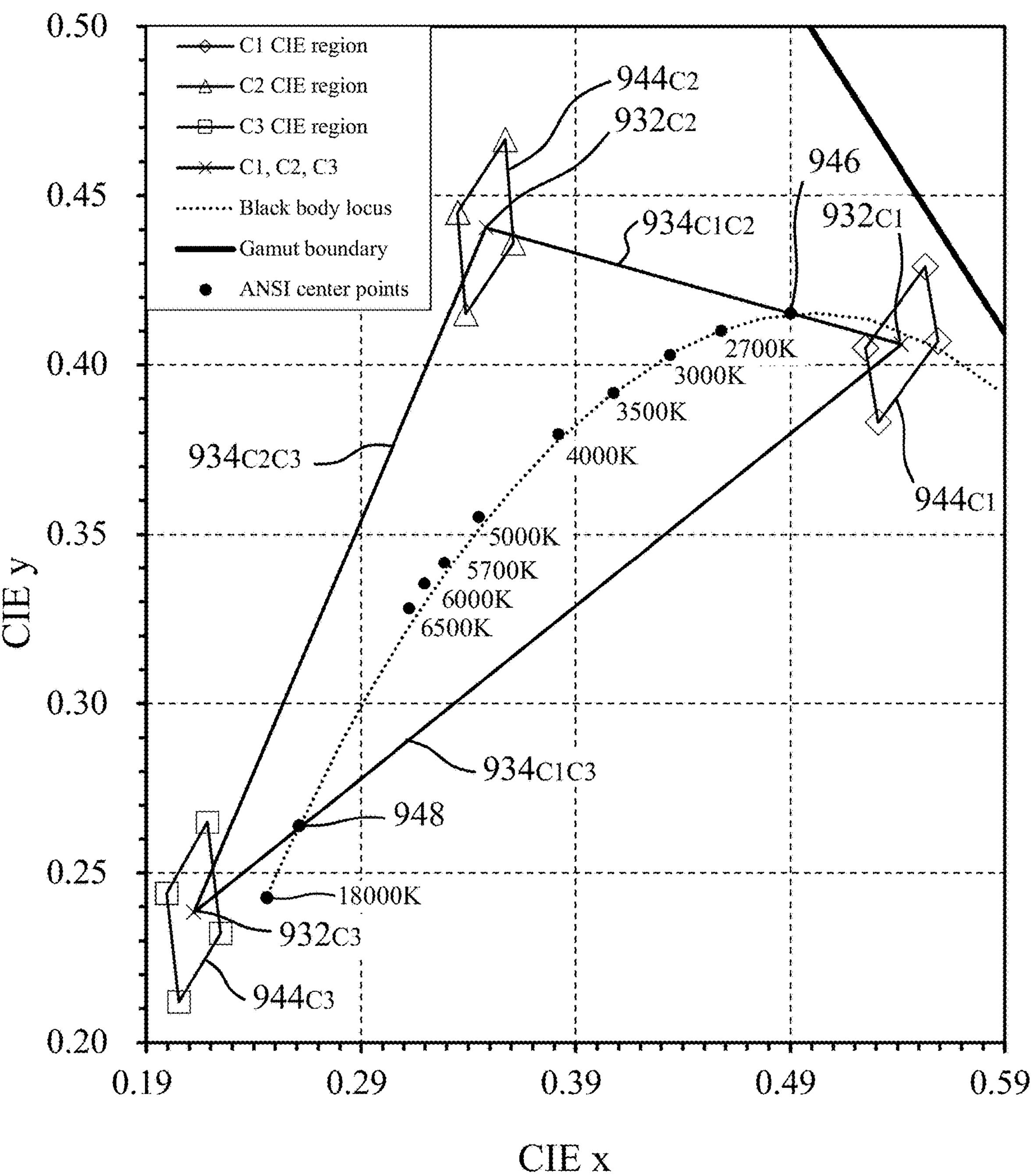
Figure 9C:
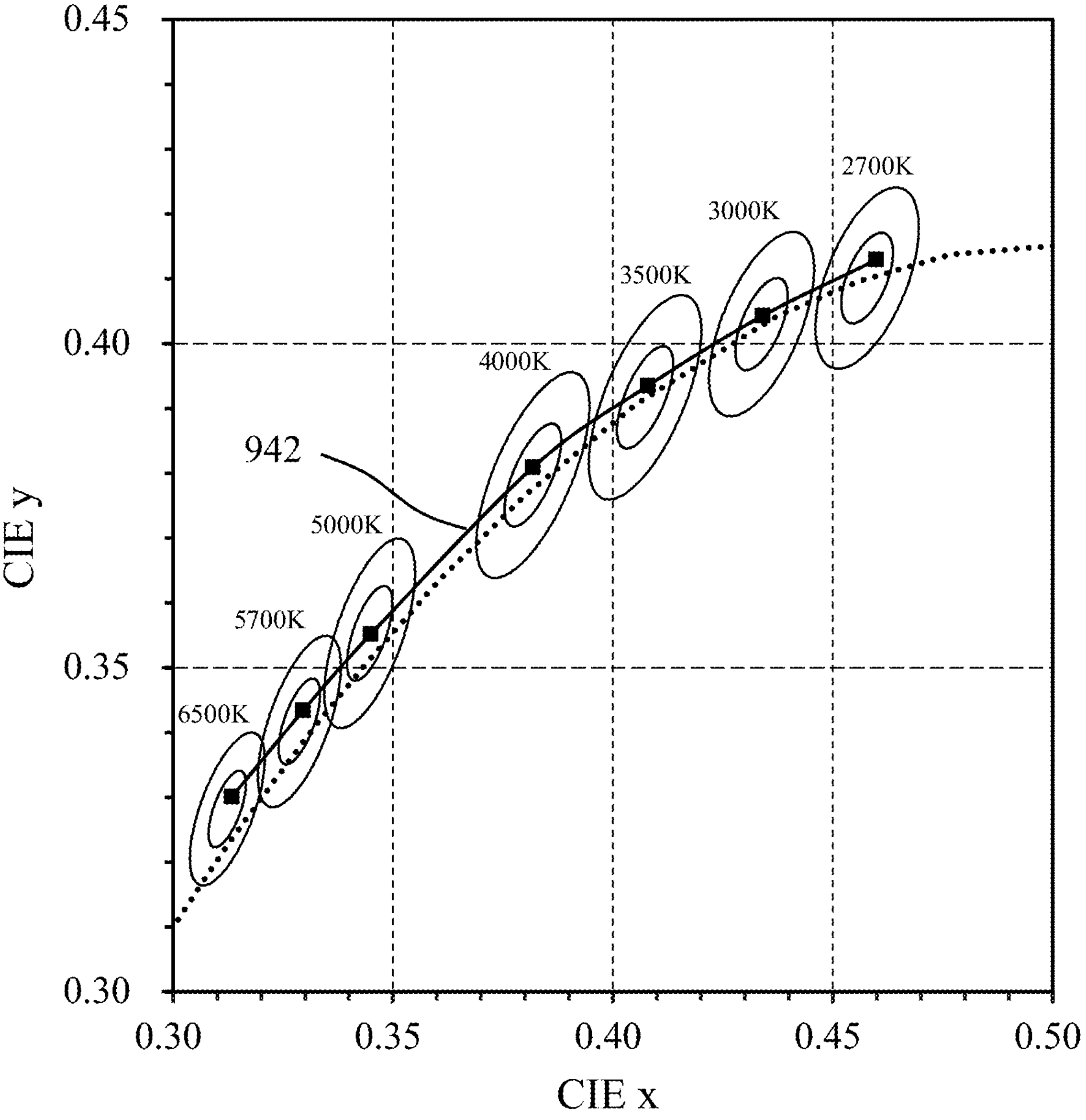

TABLE 8A tabulates measured optical/electrical characteristics of LED-C1, LED-C2, and LED-C3 of lighting device Dev.4 and TABLE 8B tabulates CIE region, CIE center point for light C1, C2, and C3 and CCT and Δuv for light C1 and C2. FIG. 9A-9C are measured characteristics for Dev.4 in which FIG. 9A shows spectra, normalized intensity (a.u.) versus wavelength (nm), for light C1 (dotted line), light C2 (solid line), and light C3 (dashed line), FIG. 9B is a CIE 1931 chromaticity diagram illustrating the chromaticity (center point—cross) of light C1, C2, C3, the CIE region for light C1 (solid line/diamond), C2 (solid line/triangle), C3 (solid line/square), gamut of light (solid line) that Dev.4 can generate, and black body locus (dotted line), and FIG. 9C is a CIE 1931 chromaticity diagram illustrating the chromaticity (color) of light (solid square) generated by Dev.4 for nominal CCTs of 2700K, 3000K, 3500K, 4000K, 4500K, 5000K, 5700K, and 6500K, light emission locus (solid line) for CCTs from 2700K to 6500K, black body locus (dotted line), and 3 SDCM and 6 SDCM (Mac Adam ellipses—thin solid line).

As can be seen from TABLE 8A: LED-C1 has a luminous efficacy (LE) of 107 lm/W and generates light of chromaticity (color point: CIE 0.5418, 0.4060, Δuv=−0.0012) corresponding to a CCT of 1840K (about 1800K) with a CRI Ra of 77.7 (about 78); LED-C2 has a luminous efficacy of 156 lm/W and generates light of chromaticity (color point: CIE 0.3481, 0.4405, Δuv=0.0375) corresponding to a CCT of 5122K (about 5100K) with a CRI Ra of 73.4 (about 70); and LED-C3 has a luminous efficacy of 120 lm/W and generates light with a chromaticity (color point: CIE 0.2121, 0.2383). C1 comprises a CIE region (C1 CIE region) defined by CIE color coordinates CIE-1 (0.525, 0.405), CIE-2 (0.531, 0.383), CIE-3 (0.559, 0.407), and CIE-4 (0.553, 0.429) which in terms of CCT is from 1728K (about 1700K) to 1962K (about 1970K). C2 comprises a CIE region (C2 CIE Region) defined by CIE color coordinates CIE-1 (0.335, 0.445), CIE-2 (0.339, 0.415), CIE-3 (0.361, 0.436), and CIE-4 (0.357, 0.467) which in terms of CCT is from about 4796K (about 4800K) to 5455K (about 5460K). C3 comprises a CIE region (C3 CIE Region) defined by CIE color coordinates CIE-1 (0.200, 0.244), CIE-2 (0.205, 0.212), CIE-3 (0.225, 0.232), and CIE-4 (0.219, 0.265)—TABLE 8B. The CIE chromaticity diagram of FIG. 9B shows each of the CIE regions: C1 CIE region $\mathbf{944}_{C1}$ (diamond/solid line), C2 CIE region $\mathbf{944}_{C2}$ (triangle/solid line), and C3 CIE Region $\mathbf{944}_{C3}$ (square/solid line).

Referring to FIG. 9A the emission spectrum for LED-C1 (dotted line) primarily comprises a broadband peak (at about 610 nm) in the red region of the visible spectrum with multiple higher intensity narrowband peaks (FWHM≈5 nm) from about 610-650 nm (maximum intensity peak at ≈632 nm). The emission spectrum for the LED-C2 (solid line) comprises a narrowband peak (FWHM≈20 nm) with a peak emission wavelength at about 450 nm in the blue region if the visible spectrum and a higher intensity broadband peak (FWHM≈110 nm) with a peak emission wavelength of about 530 nm in the green region of the visible spectrum with multiple higher intensity narrowband peaks (FWHM≈5 nm) from about 610-650 nm (maximum intensity peak at 632 nm) in the orange to red region of the visible spectrum. The emission spectrum for the LED-C3 (dashed line) comprises a narrowband peak (FWHM≈20 nm) with a peak emission wavelength of about 450 nm in the blue region of the visible spectrum and a lower intensity (about 25%) tail at wavelengths in the green to yellow region of the spectrum (460-580 nm).

TABLE 8A

Dev. 4: Measured characteristics of LED-C1, LED-C2, and LED-C3

| LED | Flux (lm) | Power (W) | LE (lm/W) | CIE center point x | CIE center point y | CCT (K) | CRI Ra | Δuv |
|---|---|---|---|---|---|---|---|---|
| LED-C1 | 40.1 | 0.376 | 107 | 0.5418 | 0.4060 | 1840 | 77.7 | −0.0012 |
| LED-C2 | 58.7 | 0.376 | 156 | 0.3481 | 0.4405 | 5122 | 73.4 | 0.0375 |
| LED-C3 | 45.0 | 0.376 | 120 | 0.2121 | 0.2383 | n/a | n/a | n/a |

TABLE 8B

| Dev. 4: CIE region for light C1, C2, and C3 | | | | | | | | | | |
|---|---|---|---|---|---|---|---|---|---|---|
| | C1 CIE region | | | | C2 CIE region | | | | C3 CIE region | |
| | CIE | | CCT | | CIE | | CCT | | CIE | |
| CIE point | x | y | (K) | Δuv | x | y | (K) | Δuv | x | y |
| CIE-1 | 0.525 | 0.405 | 1962 | −0.0025 | 0.335 | 0.445 | 5455 | 0.0438 | 0.200 | 0.244 |
| CIE-2 | 0.531 | 0.383 | 1783 | −0.0086 | 0.339 | 0.415 | 5328 | 0.0309 | 0.205 | 0.212 |
| CIE-3 | 0.559 | 0.407 | 1728 | 0.0005 | 0.361 | 0.436 | 4796 | 0.0315 | 0.225 | 0.232 |
| CIE-4 | 0.553 | 0.429 | 1891 | 0.0058 | 0.357 | 0.467 | 4966 | 0.0442 | 0.219 | 0.265 |
| Center | 0.5418 | 0.4060 | 1840 | −0.0012 | 0.3481 | 0.4405 | 5122 | 0.0375 | 0.2121 | 0.2383 |

The CIE chromaticity diagram of FIG. 9B shows the chromaticity (center color point) 932C1 of light of color C1 generated by the LED-C1, the chromaticity (center color point) 932$_{C2}$ of light of color C2 generated by LED-C2, and the chromaticity (center color point) 932$_{C3}$ of light of color C3 generated by the LED-C3. Straight lines 934$_{C1C2}$, 934$_{C2C3}$, and 932$_{C1C3}$ connecting the points 932$_{C1}$, 932$_{C2}$, and 932$_{C3}$ define a triangle that represents the gamut of chromaticity (colors)/color temperatures of light that Dev.4 can generate—i.e., the device can generate any chromaticity (color)/color temperature of light lying on the boundary or within the triangle. It is to be noted that lowest CCT of light that Dev.4 can generate that lies on the black body locus (dashed line) is about 2300K (2338K) which corresponds to the point of intersection 946 (CIE 0.492, 0.415) of line 934$_{C1C3}$ connecting color points 932$_{C1}$ to 932$_{C3}$ and the black body locus. It is to be noted that highest CCT of light that Dev.4 can generate that lies on the black body locus (dotted line) is about 16137K (about 16000K) which corresponds to the point of intersection 948 (CIE 0.262, 0.264) of line 934$_{C1C3}$ connecting color point 932$_{C1}$ to color point 932$_{C3}$ and the black body locus. It will be appreciated that Dev.4 is therefore capable of generating any CCT of light from 2300K to about 16000K lying on the black body locus.

TABLE 9 tabulates forward drive current ($I_F$) for first and second LED-C1, LED-C2, and LED-C3 of Dev.4 for generating light with a nominal general color rendering index CRI Ra of 90 for nominal color temperatures (CCT) from 2700K, 3000K, 3500K, 4000K, 5000K, 5700K, and 6500K. TABLE 10 tabulates the measured optical and electrical characteristics for Dev.4 when operated to generate light with a nominal CRI Ra of 90 for nominal color temperatures (CCT) from 2700K to 6500K.

As can be seen from TABLE 9, the CCT of light generated by Dev.4 is increased by increasing the proportion of light of color C3 while reducing the proportion of light of color C1. TABLE 10 demonstrates that by selection of the drive currents to the first and second LED-C1, LED-C2, and LED-C3, Dev.4 can generate white light with a CCT from 2700 K to 6500K with a general color rendering index CRI Ra of about 90 (91.3 to 92.6) and CRI R9 of at least 45 (46.3 to 64.8) with a luminous efficacy from about 126 lm/W (126.3 lm/W) to about 133 lm/W (133.1 lm/W). TABLE 10 also includes the measured CCT of light generated by Dev.4.

Referring to FIG. 9C it is to be noted that Dev.4 can generate light 942 (solid line) of CCTs from 2700K to 6500K with a chromaticity that closely matches the black body locus (dotted line). As can be seen from TABLE 10, the chromaticity of light generated by Dev.4 are within 0.0023 Δuv (about 0.002) or less of the black body locus for CCTs from 2700K to 6500K.

TABLE 9

| Dev. 4: Forward drive current $I_F$ for the 1st LED-C1, 2nd LED-C1, LED-C2, and LED-C3 for generating light with a nominal CRI Ra = 90 for nominal CCTs from 2700K to 6500K | | | | |
|---|---|---|---|---|
| Nom. CCT | Forward drive current $I_F$ (mA) | | | |
| (K) | 1st LED-C1 | 2nd LED-C1 | LED-C2 | LED-C3 |
| 2700 | 105 | 105 | 103 | 6 |
| 3000 | 94 | 94 | 115 | 17 |
| 3500 | 81 | 81 | 125 | 32 |
| 4000 | 69 | 69 | 132 | 49 |
| 5000 | 54 | 54 | 125 | 86 |
| 5700 | 49 | 49 | 115 | 107 |
| 6500 | 43 | 43 | 103 | 130 |

TABLE 10

| Dev. 4: Measured optical and Electrical characteristics for nominal CRI Ra = 80 for nominal color temperatures (CCT) from 2700 K to 6500 K | | | | | | | | | |
|---|---|---|---|---|---|---|---|---|---|
| Nom. | Flux | Power | LE | CIE | | CCT | CRI | | |
| CCT (K) | (lm) | (W) | (lm/W) | x | y | (K) | Ra | R9 | Δuv |
| 2700 | 123.0 | 0.97 | 126.3 | 0.4572 | 0.4107 | 2738 | 91.3 | 46.3 | 0.0003 |
| 3000 | 125.3 | 0.97 | 128.7 | 0.4340 | 0.4032 | 3043 | 92.2 | 53.3 | 0.0001 |
| 3500 | 127.4 | 0.97 | 130.8 | 0.4074 | 0.3921 | 3466 | 92.6 | 59.2 | 0.0002 |
| 4000 | 129.2 | 0.97 | 132.7 | 0.3828 | 0.3807 | 3966 | 92.3 | 61.6 | 0.0012 |
| 5000 | 129.6 | 0.97 | 133.1 | 0.3453 | 0.3552 | 5005 | 91.4 | 62.0 | 0.0017 |
| 5700 | 128.9 | 0.97 | 132.4 | 0.3292 | 0.3417 | 5644 | 91.6 | 64.8 | 0.0018 |
| 6500 | 128.0 | 0.97 | 131.5 | 0.3129 | 0.3274 | 6506 | 91.3 | 64.8 | 0.0023 |

Color-Temperature-Tunable Lighting Device—Dev.5

A color-temperature-tunable lighting device, denoted Dev.5, comprises LEDs that generate light of three different colors/CCTs: C1, C2, and C3. Lighting device Dev.5 comprises the device of FIGS. 3A-3C and comprises a 3838 four cavity package containing two LEDs, LED-C1, that generate light with a first chromaticity/color temperature C1, an LED, LED C2, that generates of a second chromaticity/color temperature C2, and an LED, LED-C3, that generates light of a third chromaticity/color temperature C3. In this embodiment, each of the LEDs, LED-C1, LED-C2, and LED-C3 comprise a broadband violet to blue InGaN LED chip with a FWHM from 25 nm to 50 nm. The broadband LED chips may comprise a multi-Quantum Well device.

The two LEDs LED-C1, in the first and second cavities, comprise a PC LED comprising a mixture of green to red photoluminescence materials (e.g., GaYAG, GaLuAG, and/or $(Y,Lu)_3(Al,Ga)_5O_{12}$) and CASN). The green to red phosphor is incorporated in a light transmissive encapsulant (e.g., phenyl silicone) and the mixture dispensed into the first and second cavities to cover the broadband violet to blue InGaN LED chip. LED-C2, in the third cavity, comprises a PC LED comprising a mixture of green to orange photoluminescence materials. The green to orange phosphors are incorporated in a light transmissive encapsulant (e.g., phenyl silicone) and the mixture dispensed into the third cavity of the package to cover the broadband violet to blue InGaN LED chip. LED-C3, in the fourth cavity, comprises a PC LED comprising green to yellow photoluminescence materials (e.g., GaYAG, GaLuAG, $(Y,Lu)_3(Al,Ga)_5O_{12}$. YAG and/or LuAG). The green to yellow phosphors are incorporated in a light transmissive encapsulant (e.g., phenyl silicone) and the mixture dispensed into the fourth cavity of the package to cover the broadband violet to blue InGaN LED chip. Color-temperature-tunable Lighting device Dev.5 is configured to generate light with a CCT from 2700K to 6500K and a general Color Rendering Index CRI Ra of 97.

Figure 10A:
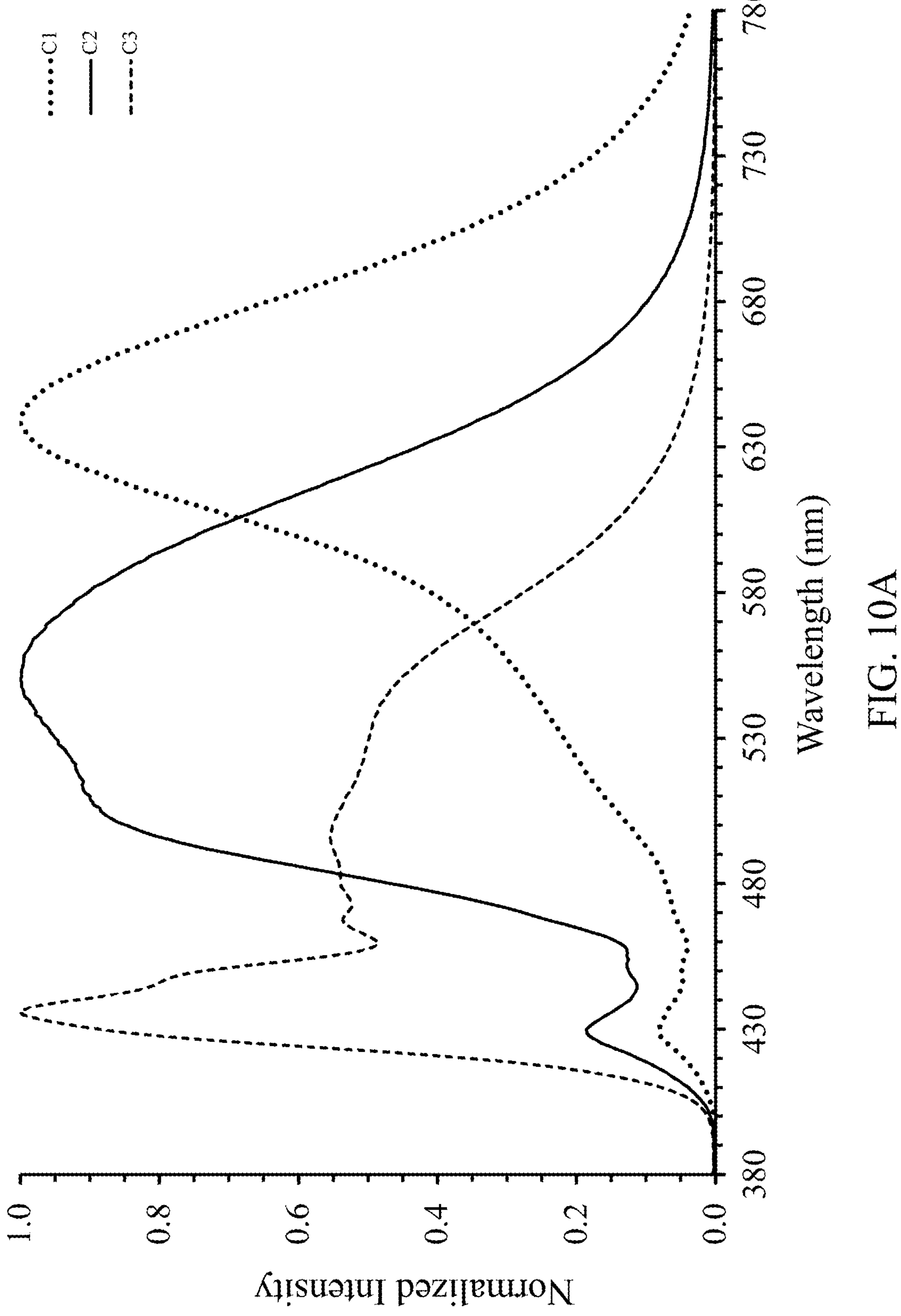
Figure 10B:
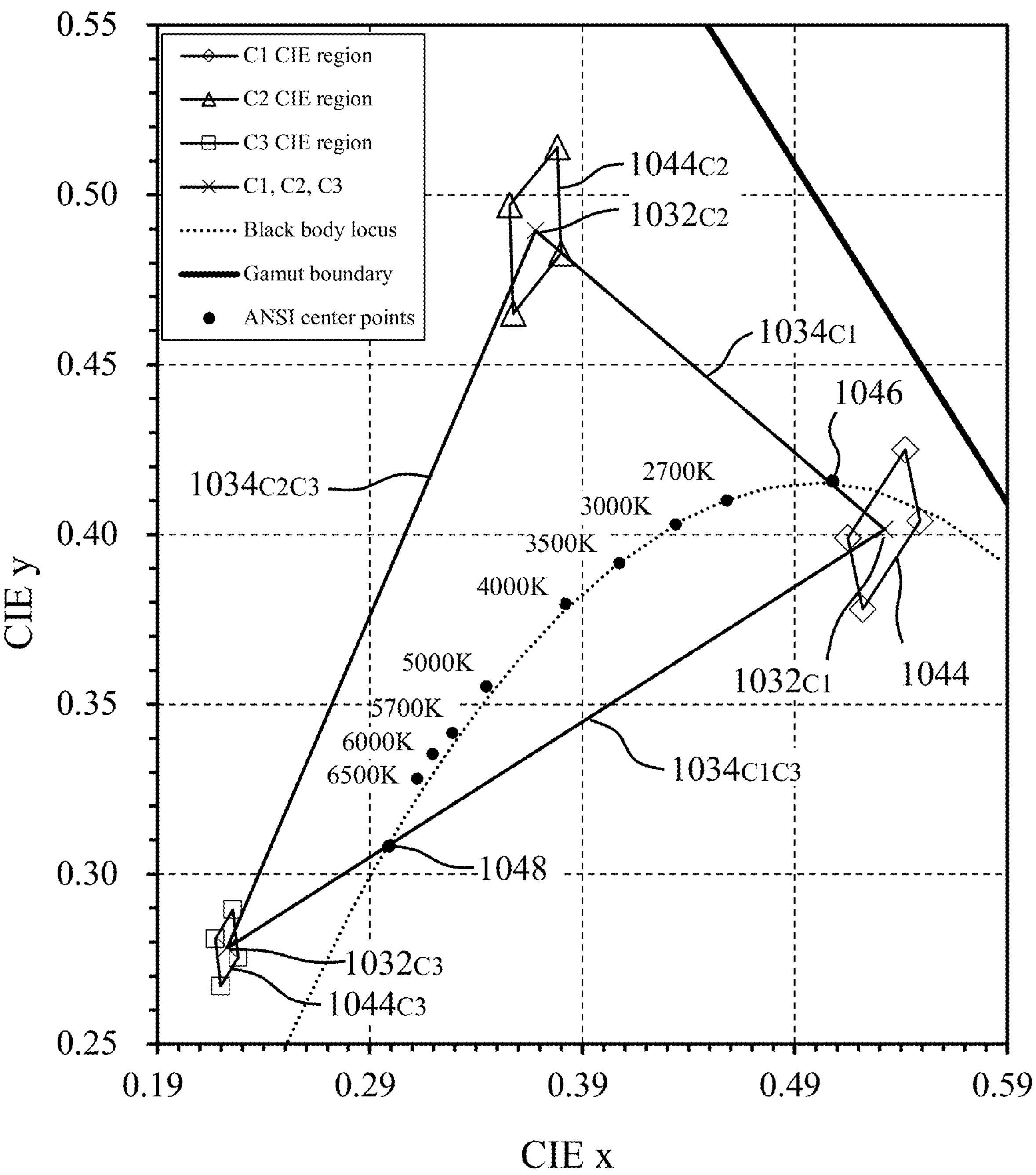
Figure 10C:
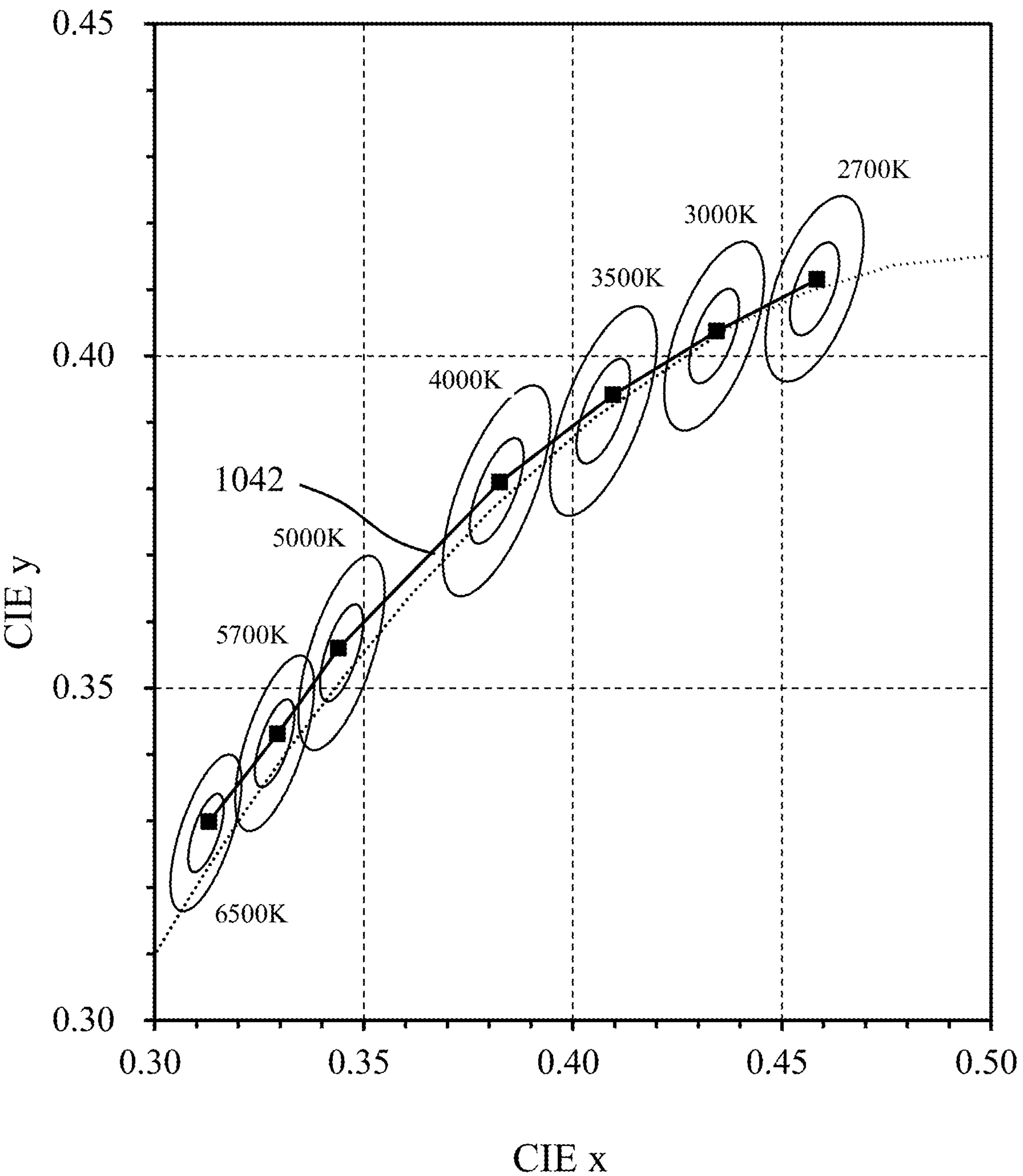
Figure 10D:
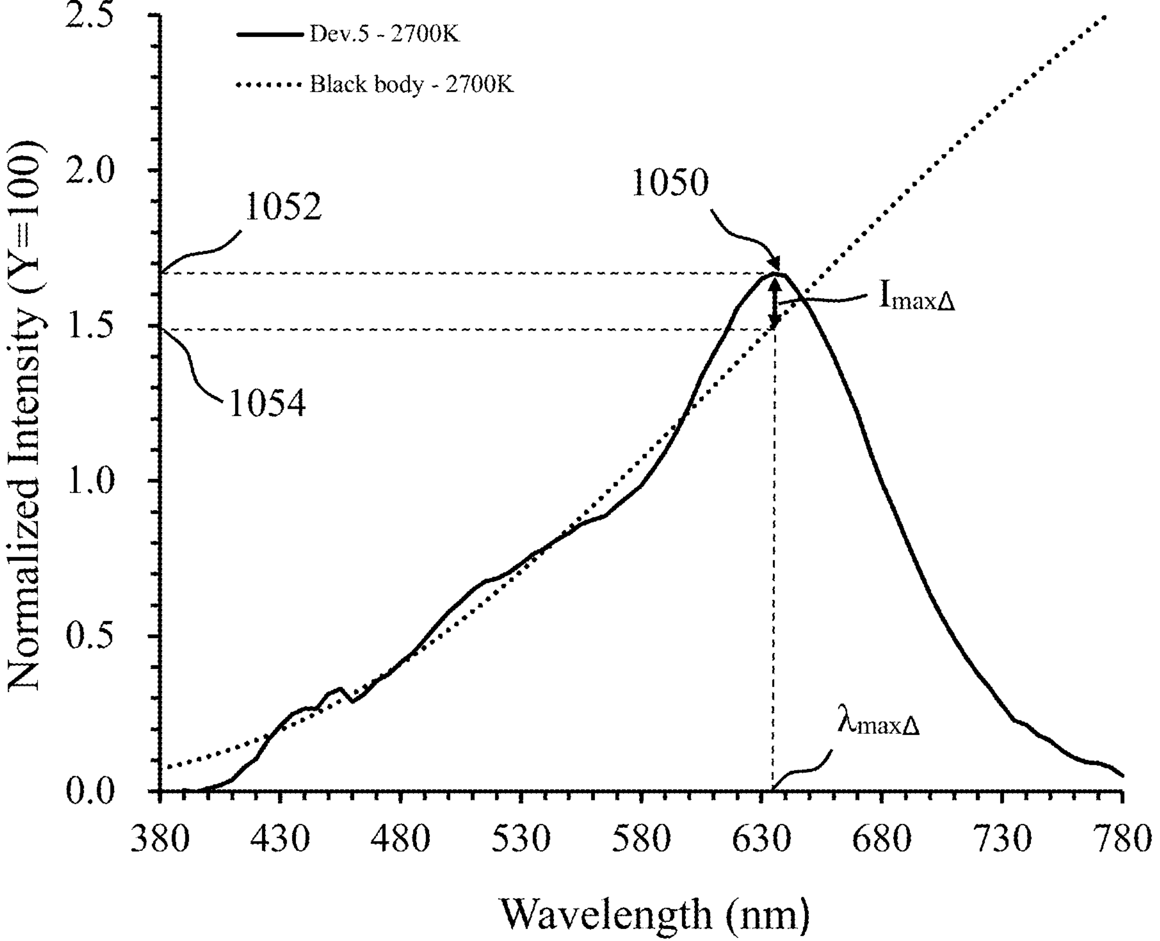
Figure 10E:
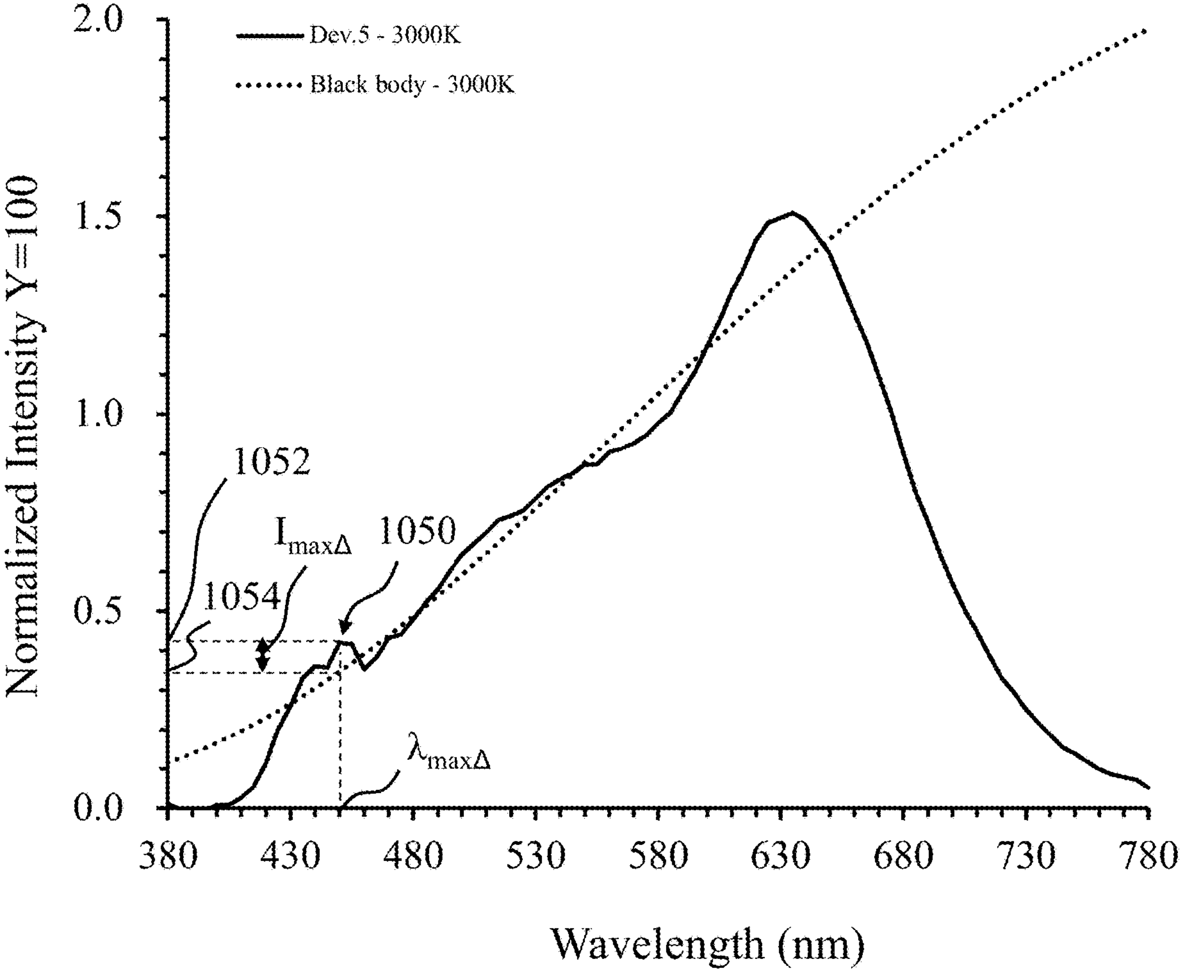
Figure 10F:
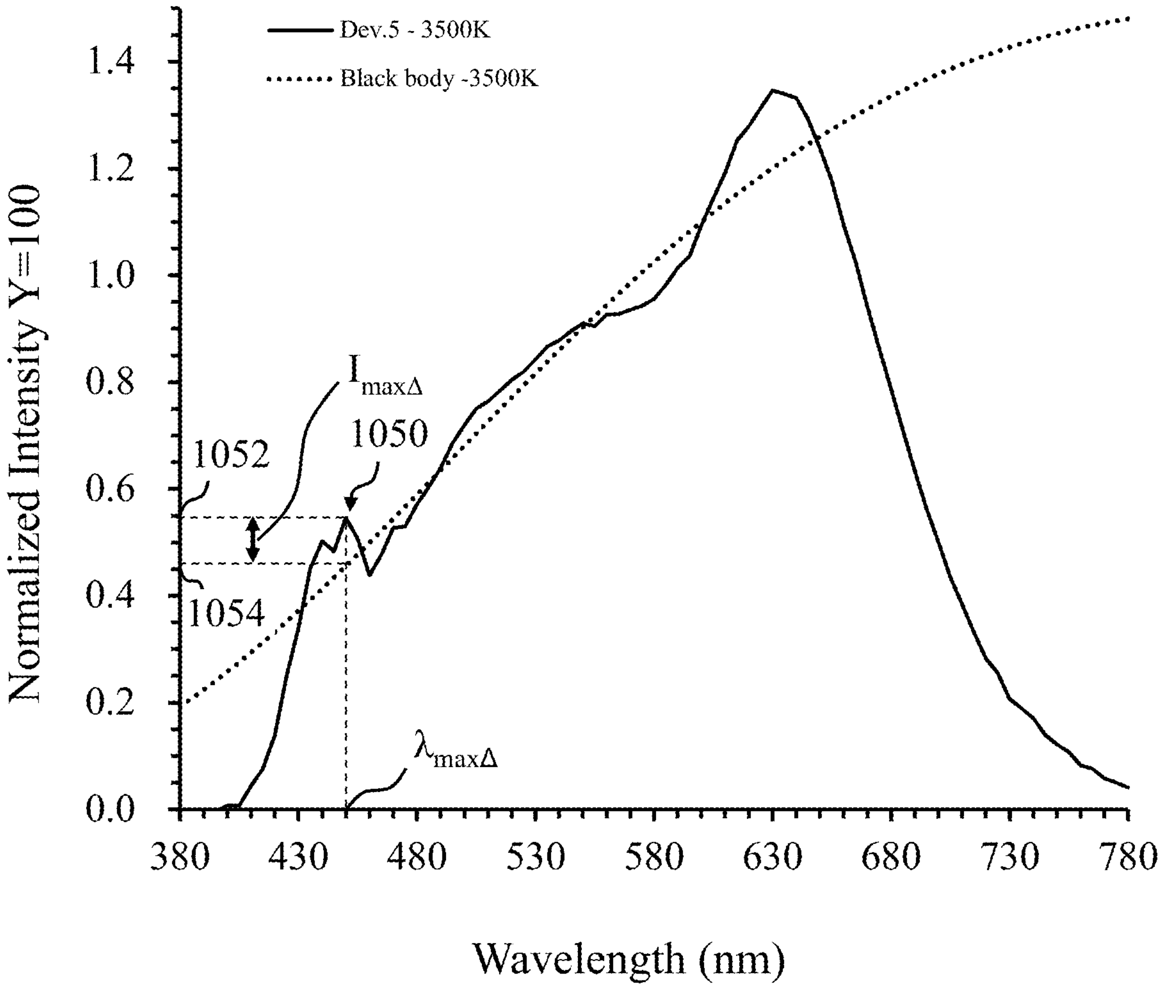
Figure 10G:
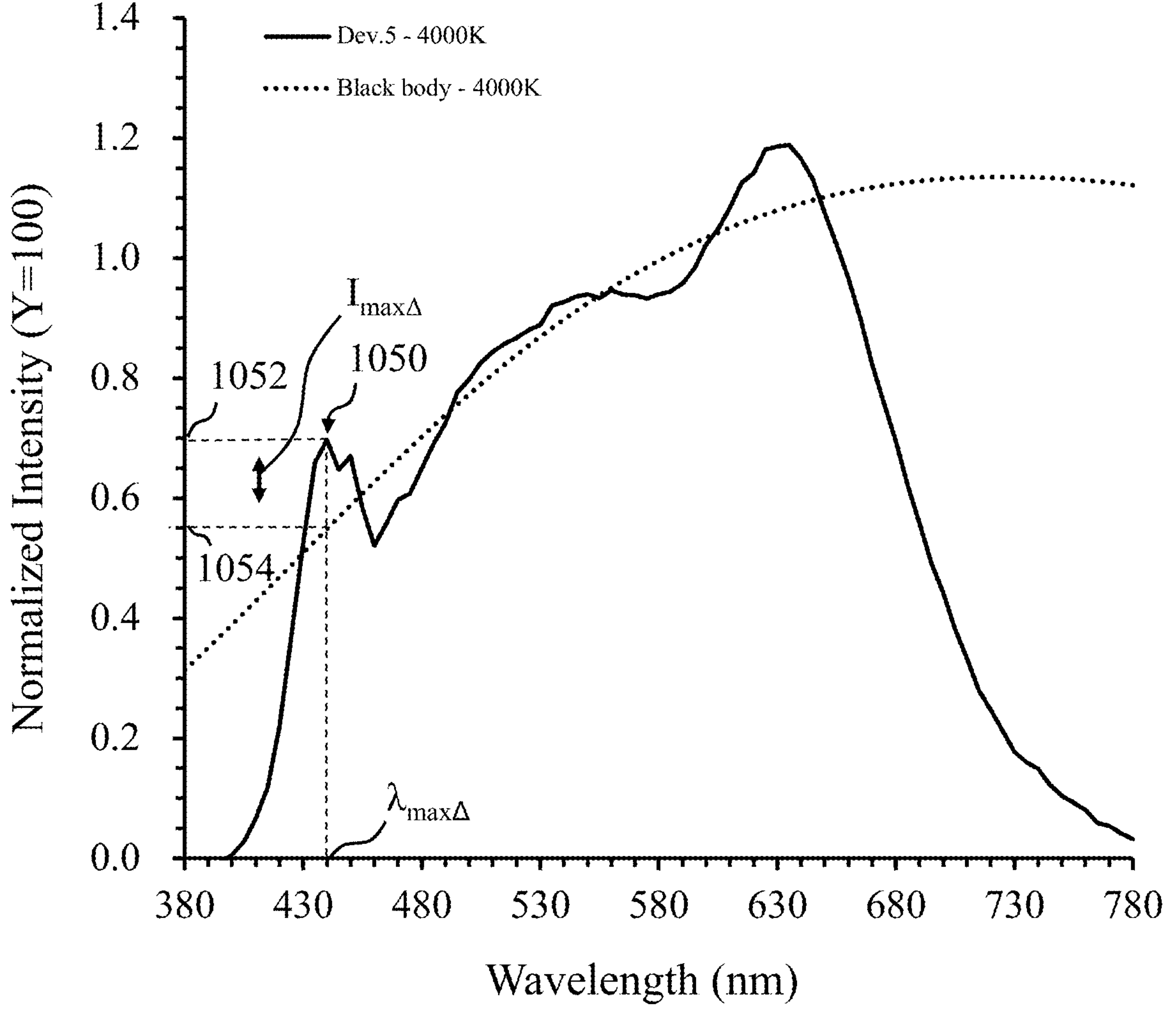
Figure 10H:
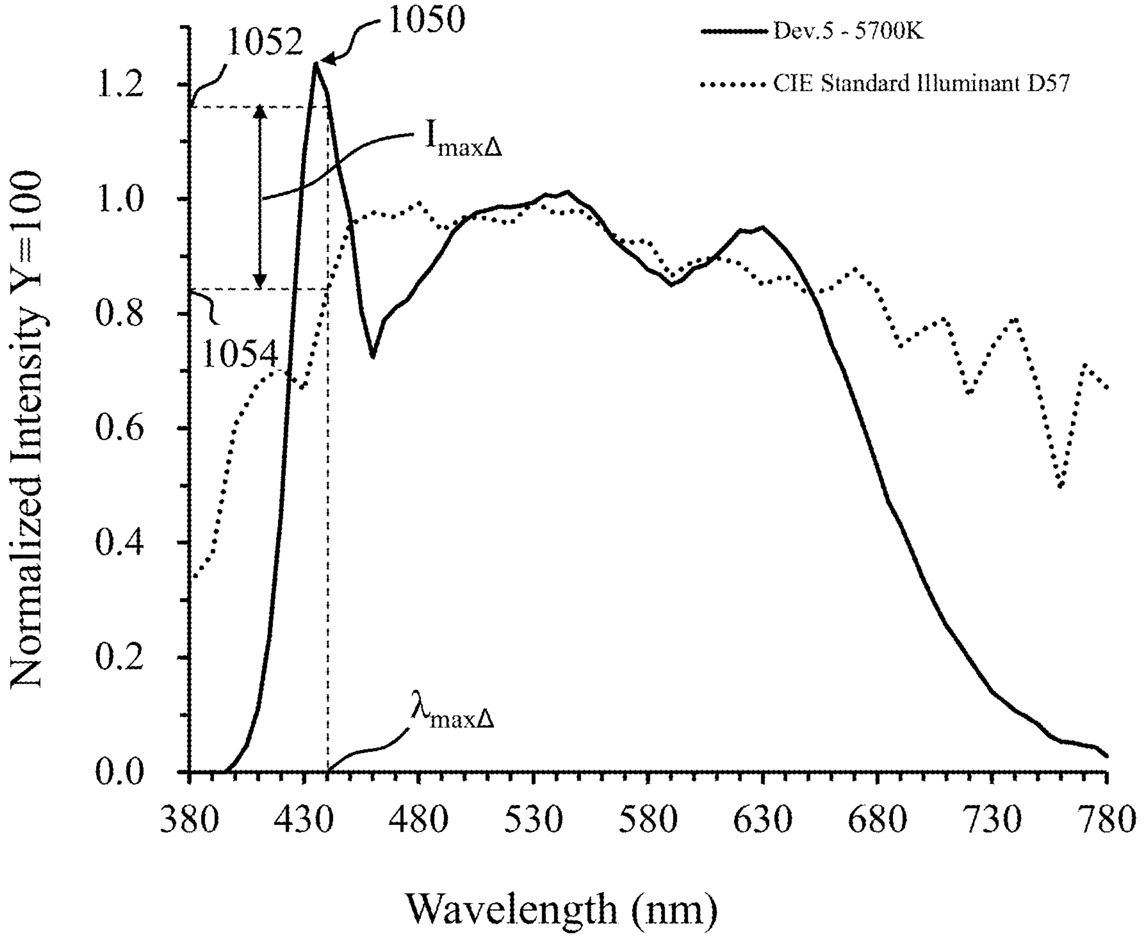
Figure 10I:
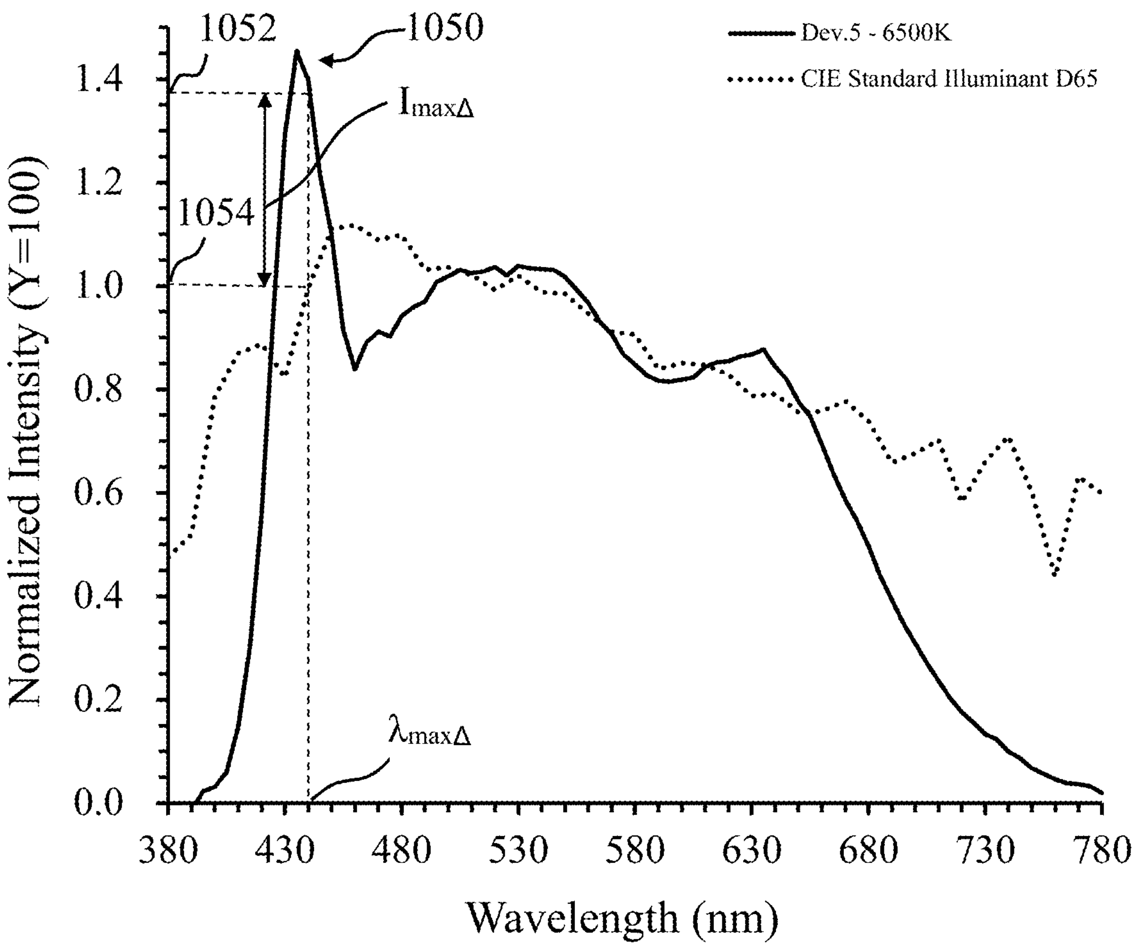

TABLE 11A tabulates measured optical/electrical characteristics of LED-C1, LED-C2, and LED-C3 of Dev.5 and TABLE 11B tabulates CIE region, CIE center point for light C1, C2, and C3 and CCT and Δuv for light C1 and C2. FIG. 10A-10C are measured characteristics for Dev.5 in which FIG. 10A shows spectra, normalized intensity (a.u.) versus wavelength (nm), for light C1 (dotted line), light C2 (solid line), and light C3 (dashed line), FIG. 11B is a CIE 1931 chromaticity diagram illustrating the chromaticity (center point—cross) of light C1, C2, C3, the CIE region for light C1 (diamond/solid line), C2 (triangle/solid line), C3 (square/solid line), gamut of light (solid line) that Dev.5 can generate, and black body locus (dotted line), and FIG. 10C is a CIE 1931 chromaticity diagram illustrating the chromaticity (color) of light (sold square) generated by Dev.5 for nominal CCTs of 2700K, 3000K, 3500K, 4000K, 4500K, 5000K, 5700K, and 6500K, light emission locus (solid line) for CCTs from 2700K to 6500K, black body locus (dashed line), and 3 SDCM and 6 SDCM (Mac Adam ellipses—thin solid line). FIGS. 10D-10I are measured emission spectra, normalized intensity (a.u.) versus wavelength (nm), for Dev.5 in which: FIG. 10D is the emission spectrum for operation for a nominal CCT of 2700K, FIG. 10E is the emission spectrum for operation for a nominal CCT of 3000K, FIG. 10F is the emission spectrum for operation for a nominal CCT of 3500K, FIG. 10G is the emission spectrum for operation for a nominal CCT of 4000K, FIG. 10H is the emission spectrum for operation for a nominal CCT of 5700K, and FIG. 10I is the emission spectrum for operation for a nominal CCT of 6500K.

As can be seen from TABLE 11A: LED-C1 has a luminous efficacy (LE) of 74 lm/W and generates light of chromaticity (color point: CIE 0.5323, 0.4015, Δuv=−0.0031) corresponding to a CCT of 1883K (about 1900K) with a CRI Ra of 94.0; LED-C2 has a luminous efficacy of 160 lm/W and generates light of chromaticity (color point: CIE 0.3680, 0.4895, Δuv=0.0484) corresponding to a CCT of 4789K (about 4800K) with a CRI Ra of 60.6 (about 61); and LED-C3 has a luminous efficacy of 148 lm/W and generates light with a chromaticity (color point: CIE 0.2228, 0.2782).

As can be seen from TABLE 11B CI comprises a CIE region (C1 CIE region) defined by CIE color coordinates CIE-1 (0.515, 0.399), CIE-2 (0.522, 0.378), CIE-3 (0.549, 0.404), and CIE-4 (0.542, 0.425) which in terms of CCT is a CIE region from 1778K (about 1750K) to 2008K (about 2020K). C2 comprises a CIE region (C2 CIE Region) defined by CIE color coordinates CIE-1 (0.356, 0.497), CIE-2 (0.358, 0.465), CIE-3 (0.380, 0.483), and CIE-4 (0.378, 0.514) which in terms of CCT is from 4,536K (about 4500K) to 5,046K (about 5050K). C3 comprises a CIE region (C3 CIE Region) defined by CIE color coordinates CIE-1 (0.217, 0.281), CIE-2 (0.220, 0.267), CIE-3 (0.228, 0.276), and CIE-4 (0.226, 0.290).

The CIE chromaticity diagram of FIG. 10B shows each of the CIE regions: C1 CIE region $\mathbf{1044}_{C1}$ (diamond/solid line), C2 CIE region $\mathbf{1044}_{C2}$ (triangle/solid line), and C3 CIE region $\mathbf{1044}_{C3}$ (square/solid line). FIG. 10B shows the chromaticity (center color point) $\mathbf{1032}_{C1}$ of light of color C1 generated by the LED-C1, the chromaticity (center color point) $\mathbf{1032}_{C2}$ of light of color C2 generated by LED-C2, and the chromaticity (center color point) $\mathbf{1032}_{C3}$ of light of color C3 generated by the LED-C3. Straight lines $\mathbf{1034}_{C1C2}$, $\mathbf{1034}_{C2C3}$, and $\mathbf{1032}_{C1C3}$ connecting the points $\mathbf{1032}_{C1}$, $\mathbf{1032}_{C2}$, and $\mathbf{1032}_{C3}$ define a triangle that represents the gamut of chromaticity (colors)/color temperatures of light that Dev.5 can generate—i.e., the device can generate any chromaticity (color)/color temperature of light lying on the boundary or within the triangle. It is to be noted that lowest CCT of light that Dev.5 can generate that lies on the black body locus (dotted line) is 2185K (about 2150K) which corresponds to the point of intersection 1046 (CIE 0.507, 0.415) of line $\mathbf{1034}_{C1C3}$ connecting color points $\mathbf{1032}_{C1}$ to $\mathbf{1032}_{C3}$ and the black body locus. It is to be noted that highest CCT of light that Dev.5 can generate that lies on the black body locus (dotted line) is 7620K (about 7650K) which corresponds to the point of intersection 1048 (CIE 0.299, 0.309) of line $\mathbf{1034}_{C1C3}$ connecting color point $\mathbf{1032}_{C1}$ to color point $\mathbf{1032}_{C3}$ and the black body locus. It will be appreciated that Dev.5 is therefore capable of generating any CCT of light from 2150K to about 7650K lying on the black body locus.

As can be seen from FIG. 10A, the emission spectrum for the LED-C1 (dotted line) is composed primarily of a broadband peak (FWHM≈100 nm) with a peak emission wavelength of about 640 nm in the red region of the visible spectrum, the emission spectrum for the LED-C2 (solid line) is composed primarily of a broadband peak (FWHM≈140 nm) with a peak emission wavelength of about 550 nm in the green region of the visible spectrum, and the emission spectrum for the LED-C3 (dashed line) is composed of a broadband peak (FWHM≈36 nm) with a peak emission wavelength of about 440 nm in the blue region of the visible spectrum and a broadband region at wavelengths in the green to yellow region of the spectrum (460-580 nm).

TABLE 11A

| Dev. 5: Measured characteristics of LED-C1, LED-C2, and LED-C3 | | | | | | | | |
|---|---|---|---|---|---|---|---|---|
| | Flux | Power | LE | CIE center point | | CCT | CRI | |
| LED | (lm) | (W) | (lm/W) | x | y | (K) | Ra | Δuv |
| LED-C1 | 27.2 | 0.366 | 74 | 0.5323 | 0.4015 | 1883 | 94.0 | −0.0031 |
| LED-C2 | 58.7 | 0.366 | 160 | 0.3680 | 0.4895 | 4789 | 60.6 | 0.0484 |
| LED-C3 | 54.2 | 0.366 | 148 | 0.2228 | 0.2782 | n/a | n/a | n/a |

TABLE 11B

| Dev. 5: CIE region for light C1, C2, and C3 | | | | | | | | | | |
|---|---|---|---|---|---|---|---|---|---|---|
| | C1 CIE region | | | | C2 CIE region | | | | C3 CIE region | |
| | CIE | | CCT | | CIE | | CCT | | CIE | |
| CIE point | x | y | (K) | Δuv | x | y | (K) | Δuv | x | y |
| CIE-1 | 0.515 | 0.399 | 2008 | −0.0048 | 0.356 | 0.497 | 5046 | 0.0546 | 0.217 | 0.281 |
| CIE-2 | 0.522 | 0.378 | 1820 | −0.0108 | 0.358 | 0.465 | 4948 | 0.0433 | 0.220 | 0.267 |
| CIE-3 | 0.549 | 0.404 | 1778 | −0.0012 | 0.380 | 0.483 | 4536 | 0.0426 | 0.228 | 0.276 |
| CIE-4 | 0.542 | 0.425 | 1949 | 0.0041 | 0.378 | 0.514 | 4660 | 0.0534 | 0.226 | 0.290 |
| Center | 0.5323 | 0.4015 | 1883 | −0.0031 | 0.3680 | 0.4895 | 4789 | 0.0484 | 0.2228 | 0.2782 |

TABLE 12 tabulates forward drive current ($I_F$) for the first and second LEDs LED-C1, LED-C2, and LED-C3 of Dev.5 for generating light with a nominal general color rendering index CRI Ra of 90 for nominal color temperatures (CCT) from 2700K, 3000K, 3500K, 4000K, 5000K, 5700K, and 6500K. TABLE 13A tabulates the measured optical and electrical characteristics for Dev.5 when operated to generate light with a nominal CRI Ra of 97 for nominal color temperatures (CCT) from 2700K to 6500K.

As can be seen from TABLE 12, the CCT of light generated by Dev.5 is increased by increasing the proportion of light of color C3 while reducing the proportion of light of color C1. TABLE 13A demonstrates that by selection of the drive currents to the first and second LED-C1, LED-C2, and LED-C3, the color-tunable multi-LED packaged light emitting device (Dev.5) can generate white light with a CCT from 2700 K to 6500K with a general color rendering index CRI Ra of about 97 (94.0 to 98.0) and CRI R9 of at least 92 (92.5 to 98.7) with a luminous efficacy from 100 lm/W (99.9 lm/W) to about 116 lm/W (116.0 lm/W). TABLE 13A also includes the measured CCT of light generated by Dev.5.

Referring to FIG. 10C it is to be noted that Dev.5 can generate light 1042 (solid line) of CCTs from 2700K to 6500K with a chromaticity that closely matches the black body locus (dotted line). As can be seen from TABLE 13A, the chromaticity of light generated by Dev.5 are within 0.0026 Δuv (about 0.003) or less of the black body locus for CCTs from 2700K to 6500K.

TABLE 12

| Dev. 5: Forward drive current $I_F$ for the 1st LED-C1, 2nd LED-C1, LED-C2, and LED-C3 for generating light with a nominal CRI Ra = 97 for nominal CCTs from 2700K to 6500K | | | | |
|---|---|---|---|---|
| Nom. CCT | Forward drive current $I_F$ (mA) | | | |
| (K) | 1st LED-C1 | 2nd LED-C1 | LED-C2 | LED-C3 |
| 2700 | 129 | 129 | 57 | 13 |
| 3000 | 118 | 118 | 64 | 26 |
| 3500 | 106 | 106 | 68 | 47 |
| 4000 | 95 | 95 | 70 | 66 |
| 5000 | 81 | 81 | 52 | 113 |
| 5700 | 75 | 75 | 40 | 137 |
| 6500 | 68 | 68 | 30 | 162 |

TABLE 13A

| Dev. 5: Measured optical and Electrical characteristics for nominal CRI Ra = 97 for nominal color temperatures (CCT) from 2700 K to 6500 K | | | | | | | | | |
|---|---|---|---|---|---|---|---|---|---|
| Nom. | Flux | Power | LE | CIE | | CCT | CRI | | |
| CCT (K) | (lm) | (W) | (lm/W) | x | y | (K) | Ra | R9 | Δuv |
| 2700 | 96.9 | 0.97 | 99.9 | 0.4605 | 0.4133 | 2712 | 97.0 | 98.7 | 0.0009 |
| 3000 | 102.0 | 0.97 | 105.2 | 0.4359 | 0.4057 | 3031 | 97.0 | 97.2 | 0.0008 |
| 3500 | 106.9 | 0.97 | 110.2 | 0.4071 | 0.3930 | 3480 | 97.0 | 94.9 | 0.0006 |
| 4000 | 111.0 | 0.97 | 114.4 | 0.3841 | 0.3287 | 3946 | 98.0 | 97.2 | 0.0017 |
| 5000 | 112.5 | 0.97 | 116.0 | 0.3463 | 0.3549 | 4966 | 97.0 | 94.3 | 0.0012 |

TABLE 13A-continued

Dev. 5: Measured optical and Electrical characteristics for nominal CRI Ra = 97 for nominal color temperatures (CCT) from 2700 K to 6500 K

| Nom. | Flux | Power | LE | CIE | | CCT | CRI | | |
|---|---|---|---|---|---|---|---|---|---|
| CCT (K) | (lm) | (W) | (lm/W) | x | y | (K) | Ra | R9 | Δuv |
| 5700 | 111.6 | 0.97 | 115.1 | 0.3307 | 0.3422 | 5577 | 95.0 | 92.5 | 0.0014 |
| 6500 | 111.1 | 0.97 | 114.5 | 0.3149 | 0.3299 | 6380 | 94.0 | 94.5 | 0.0026 |

FIGS. 10D-10I are measured emission spectra, normalized intensity (normalized to a CIE 1931 XYZ luminance Y=100) versus wavelength (nm), for lighting device Dev.5 in which: FIG. 10D is the emission spectrum for operation for a nominal CCT of 2700K and black body spectrum of 2700K, FIG. 10E is the emission spectrum for operation for a nominal CCT of 3000K and a black body spectrum of 3000K, FIG. 10F is the emission spectrum for operation for a nominal CCT of 3500K and a black body spectrum of 3500K, FIG. 10G is the emission spectrum for operation for a nominal CCT of 4000K and a black body spectrum of 4000K, FIG. 10H is the emission spectrum for operation for a nominal CCT of 5700K and a CIE Standard Illuminant D57 (5700K), and FIG. 10I is the emission spectrum for operation for a nominal CCT of 6500K and a CIE Standard Illuminant D65 (6500K). As can be seen from the figures, light generated by Dev.5 has a spectrum that closely resembles the black body spectrum/Standard illuminant for wavelengths from about 450 nm to 650 nm for CCT from 2700K to 6500K.

A metric for quantifying how closely the spectrum resembles the black body spectrum/Standard illuminant is a maximum (largest) intensity deviation ($I_{max\Delta}$) from the intensity of light of a black body radiator of the same Correlated Color Temperature. That is, over a selected wavelength range, $I_{max\Delta}$ is the maximum (largest) intensity difference between the intensity of the spectrum and the intensity of the spectrum of a black body radiator. The maximum deviation can be positive where the spectrum intensity is greater than the black body spectrum intensity (e.g., a peak in the emission spectrum) or negative where the spectrum intensity is less than the black body spectrum intensity (e.g., a trough in the emission spectrum). To compare the spectra, each spectrum is normalized to have the same CIE 1931 XYZ luminance Y (e.g., Y=100), that is, each spectrum has the same lumen brightness. Each spectrum is normalized using the photopic luminosity function y(λ)—sometimes referred to as the photopic or visual luminous efficiency function v(λ)—of a standard observer which takes account of the photopic (visual) response of an observer and are for the same correlated color temperature. $I_{max\Delta}$ is thus the maximum (greatest) intensity difference between the normalized intensity of the spectrum and the normalized intensity of the black body spectrum over a selected wavelength range. $I_{max\Delta}$ is defined as:

$$I_{max\Delta} = \left[\frac{\text{Spectrum intensity @ } \lambda_{max\Delta} \times 100}{\text{Black body (Standard illuminant) spectrum intensity @ } \lambda_{max\Delta}}\right] - 100$$

where $\lambda_{max\Delta}$ is the wavelength at which the intensity difference (deviation) is a maximum.

Each of FIGS. 10D-10I indicate the maximum intensity deviation ($I_{max\Delta}$) and wavelength at which the intensity difference (deviation) is a maximum ($\lambda_{max\Delta}$) for a wavelength range 440 nm to 650 nm.

For example, when Dev.5 is operable to generate light with a color temperature of 2700K, over a wavelength range from 440 nm to 650 nm, the maximum deviation of the spectrum of Dev.5 from the spectrum of a black body of the same color temperature (i.e., 2700K) is about 12% (0.12) corresponding to peak 1050 at a wavelength $\lambda_{max\Delta}$ of 635 nm (FIG. 10D). In the figure, the spectrum intensity at $\lambda_{max\Delta}$ is denoted 1052 and the black body spectrum intensity at $\lambda_{max\Delta}$ is denoted 1054. Therefore, over the wavelength range from 440 nm to 650 nm, light generated by Dev.5 when operated to generate light of color temperature 2700K has a maximum percentage intensity deviation $I_{max\Delta}$ of 12%, that is at the maximum intensity deviation the normalized spectrum intensity at wavelength $\lambda_{max\Delta}$ is 112% of the normalized black body spectrum intensity at the same wavelength.

When Dev.5 is operable to generate light with a color temperature of 3000K, over a wavelength range from 440 nm to 650 nm, the maximum deviation of the spectrum of Dev.5 from the spectrum of the black body of the same color temperature (i.e., 3000K) is about 23% (0.23) corresponding to peak 1050 at a wavelength $\lambda_{max\Delta}$ of 450 nm (FIG. 10E). In the figure, the spectrum intensity at $\lambda_{max\Delta}$ is denoted 1052 and the black body spectrum intensity at $\lambda_{max\Delta}$ is denoted 1054. Therefore, over the wavelength range from 440 nm to 650 nm, light generated by Dev.5 when operated to generate light of color temperature 3000K has a maximum percentage intensity deviation $I_{max\Delta}$ of 23%, that is at the maximum intensity deviation the normalized spectrum intensity at wavelength $\lambda_{max\Delta}$ is 123% of the normalized black body spectrum intensity at the same wavelength.

When Dev.5 is operable to generate light with a color temperature of 3500K, over a wavelength range from 440 nm to 650 nm, the maximum deviation of the spectrum of Dev.5 from the spectrum of the black body of the same color temperature (i.e., 3500K) is about 23% (0.23) corresponding to peak 1050 at a wavelength $\lambda_{max\Delta}$ of 450 nm (FIG. 10F). In the figure, the spectrum intensity at $\lambda_{max\Delta}$ is denoted 1052 and the black body spectrum intensity at $\lambda_{max\Delta}$ is denoted 1054. Therefore, over the wavelength range from 440 nm to 650 nm, light generated by Dev.5 when operated to generate light of color temperature 3500K has a maximum percentage intensity deviation $I_{max\Delta}$ of 23%, that is at the maximum intensity deviation the normalized spectrum intensity at wavelength $\lambda_{max\Delta}$ is 123% of the normalized black body spectrum intensity at the same wavelength.

When Dev.5 is operable to generate light with a color temperature of 4000K, over a wavelength range from 440 nm to 650 nm, the maximum deviation of the spectrum of Dev.5 from the spectrum of the black body of the same color temperature (i.e., 4000K) is about 28% (0.28) corresponding to peak 1050 at a wavelength $\lambda_{max\Delta}$ of 440 nm (FIG. 10G).

In the figure, the spectrum intensity at $\lambda_{max\Delta}$ is denoted 1052 and the black body spectrum intensity at $\lambda_{max\Delta}$ is denoted 1054. Therefore, over the wavelength range from 440 nm to 650 nm, light generated by Dev.5 when operated to generate light of color temperature 4000K has a maximum percentage intensity deviation $I_{max\Delta}$ of 28%, that is at the maximum intensity deviation the normalized spectrum intensity at wavelength $\lambda_{max\Delta}$ is 128% of the normalized black body spectrum intensity at the same wavelength.

When Dev.5 is operable to generate light with a color temperature of 5700K, over a wavelength range from 440 nm to 650 nm, the maximum deviation of the spectrum of Dev.5 from the spectrum of the Standard Illuminant D57 of the same color temperature (i.e., 5700K) is about 38% (0.38) corresponding to peak 1050 at a wavelength $\lambda_{max\Delta}$ of 440 nm (FIG. 10H). In the figure, the spectrum intensity at $\lambda_{max\Delta}$ is denoted 1052 and the Standard Illuminant spectrum intensity at $\lambda_{max\Delta}$ is denoted 1054. Therefore, over the wavelength range from 440 nm to 650 nm, light generated by Dev.5 when operated to generate light of color temperature 5700K has a maximum percentage intensity deviation $I_{max\Delta}$ of 38%, that is at the maximum intensity deviation the normalized spectrum intensity at wavelength $\lambda_{max\Delta}$ is 138% of the Standard Illuminant spectrum intensity at the same wavelength.

When Dev.5 is operable to generate light with a color temperature of 6500K, over a wavelength range from 440 nm to 650 nm, the maximum deviation of the spectrum of Dev.5 from the spectrum of the Standard Illuminant D65 of the same color temperature (i.e., 6500K) is about 33% (0.33) close to peak 1050 at a wavelength $\lambda_{max\Delta}$ of 440 nm (FIG. 10I). In the figure, the spectrum intensity at $\lambda_{max\Delta}$ is denoted 1052 and the Standard Illuminant spectrum intensity at $\lambda_{max\Delta}$ is denoted 1054. Therefore, over the wavelength range from 440 nm to 650 nm, light generated by Dev.5 when operated to generate light of color temperature 6500K has a maximum percentage intensity deviation $I_{max\Delta}$ of 38%, that is at the maximum intensity deviation the normalized spectrum intensity at wavelength $\Delta_{max\Delta}$ is 138% of the Standard Illuminant spectrum intensity at the same wavelength.

TABLE 13B tabulates maximum intensity deviation ($I_{max\Delta}$) and wavelength of maximum deviation ($\lambda_{max\Delta}$) for wavelength ranges 440 nm to 650 nm and 460 nm to 650 nm for Dev.5 operable to generate light of nominal CCTs from 2700K to 6500K. As can be seen from the table Dev.5 is capable of generating light of color temperatures from 2700K to 6500K having an intensity versus wavelength spectrum, which over a wavelength range 440 nm to 650 nm, has a maximum deviation between the normalized intensity of light generated by the lighting device compared with the normalized intensity of light of the spectrum of a black body radiator or standard illuminant which is less than 0.38 (38%). As can be seen from the table Dev.5 is capable of generating light of color temperatures from 2700K to 6500K having an intensity versus wavelength spectrum, which over a wavelength range 460 nm to 650 nm, has a maximum deviation between the normalized intensity of light generated by the lighting device compared with the normalized intensity of light of the spectrum of a black body radiator or standard illuminant which is less than 0.25 (25%). Test data indicates that through further optimization, devices in accordance with the invention can generate light with color temperatures from 2700K to 6500K with the maximum deviation of less than 0.3, 0.2, and/or less than 0.1 over a wavelength range 440 nm to 650 nm.

TABLE 13B

Maximum intensity deviation ($I_{max\Delta}$) and wavelength of maximum deviation ($\lambda_{max\Delta}$) for wavelength ranges 440 nm to 650 nm and 460 nm to 650 nm for Dev. 5 operable to generate light of nominal CCTs from 2700K to 6500K

| Nom. CCT | Wavelength range 440 nm to 650 nm | | Wavelength range 460 nm to 650 nm | |
|---|---|---|---|---|
| (K) | $I_{max\Delta}$ | $\lambda_{max\Delta}$ | $I_{max\Delta}$ | $\lambda_{max\Delta}$ (nm) |
| 2700 | 12% (0.12) | 635 nm | 12% (0.12) | 635 nm |
| 3000 | 23% (0.23) | 450 nm | 23% (0.23) | 450 nm |
| 3500 | 23% (0.23) | 450 nm | 12% (0.12) | 630 nm |
| 4000 | 28% (0.28) | 440 nm | −17% (−0.17) | 460 nm |
| 5700 | 38% (0.38) | 440 nm | −25% (−0.25) | 460 nm |
| 6500 | 38% (0.36) | 440 nm | −25% (−0.25) | 460 nm |

CIE Region and Center Points for C1, C2, C3

TABLE 14 tabulates CIE regions, CIE center points for light C1, C2, and C3 and CCT and Δuv for light C1 and C2. The CIE regions for each color C1, C2, and C3 encompass each of the CIE regions for Devs.2-5, that is for lighting devices with a CRI Ra from 80 to 97. As can be seen from TABLE 14, C1 comprises a CIE region (C1 CIE region) defined by CIE color coordinates CIE-1 (0.498, 0.422), CIE-2 (0.522, 0.370), CIE-3 (0.562, 0.410), and CIE-4 (0.537, 0.461) which in terms of CCT is a CIE region from 1725K (about 1720K) to 2323K (about 2350K). C2 comprises a CIE region (C2 CIE Region) defined by CIE color coordinates CIE-1 (0.330, 0.480), CIE-2 (0.342, 0.385), CIE-3 (0.392, 0.420), and CIE-4 (0.378, 0.514) which in terms of CCT is from 4004K (about 4000K) to 5580K. C3 comprises a CIE region (C3 CIE Region) defined by CIE color coordinates CIE-1 (0.196, 0.261), CIE-2 (0.206, 0.212), CIE-3 (0.234, 0.243), and CIE-4 (0.226, 0.290).

TABLE 14

CIE regions and center points for light C1, C2, and C3

| | C1 | | | | C2 | | | | C3 | |
|---|---|---|---|---|---|---|---|---|---|---|
| | CIE | | CCT | | CIE | | CCT | | CIE | |
| CIE point | x | y | (K) | Δuv | x | y | (K) | Δuv | x | y |
| CIE-1 | 0.498 | 0.422 | 2323 | 0.0022 | 0.330 | 0.480 | 5580 | 0.0575 | 0.196 | 0.261 |
| CIE-2 | 0.522 | 0.370 | 1771 | −0.0132 | 0.342 | 0.385 | 5195 | 0.0171 | 0.206 | 0.212 |
| CIE-3 | 0.562 | 0.410 | 1725 | 0.0016 | 0.392 | 0.420 | 4004 | 0.0157 | 0.234 | 0.243 |
| CIE-4 | 0.537 | 0.461 | 2203 | 0.0137 | 0.378 | 0.514 | 4665 | 0.0534 | 0.226 | 0.290 |
| Center | 0.530 | 0.415 | 1983 | 0.0006 | 0.360 | 0.450 | 4859 | 0.0371 | 0.216 | 0.251 |

FIGS. 11A-11D are CIE 1931 chromaticity diagrams illustrating various CIE regions and center points for light C1, C2, and C3.

Figure 11A:
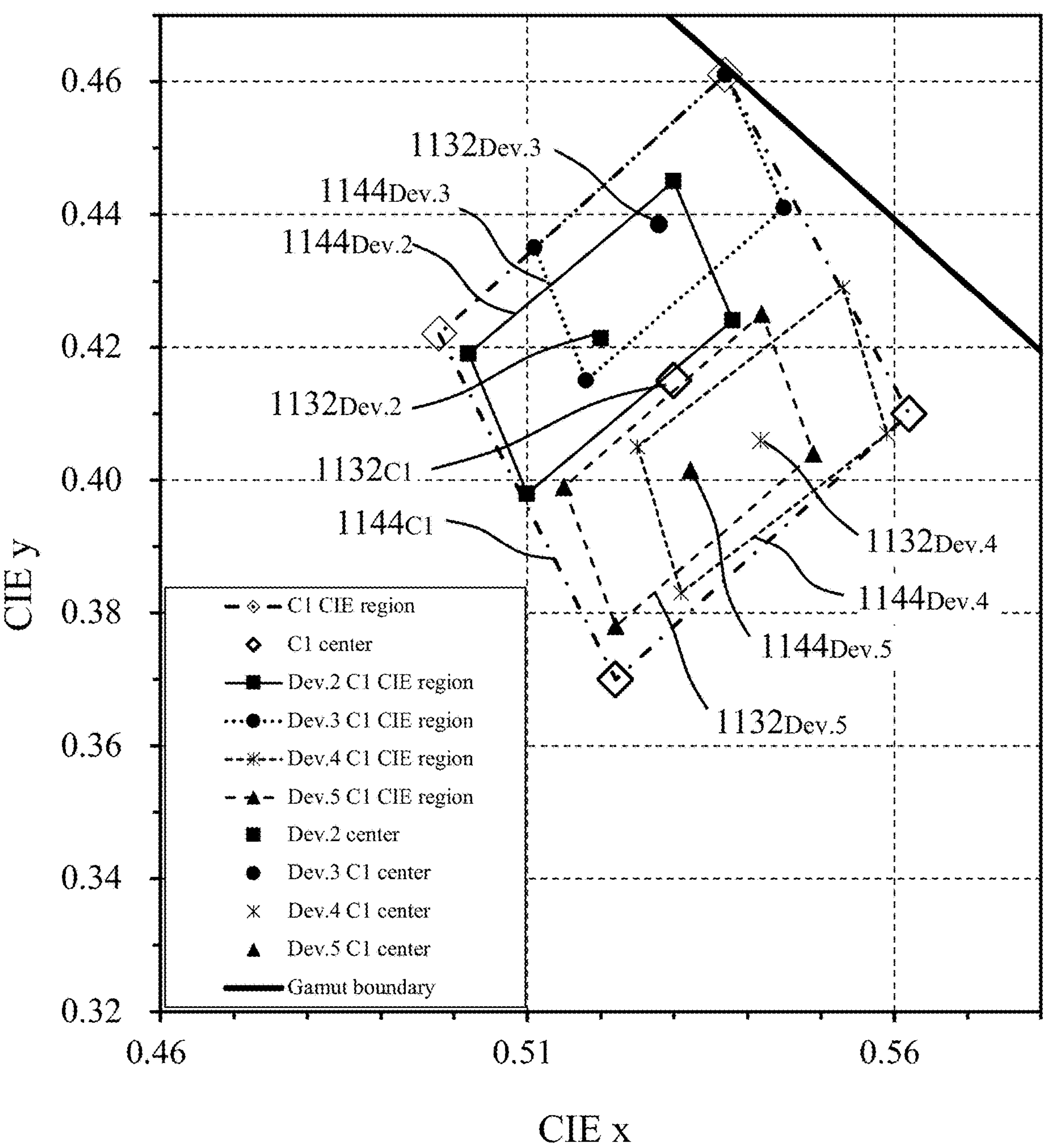
FIGS. 11A-11D are CIE 1931 chromaticity diagrams illustrating various CIE regions and center points for light of chromaticity C1, C2, and C3.
Figure 11B:
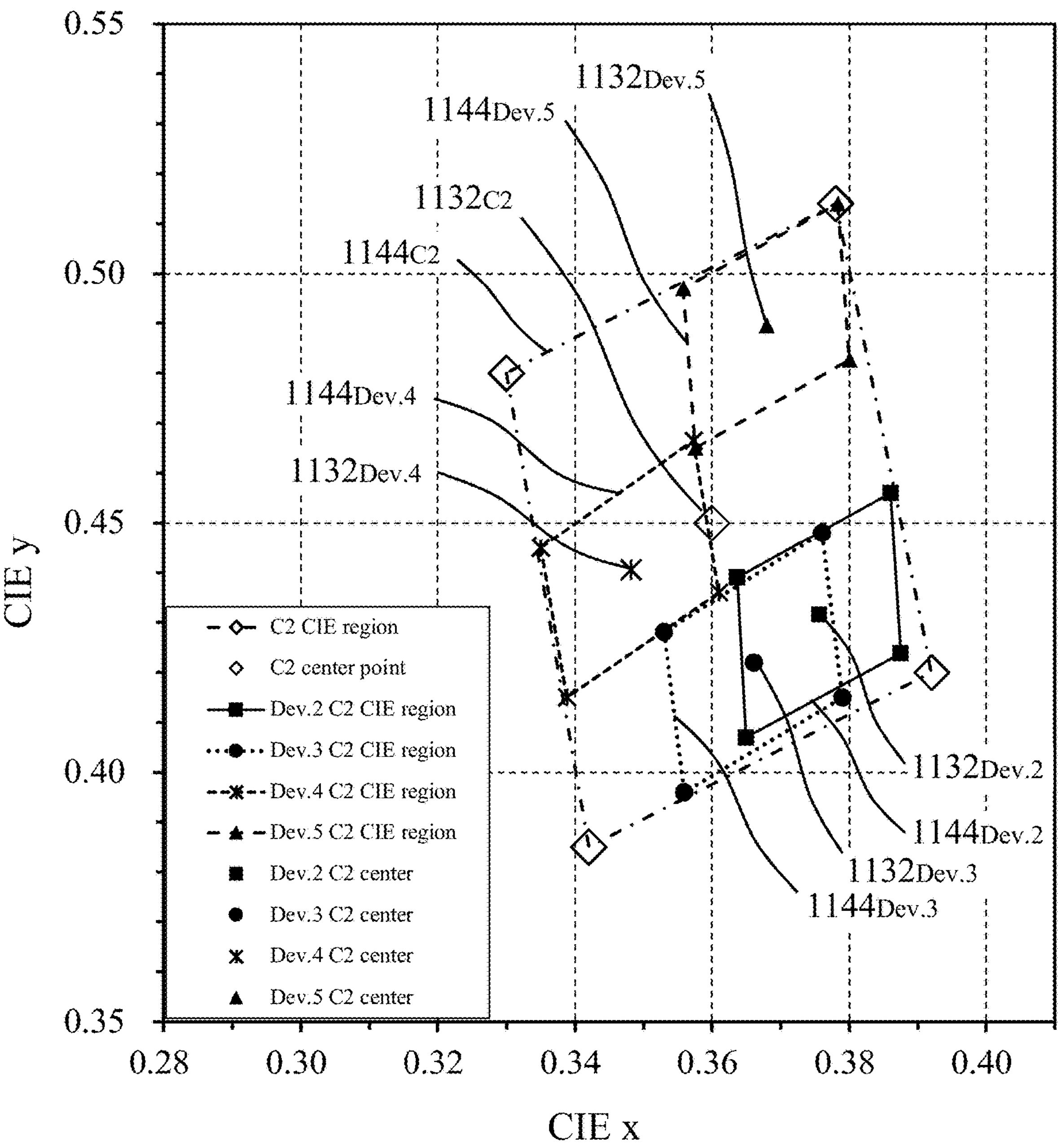

FIG. 11A shows C1 CIE regions 1144 and C1 center points 1132 for lighting devices Dev.2 ($\mathbf{1144}_{Dev.2}$—solid square/solid line and $\mathbf{1132}_{Dev.2}$—solid square), Dev.3 ($\mathbf{1144}_{Dev.3}$—dot/dotted line and $\mathbf{1132}_{Dev.3}$—dot), Dev.4 ($\mathbf{1144}_{Dev.4}$—star/dashed line and $\mathbf{1132}_{Dev.4}$—star), and Dev.5 ($\mathbf{1144}_{Dev.5}$—solid triangle/dashed line and $\mathbf{1132}_{Dev.5}$—solid triangle) and C1 CIE region ($\mathbf{1144}_{C1}$—diamond/dashed dot line) and C1 center point ($\mathbf{1132}_{C1}$—diamond) that encompass lighting devices Devs.2-5. As can be seen from FIG. 11A, the C1 CIE region $\mathbf{1144}_{C1}$ encompasses (fully encloses) the C1 CIE regions $\mathbf{1144}_{Dev.2}$, $\mathbf{1144}_{Dev.3}$, $\mathbf{1144}_{Dev.4}$, $\mathbf{1144}_{Dev.5}$.

FIG. 11B shows C2 CIE regions 1144 and C2 center points 1132 for lighting devices Dev.2 ($\mathbf{1144}_{Dev.2}$—solid square/solid line and $\mathbf{1132}_{Dev.2}$—solid square), Dev.3 ($\mathbf{1144}_{Dev.3}$—dot/dotted line and $\mathbf{1132}_{Dev.3}$—dot), Dev.4 ($\mathbf{1144}_{Dev.4}$—star/dashed line and $\mathbf{1132}_{Dev.4}$—star), and Dev.5 ($\mathbf{1144}_{Dev.5}$—solid triangle/dashed line and $\mathbf{1132}_{Dev.5}$—solid triangle) and C2 CIE region ($\mathbf{1144}_{C1}$—diamond/dashed dot line) and C2 center point ($\mathbf{1132}_{C1}$—diamond) that encompass lighting devices Devs.2-5. As can be seen from FIG. 11B, the C2 CIE region $\mathbf{1144}_{C2}$ encompasses (fully encloses) the C2 CIE regions $\mathbf{1144}_{Dev.2}$, $\mathbf{1144}_{Dev.3}$, $\mathbf{1144}_{Dev.4}$, $\mathbf{1144}_{Dev.5}$.

Figure 11C:
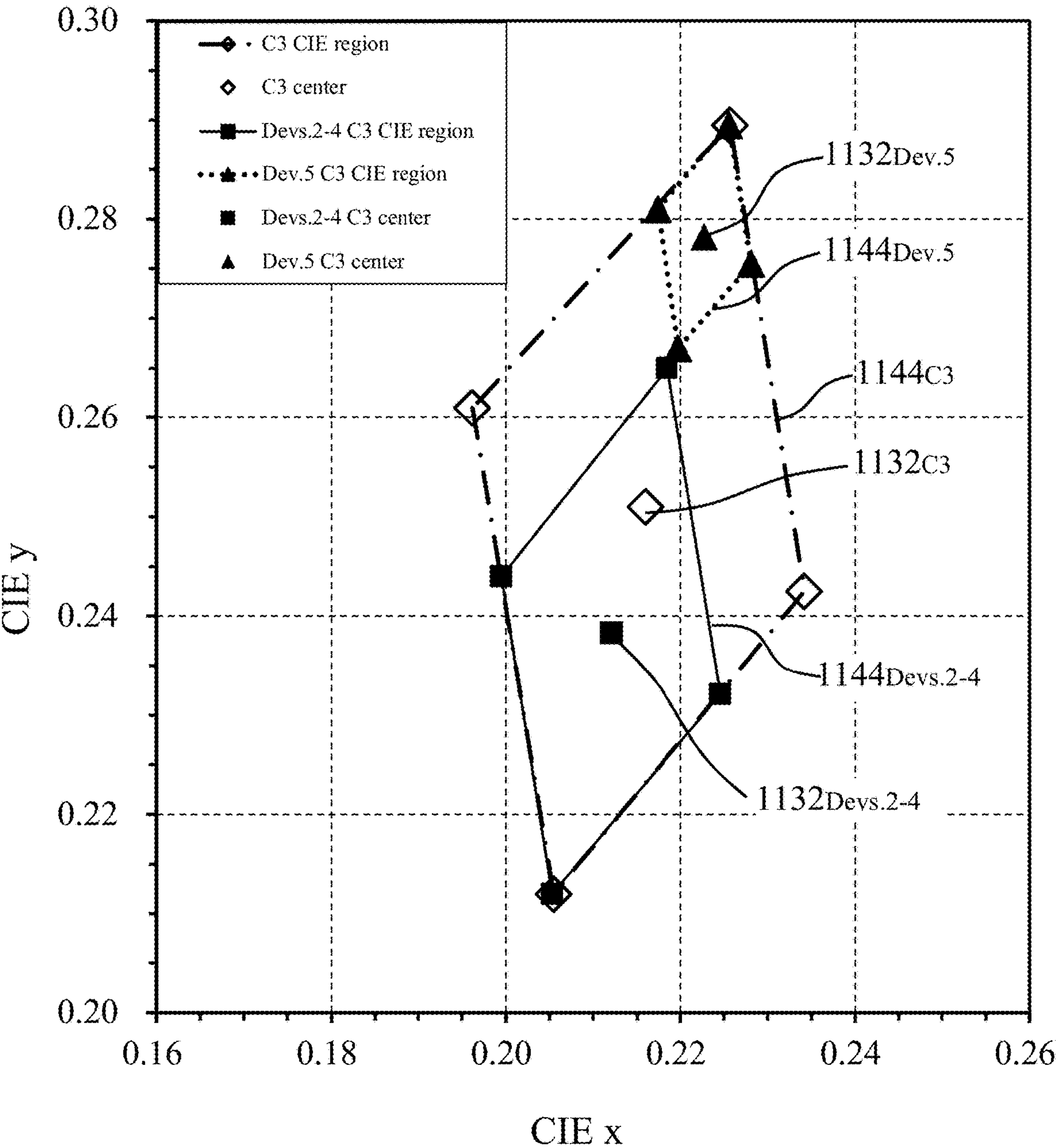

FIG. 11C shows C3 CIE regions 1144 and C3 center points 1132 for lighting devices Devs.2-4 ($\mathbf{1144}_{Devs.2-4}$—solid square/solid line and $\mathbf{1132}_{Devs.2-4}$—solid square) and Dev.5 ($\mathbf{1144}_{Dev.5}$—solid triangle/dotted line and $\mathbf{1132}_{Dev.5}$—solid triangle) and C3 CIE region ($\mathbf{1144}_{C3}$—diamond/dashed dot line) and C3 center point ($\mathbf{1132}_{C3}$—diamond) that encompass lighting devices Dev.2-5. As can be seen from FIG. 11C, the C3 CIE region $\mathbf{1144}_{C3}$ encompasses (fully encloses) the C3 CIE regions $\mathbf{1144}_{Dev.2}$, $\mathbf{1144}_{Dev.3}$, $\mathbf{1144}_{Dev.4}$, $\mathbf{1144}_{Dev.5}$.

Figure 11D:
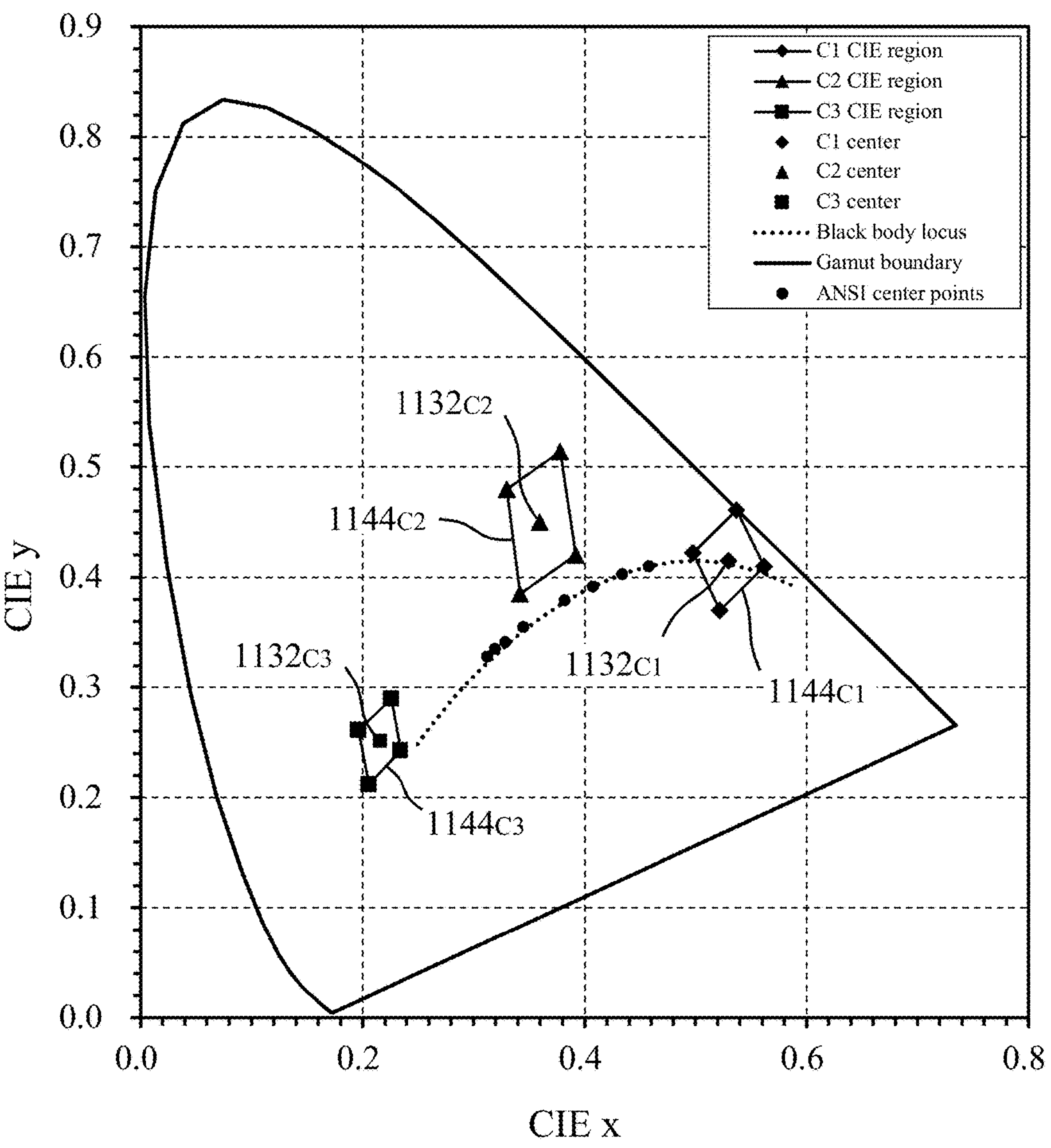

FIG. 11D shows CIE regions 1144 and center points 1132 for C1 ($\mathbf{1144}_{C1}$—solid diamond/solid line and $\mathbf{1132}_{C1}$—solid diamond), C2 ($\mathbf{1144}_{C2}$—solid triangle/solid line and $\mathbf{1132}_{C2}$—solid triangle), and C3 ($\mathbf{1144}_{C3}$—solid square/solid line and $\mathbf{1132}_{C3}$—solid square) that encompass lighting devices Dev.2-5.

Lighting Devices Comprising Light of Four Different Colors/CCTs: C1, C2, C3 and C4

As described herein, lighting devices in accordance with embodiments of the invention may comprise LEDs that generate light of four different colors/CCTs: C1, C2, C3 and C4.

In embodiments, a four color/CCT lighting device may comprise, for example, the lighting devices Dev.2-5 that further comprises a fourth LED that generates light of a fourth chromaticity in a fourth chromaticity region. In embodiments, the fourth center point and chromaticity region can be (i) between the first and second chromaticity regions or (ii) between the second and third chromaticity regions. TABLES 15A and 15B tabulate CIE regions, CIE center points for light C1, C2, C3, C4a, and C4b, CCT and Δuv for light C1, C2, C4a, C4b. The CIE regions for each color C1, C2, C3, C4a and C4b encompass lighting devices that can generate light with a CRI Ra from 80 to 97. Center point C4a and CIE region C4a are between the first and second chromaticity regions and center point C4b and CIE region C4b are between the second and third chromaticity regions. The center points and CIE regions for C1, C2, and C3 are those tabulated in TABLE 15A. As can be seen from TABLE 15B, C4a comprises a CIE region (C4a CIE region) defined by CIE color coordinates CIE-1 (0.420, 0.468), CIE-2 (0.418, 0.383), CIE-3 (0.475, 0.430), and CIE-4 (0.479, 0.514) which in terms of CCT is a CIE region from 2644K (about 2620K) to 3736K (about 3750K). C4*b* comprises a CIE region (C4b CIE Region) defined by CIE color coordinates CIE-1 (0.249, 0.362), CIE-2 (0.265, 0.283), CIE-3 (0.309, 0.335), and CIE-4 (0.295, 0.414) which in terms of CCT is from 6654K (about 6650K) to 12482K (about 12500K).

Figure 12:
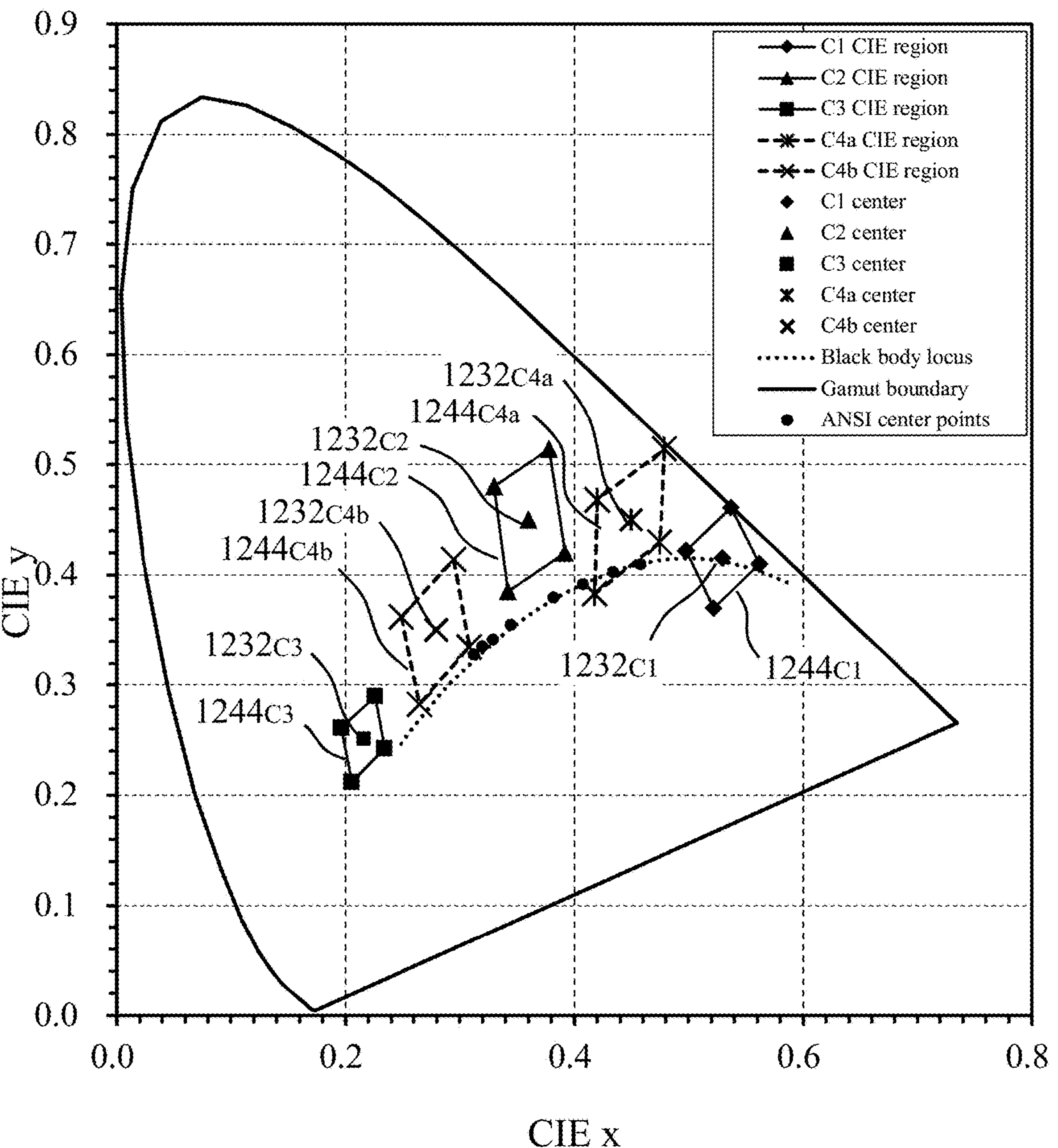
FIG. 12 is a CIE 1931 chromaticity diagram illustrating CIE regions and center points for a lighting device comprising LEDs that generate light of four chromaticity C1, C2, C3, and C4.

FIG. 12 shows CIE regions 1244 and center points 1232 for C1 ($\mathbf{1244}_{C1}$—solid diamond/solid line and $\mathbf{1232}_{C1}$—solid diamond), C2 ($\mathbf{1244}_{C2}$—solid triangle/solid line and $\mathbf{1232}_{C2}$—solid triangle), C3 ($\mathbf{1244}_{C3}$—solid square/solid line and $\mathbf{1232}_{C3}$—solid square), C4a ($\mathbf{1244}_{C4a}$—star/dashed line and $\mathbf{1232}_{C4a}$—star), and C4b ($\mathbf{1244}_{C4b}$—cross/dashed line and $\mathbf{1232}_{C4b}$—cross).

TABLE 15A

CIE regions and center points for light C1, C2, and C3

| | C1 | | | | C2 | | | | C3 | |
|---|---|---|---|---|---|---|---|---|---|---|
| | CIE | | CCT | | CIE | | CCT | | CIE | |
| CIE point | x | y | (K) | Δuv | x | y | (K) | Δuv | x | y |
| CIE-1 | 0.498 | 0.422 | 2323 | 0.0022 | 0.330 | 0.480 | 5580 | 0.0575 | 0.196 | 0.261 |
| CIE-2 | 0.522 | 0.370 | 1771 | −0.0132 | 0.342 | 0.385 | 5195 | 0.0171 | 0.206 | 0.212 |
| CIE-3 | 0.562 | 0.410 | 1725 | 0.0016 | 0.392 | 0.420 | 4004 | 0.0157 | 0.234 | 0.243 |
| CIE-4 | 0.537 | 0.461 | 2203 | 0.0137 | 0.378 | 0.514 | 4665 | 0.0534 | 0.226 | 0.290 |
| Center | 0.530 | 0.415 | 1983 | 0.0006 | 0.360 | 0.450 | 4859 | 0.0371 | 0.216 | 0.251 |

TABLE 15B

| CIE regions and center points for light C4a and C4b | | | | | | | | |
|---|---|---|---|---|---|---|---|---|
| | C4a | | | | C4b | | | |
| | CIE | | CCT | | CIE | | CCT | |
| CIE point | x | y | (K) | Δuv | x | y | (K) | Δuv |
| CIE-1 | 0.420 | 0.468 | 3736 | 0.0274 | 0.249 | 0.362 | 9582 | 0.0508 |
| CIE-2 | 0.418 | 0.383 | 3167 | −0.0059 | 0.265 | 0.283 | 12482 | 0.0073 |
| CIE-3 | 0.475 | 0.430 | 2644 | 0.0058 | 0.309 | 0.335 | 6654 | 0.0081 |
| CIE-4 | 0.479 | 0.514 | 3135 | 0.0324 | 0.295 | 0.414 | 6700 | 0.0483 |
| Center | 0.450 | 0.450 | 3135 | 0.0155 | 0.280 | 0.350 | 8029 | 0.0299 |

In embodiments, a four color/CCT lighting device may comprise for example a first LED that generates light of a first chromaticity C1, a second LED that generates light of a second chromaticity C2, a third LED that generates light of a third chromaticity C3, and a fourth LED that generates light of a fourth chromaticity C4. TABLES 16A and 16B tabulate CIE regions, CIE center points for light C1, C2, C3 and C4, CCT and Δuv for light C1, C2, and C3. The CIE regions for each color C1, C2, C3, and C4 encompass lighting devices that can generate light with a CRI Ra from 80 to 97. As can be seen from TABLES 16A and 16B, C1 comprises a CIE region (C1 CIE region) defined by CIE color coordinates CIE-1 (0.498, 0.422), CIE-2 (0.522, 0.370), CIE-3 (0.562, 0.410), and CIE-4 (0.537, 0.461) which in terms of CCT is a CIE region from 1725K (about 1720K) to 2323K (about 2350K). C2 comprises a CIE region (C2 CIE Region) defined by CIE color coordinates CIE-1 (0.390, 0.488), CIE-2 (0.398, 0.403), CIE-3 (0.450, 0.450), and CIE-4 (0.442, 0.534) which in terms of CCT is from 3135K (about 3120K) to 4366K (about 4370K). C3 comprises a CIE region (C3 CIE Region) defined by CIE color coordinates CIE-1 (0.277, 0.418), CIE-2 (0.283, 0.333), CIE-3 (0.334, 0.380), and CIE-4 (0.327, 0.464) which in terms of CCT is from 5456K (about 5450K) to 8192K (about 8200K). C4 comprises a CIE region (C4 CIE Region) defined by CIE color coordinates CIE-1 (0.196, 0.261), CIE-2 (0.206, 0.212), CIE-3 (0.234, 0.243), and CIE-4 (0.226, 0.290).

Figure 13:
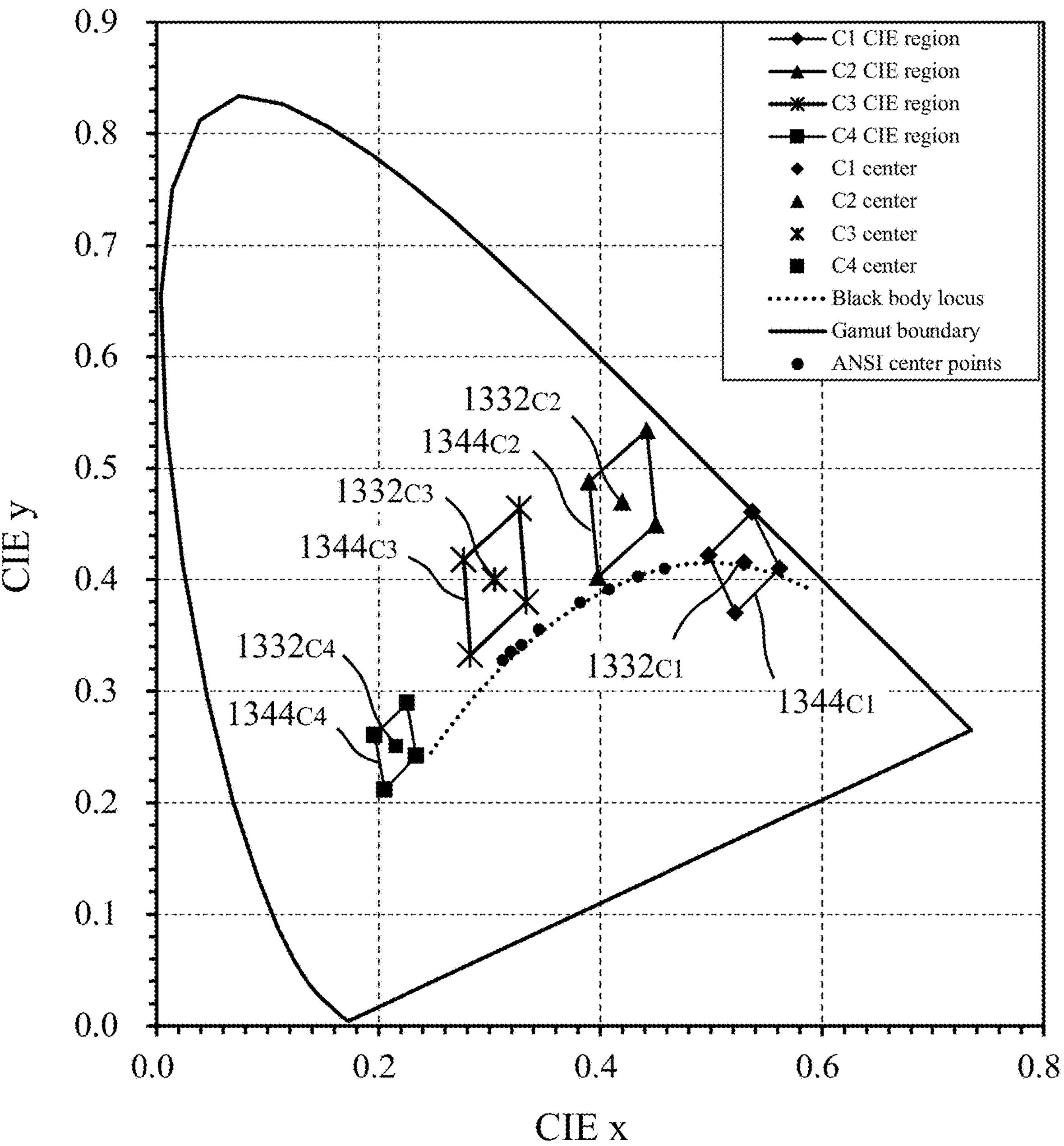
FIG. 13 is a CIE 1931 chromaticity diagram illustrating CIE regions and center points for a lighting device comprising LEDs that generate light of four chromaticity C1, C2, C3, and C4.

FIG. 13 shows CIE regions 1344 and center points 1332 for C1 ($\mathbf{1344}_{C1}$—solid diamond/solid line and $\mathbf{1332}_{C1}$—solid diamond), C2 ($\mathbf{1344}_{C2}$—solid triangle/solid line and $\mathbf{1332}_{C2}$—solid triangle), C3 ($\mathbf{1344}_{C3}$—star/solid line and $\mathbf{1332}_{C3}$—star), and C4 ($\mathbf{1344}_{C4}$—solid square/solid line and $\mathbf{1332}_{C4}$—solid square).

TABLE 16A

| CIE regions and center points for light C1 and C2 | | | | | | | | |
|---|---|---|---|---|---|---|---|---|
| | C1 | | | | C2 | | | |
| | CIE | | CCT | | CIE | | CCT | |
| CIE point | x | y | (K) | Δuv | x | y | (K) | Δuv |
| CIE-1 | 0.498 | 0.422 | 2323 | 0.0022 | 0.390 | 0.488 | 4366 | 0.0417 |
| CIE-2 | 0.522 | 0.370 | 1771 | −0.0132 | 0.398 | 0.403 | 3757 | 0.0071 |
| CIE-3 | 0.562 | 0.410 | 1725 | 0.0016 | 0.450 | 0.450 | 3135 | 0.0154 |
| CIE-4 | 0.537 | 0.461 | 2203 | 0.0137 | 0.442 | 0.534 | 3728 | 0.0445 |
| Center | 0.530 | 0.415 | 1983 | 0.0006 | 0.420 | 0.470 | 3747 | 0.0281 |

TABLE 16B

| CIE regions and center points for light C3 and C4 | | | | | | |
|---|---|---|---|---|---|---|
| | C3 | | | | C4 | |
| | CIE | | CCT | | CIE | |
| CIE point | x | y | (K) | Δuv | x | Y |
| CIE-1 | 0.277 | 0.418 | 7302 | 0.0575 | 0.196 | 0.261 |
| CIE-2 | 0.283 | 0.333 | 8192 | 0.0207 | 0.206 | 0.212 |
| CIE-3 | 0.334 | 0.380 | 5456 | 0.0180 | 0.234 | 0.243 |
| CIE-4 | 0.327 | 0.464 | 5654 | 0.0533 | 0.226 | 0.290 |
| Center | 0.305 | 0.400 | 6426 | 0.0387 | 0.216 | 0.251 |

Color-Temperature-Tunable Lighting Device—Dev.6

A color-temperature-tunable lighting device, denoted Dev.6, comprises LEDs that generate light of three different colors/CCTs: C1, C2, and C3. Lighting device Dev.6 comprises the device of FIGS. 3A-3C and comprises a 3838 four cavity package containing an LED, LED-C1, that generate light with a first chromaticity/color temperature C1, an LED, LED C2, that generates of a second chromaticity/color temperature C2, and two LEDs, LED-C3, that generates light of a third chromaticity/color temperature C3. In this embodiment, each of the LEDs, LED-C1, LED-C2, and LED-C3 comprise a broadband violet to blue InGaN LED chip with a FWHM from 25 nm to 50 nm. The broadband LED chips may comprise a multi-Quantum Well device.

The two LEDs LED-C3 comprise a PC LED comprising a mixture of green to red photoluminescence materials (e.g., GaYAG, GaLuAG, and/or $(Y,Lu)_3(Al,Ga)_5O_{12}$) and CASN). LED-C2, in the third cavity, comprises a PC LED comprising a mixture of green to orange photoluminescence materials. LED-C1 comprises a PC LED comprising green to yellow photoluminescence materials (e.g., GaYAG, GaLuAG, $(Y,Lu)_3(Al,Ga)_5O_{12}$. YAG and/or LuAG). Color-temperature-tunable Lighting device Dev.6 is configured to generate light with a CCT from 2700K to 6500K and a general Color Rendering Index CRI Ra of 97.

TABLE 17A tabulates measured optical/electrical characteristics of LED-C1, LED-C2, and LEDs, LED-C3 of Dev.6 and TABLES 17B-17D tabulates CIE region, CIE center point, CCT, and Δuv for light C1, C2, and C3.

Figure 14A:
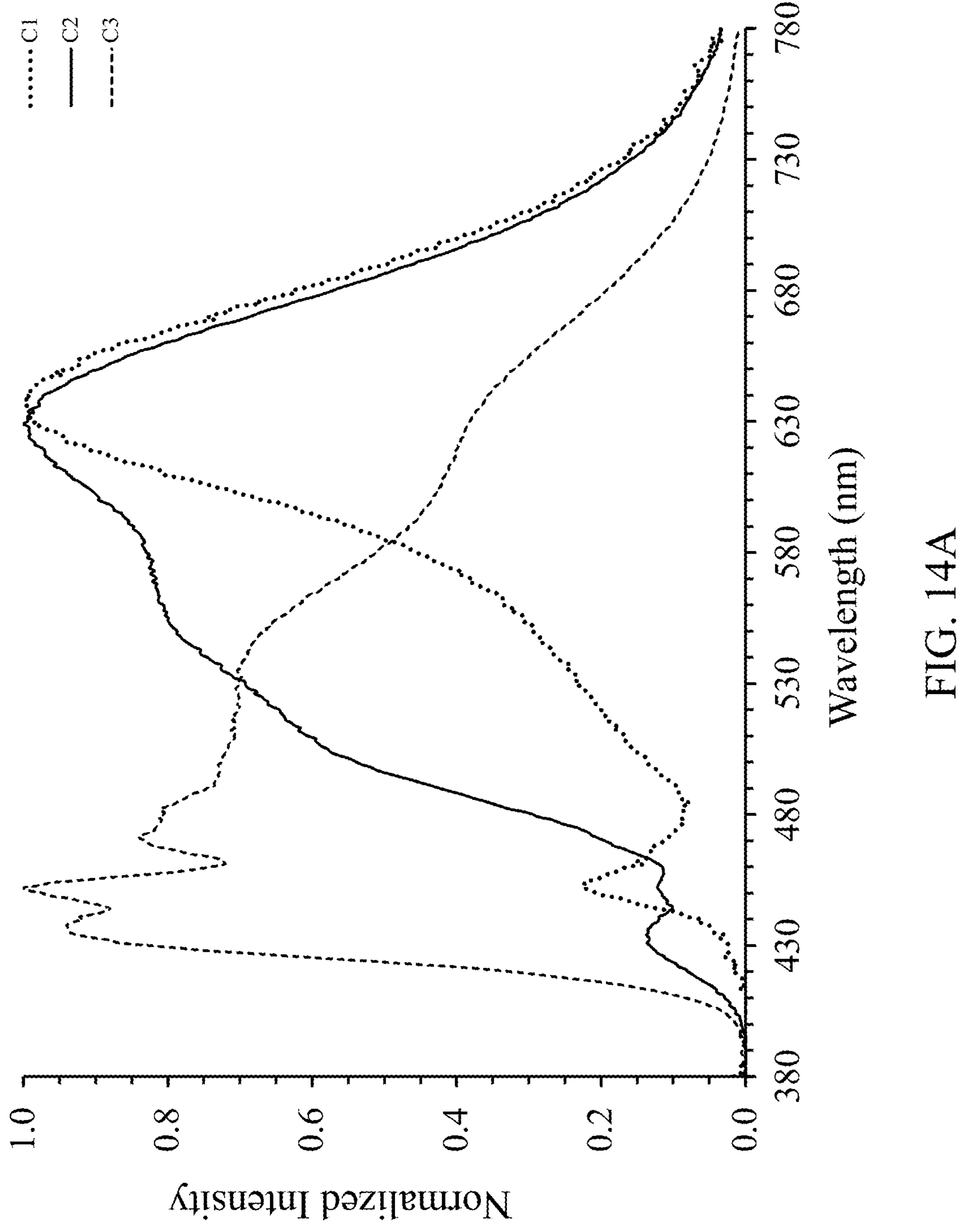
Figure 14B:
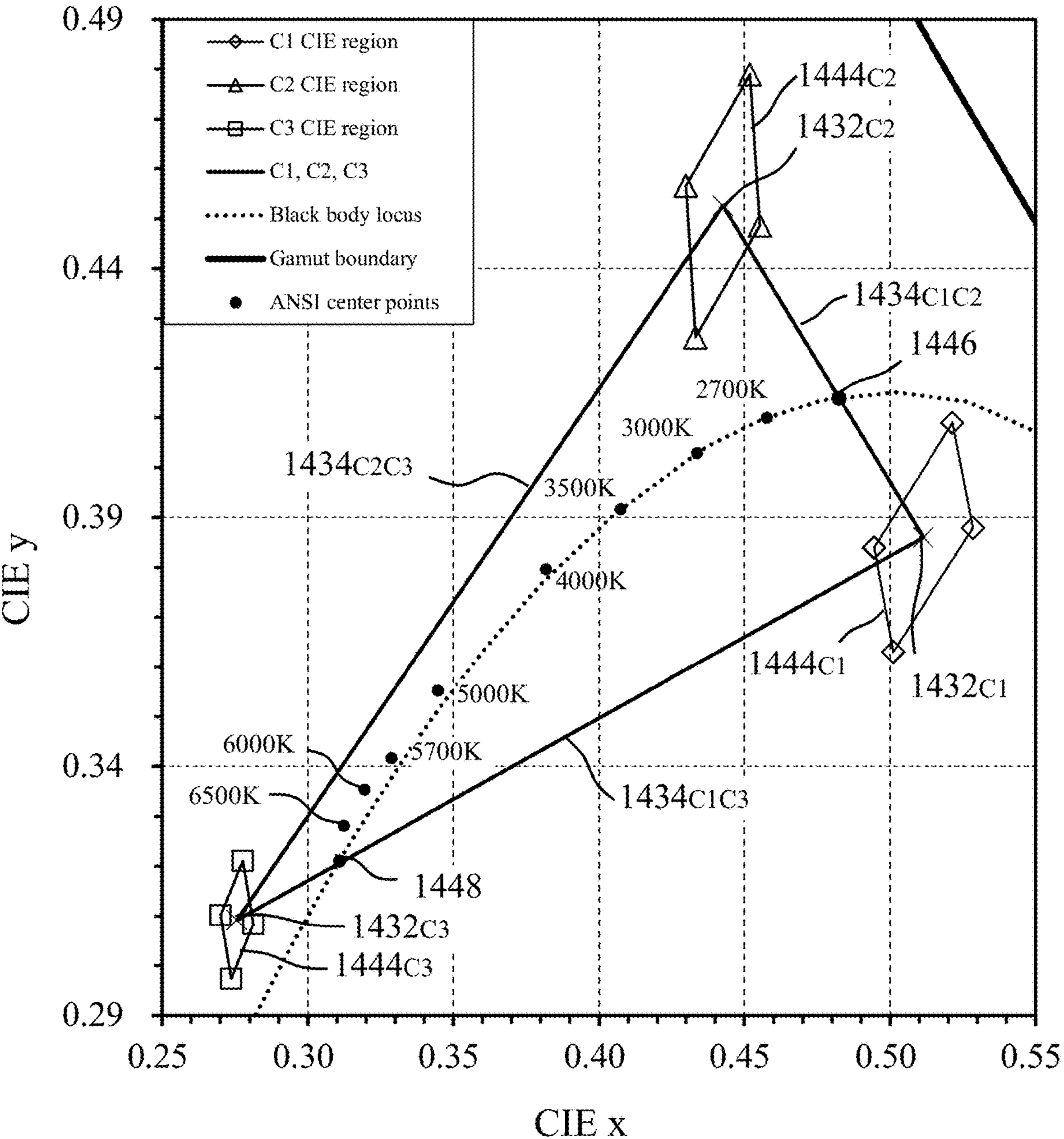
Figure 14C:
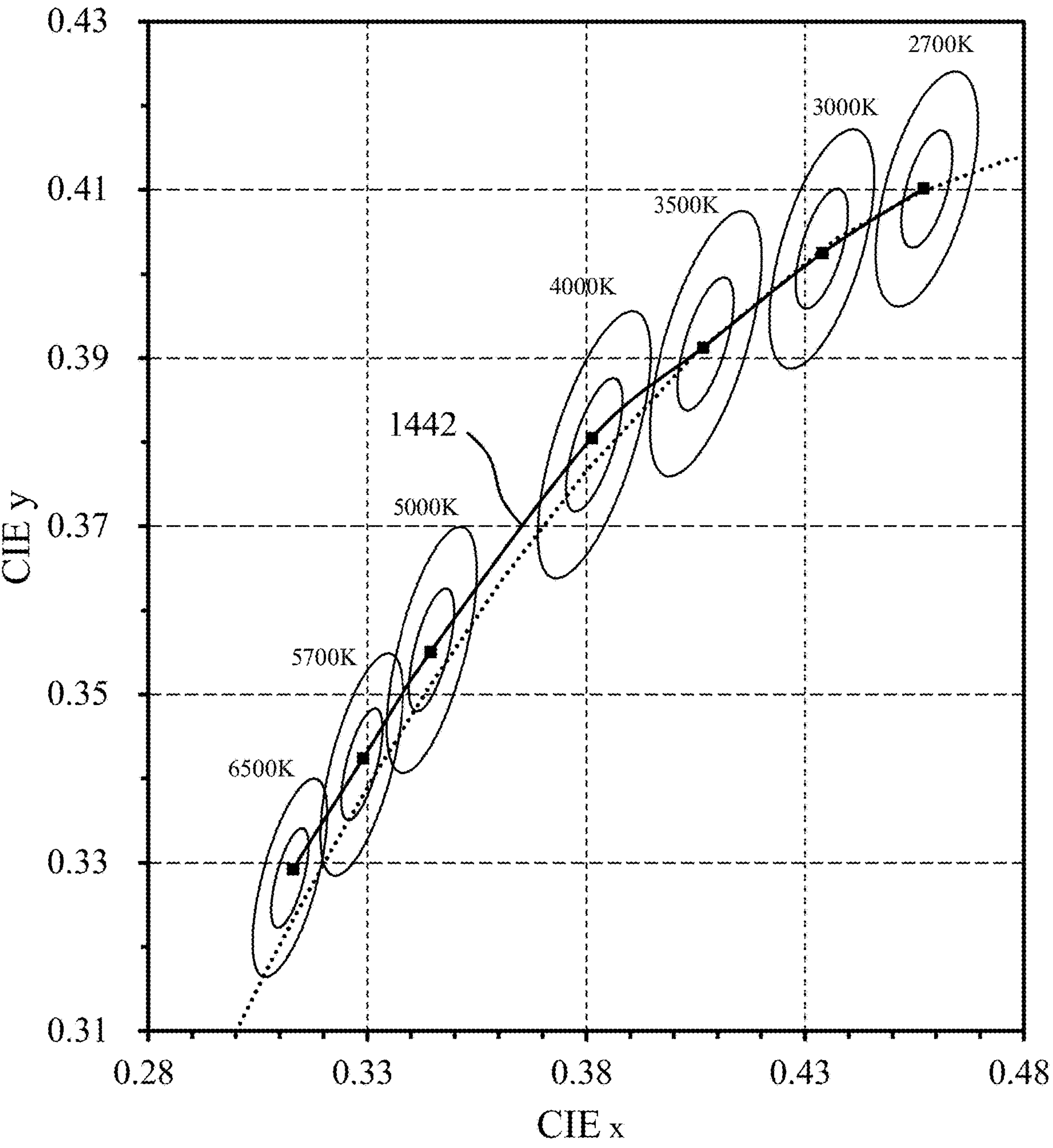
Figure 14D:
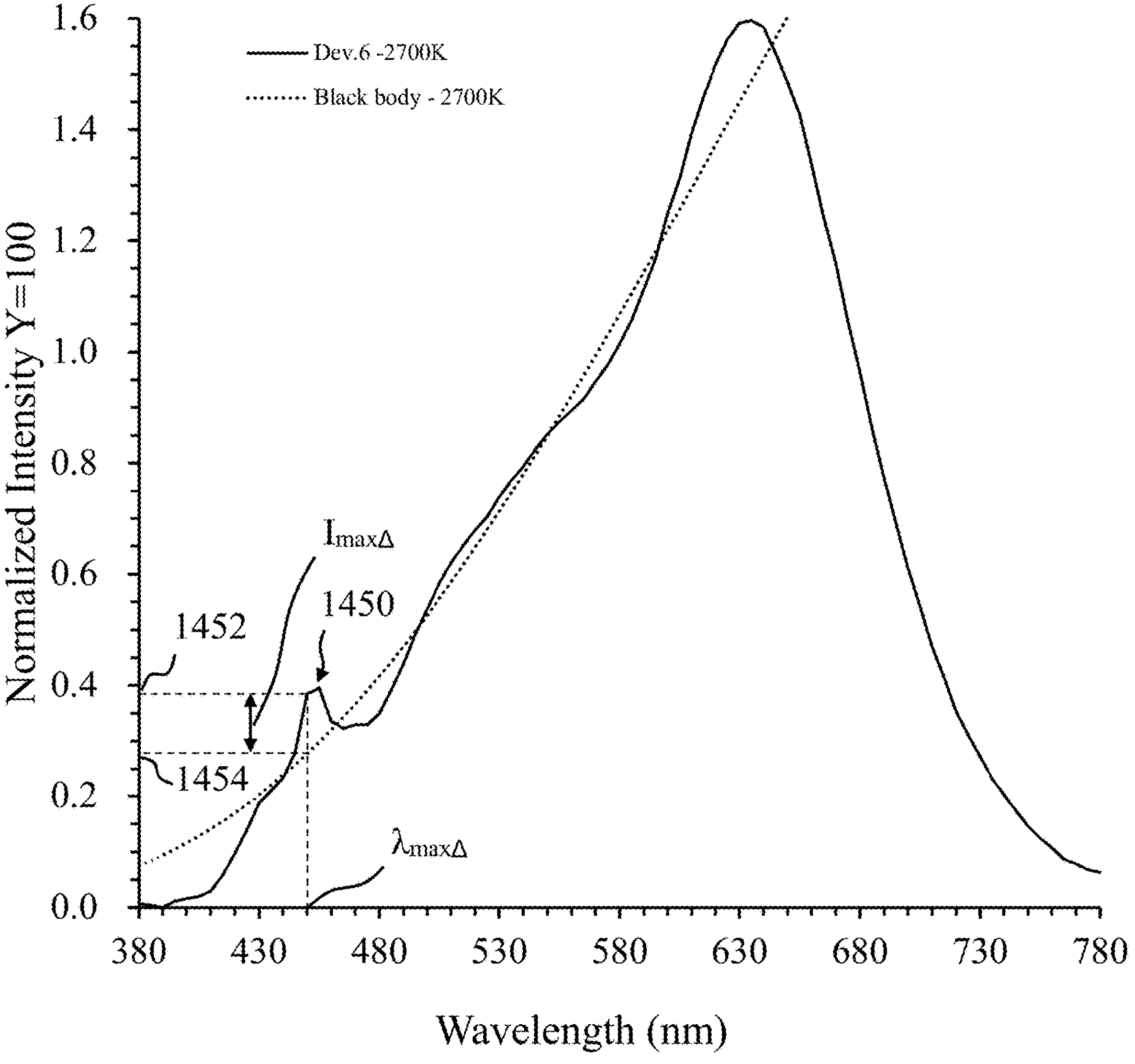
Figure 14E:
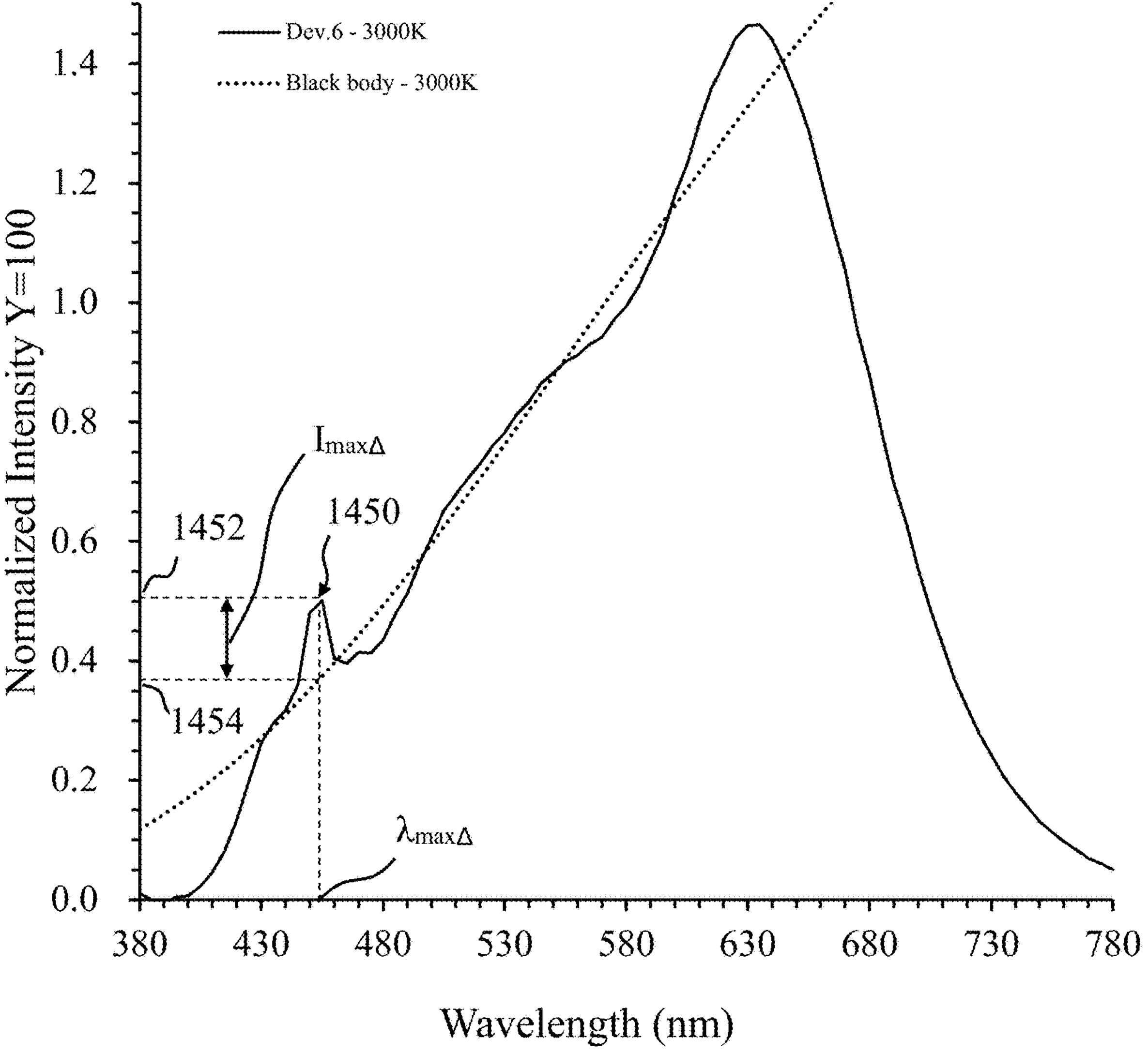
Figure 14F:
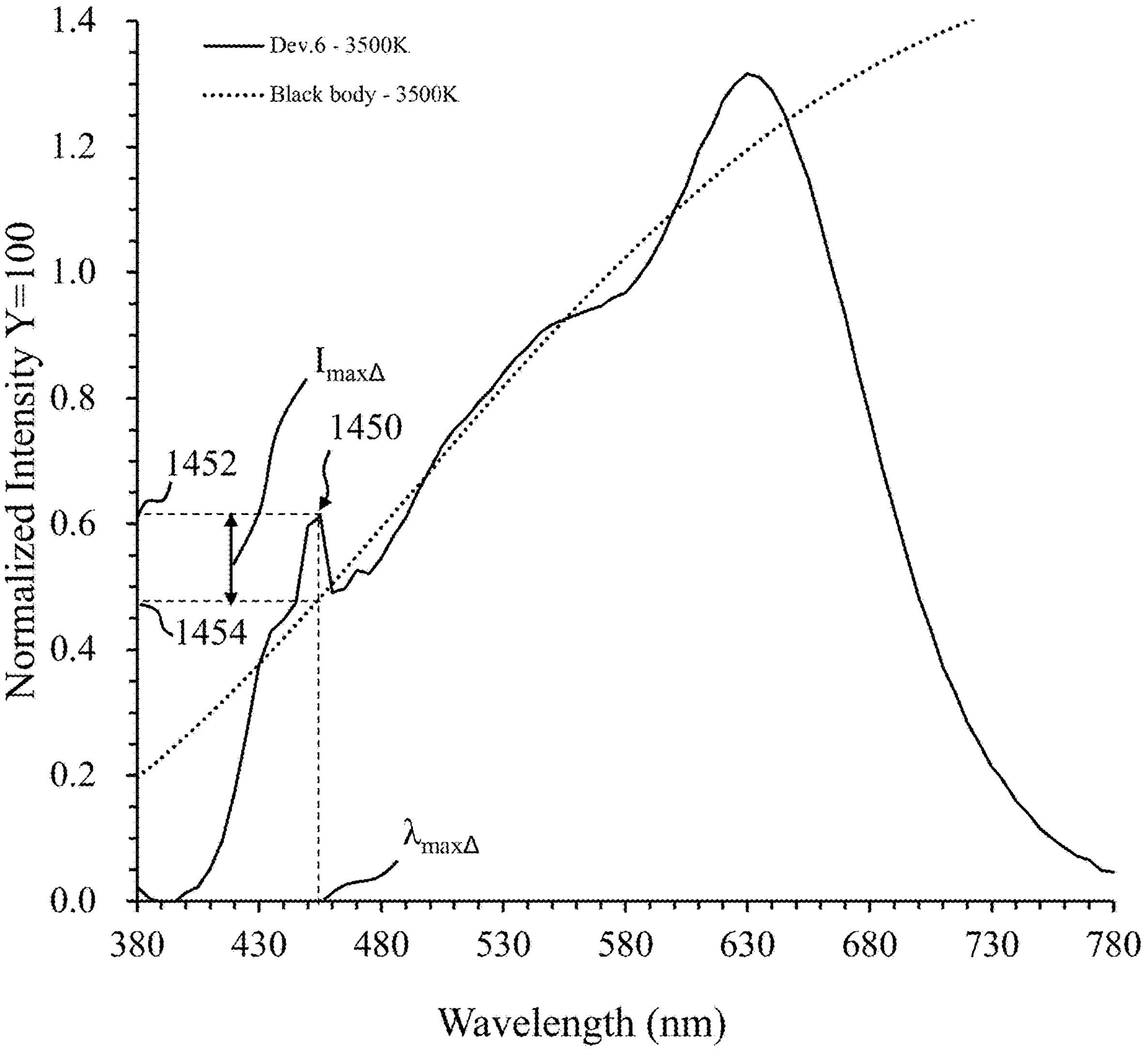
Figure 14G:
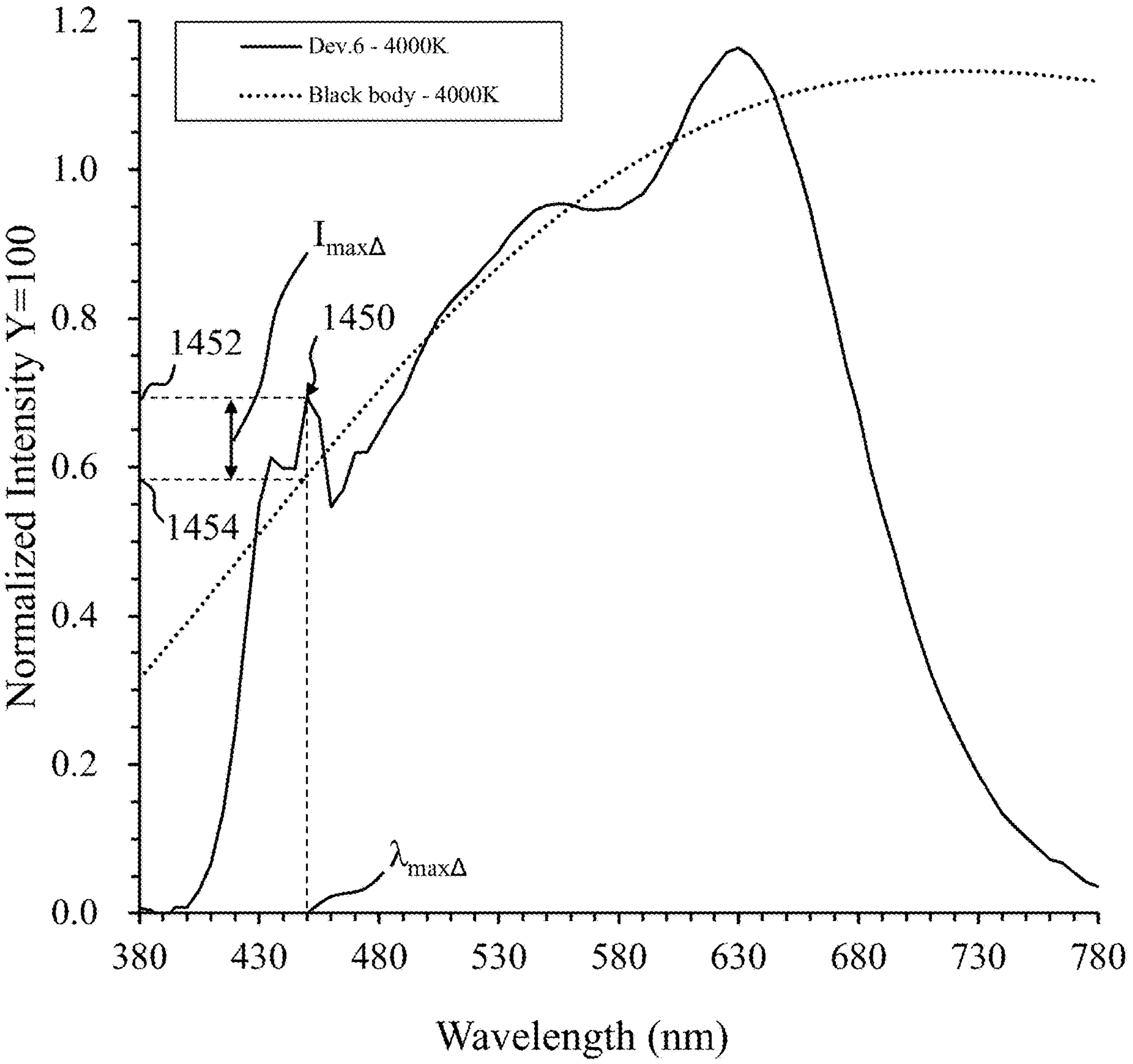

FIG. 14A-14C are measured characteristics for a color-temperature-tunable lighting device (Dev.6) comprising LEDs of three chromaticity/color temperatures C1, C2, C3 in which FIG. 14A shows spectra, normalized intensity (a.u.) versus wavelength (nm), for light C1 (dotted line), light C2 (solid line), and light C3 (dashed line), FIG. 14B is a CIE 1931 chromaticity diagram illustrating the chromaticity (CIE center point—cross) of light C1, C2, C3, the CIE region for light C1 (solid line/diamond), C2 (solid line/triangle), C3 (solid line/square), gamut of light (solid line) that lighting device Dev.6 can generate, and black body locus (dotted line), and FIG. 14C is a CIE 1931 chromaticity diagram illustrating the chromaticity (color) of light (sold square) generated by lighting device Dev.6 for nominal CCTs of 2700K, 3000K, 3500K, 4000K, 5000K, 5700K, and 6500K, light emission locus (solid line) for CCTs from 2700K to 6500K, black body locus (dashed line), and 3 SDCM and 6 SDCM (Mac Adam ellipses—thin solid line). FIGS. 14D-14J are measured emission spectra (solid line), normalized intensity versus wavelength (nm), for lighting device Dev.6 in which: FIG. 14D is the emission spectrum for operation for a nominal CCT of 2700K, FIG. 14E is the emission spectrum for operation for a nominal CCT of 3000K, FIG. 14F is the emission spectrum for operation for a nominal CCT of 3500K, FIG. 14G is the emission spectrum for operation for a nominal CCT of 4000K, FIG. 10H is the emission spectrum for operation for a nominal CCT of 5000K, FIG. 14I is the emission spectrum for operation for a nominal CCT of 5700K, and FIG. 14J is the emission spectrum for operation for a nominal CCT of 6500K.

As can be seen from TABLE 17A: LED-C1 has a luminous efficacy (LE) of 102 lm/W and generates light of chromaticity (color point: CIE 0.511, 0.386, Δuv=−0.0090) corresponding to a CCT of 1955K (about 1950K) with a CRI Ra of 91.8; LED-C2 has a luminous efficacy of 137 lm/W and generates light of chromaticity (color point: CIE 0.443, 0.453, Δuv=0.0175) corresponding to a CCT of 3267K (about 3300K) with a CRI Ra of 88.7 (about 90); and LED-C3 has a luminous efficacy of 135 lm/W and generates light with a chromaticity of chromaticity (color point: CIE 0.276, 0.309, Δuv=0.0136) corresponding to a CCT of 9461K (about 9500K) with a CRI Ra of 89.9 (about 90).

As can be seen from TABLE 17B: C1 comprises a CIE region (C1 CIE region) defined by CIE color coordinates CIE-1 (0.495, 0.384), CIE-2 (0.501, 0.363), CIE-3 (0.529, 0.388), and CIE-4 (0.522, 0.409) which in terms of CCT is a CIE region from 1831K (about 1800K) to 2094K (about 2100K). The C1 CIE region corresponds to about 6 SDCM centered on a CIE center (0.511, 0.386). As can be seen from TABLE 17C: C2 comprises a CIE region (C2 CIE Region) defined by CIE color coordinates CIE-1 (0.430, 0.457), CIE-2 (0.433 0.426), CIE-3 (0.455, 0.449), and CIE-4 (0.452, 0.479) which in terms of CCT is from 3046K (about 3050K) to 3479K (about 3500K). The C2 CIE region corresponds to about 6 SDCM centered on a CIE center (0.443, 0.453). As can be seen from TABLE 17D: C3 comprises a CIE region (C3 CIE Region) defined by CIE color coordinates CIE-1 (0.270, 0.310), CIE-2 (0.274, 0.297), CIE-3 (0.281, 0.308), and CIE-4 (0.278, 0.321) which in terms of CCT is from 8873K (about 8500K) to 10234K (about 10500K).

The CIE chromaticity diagram of FIG. 14B shows each of the CIE regions: C1 CIE region $\mathbf{1444}_{C1}$ (diamond/solid line), C2 CIE region $\mathbf{1044}_{C2}$ (triangle/solid line), and C3 CIE region $\mathbf{1044}_{C3}$ (square/solid line). FIG. 14B shows the chromaticity (center color point) $\mathbf{1432}_{C1}$ of light of color C1 generated by the LED-C1, the chromaticity (center color point) $\mathbf{1432}_{C2}$ of light of color C2 generated by LED-C2, and the chromaticity (center color point) $\mathbf{1432}_{C3}$ of light of color C3 generated by the LED-C3. Straight lines $\mathbf{1434}_{C1C2}$, $\mathbf{1434}_{C2C3}$, and $\mathbf{1432}_{C1C3}$ connecting the points $\mathbf{1432}_{C1}$, $\mathbf{1432}_{C2}$, and $\mathbf{1432}_{C3}$ define a triangle that represents the gamut of chromaticity (colors)/color temperatures of light that Dev.6 can generate—i.e., the device can generate any chromaticity (color)/color temperature of light lying on the boundary or within the triangle. It is to be noted that lowest CCT of light that Dev.6 can generate that lies on the black body locus (dotted line) is 1695K (about 1700K) which corresponds to the point of intersection 1446 (CIE 0.4825, 0.4140) of line $\mathbf{1434}_{C1C3}$ connecting color points $\mathbf{1432}_{C1}$ to $\mathbf{1432}_{C3}$ and the black body locus. It is to be noted that highest CCT of light that Dev.6 can generate that lies on the black body locus (dotted line) is 6668K (about 6600K) which corresponds to the point of intersection 1448 (CIE 0.3110, 0.3210) of line $\mathbf{1434}_{C1C3}$ connecting color point $\mathbf{1432}_{C1}$ to color point $\mathbf{1432}_{C3}$ and the black body locus. It will be appreciated that Dev.6 is therefore capable of generating any CCT of light from 1700K to about 6600K lying on the black body locus.

As can be seen from FIG. 14A, the emission spectrum for the LED-C1 (dotted line) is composed primarily of a broadband peak (FWHM≈100 nm) with a peak emission wavelength of about 640 nm in the red region of the visible spectrum, the emission spectrum for the LED-C2 (solid line) is composed primarily of a broadband peak (FWHM≈200 nm) centered at a wavelength of about 590 nm in the yellow region of the visible spectrum, and the emission spectrum for the LED-C3 (dashed line) is composed of a broadband peak (FWHM≈36 nm) with a peak emission wavelength of about 440 nm in the blue region of the visible spectrum and a broadband tail region at wavelengths in the green to red region of the spectrum (460-680 nm).

TABLE 17A

Dev. 6: Measured characteristics of LED-C1, LED-C2, and LED-C3

| LED | Flux (lm) | Power (W) | LE (lm/W) | CIE center point x | CIE center point y | CCT (K) | CRI Ra | Δuv |
|---|---|---|---|---|---|---|---|---|
| LED-C1 | 17.2 | 0.17 | 102 | 0.5114 | 0.3860 | 1955 | 91.8 | −0.0090 |
| LED-C2 | 23.8 | 0.17 | 137 | 0.4426 | 0.4526 | 3267 | 88.7 | 0.0175 |
| LED-C3 | 23.8 | 0.18 | 135 | 0.2757 | 0.3092 | 9461 | 89.9 | 0.0136 |

TABLE 17B

Dev. 6: CIE region for light C1

| CIE point | C1 CIE region CIE x | y | CCT (K) | Δuv |
|---|---|---|---|---|
| CIE-1 | 0.495 | 0.384 | 2094 | −0.0103 |
| CIE-2 | 0.501 | 0.363 | 1892 | −0.0170 |
| CIE-3 | 0.529 | 0.388 | 1831 | −0.0007 |
| CIE-4 | 0.522 | 0.409 | 2016 | −0.0015 |
| Center | 0.511 | 0.386 | 1955 | −0.0090 |

TABLE 17C

| Dev. 6: CIE region for light C2 | | | | |
|---|---|---|---|---|
| | C2 CIE region | | | |
| CIE | CIE | | CCT | |
| point | x | y | (K) | Δuv |
| CIE-1 | 0.430 | 0.457 | 3497 | 0.0212 |
| CIE-2 | 0.433 | 0.426 | 3236 | 0.0093 |
| CIE-3 | 0.455 | 0.449 | 3046 | 0.0142 |
| CIE-4 | 0.452 | 0.479 | 3294 | 0.0220 |
| Center | 0.443 | 0.453 | 3267 | 0.0175 |

TABLE 17D

| Dev. 6: CIE region for light C3 | | | | |
|---|---|---|---|---|
| | C3 CIE region | | | |
| CIE | CIE | | CCT | |
| point | x | Y | (K) | Δuv |
| CIE-1 | 0.270 | 0.310 | 9927 | 0.0174 |
| CIE-2 | 0.274 | 0.297 | 10234 | 0.0090 |
| CIE-3 | 0.281 | 0.308 | 9013 | 0.0099 |
| CIE-4 | 0.278 | 0.321 | 8873 | 0.0181 |
| Center | 0.276 | 0.309 | 9465 | 0.0136 |

TABLE 18 tabulates forward drive current ($I_F$) for the first and second LEDs LED-C3, LED-C2, and LED-C1 of Dev.6 for generating light with a nominal general color rendering index CRI Ra of 97 for nominal color temperatures (CCT) of 2700K, 3000K, 3500K, 4000K, 5000K, 5700K, and 6500K. TABLE 19 tabulates the measured optical and electrical characteristics for Dev.6 when operated to generate light with a nominal CRI Ra of 97 for nominal color temperatures (CCT) from 2700K to 6500K.

As can be seen from TABLE 18, the CCT of light generated by Dev.6 is increased by increasing the proportion of light of color C3 while reducing the proportion of light of color C1 and C2. TABLE 19 demonstrates that by selection of the drive currents to the first and second LED-C1, LED-C2, and LED-C3, the color-tunable multi-LED packaged light emitting device (Dev.6) can generate white light with a CCT from 2700 K to 6500K with a general color rendering index CRI Ra of at least 97 (97.1 to 99.0) and CRI R9 of at least 90 (90.4 to 99.0) with a luminous efficacy from 102 lm/W (102.1 lm/W) to about 122 lm/W (121.6 lm/W). TABLE 19 also includes the measured CCT of light generated by Dev.6.

Referring to FIG. 14C it is to be noted that Dev.6 can generate light 1442 (solid line) of CCTs from 2700K to 6500K with a chromaticity that closely matches the black body locus (dotted line). As can be seen from TABLE 19, the chromaticity of light generated by Dev.6 are within 0.0032 Δuv (about 0.003) or less of the black body locus for CCTs from 2700K to 6500K.

TABLE 18

| Dev. 6: Forward drive current $I_F$ for the 1st LED-C3, 2nd LED-C3, LED-C2, and LED-C1 for generating light with a nominal CRI Ra = 97 for nominal CCTs from 2700K to 6500K | | | | |
|---|---|---|---|---|
| Nom. CCT | Forward drive current $I_F$ (mA) | | | |
| (K) | LED-C1 | LED-C2 | 1st LED-C3 | 2nd LED-C3 |
| 2700 | 149.9 | 134.5 | 7.8 | 7.8 |
| 3000 | 119.8 | 145.7 | 17.3 | 17.3 |
| 3500 | 89.7 | 148.3 | 31.0 | 31.0 |
| 4000 | 59.2 | 146.9 | 46.9 | 46.9 |
| 5000 | 44.6 | 97.0 | 79.2 | 79.2 |
| 5700 | 44.4 | 63.4 | 96.1 | 96.1 |
| 6500 | 42.9 | 27.6 | 114.8 | 114.8 |

TABLE 19A

| Dev. 6: Measured optical and Electrical characteristics for nominal CRI Ra = 97 for nominal color temperatures (CCT) from 2700 K to 6500 K | | | | | | | | | |
|---|---|---|---|---|---|---|---|---|---|
| Nom. | Flux | Power | LE | CIE | | CCT | CRI | | |
| CCT (K) | (lm) | (W) | (lm/W) | x | y | (K) | Ra | R9 | Δuv |
| 2700 | 91.4 | 0.90 | 102.1 | 0.4571 | 0.4102 | 2736 | 97.7 | 90.4 | 0.0001 |
| 3000 | 95.3 | 0.90 | 106.8 | 0.4340 | 0.4025 | 3038 | 97.1 | 95.2 | −0.0002 |
| 3500 | 99.3 | 0.89 | 112.1 | 0.4068 | 0.3913 | 3471 | 98.4 | 98.5 | 0.0001 |
| 4000 | 102.8 | 0.89 | 116.0 | 0.3813 | 0.3805 | 4005 | 99.0 | 97.0 | 0.0015 |
| 5000 | 106.5 | 0.87 | 121.6 | 0.3445 | 0.3551 | 5033 | 97.9 | 96.7 | 0.0020 |
| 5700 | 106.1 | 0.87 | 121.5 | 0.3290 | 0.3424 | 5654 | 97.6 | 99.0 | 0.0022 |
| 6500 | 106.2 | 0.88 | 120.3 | 0.3130 | 0.3293 | 6488 | 97.2 | 97.8 | 0.0032 |

Figure 14H:
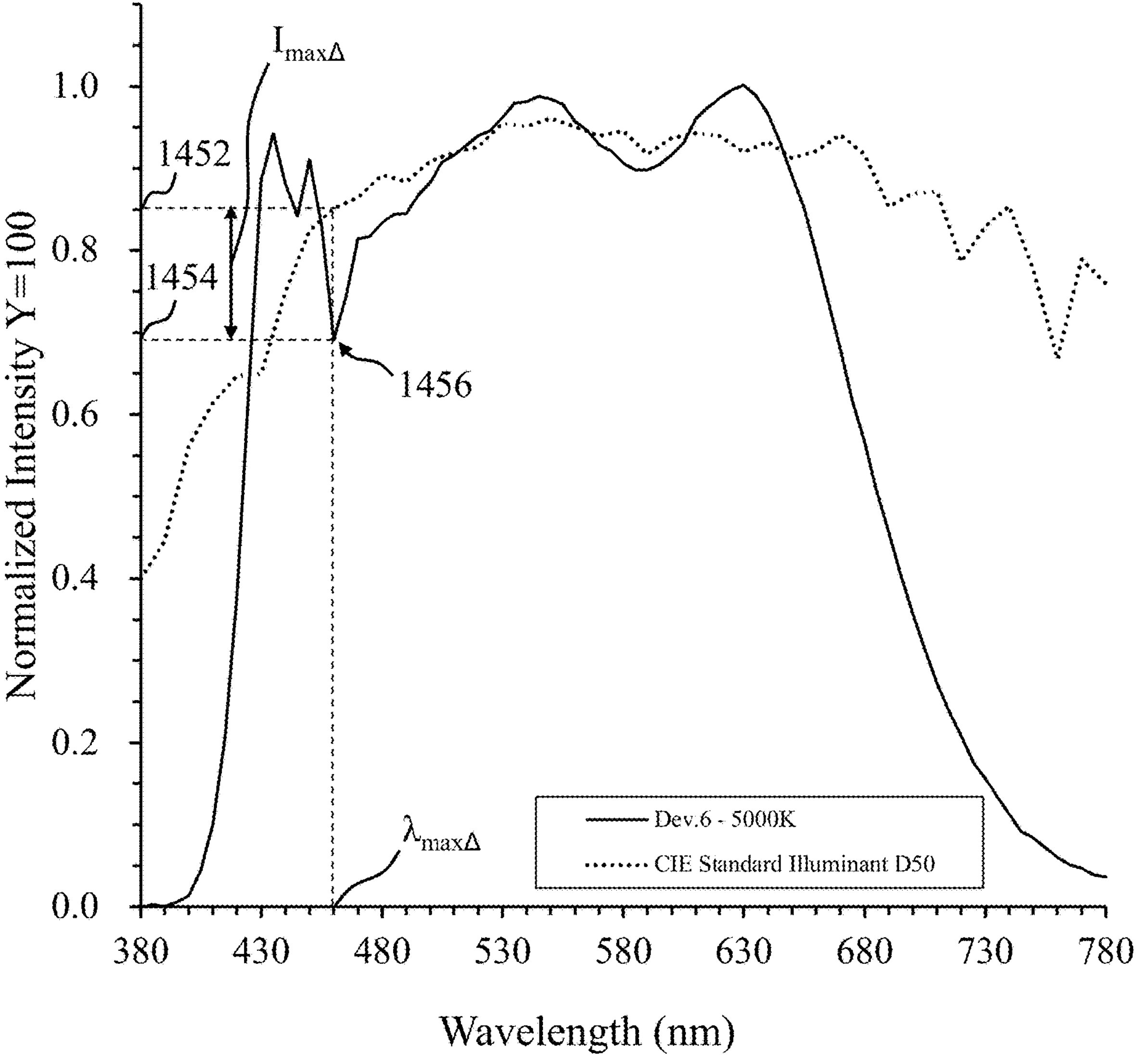
Figure 14I:
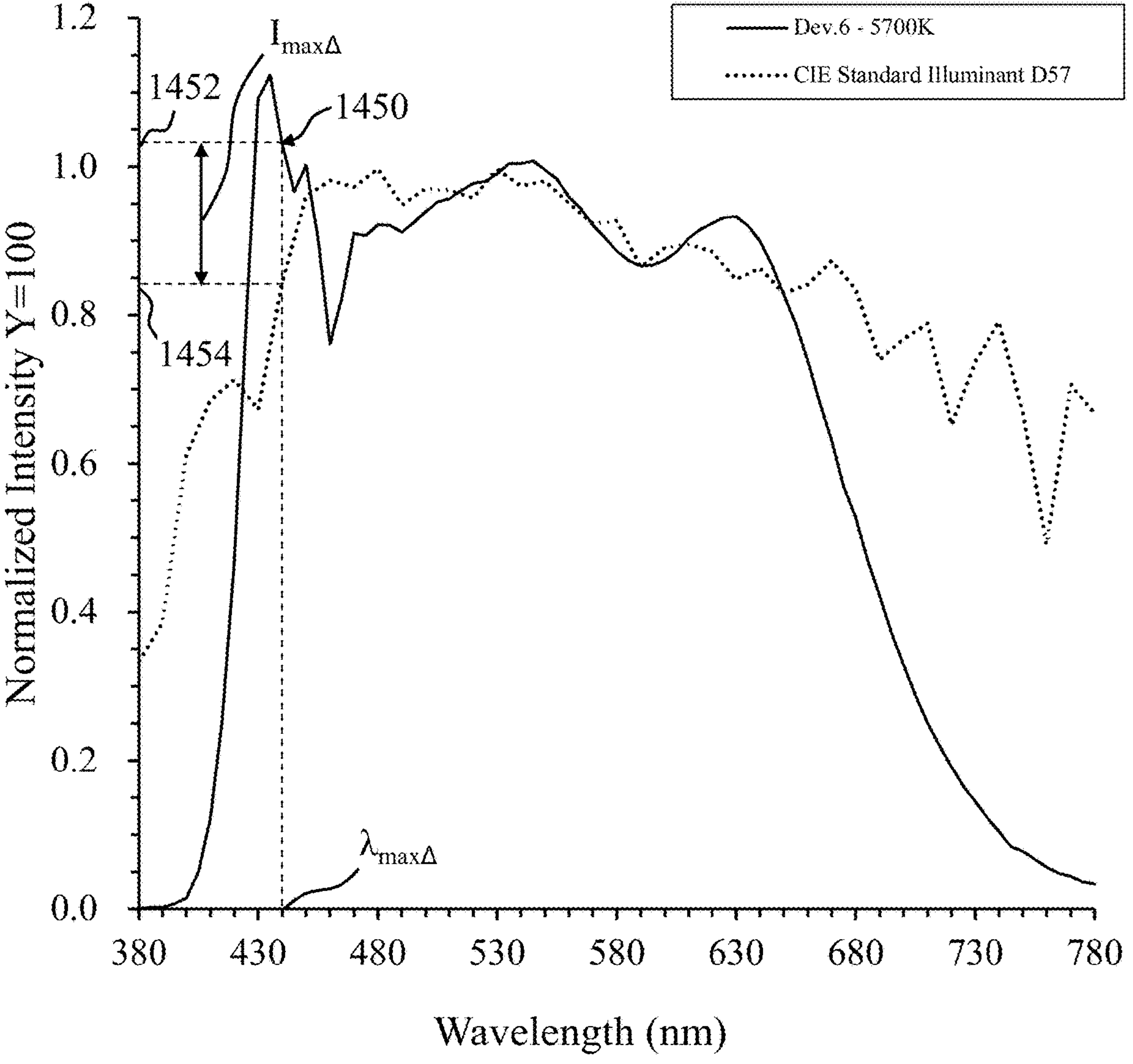
Figure 14J:
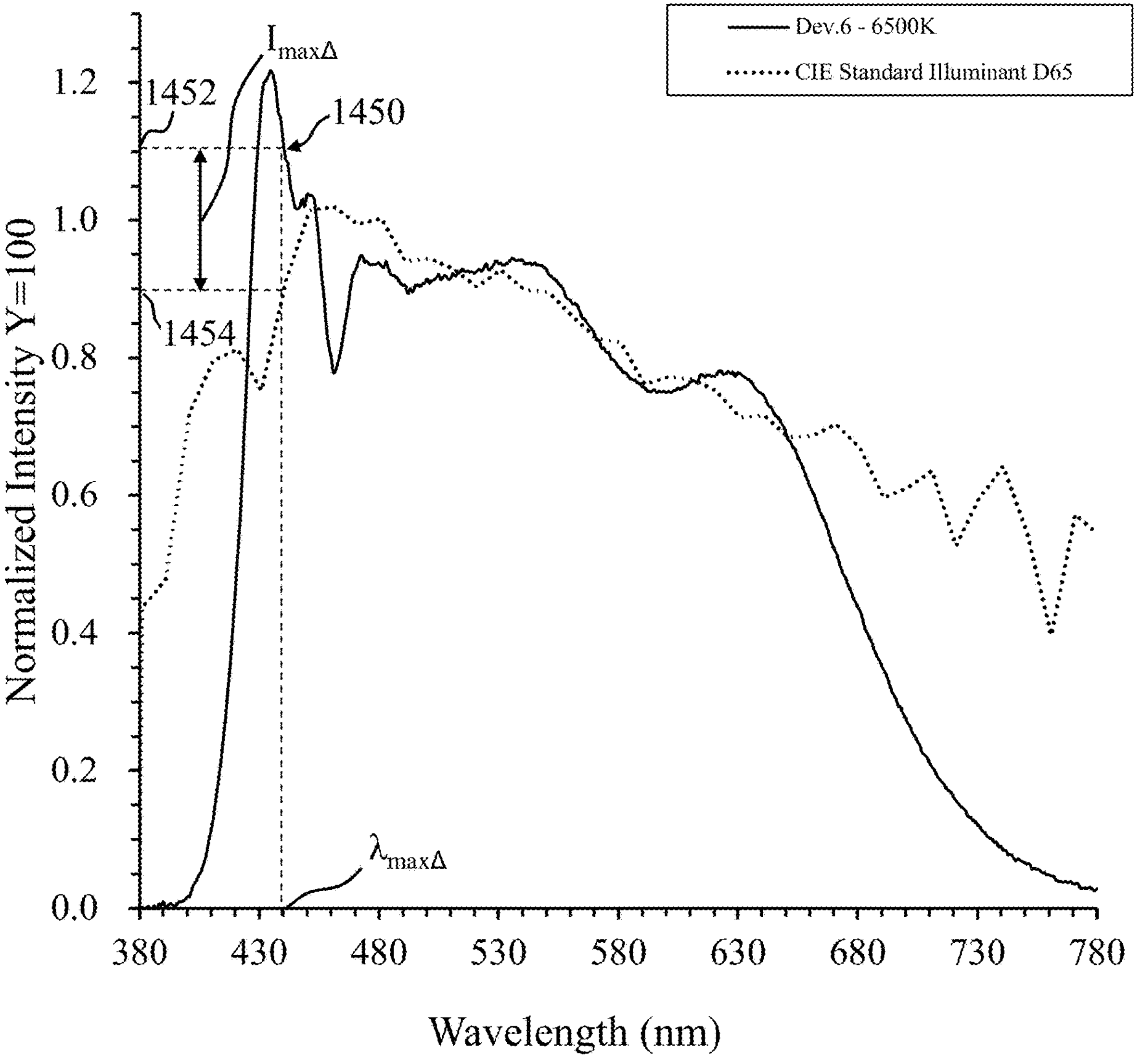

FIGS. 14D-14J are measured emission spectra, normalized intensity (normalized to a CIE 1931 XYZ luminance Y=100) versus wavelength (nm), for lighting device Dev.6 in which: FIG. 14D is the emission spectrum for operation for a nominal CCT of 2700K and black body spectrum of 2700K, FIG. 14E is the emission spectrum for operation for a nominal CCT of 3000K and a black body spectrum of 3000K, FIG. 14F is the emission spectrum for operation for a nominal CCT of 3500K and a black body spectrum of 3500K, FIG. 14G is the emission spectrum for operation for a nominal CCT of 4000K and a black body spectrum of 4000K, FIG. 14H is the emission spectrum for operation for a nominal CCT of 5000K and a black body spectrum of 5000K, FIG. 14I is the emission spectrum for operation for a nominal CCT of 5700K and a CIE Standard Illuminant D57 (5700K), and FIG. 14J is the emission spectrum for operation for a nominal CCT of 6500K and a CIE Standard Illuminant D65 (6500K). As can be seen from the figures, light generated by Dev.6 has a spectrum that closely resembles the black body spectrum/Standard illuminant for wavelengths from about 450 nm to 650 nm. Each of FIGS. 14D-10J show the maximum intensity deviation ($I_{max\Delta}$) and wavelength at which the intensity difference (deviation) is a maximum ($\lambda_{max\Delta}$) for a wavelength range 440 nm to 650 nm.

TABLE 19B tabulates maximum intensity deviation ($I_{max\Delta}$) and wavelength of maximum deviation ($\lambda_{max\Delta}$) for wavelength ranges 440 nm to 650 nm and 460 nm to 650 nm for Dev.6 operable to generate light of nominal CCTs from 2700K to 6500K. As can be seen from the table Dev.6 is capable of generating light of color temperatures from 2700K to 6500K having an intensity versus wavelength spectrum, which over a wavelength range 440 nm to 650 nm, has a maximum deviation between the normalized intensity of light generated by the lighting device compared with the normalized intensity of light of the spectrum of a black body radiator or standard illuminant which is less than 0.38 (38%). As can be seen from the table Dev.6 is capable of generating light of color temperatures from 2700K to 6500K having an intensity versus wavelength spectrum, which over a wavelength range 460 nm to 650 nm, has a maximum deviation between the normalized intensity of light generated by the lighting device compared with the normalized intensity of light of the spectrum of a black body radiator or standard illuminant which is less than 0.22 (22%). Test data indicates that through further optimization, devices in accordance with the invention can generate light with color temperatures from 2700K to 6500K with the maximum deviation of less than 0.3, 0.2, and/or less than 0.1 over a wavelength range 440 nm to 650 nm.

TABLE 19B

Maximum intensity deviation ($I_{max\Delta}$) and wavelength of maximum deviation ($\lambda_{max\Delta}$) for wavelength ranges 440 nm to 650 nm and 460 nm to 650 nm for Dev. 6 operable to generate light of nominal CCTs from 2700K to 6500K

| Nom. CCT | Wavelength range 440 nm to 650 nm | | Wavelength range 460 nm to 650 nm | |
|---|---|---|---|---|
| (K) | $I_{max\Delta}$ | $\lambda_{max\Delta}$ | $I_{max\Delta}$ | $\lambda_{max\Delta}$ (nm) |
| 2700 | 38% (0.40) | 450 nm | 16% (0.16) | 475 nm |
| 3000 | 36% (0.35) | 455 nm | 12% (0.12) | 475 nm |
| 3500 | 29% (0.29) | 455 nm | 11% (0.11) | 630 nm |
| 4000 | 19% (0.19) | 450 nm | 14% (0.14) | 460 nm |
| 5000 | 19% (0.19) | 460 nm | 19% (0.19) | 460 nm |
| 5700 | 23% (0.23) | 440 nm | 22% (0.22) | 462 nm |
| 6500 | 23% (0.23) | 440 nm | 22% (0.22) | 462 nm |

Color-Temperature-Tunable Lighting Device—Dev.7

A color-temperature-tunable lighting device, denoted Dev.7, comprises LEDs that generate light of three different colors/CCTs: C1, C2, and C3. Lighting device Dev.7 comprises the device of FIGS. 3A-3C and comprises a 3838 four cavity package containing two LEDs, LED-C1, that generate light with a first chromaticity/color temperature C1, an LED, LED-C2, that generates of a second chromaticity/color temperature C2, and an LED, LED-C3, that generates light of a third chromaticity/color temperature C3. The two C1 LEDs, in the first and second cavities, comprise a PC LED comprising a mixture of green to red photoluminescence materials (e.g., GaYAG, GaLuAG, and/or $(Y,Lu)_3(Al,Ga)_5O_{12}$ and CASN) and a narrowband red phosphor (e.g., KSF). LED-C2, in the third cavity, comprises a PC LED comprising a mixture of green to red photoluminescence materials (e.g., GaYAG, GaLuAG, and/or $(Y,Lu)_3(Al,Ga)_5O_{12}$ and CASN) and a narrowband red phosphor (e.g., KSF). LED-C3, in the fourth cavity, comprises a PC LED comprising green to yellow photoluminescence materials (e.g., YAG, LuAG, GaYAG, GaLuAG, and/or $(Y,Lu)_3(Al,Ga)_5O_{12}$). The Lighting device, Dev.7, is configured to generate light with a general color rendering index CRI Ra of 90.

Figure 15A:
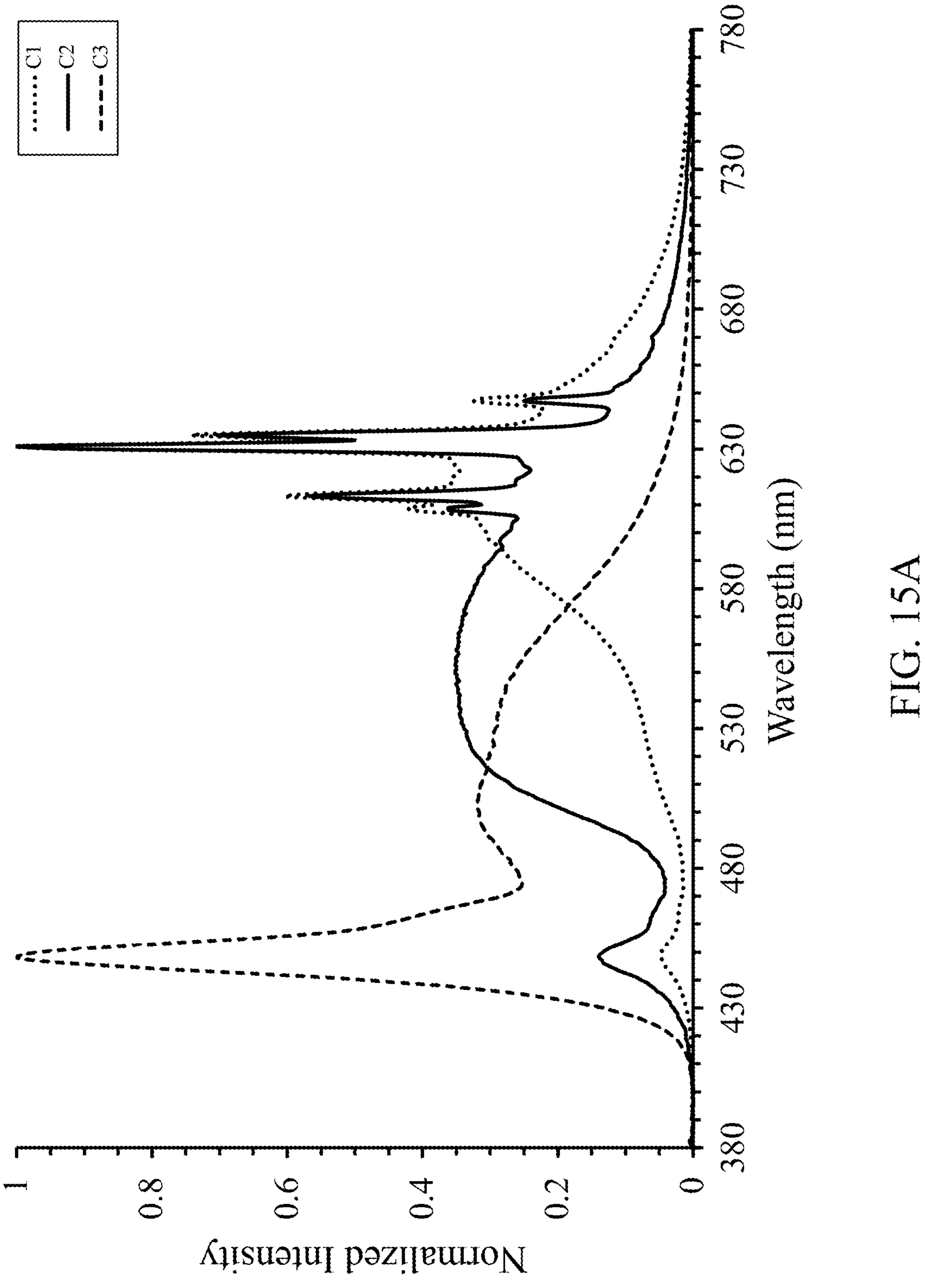
Figure 15B:
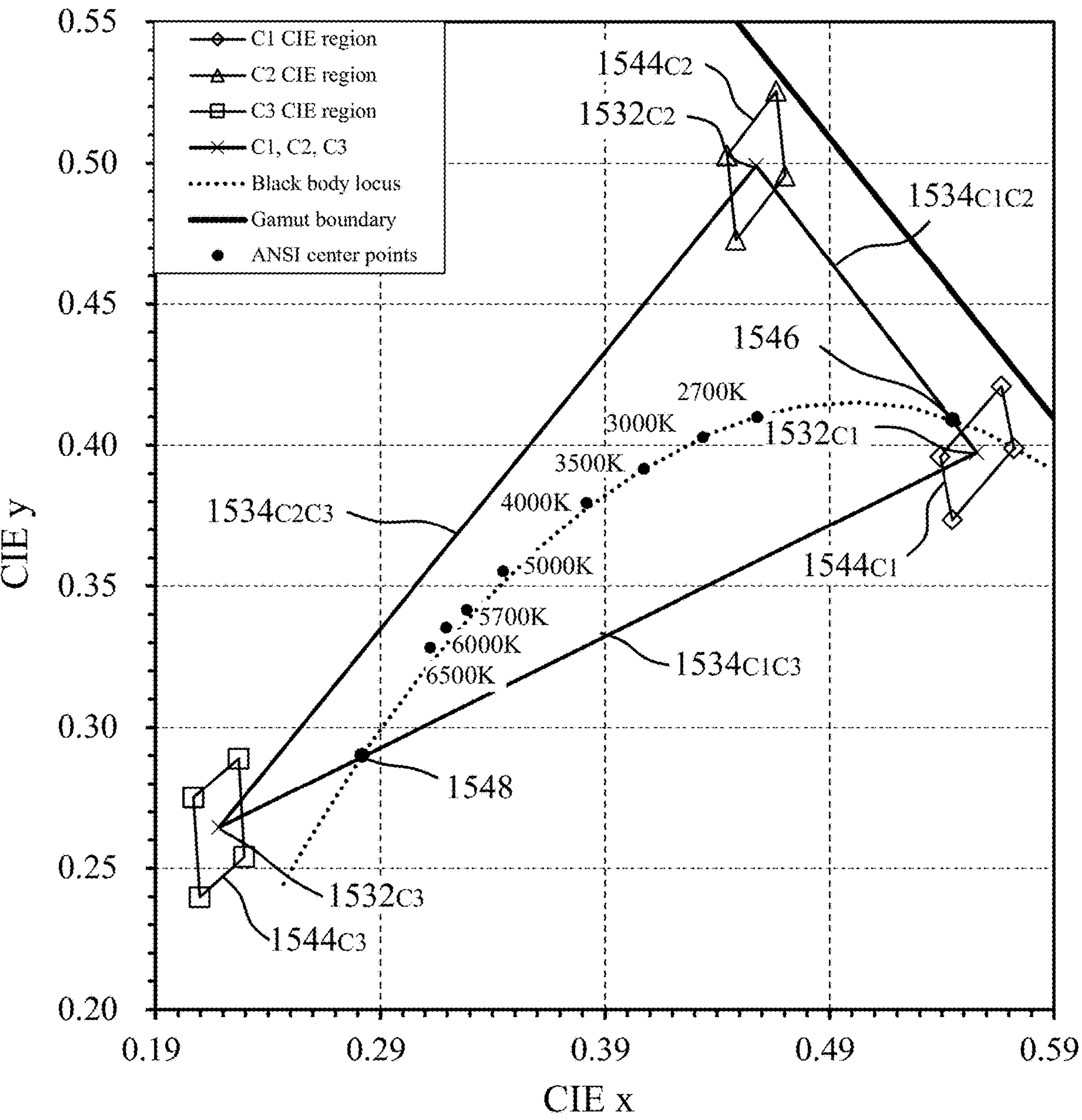
Figure 15C:
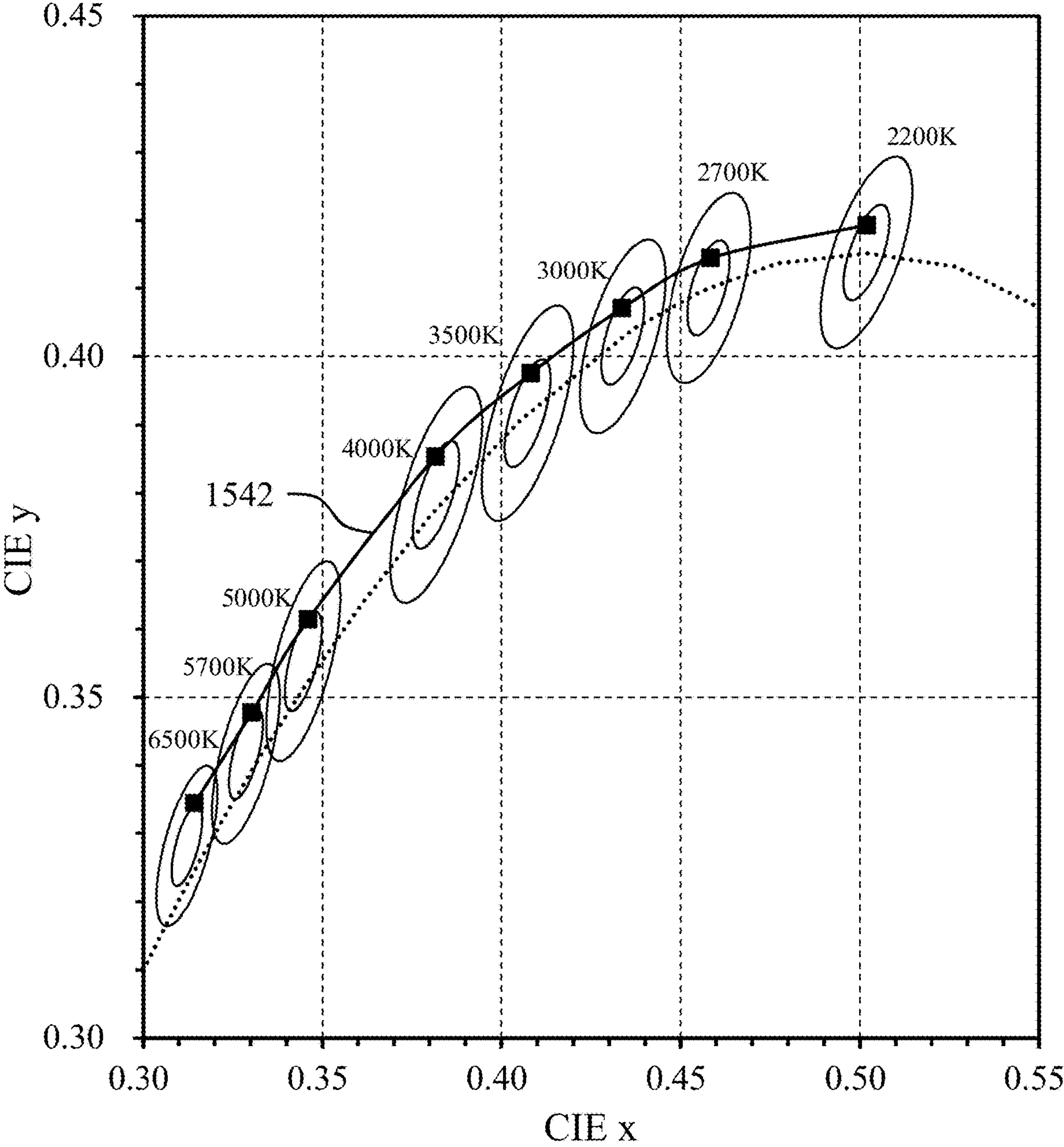

TABLE 20A tabulates measured optical/electrical characteristics of LED-C1, LED-C2, and LED-C3 of lighting device Dev.7 and TABLE 20B tabulates CIE region, CIE center point, CCT and Δuv for light C1, C2, and C3. FIG. 15A-15C are measured characteristics for a color-temperature-tunable lighting device (Dev.7) comprising LEDs of three chromaticity/color temperatures C1, C2, C3 in which FIG. 15A shows spectra, normalized intensity (a.u.) versus wavelength (nm), for light C1 (dotted line), light C2 (solid line), and light C3 (dashed line), FIG. 15B is a CIE 1931 chromaticity diagram illustrating the chromaticity (CIE center point—cross) of light C1, C2, C3, the CIE region for light C1 (solid line/diamond), C2 (solid line/triangle), C3 (solid line/square), gamut of light (solid line) that lighting device Dev.7 can generate, and black body locus (dotted line), and FIG. 15C is a CIE 1931 chromaticity diagram illustrating the chromaticity (color) of light (solid square) generated by lighting device Dev.7 for nominal CCTs of 2700K, 3000K, 3500K, 4000K, 5000K, 5700K, and 6500K, light emission locus (solid line) for CCTs from 2700K to 6500K, black body locus (dotted line), and 3 SDCM and 6 SDCM (Mac Adam ellipses—thin solid line)

As can be seen from TABLE 20A: LED-C1 has a luminous efficacy (LE) of 121.7 lm/W (122 lm/W) and generates light of chromaticity (color point: CIE 0.5557, 0.3974, Δuv=−0.0023) corresponding to a CCT of 1700K with a CRI Ra of 81.5 (about 82); LED-C2 has a luminous efficacy of 176.9 lm/W (177 lm/W) and generates light of chromaticity (color point: CIE 0.4575, 0.4991, Δuv=0.0309) corresponding to a CCT of 3333K (about 3300K) with a CRI Ra of 81.2 (about 81); and LED-C3 has a luminous efficacy of 143.9 lm/W (144 lm/W) and generates light with a chromaticity (color point: CIE 0.218, 0.264). C1 comprises a CIE region (C1 CIE region) defined by CIE color coordinates CIE-1 (0.539, 0.396), CIE-2 (0.545, 0.374), CIE-3 (0.572, 0.399), and CIE-4 (0.567, 0.421) which in terms of CCT is from 1605K (about 1600K) to 1800K. C2 comprises a CIE region (C2 CIE Region) defined by CIE color coordinates CIE-1 (0.445, 0.503), CIE-2 (0.448, 0.473), CIE-3 (0.470, 0.496), and CIE-4 (0.467, 0.526) which in terms of CCT is from about 3139K (about 3100K) to 3536K (about 3550K). C3 comprises a CIE region (C3 CIE Region) defined by CIE color coordinates CIE-1 (0.207, 0.275), CIE-2 (0.210, 0.240), CIE-3 (0.230, 0.254), and CIE-4 (0.227, 0.289)—TABLE 20B. The CIE chromaticity diagram of FIG. 15B shows each of the CIE regions: C1 CIE region $\mathbf{1544}_{C1}$ (diamond/solid line), C2 CIE region $\mathbf{1544}_{C2}$ (triangle/solid line), and C3 CIE Region $\mathbf{1544}_{C3}$ (square/solid line).

Referring to FIG. 15A the emission spectrum for LED-C1 (dotted line) primarily comprises a broadband peak (at about 610 nm) in the red region of the visible spectrum with multiple higher intensity narrowband peaks (FWHM≈5 nm) from about 610-650 nm (maximum intensity peak at ≈632 nm). The emission spectrum for the LED-C2 (solid line) comprises a narrowband peak (FWHM≈20 nm) with a peak emission wavelength at about 450 nm in the blue region if the visible spectrum and a higher intensity broadband peak (FWHM≈110 nm) with a peak emission wavelength of about 550 nm in the yellow to green region of the visible spectrum with multiple higher intensity narrowband peaks (FWHM≈5 nm) from about 610-650 nm (maximum intensity peak at 632 nm) in the orange to red region of the visible spectrum. The emission spectrum for the LED-C3 (dashed line) comprises a narrowband peak (FWHM≈20 nm) with a peak emission wavelength of about 450 nm in the blue region of the visible spectrum and a lower intensity (about 30%) tail at wavelengths in the green to yellow region of the spectrum (460-580 nm).

TABLE 20A

Dev. 7: Measured characteristics of LED-C1, LED-C2, and LED-C3

| LED | Flux (lm) | Power (W) | LE (lm/W) | CIE center point x | CIE center point y | CCT (K) | CRI Ra | Δuv |
|---|---|---|---|---|---|---|---|---|
| LED-C1 | 43.8 | 0.36 | 121.7 | 0.5557 | 0.3974 | 1700 | 81.5 | −0.0023 |
| LED-C2 | 63.7 | 0.36 | 176.9 | 0.4575 | 0.4991 | 3333 | 81.2 | 0.0309 |
| LED-C3 | 51.8 | 0.36 | 143.9 | 0.2183 | 0.2644 | n/a | n/a | n/a |

TABLE 20B

Dev. 7: CIE region for light C1, C2, and C3

| | C1 CIE region | | | | C2 CIE region | | | | C3 CIE region | |
|---|---|---|---|---|---|---|---|---|---|---|
| | CIE | | CCT | | CIE | | CCT | | CIE | |
| CIE point | x | y | (K) | Δuv | x | y | (K) | Δuv | x | y |
| CIE-1 | 0.539 | 0.396 | 1800 | −0.0042 | 0.445 | 0.503 | 3536 | 0.0342 | 0.207 | 0.275 |
| CIE-2 | 0.545 | 0.374 | 1636 | −0.0099 | 0.448 | 0.473 | 3308 | 0.0237 | 0.210 | 0.240 |
| CIE-3 | 0.572 | 0.399 | 1605 | −0.0002 | 0.470 | 0.496 | 3139 | 0.0279 | 0.230 | 0.254 |
| CIE-4 | 0.567 | 0.421 | 1754 | 0.0047 | 0.467 | 0.526 | 3356 | 0.0377 | 0.227 | 0.289 |
| Center | 0.556 | 0.397 | 1693 | −0.0024 | 0.458 | 0.499 | 3332 | 0.031 | 0.218 | 0.264 |

The CIE chromaticity diagram of FIG. 15B shows the chromaticity (CIE center point) 1532$_{C1}$ of light of color C1 generated by the LED-C1, the chromaticity (CIE center point) 1532$_{C2}$ of light of color C2 generated by LED-C2, and the chromaticity (CIE center point) 932C3 of light of color C3 generated by the LED-C3. Straight lines 1534$_{C1C2}$, 1534$_{C2C3}$, and 1532$_{C1C3}$ connecting the points 1532$_{C1}$, 1532$_{C2}$, and 1532$_{C3}$ define a triangle that represents the gamut of chromaticity (colors)/color temperatures of light that Dev.7 can generate—i.e. the device can generate any chromaticity (color)/color temperature of light lying on the boundary or within the triangle. It is to be noted that lowest CCT of light that Dev.7 can generate that lies on the black body locus (dashed line) is about 1800K (1821K) which corresponds to the point of intersection 1546 (CIE 0.546, 0.408) of line 1534$_{C1C3}$ connecting color points 1532$_{C1}$ to 1532$_{C3}$ and the black body locus. It is to be noted that highest CCT of light that Dev.7 can generate light that lies on the black body locus (dotted line) is about 9800K (9809K) which corresponds to the point of intersection 1548 (CIE 0.282, 0.289) of line 1534$_{C1C3}$ connecting color point 1532$_{C1}$ to color point 1532$_{C3}$ and the black body locus. It will be appreciated that Dev.7 is therefore capable of generating any CCT of light from about 1800K to about 9800K lying on the black body locus.

TABLE 21 tabulates forward drive current ($I_F$) for first and second LED-C1, LED-C2, and LED-C3 of Dev.7 for generating light with a nominal general color rendering index CRI Ra of 90 for nominal color temperatures (CCT) of 2200K, 2700K, 3000K, 3500K, 4000K, 5000K, 5700K, and 6500K. TABLE 22 tabulates the measured optical and electrical characteristics for Dev.7 when operated to generate light with a nominal CRI Ra of 90 for nominal color temperatures (CCT) from 2200K to 6500K.

As can be seen from TABLE 21, the CCT of light generated by Dev.7 is increased by increasing the proportion of light of color C3 while reducing the proportion of light of color C1. TABLE 22 demonstrates that by selection of the drive currents to the first and second LED-C1, LED-C2, and LED-C3, Dev.7 can generate white light with a CCT from 2200 K to 6500K with a general color rendering index CRI Ra of at least 90 (91.9 to 94.3) and CRI R9 of at least 45 (44.0 to 70.3) with a luminous efficacy from about 143 lm/W (143.1 lm/W) to about 159 lm/W (158.7 lm/W). TABLE 22 also includes the measured CCT of light generated by Dev.7.

Referring to FIG. 15C it is to be noted that Dev.7 can generate light 1542 (solid line) of CCTs from 2200K to 6500K with a chromaticity that closely matches the black body locus (dotted line). As can be seen from TABLE 22, the chromaticity of light generated by Dev.7 are within 0.0051 Δuv (about 0.005) or less of the black body locus for CCTs from 2200K to 6500K.

TABLE 21

Dev. 7: Forward drive current $I_F$ for the 1$^{st}$ LED-C3, 2$^{nd}$ LED-C3, LED-C2, and LED-C1 for generating light with a nominal CRI Ra = 90 for nominal CCTs from 2200K to 6500K

| Nom. CCT | Forward drive current $I_F$ (mA) | | | |
|---|---|---|---|---|
| (K) | 1$^{st}$ LED-C1 | 2$^{nd}$ LED-C1 | LED-C2 | LED-C3 |
| 2200 | 104.9 | 104.9 | 89.1 | 1.1 |
| 2700 | 77.3 | 77.3 | 127.4 | 18.0 |
| 3000 | 64.3 | 64.3 | 139.8 | 31.6 |
| 3500 | 51.9 | 51.9 | 147.7 | 48.5 |
| 4000 | 40.4 | 40.4 | 149.4 | 69.7 |
| 5000 | 30.5 | 30.5 | 129.7 | 109.4 |

TABLE 21-continued

Dev. 7: Forward drive current $I_F$ for the 1st LED-C3, 2nd LED-C3, LED-C2, and LED-C1 for generating light with a nominal CRI Ra = 90 for nominal CCTs from 2200K to 6500K

| Nom. CCT | Forward drive current $I_F$ (mA) | | | |
|---|---|---|---|---|
| (K) | 1st LED-C1 | 2nd LED-C1 | LED-C2 | LED-C3 |
| 5700 | 28.8 | 28.8 | 110.5 | 132.0 |
| 6500 | 25.9 | 25.9 | 92.5 | 155.6 |

TABLE 22

Dev. 7: Measured optical and Electrical characteristics for nominal CRI Ra = 90 for nominal color temperatures (CCT) from 2200 K to 6500 K

| Nom. | Flux | Power | LE | CIE | | CCT | CRI | | |
|---|---|---|---|---|---|---|---|---|---|
| CCT (K) | (lm) | (W) | (lm/W) | x | y | (K) | Ra | R9 | Δuv |
| 2200 | 126.8 | 0.89 | 143.1 | 0.5019 | 0.4193 | 2264 | 91.9 | 44.0 | 0.0013 |
| 2700 | 134.8 | 0.88 | 153.5 | 0.4585 | 0.4145 | 2749 | 94.0 | 59.5 | 0.0016 |
| 3000 | 155.5 | 0.88 | 155.5 | 0.4336 | 0.4071 | 3082 | 94.3 | 65.2 | 0.0017 |
| 3500 | 157.5 | 0.88 | 157.5 | 0.4082 | 0.3975 | 3492 | 94.0 | 69.0 | 0.0023 |
| 4000 | 158.7 | 0.88 | 158.7 | 0.3817 | 0.3854 | 4029 | 93.2 | 69.7 | 0.0036 |
| 5000 | 157.8 | 0.88 | 157.8 | 0.3460 | 0.3614 | 4999 | 92.4 | 68.6 | 0.0045 |
| 5700 | 155.7 | 0.89 | 155.7 | 0.3304 | 0.3478 | 5589 | 92.4 | 70.3 | 0.0043 |
| 6500 | 151.3 | 0.90 | 151.3 | 0.3144 | 0.3344 | 6377 | 92.1 | 69.3 | 0.0051 |

CIE Region and Center Points for C1, C2, C3: Dev.6 and Dev.7

TABLES 23A, 23B, and 23C tabulate CIE regions, CIE center points, CCT and Δuv for light C1, C2, and C3 respectively. The CIE regions for each color C1, C2, and C3 encompass the CIE regions for Dev.6 and Dev.7, that is for lighting devices with a CRI Ra from 80 to 97.

As can be seen from the tables, C1 comprises a CIE region (C1 CIE region) defined by CIE color coordinates CIE-1 (0.495, 0.384), CIE-2 (0.509, 0.340), CIE-3 (0.576, 0.402), and CIE-4 (0.557, 0.442) which in terms of CCT is a CIE region from 1601K (about 1600K) to 2089K (about 2100K). C2 comprises a CIE region (C2 CIE Region) defined by CIE color coordinates CIE-1 (0.427, 0.484), CIE-2 (0.433, 0.427), CIE-3 (0.474, 0.468), and CIE-4 (0.467, 0.526) which in terms of CCT is from 2920K (about 2900K) to 3713K (about 3750K). C3 comprises a CIE region (C3 CIE Region) defined by CIE color coordinates CIE-1 (0.207, 0.275), CIE-2 (0.210, 0.240), CIE-3 (0.284, 0.294), and CIE-4 (0.279, 0.326).

TABLE 23A

Devs. 6-7: CIE region and CIE center point for light C1

| CIE | C1 CIE region | | | |
|---|---|---|---|---|
| | CIE | | CCT | |
| point | x | y | (K) | Δuv |
| CIE-1 | 0.495 | 0.384 | 2089 | −0.0103 |
| CIE-2 | 0.509 | 0.340 | 1685 | −0.0240 |
| CIE-3 | 0.576 | 0.402 | 1601 | 0.0009 |
| CIE-4 | 0.557 | 0.442 | 1801 | 0.0108 |
| Center | 0.536 | 0.394 | 1813 | −0.0052 |

TABLE 23B

Devs. 6-7: CIE region and CIE center point for light C2

| CIE | C2 CIE region | | | |
|---|---|---|---|---|
| | CIE | | CCT | |
| point | x | y | (K) | Δuv |
| CIE-1 | 0.427 | 0.484 | 3713 | 0.0315 |
| CIE-2 | 0.433 | 0.427 | 3267 | 0.0094 |
| CIE-3 | 0.474 | 0.468 | 2920 | 0.0185 |
| CIE-4 | 0.467 | 0.526 | 3356 | 0.0377 |
| Center | 0.450 | 0.476 | 3298 | 0.0244 |

TABLE 23C

Devs. 6-7: CIE region and CIE center point for light C3

| CIE | C3 CIE region | | | |
|---|---|---|---|---|
| | CIE | | CCT | |
| point | x | y | (K) | Δuv |
| CIE-1 | 0.207 | 0.275 | n/a | n/a |
| CIE-2 | 0.210 | 0.240 | n/a | n/a |
| CIE-3 | 0.284 | 0.294 | 9351 | 0.0009 |
| CIE-4 | 0.279 | 0.326 | 8634 | 0.0197 |
| Center | 0.249 | 0.286 | 15053 | 0.0192 |

FIGS. 16A-16D are CIE 1931 chromaticity diagrams illustrating various CIE regions and CIE center points for light C1, C2, and C3 for lighting devices Dev.6 and Dev.7.

Figure 16A:
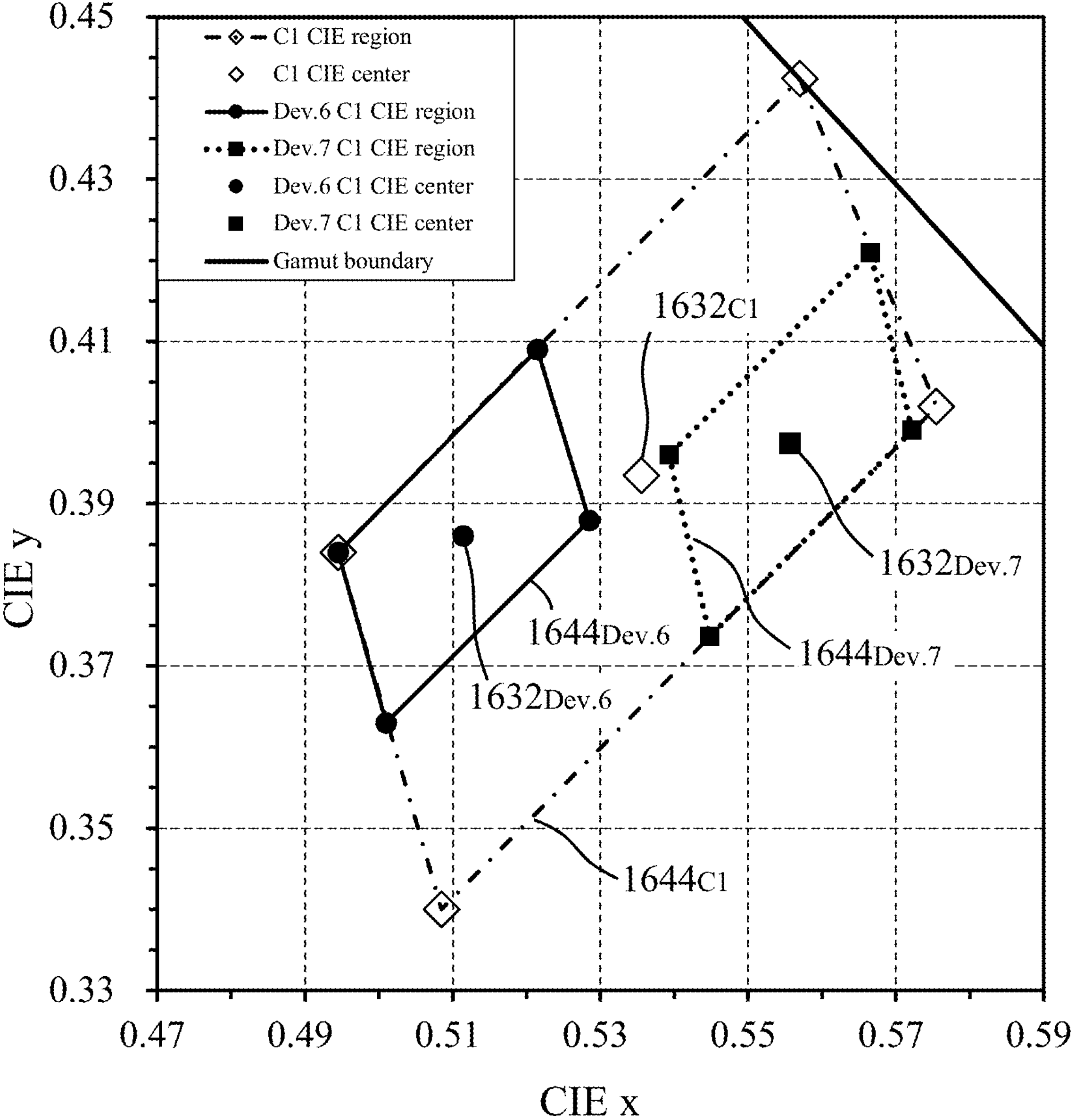
FIGS. 16A-16D are CIE 1931 chromaticity diagrams illustrating various CIE regions and CIE center points for light of chromaticity C1, C2, and C3 for lighting devices Dev.6 and Dev.7.

FIG. 16A shows C1 CIE regions 1644 and C1 CIE center points 1632 for lighting devices Dev.6 (1144$_{Dev.6}$—solid square/solid line and 1632$_{Dev.6}$—solid square), Dev.7 (1644$_{Dev.7}$—dot/dotted line and 1632$_{Dev.7}$—dot), and C1 CIE region (1644$_{C1}$—diamond/dashed dot line) and C1 CIE center point (1632$_{C1}$—diamond) that encompass lighting devices Dev.6 and Dev.7. As can be seen from FIG. 16A the C1 CIE region 1644$_{C1}$ encompasses (fully encloses) the C1 CIE regions 1644$_{Dev.6}$ and 1644$_{Dev.7}$.

Figure 16B:
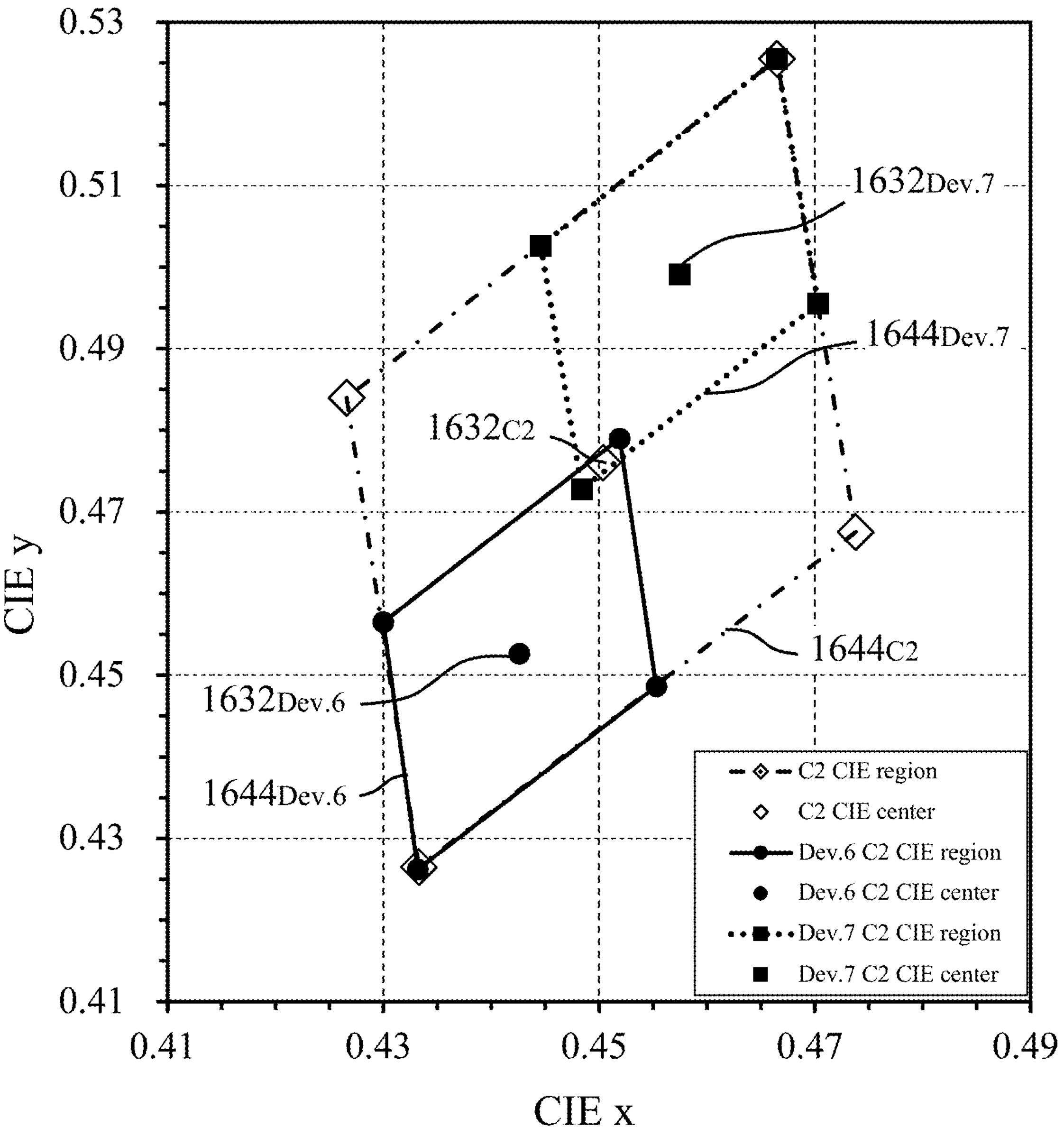

FIG. 16B shows C2 CIE regions 1644 and C2 CIE center points 1632 for lighting devices Dev.6 ($\mathbf{1644}_{Dev.6}$—solid square/solid line and $\mathbf{1632}_{Dev.6}$—solid square), Dev.7 ($\mathbf{1644}_{Dev.7}$—dot/dotted line and $\mathbf{1632}_{Dev.7}$—dot), and C2 CIE region ($\mathbf{1644}_{C2}$—diamond/dashed dot line) and C2 CIE center point ($\mathbf{1632}_{C1}$—diamond) that encompass lighting devices Dev.6 and Dev.7. As can be seen from FIG. 16B the C2 CIE region $\mathbf{1644}_{C1}$ encompasses (fully encloses) the C2 CIE regions $\mathbf{1644}_{Dev.6}$ and $\mathbf{1644}_{Dev.7}$.

Figure 16C:
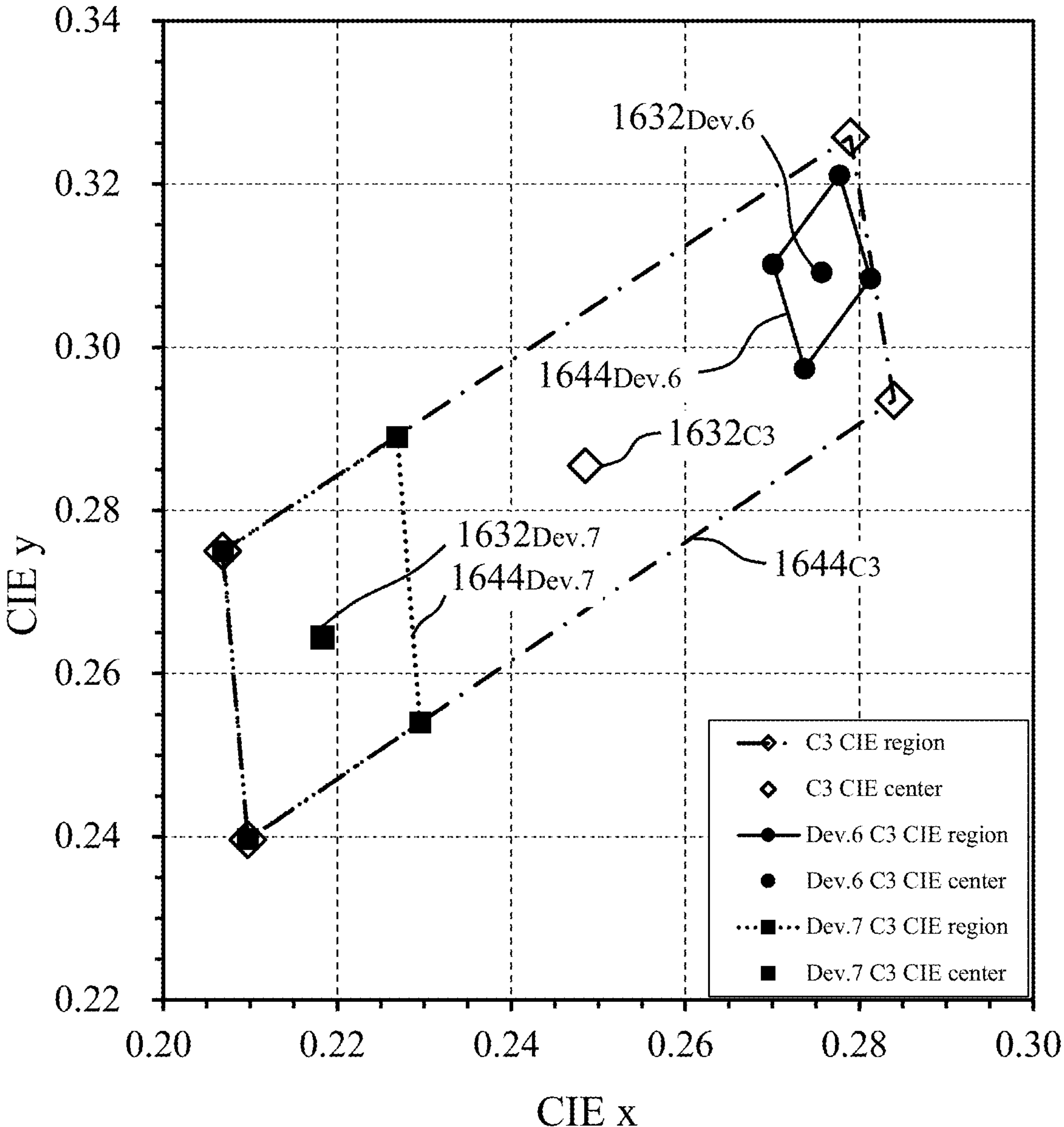

FIG. 16C shows C3 CIE regions 1644 and C3 CIE center points 1632 for lighting devices Dev.6 ($\mathbf{1144}_{Dev.6}$—solid square/solid line and $\mathbf{1632}_{Dev.6}$—solid square), Dev.7 ($\mathbf{1644}_{Dev.7}$—dot/dotted line and $\mathbf{1632}_{Dev.7}$—dot), and C3 CIE region ($\mathbf{1644}_{C3}$—diamond/dashed dot line) and C3 CIE center point ($\mathbf{1632}_{C3}$—diamond) that encompass lighting devices Dev.6 and Dev.7. As can be seen from FIG. 16B the C3 CIE region $\mathbf{1644}_{C1}$ encompasses (fully encloses) the C3 CIE regions $\mathbf{1644}_{Dev.6}$ and $\mathbf{1644}_{Dev.7}$.

Figure 16D:
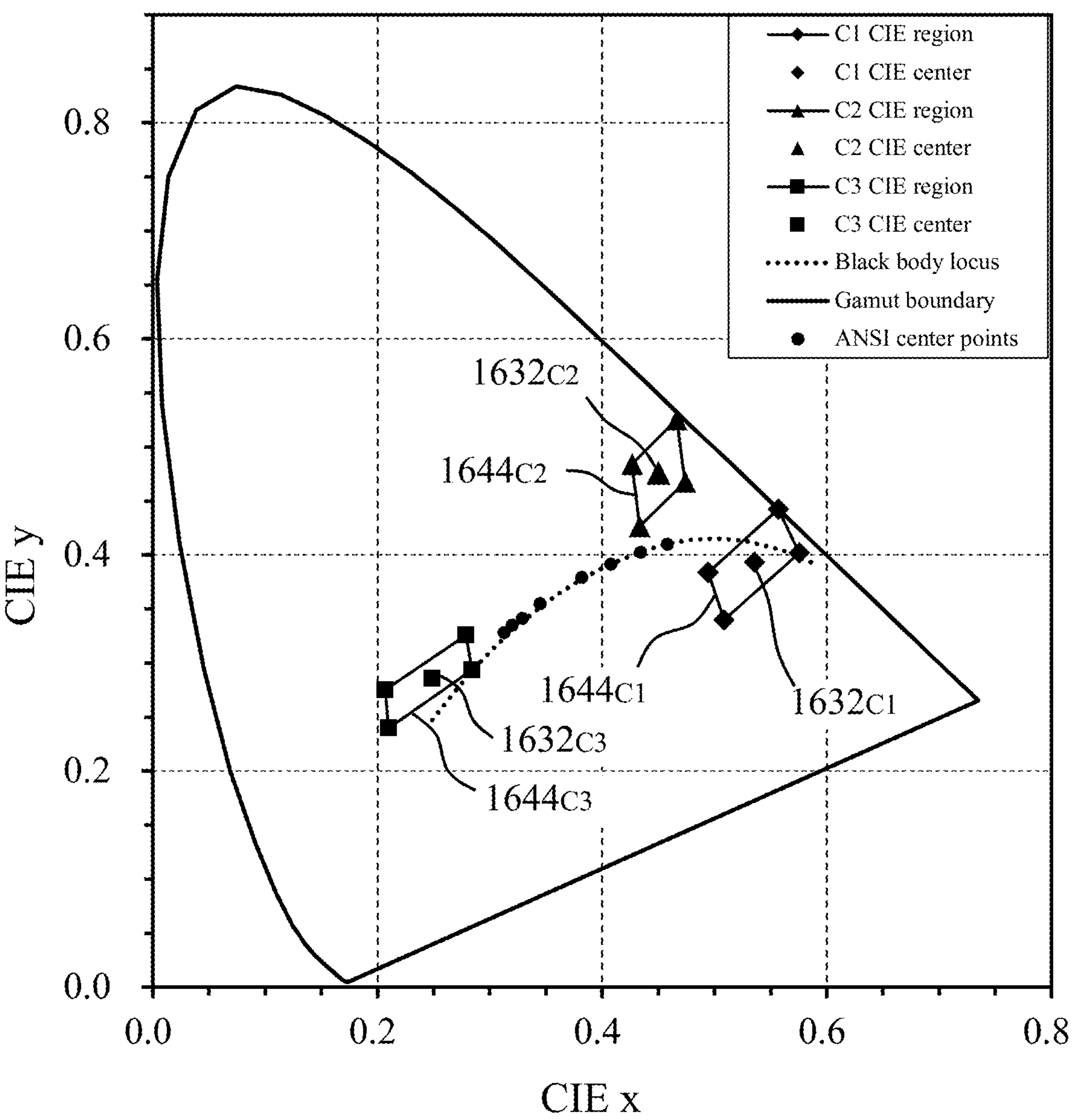

FIG. 16D shows CIE regions 1644 and CIE center points 1632 for C1 ($\mathbf{1644}_{C1}$—solid diamond/solid line and $\mathbf{1632}_{C1}$—solid diamond), C2 ($\mathbf{1644}_{C2}$—solid triangle/solid line and $\mathbf{1632}_{C2}$—solid triangle), and C3 ($\mathbf{1644}_{C3}$—solid square/solid line and $\mathbf{1632}_{C3}$—solid square) that encompass lighting devices Dev.6 and Dev.7.

CIE Region and Center Points for C1, C2, C3—Devs.2-7

TABLES 24A, 24B, and 24C tabulate CIE regions, CIE center points, CCT and Δuv for light C1, C2, and C3 respectively. The CIE regions for each color C1, C2, and C3 encompass the CIE regions for lighting devices Devs.2-7.

As can be seen from the tables, C1 comprises a CIE region (C1 CIE region) defined by CIE color coordinates CIE-1 (0.486, 0.410), CIE-2 (0.509, 0.340), CIE-3 (0.578, 0.405), and CIE-4 (0.537, 0.461) which in terms of CCT is a CIE region from 1602K (about 1600K) to 2368K (about 2400K). C2 comprises a CIE region (C2 CIE Region) defined by CIE color coordinates CIE-1 (0.328, 0.495), CIE-2 (0.342, 0.390), CIE-3 (0.478, 0.444), and CIE-4 (0.464, 0.545) which in terms of CCT is from 2706K (about 2700K) to 5621K (about 5700K). C3 comprises a CIE region (C3 CIE Region) defined by CIE color coordinates CIE-1 (0.195, 0.266), CIE-2 (0.205, 0.212), CIE-3 (0.286, 0.293), and CIE-4 (0.276, 0.328).

TABLE 24A

Devs. 2-7: CIE region and CIE center point for light C1

| | C1 CIE region | | | |
|---|---|---|---|---|
| CIE | CIE | | CCT | |
| point | x | y | (K) | Δuv |
| CIE-1 | 0.486 | 0.410 | 2368 | −0.0016 |
| CIE-2 | 0.509 | 0.340 | 1681 | −0.0240 |
| CIE-3 | 0.578 | 0.405 | 1602 | 0.0019 |
| CIE-4 | 0.537 | 0.461 | 2203 | 0.0137 |
| Center | 0.525 | 0.408 | 1981 | −0.0016 |

TABLE 24B

Devs. 2-7: CIE region and CIE center point for light C2

| | C2 CIE region | | | |
|---|---|---|---|---|
| CIE | CIE | | CCT | |
| point | x | y | (K) | Δuv |
| CIE-1 | 0.328 | 0.495 | 5621 | 0.0630 |
| CIE-2 | 0.342 | 0.390 | 5204 | 0.0193 |
| CIE-3 | 0.478 | 0.444 | 2706 | 0.0103 |
| CIE-4 | 0.464 | 0.545 | 3486 | 0.0438 |
| Center | 0.405 | 0.469 | 4008 | 0.0312 |

TABLE 24C

Devs. 2-7: CIE region and CIE center point for light C3

| | C3 CIE region | | | |
|---|---|---|---|---|
| CIE | CIE | | CCT | |
| point | x | y | (K) | Δuv |
| CIE-1 | 0.195 | 0.266 | n/a | n/a |
| CIE-2 | 0.205 | 0.212 | n/a | n/a |
| CIE-3 | 0.286 | 0.293 | 9198 | −0.0008 |
| CIE-4 | 0.276 | 0.328 | 8789 | 0.0223 |
| Center | 0.247 | 0.282 | 16002 | 0.0186 |

FIGS. 17A-17D are CIE 1931 chromaticity diagrams illustrating various CIE regions and CIE center points for light of chromaticity C1, C2, and C3 for lighting devices Dev.2-7.

Figure 17A:
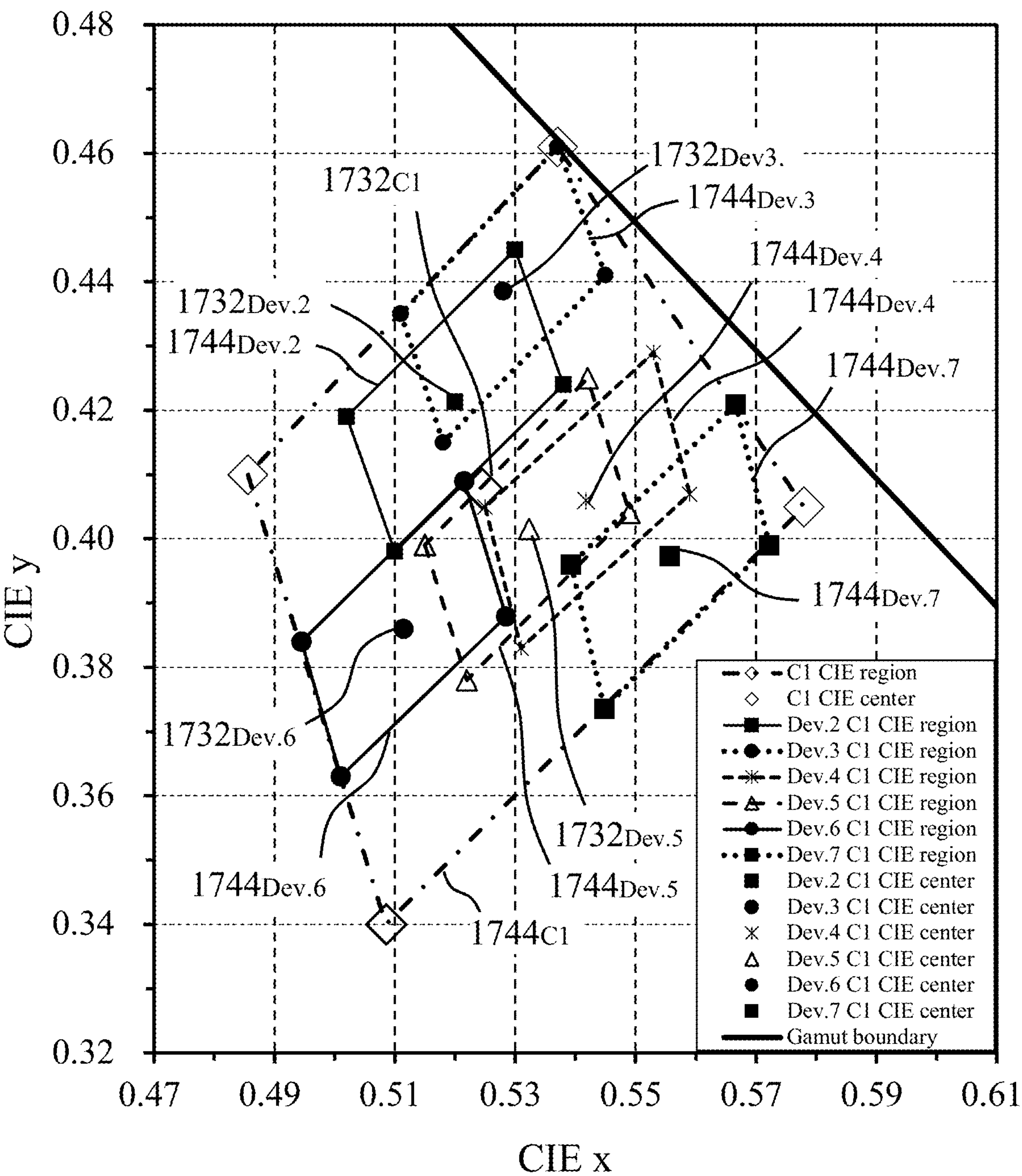
FIGS. 17A-17D are CIE 1931 chromaticity diagrams illustrating various CIE regions and CIE center points for light of chromaticity C1, C2, and C3 for lighting devices Dev.2-7.

FIG. 17A shows C1 CIE regions 1744 and C1 CIE center points 1732 for lighting devices Dev.2 ($\mathbf{1744}_{Dev.2}$—solid square/solid line and $\mathbf{1744}_{Dev.2}$—solid square), Dev.3 ($\mathbf{1744}_{Dev.3}$—dot/dotted line and $\mathbf{1732}_{Dev.3}$—dot), Dev.4 ($\mathbf{1744}_{Dev.4}$—star/dashed line and $\mathbf{1732}_{Dev.4}$—dot), Dev.5 ($\mathbf{1744}_{Dev.5}$—triangle/dashed line and $\mathbf{1732}_{Dev.5}$—triangle), Dev.6 ($\mathbf{1744}_{Dev.6}$—dot/solid line and $\mathbf{1732}_{Dev.6}$—dot), Dev.7 ($\mathbf{1744}_{Dev.7}$—square/dotted line and $\mathbf{1732}_{Dev.7}$—square), and C1 CIE region ($\mathbf{1744}_{C1}$—diamond/dashed dot line) and C1 CIE center point ($\mathbf{1732}_{C1}$—diamond) that encompass lighting devices Devs.2-7. As can be seen from FIG. 17A the C1 CIE region $\mathbf{1744}_{C1}$ encompasses (fully encloses) the C1 CIE regions $\mathbf{1744}_{Dev.2}$, $\mathbf{1744}_{Dev.3}$, $\mathbf{1744}_{Dev.}4$, $\mathbf{1744}_{Dev.5}$, $\mathbf{1744}_{Dev.6}$, and $\mathbf{1744}_{Dev.7}$ for lighting devices Devs.2-7.

Figure 17B:
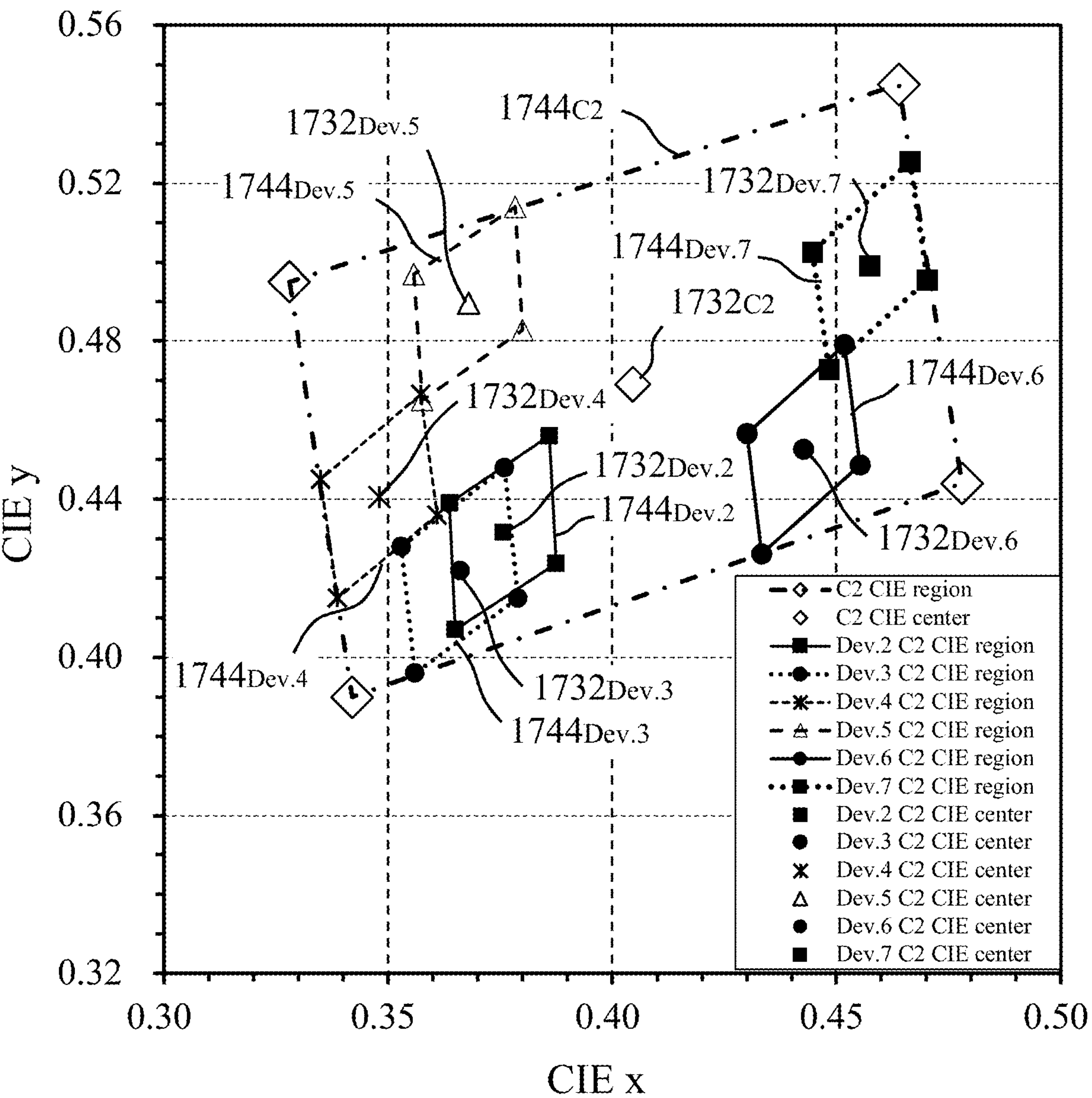

FIG. 17B shows C2 CIE regions 1744 and C2 CIE center points 1732 for lighting devices Dev.2 ($\mathbf{1744}_{Dev.2}$—solid square/solid line and $\mathbf{1744}_{Dev.2}$—solid square), Dev.3 ($\mathbf{1744}_{Dev.3}$—dot/dotted line and $\mathbf{1732}_{Dev.3}$—dot), Dev.4 ($\mathbf{1744}_{Dev.4}$—star/dashed line and $\mathbf{1732}_{Dev.4}$—dot), Dev.5 ($\mathbf{1744}_{Dev.5}$—triangle/dashed line and $\mathbf{1732}_{Dev.5}$—triangle), Dev.6 ($\mathbf{1744}_{Dev.6}$—dot/solid line and $\mathbf{1732}_{Dev.6}$—dot), Dev.7 ($\mathbf{1744}_{Dev.7}$—square/dotted line and $\mathbf{1732}_{Dev.7}$—square), and C2 CIE region ($\mathbf{1744}_{C2}$—diamond/dashed dot line) and C2 CIE center point ($\mathbf{1732}_{C2}$—diamond) that encompass lighting devices Devs.2-7. As can be seen from FIG. 17B the C2 CIE region $\mathbf{1744}_{C2}$ encompasses (fully encloses) the C2 CIE regions $\mathbf{1744}_{Dev.2}$, $\mathbf{1744}_{Dev.3}$, $\mathbf{1744}_{Dev.4}$, $\mathbf{1744}_{Dev.5}$, $\mathbf{1744}_{Dev.6}$, and $\mathbf{1744}_{Dev.7}$ for lighting devices Devs.2-7.

Figure 17C:
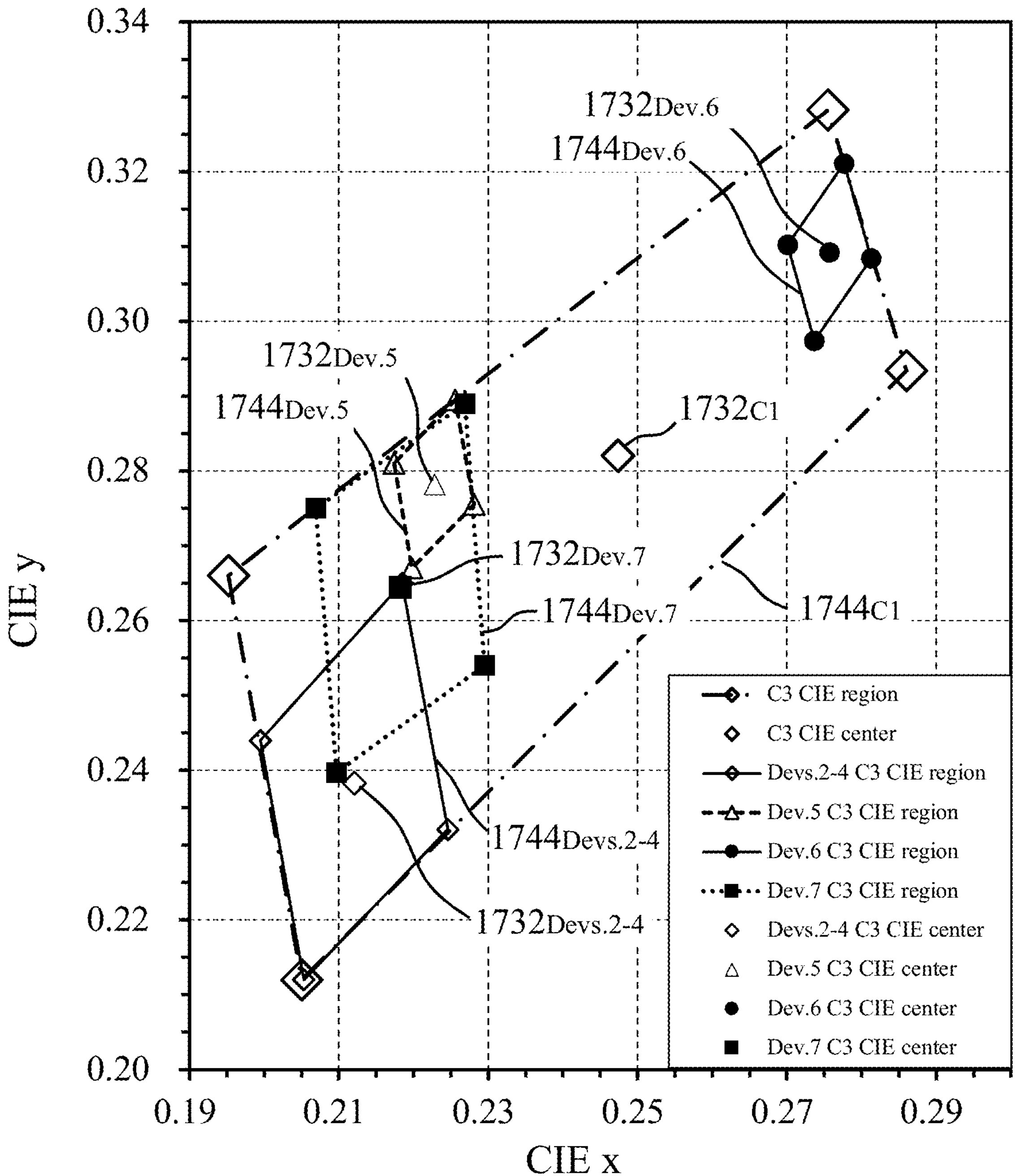

FIG. 17C shows C3 CIE regions 1744 and C3 CIE center points 1732 for lighting devices Dev.2-4 ($\mathbf{1744}_{Devs.2\text{-}4}$—diamond/solid line and $\mathbf{1744}_{Devs.2\text{-}4}$—diamond), Dev.5 ($\mathbf{1744}_{Dev.5}$—triangle/dashed line and $\mathbf{1732}_{Dev.5}$—triangle), Dev.6 ($\mathbf{1744}_{Dev.6}$—dot/solid line and $\mathbf{1732}_{Dev.6}$—dot), Dev.7 ($\mathbf{1744}_{Dev.7}$—square/dotted line and $\mathbf{1732}_{Dev.7}$—square), and C3 CIE region ($\mathbf{1744}_{C3}$—diamond/dashed dot line) and C3 CIE center point ($\mathbf{1732}_{C3}$—diamond) that encompass lighting devices Devs.2-7. As can be seen from FIG. 17C the C3 CIE region $\mathbf{1744}_{C3}$ encompasses (fully encloses) the C3 CIE regions $\mathbf{1744}_{Devs.2\text{-}4}$, $\mathbf{1744}_{Dev.5}$, $\mathbf{1744}_{Dev.6}$, and $\mathbf{1744}_{Dev.7}$ for lighting devices Devs.2-7.

Figure 17D:
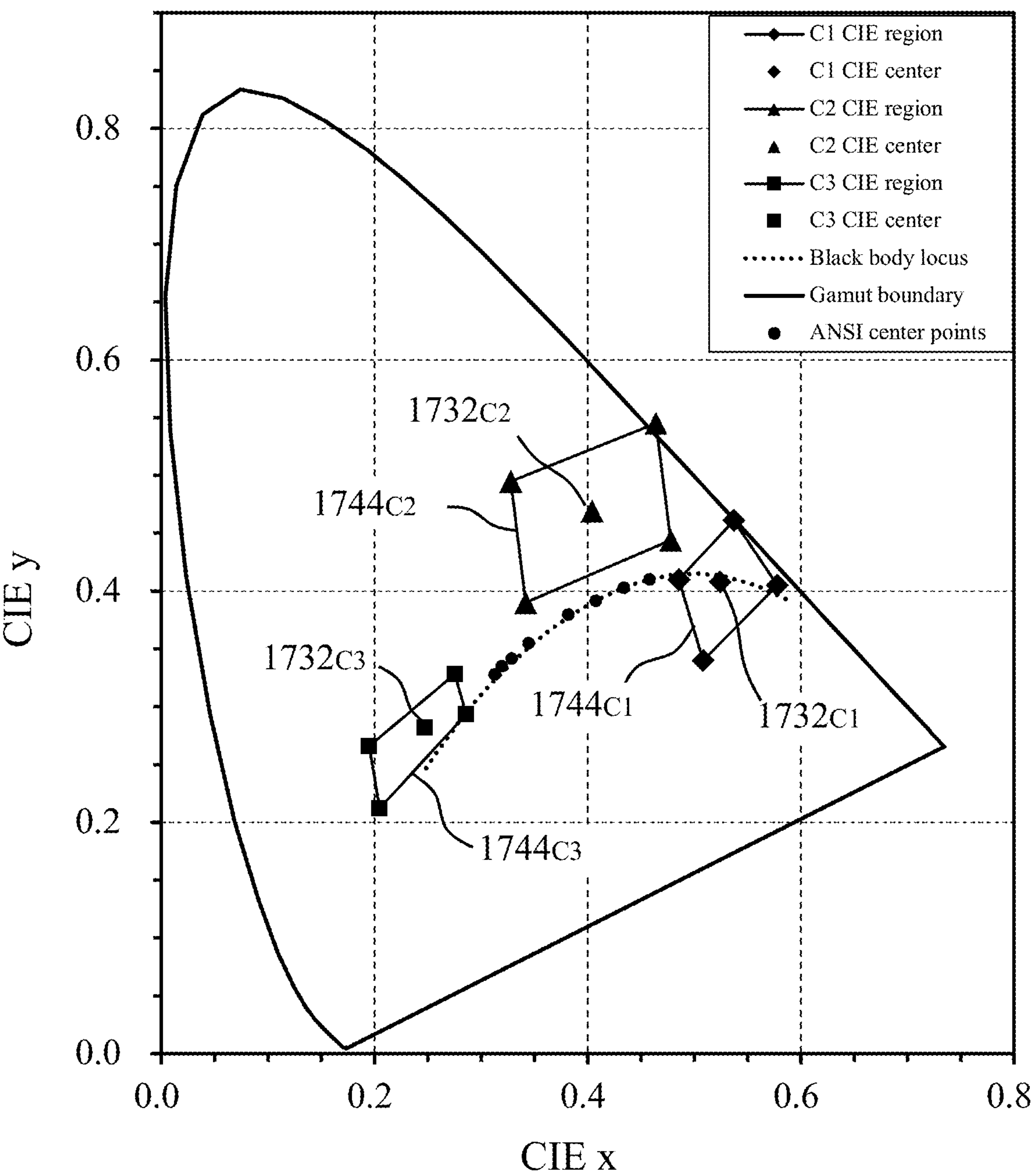

FIG. 17D shows CIE regions 1744 and CIE center points 1732 for C1 ($\mathbf{1744}_{C1}$—solid diamond/solid line and $\mathbf{1732}_{C1}$—solid diamond), C2 ($\mathbf{1744}_{C2}$—solid triangle/solid line and $\mathbf{1732}_{C2}$—solid triangle), and C3 ($\mathbf{1744}_{C3}$—solid square/solid line and $\mathbf{1732}_{C3}$—solid square) that encompass lighting devices Devs.2-7.

CIE Region and Center Points for C1, C2, C3—Devs.2,3,6,7

TABLES 25A, 25B, and 25C tabulate CIE regions, CIE center points, CCT and Δuv for light C1, C2, and C3 respectively. The CIE regions for each color C1, C2, and C3 encompass the CIE regions for lighting devices Dev.2, Dev.3, Dev.6 and Dev.7.

As can be seen from TABLES 25A, 25B, and 25C , C1 comprises a CIE region (C1 CIE region) defined by CIE color coordinates CIE-1 (0.486, 0.410), CIE-2 (0.509, 0.340), CIE-3 (0.578, 0.405), and CIE-4 (0.537, 0.461) which in terms of CCT is a CIE region from 1602K (about 1600K) to 2368K (about 2400K). C2 comprises a CIE region (C2 CIE Region) defined by CIE color coordinates CIE-1 (0.348, 0.478), CIE-2 (0.356, 0.396), CIE-3 (0.477, 0.444), and CIE-4 (0.467, 0.526) which in terms of CCT is from 2719K (about 2700K) to 5180K (about 5200K). C3 comprises a CIE region (C3 CIE Region) defined by CIE color coordinates CIE-1 (0.195, 0.266), CIE-2 (0.205, 0.212), CIE-3 (0.286, 0.293), and CIE-4 (0.276, 0.328).

TABLE 25A

Devs. 2-3, 6-7: CIE region and CIE center point for light C1

| CIE | C1 CIE region | | | |
|---|---|---|---|---|
| | CIE | | CCT | |
| point | x | y | (K) | Δuv |
| CIE-1 | 0.486 | 0.410 | 2368 | −0.0016 |
| CIE-2 | 0.509 | 0.340 | 1681 | −0.0240 |
| CIE-3 | 0.578 | 0.405 | 1602 | 0.0019 |
| CIE-4 | 0.537 | 0.461 | 2203 | 0.0137 |
| Center | 0.525 | 0.408 | 1981 | −0.0016 |

TABLE 25B

Devs. 2-3, 6-7: CIE region and CIE center point for light C2

| CIE | C2 CIE region | | | |
|---|---|---|---|---|
| | CIE | | CCT | |
| point | x | y | (K) | Δuv |
| CIE-1 | 0.348 | 0.478 | 5180 | 0.0508 |
| CIE-2 | 0.356 | 0.396 | 4797 | 0.0167 |
| CIE-3 | 0.477 | 0.444 | 2719 | 0.0104 |
| CIE-4 | 0.467 | 0.526 | 3352 | 0.0377 |
| Center | 0.412 | 0.462 | 3844 | 0.0270 |

TABLE 25C

Devs. 2-3, 6-7: CIE region and CIE center point for light C3

| CIE | C3 CIE region | | | |
|---|---|---|---|---|
| | CIE | | CCT | |
| point | x | y | (K) | Δuv |
| CIE-1 | 0.195 | 0.266 | n/a | n/a |
| CIE-2 | 0.205 | 0.212 | n/a | n/a |
| CIE-3 | 0.286 | 0.293 | 9198 | −0.0008 |
| CIE-4 | 0.276 | 0.328 | 8789 | 0.0223 |
| Center | 0.247 | 0.282 | 16002 | 0.0186 |

FIGS. 18A-18D are CIE 1931 chromaticity diagrams illustrating various CIE regions and CIE center points for light of chromaticity C1, C2, and C3 for lighting devices Dev.2, Dev.3, Dev.6, and Dev.7.

Figure 18A:
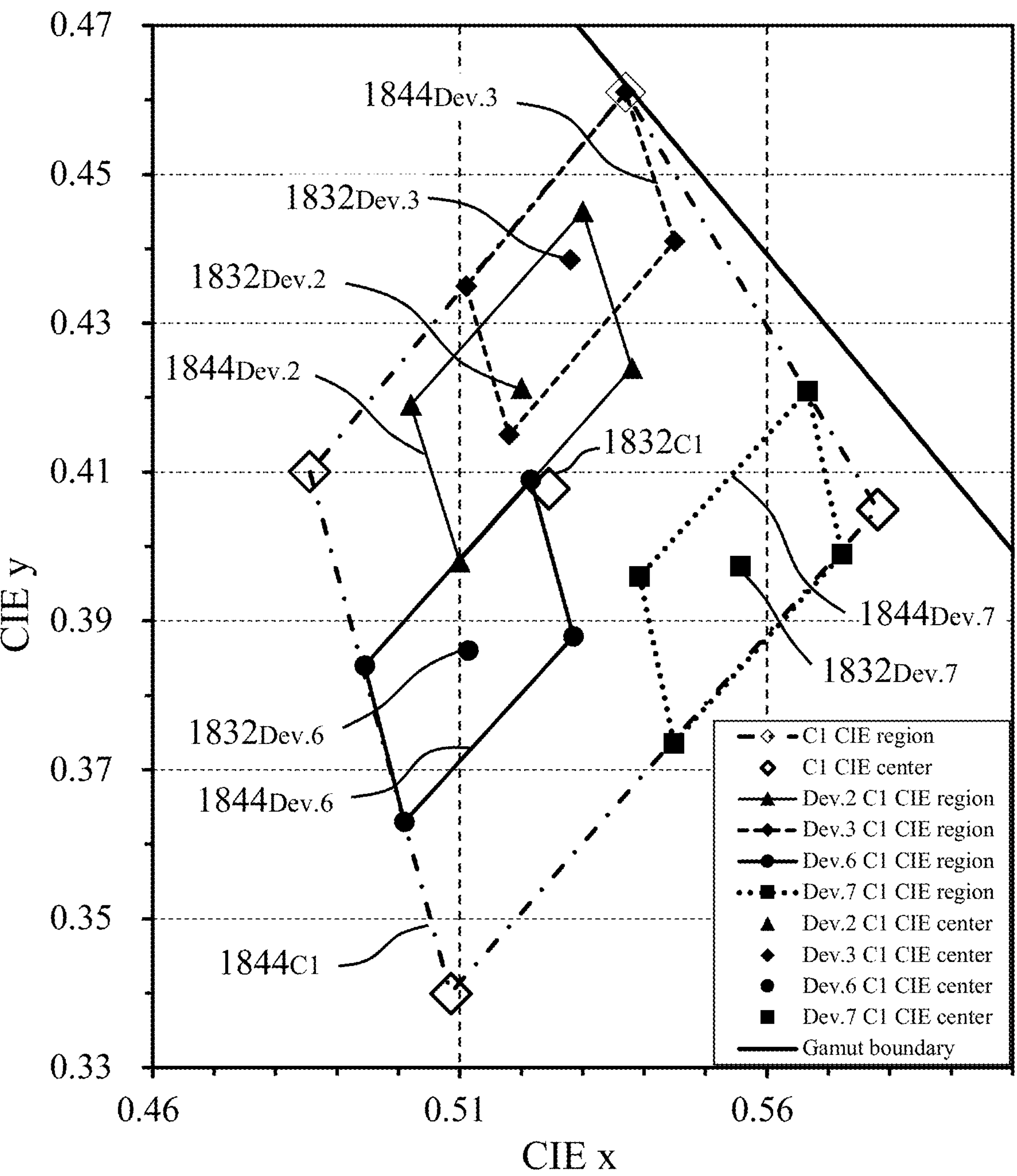
FIGS. 18A-18D are CIE 1931 chromaticity diagrams illustrating various CIE regions and CIE center points for light of chromaticity C1, C2, and C3 for lighting devices Dev.2-3 and Dev.6-7.

FIG. 18A shows C1 CIE regions 1844 and C1 CIE center points 1832 for lighting devices Dev.2 ($\mathbf{1844}_{Dev.2}$—solid triangle/solid line and $\mathbf{1844}_{Dev.2}$—solid triangle), Dev.3 ($\mathbf{1844}_{Dev.3}$—solid diamond/dashed line and $\mathbf{1832}_{Dev.3}$—solid triangle), Dev.6 ($\mathbf{1844}_{Dev.6}$—dot/solid line and $\mathbf{1832}_{Dev.6}$—dot), Dev.7 ($\mathbf{1844}_{Dev.7}$—square/dotted line and $\mathbf{1832}_{Dev.7}$—square), and C1 CIE region ($\mathbf{1844}_{C1}$—diamond/dashed dot line) and C1 CIE center point ($\mathbf{1832}_{C1}$—diamond) that encompass lighting devices Devs.2, Dev.3, Dev.6, and Dev.7. As can be seen from FIG. 18A the C1 CIE region $\mathbf{1844}_{C1}$ encompasses (fully encloses) the C1 CIE regions $\mathbf{1844}_{Dev.2}$, $\mathbf{1844}_{Dev.3}$, $\mathbf{1844}_{Dev.6}$, and $\mathbf{1844}_{Dev.7}$ for lighting devices Devs.2-3,6-7.

Figure 18B:
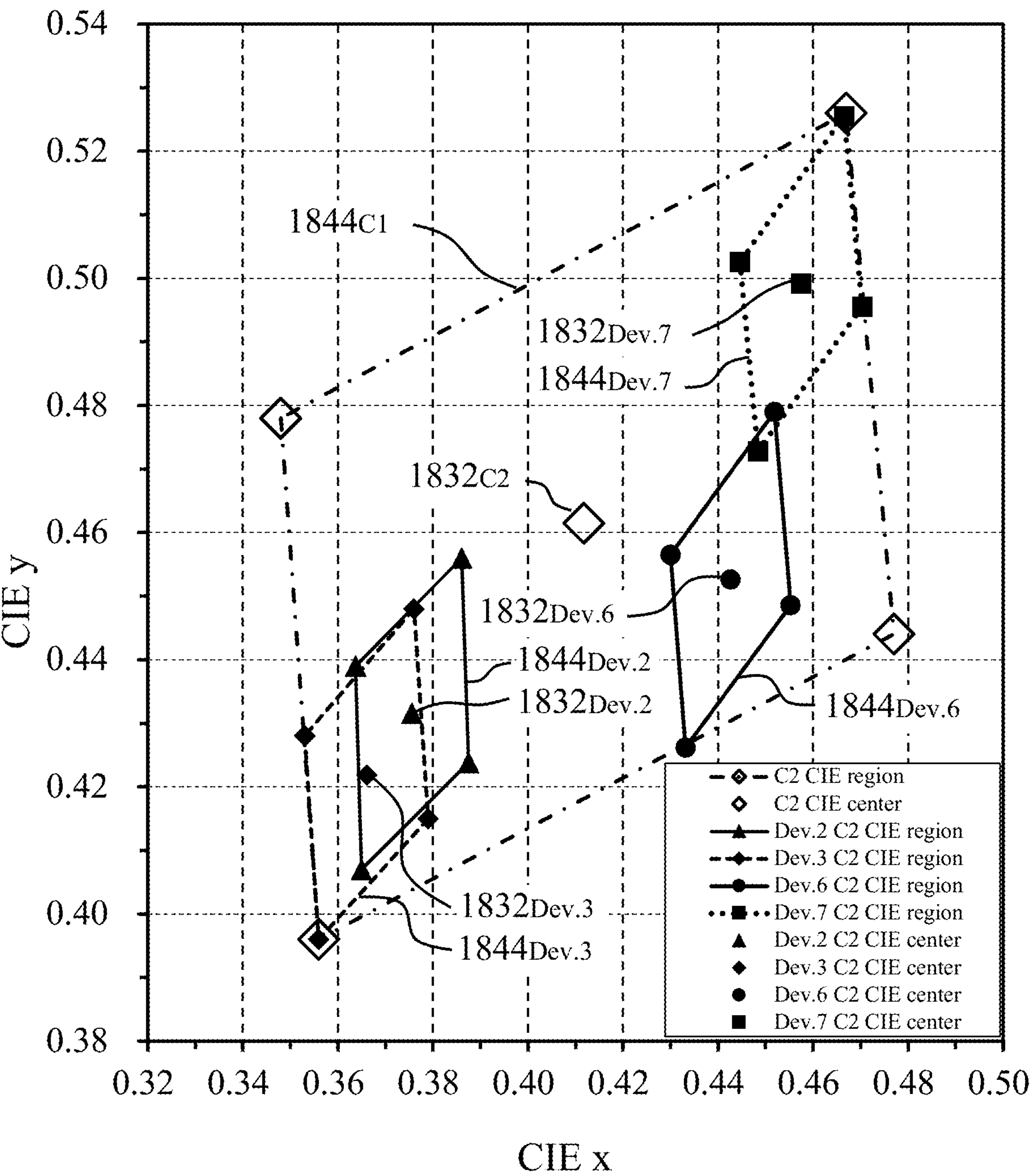

FIG. 18B shows C2 CIE regions 1844 and C2 CIE center points 1832 for lighting devices Dev.2 ($\mathbf{1844}_{Dev.2}$—solid triangle/solid line and $\mathbf{1844}_{Dev.2}$—solid triangle), Dev.6 ($\mathbf{1844}_{Dev.6}$—dot/solid line and $\mathbf{1832}_{Dev.6}$—dot), Dev.7 ($\mathbf{1844}_{Dev.7}$—solid square/dotted line and $\mathbf{1832}_{Dev.7}$—solid triangle), and C2 CIE region ($\mathbf{1844}_{C2}$—diamond/dashed dot line) and C2 CIE center point ($\mathbf{1832}_{C2}$—diamond) that encompass lighting devices Devs.2, Dev.3, Dev.6, and Dev.7. As can be seen from FIG. 18B the C2 CIE region $\mathbf{1844}_{C2}$ encompasses (fully encloses) the C2 CIE regions $\mathbf{1844}_{Dev.2}$, $\mathbf{1844}_{Dev.3}$, $\mathbf{1844}_{Dev.6}$, and $\mathbf{1844}_{Dev.7}$ for lighting devices Devs.2-3,6-7.

Figure 18C:
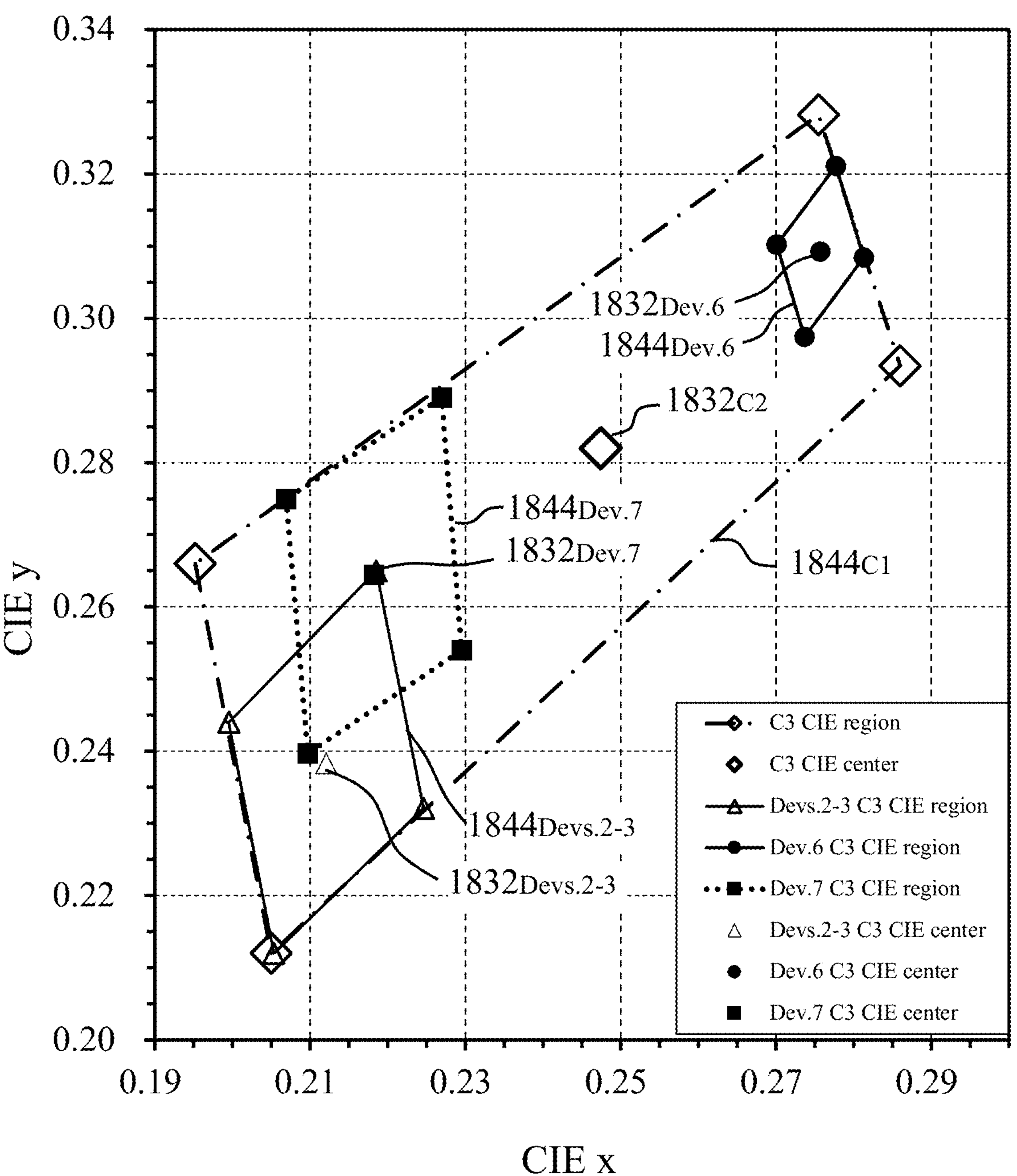

FIG. 18C shows C3 CIE regions 1844 and C3 CIE center points 1832 for lighting devices Dev.2-3 ($\mathbf{1844}_{Devs.2\text{-}3}$—triangle/solid line and $\mathbf{1844}_{Devs.2\text{-}3}$—triangle), Dev.6 ($\mathbf{1844}_{Dev.6}$—dot/solid line and $\mathbf{1832}_{Dev.6}$—dot), Dev.7 ($\mathbf{1844}_{Dev.7}$—solid square/dotted line and $\mathbf{1832}_{Dev.7}$—solid square), and C3 CIE region ($\mathbf{1844}_{C3}$—diamond/dashed dot line) and C3 CIE center point ($\mathbf{1832}_{C3}$—diamond) that encompass lighting devices Devs.2, Dev.3, Dev.6, and Dev.7. As can be seen from FIG. 18C the C3 CIE region $\mathbf{1844}_{C3}$ encompasses (fully encloses) the C3 CIE regions $\mathbf{1844}_{Devs.2\text{-}3}$, $\mathbf{1844}_{Dev.6}$, and $\mathbf{1844}_{Dev.7}$ for lighting devices Devs.2-3,6-7.

Figure 18D:
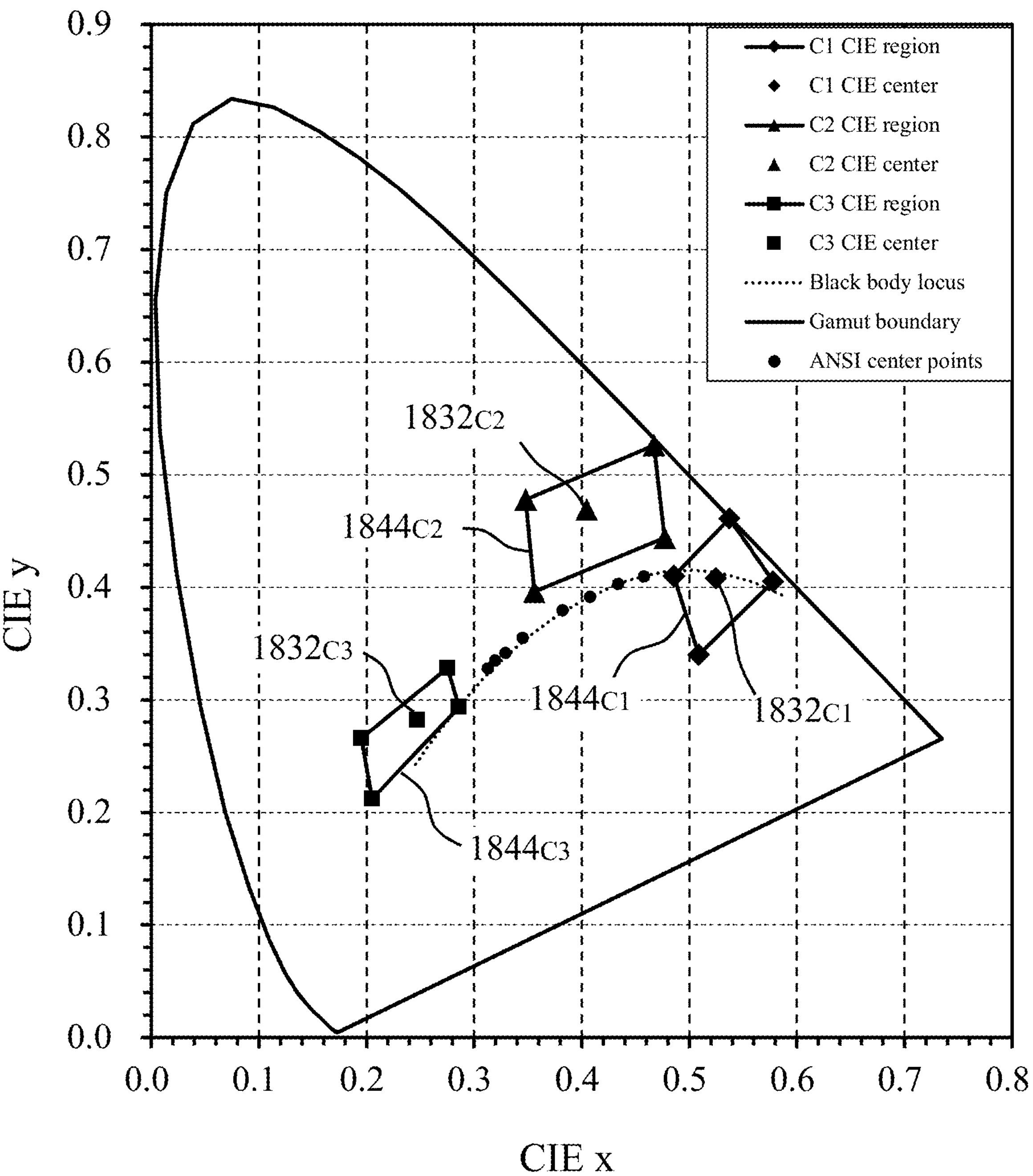

FIG. 18D shows CIE regions 1844 and CIE center points 1832 for C1 ($\mathbf{1844}_{C1}$—solid diamond/solid line and $\mathbf{1832}_{C1}$—solid diamond), C2 ($\mathbf{1844}_{C2}$—solid triangle/solid line and $\mathbf{1832}_{C2}$—solid triangle), and C3 ($\mathbf{1844}_{C3}$—solid square/solid line and $\mathbf{1832}_{C3}$—solid square) that encompass the CIE regions $\mathbf{1844}_{Dev.2}$, $\mathbf{1844}_{Dev.3}$, $\mathbf{1844}_{Dev.6}$, and $\mathbf{1844}_{Dev.7}$ for lighting devices Devs.2-3,6-7.

LIST OF REFERENCE NUMERALS

FIG. 1

1 Multi-LED package
2 Lead frame
3 Direct-Emitting LED chip
3R Direct-Emitting Red LED chip
3G Direct-Emitting Green LED chip
3B Direct-Emitting Blue LED chip
4 Housing
5 Cavity (recess)
6 Light-transmissive encapsulant
7 Anode electrical terminal
7R Anode electrical terminal Red LED
7G Anode electrical terminal Green LED
7B Anode electrical terminal Blue LED
8 Cathode electrical terminal
8R Cathode electrical terminal Red LED
8G Cathode electrical terminal Green LED
8B Cathode electrical terminal Blue LED FIGS. 2 to 9 (#=Figure Number)

#10 Multi-LED package (package)
#12 Anode lead frame
#12*a* Anode lead frame—first cavity
#12*b* Anode lead frame—second cavity
#12*c* Anode lead frame—third cavity
#12*d* Anode lead frame—fourth cavity
#12*e* Common cathode lead frame—cavities 1-4
#14 Cathode lead frame
#14*a-d* Cathode lead frame—common to cavities 1-4
#14*a* Cathode lead frame—first cavity
#14*b* Cathode lead frame—second cavity
#14*c* Cathode lead frame—third cavity
#14*d* Cathode lead frame—fourth cavity
#16 Housing
#18 Cavity (recess or cup)
#18*a* First cavity
#18*b* Second cavity
#18*c* Third cavity
#18*d* Fourth cavity
#20 LED chip
#20*a* LED chip—first cavity
#20*b* LED chip—second cavity
#20*c* LED chip—third cavity
#20*d* LED chip—fourth cavity
#22 Anode electrical terminal
#22*a* Anode electrical terminal first cavity (recess)
#22*b* Anode electrical terminal second cavity (recess)
#22*c* Anode electrical terminal third cavity (recess)
#22*d* Anode electrical terminal fourth cavity (recess)
#24 Cathode electrical terminal
#24*a-d* Cathode electrical terminal—common to cavities 1-4
#24*a* Cathode electrical terminal first cavity (recess)
#24*b* Cathode electrical terminal second cavity (recess)
#24*c* Cathode electrical terminal third cavity (recess)
#24*d* Cathode electrical terminal fourth cavity (recess)
#26 Color-temperature-tunable lighting device (lighting device)
#28 LED (Light Emitting Diode)
#28*a* First LED
#28*b* Second LED
#28*c* Third LED
#28*d* Fourth LED
#30 Photoluminescence layer
#30*a* Photoluminescence layer—first cavity
#30*b* Photoluminescence layer—second cavity
#30*c* Photoluminescence layer—third cavity
#30*d* Photoluminescence layer—fourth cavity
#32 Chromaticity (color point)
#$\mathbf{32}_{C1}$ Chromaticity (color point) of light C1
#$\mathbf{32}_{C2}$ Chromaticity (color point) of light C2
#$\mathbf{32}_{C3}$ Chromaticity (color point) of light C3
#$\mathbf{32}_{C4}$ Chromaticity (color point) of light C4
#34 Straight line connecting chromaticity (color points)
#$\mathbf{34}_{C1C2}$ Straight line connecting color points C1 and C2
#$\mathbf{34}_{C1C3}$ Straight line connecting color points C1 and C3
#$\mathbf{34}_{C1C4}$ Straight line connecting color points C1 and C4
#$\mathbf{34}_{C2C3}$ Straight line connecting color points C2 and C3
#$\mathbf{34}_{C3C4}$ Straight line connecting color points C3 and C4
#36 Color-tunable linear light emitting device (linear lighting device)
#38 Substrate
#40 Electrical connector
#42 Light emission locus
#44 LED CIE region
#$\mathbf{44}_{C1}$ C1 CIE Region
#$\mathbf{44}_{C2}$ C2 CIE Region
#$\mathbf{44}_{C3}$ C3 CIE Region
#46 Lowest CCT
#48 Highest CCT
#50 Peak
#52 Spectrum intensity at $\lambda_{max\Delta}$
#54 Black body spectrum intensity at $\lambda_{max\Delta}$
#56 Trough

The invention claimed is:

1. A lighting device comprising:

a first LED for generating light of a first chromaticity;

a second LED for generating light of a second chromaticity; and a third LED for generating light of a third chromaticity; and wherein at least one of the first LED, the second LED, or the third LED comprises a phosphor selected from the group consisting of: $K_2SiF_6:Mn^{4+}$, $K_2GeF_6:Mn^{4+}$, and $K_2TiF_6:Mn^{4+}$; and wherein the lighting device is for generating light having (i) a CCT that is tunable within a range of CCTs from 1800K to 6500K by controlling power to the first LED, the second LED and the third LED and (ii) a chromaticity that is within 5 SDCM of the black body locus.

2. The lighting device of claim 1, wherein the first chromaticity is in a first chromaticity region defined by chromaticity coordinates (0.495, 0.384), (0.509, 0.340), (0.576, 0.402), and (0.557, 0.442);

the second chromaticity is in a second chromaticity region defined by chromaticity coordinates (0.427, 0.484), (0.433, 0.427), (0.474, 0.468), and (0.467, 0.526); and the third chromaticity is in a third chromaticity region defined by chromaticity coordinates (0.207, 0.275), (0.210, 0.240), (0.284, 0.294), and (0.279, 0.326).

3. The lighting device of claim 1, wherein the first chromaticity is in a first chromaticity region defined by chromaticity coordinates (0.539, 0.396), (0.545, 0.374), (0.572, 0.399), and (0.567, 0.421);

the second chromaticity is in a second chromaticity region defined by chromaticity coordinates (0.445, 0.503), (0.448, 0.473), (0.470, 0.496), and (0.467, 0.526); and the third chromaticity is in a third chromaticity region defined by chromaticity coordinates (0.207, 0.275), (0.210, 0.240), (0.230, 0.254), and (0.227, 0.289).

4. The lighting device of claim 1, wherein the lighting device is for generating light of chromaticity that is within 0.004 Δuv of the black body locus for a CCT in a range from 1800K to 6500K.

5. The lighting device of claim 1, wherein the lighting device is for generating light having an intensity versus wavelength spectrum, which over a wavelength range 440 nm to 650 nm, a maximum percentage deviation between the intensity of light generated by the lighting device and the intensity of light of the spectrum of a black body radiator or standard illuminant is at least one of less than 30%, less than 20%, or less than 10%.

6. The lighting device of claim 1, wherein the lighting device is for generating light with a 3 SDCM of the black body locus.

7. The lighting device of claim 1, wherein the device has a luminous efficacy of at least 95 lm/W or at least 135 lm/W.

8. The light emitting device of claim 1, wherein the first chromaticity is in a first chromaticity region defined by chromaticity coordinates (0.486, 0.410), (0.509, 0.340), (0.578, 0.405), and (0.537, 0.461);

the second chromaticity is in a second chromaticity region defined by chromaticity coordinates (0.328, 0.495), (0.342, 0.390), (0.478, 0.444), and (0.464, 0.545); and the third chromaticity is in a third chromaticity region defined by chromaticity coordinates (0.195, 0.266), (0.205, 0.212), (0.286, 0.293), and (0.276, 0.328).

9. The lighting device of claim 1, wherein the first chromaticity is in a first chromaticity region, the second chromaticity is in a second chromaticity region, the third chromaticity is in a third chromaticity region, and further comprising a fourth LED for generating light with a fourth chromaticity in a fourth chromaticity region; wherein the fourth chromaticity region is between the first and second chromaticity regions or between the second and third chromaticity regions.

10. A lighting device comprising: a circuit board and a plurality of lighting devices according to claim 1.

11. The lighting device of claim 10, wherein the circuit board comprises a flexible circuit board.

12. The lighting device of claim 1, comprising a fourth LED; and an LED package which comprises:

a housing comprising a first cavity for the first LED, a second cavity for the second LED, a third cavity for the third LED, and a fourth cavity for the fourth LED; and a lead frame comprising respective anode and cathode regions for each cavity, wherein each anode region comprises an anode electrode and an anode terminal for providing power to the anode electrode, and each cathode region comprises a cathode electrode and a cathode terminal for providing power to the cathode electrode, and wherein the anode and cathode terminals are located along opposing sides of the housing and are aligned with each other.

13. The lighting device of claim 12, wherein the fourth LED has a chromaticity that is the same as the chromaticity of one of the first LED, the second LED, or third LED.

14. The lighting device of claim 1, wherein at least one of the first LED, the second LED, or the third LED comprises an LED chip for generating blue light having a FWHM of about 30 nm to about 80 nm.

15. The lighting device of claim 1, wherein the first LED is for generating light with a CCT from about 1700K to about 3500K, the second LED is for generating light with a CCT from about 4000K to about 5600K, and the third LED is for generating light with a chromaticity defined by chromaticity coordinates (0.207, 0.275), (0.210, 0.240), (0.284, 0.294), and (0.279, 0.326).

16. A lighting device comprising:

a first LED for generating light of a first chromaticity;

a second LED for generating light of a second chromaticity; and a third LED for generating light of a third chromaticity; and wherein at least one of the first LED, the second LED, or the third LED comprises an LED chip for generating blue light having a FWHM of at about 30 nm to about 80 nm; and wherein the lighting device is for generating light having (i) a CCT that is tunable within a range of CCTs from 1800K to 6500K by controlling power to the first LED, the second LED and the third LED and (ii) a chromaticity that is within 5 SDCM of the black body locus.

17. The lighting device of claim 16, wherein the lighting device is for generating light of chromaticity that is within 0.004 Δuv of the black body locus for a CCT in a range from 1800K to 6500K.

18. The lighting device of claim 16, wherein the lighting device is for generating light having an intensity versus wavelength spectrum, which over a wavelength range 440 nm to 650 nm, a maximum percentage deviation between the intensity of light generated by the lighting device and the intensity of light of the spectrum of a black body radiator or standard illuminant is at least one of less than 30%, less than 20%, or less than 10%.

19. The lighting device of claim 16, wherein the lighting device is for generating light with a chromaticity that is within 3 SDCM of the black body locus.

20. The lighting device of claim 16, wherein the device has a luminous efficacy of at least 95 lm/W or at least 135 lm/W.

21. The lighting device of claim 16, wherein the first LED is for generating light with a CCT from about 1700K to about 3500K, the second LED is for generating light with a CCT from about 4000K to about 5600K, and the third LED is for generating light with a chromaticity defined by chromaticity coordinates (0.207, 0.275), (0.210, 0.240), (0.284, 0.294), and (0.279, 0.326).

* * * * *